United States Patent
Samuels

(10) Patent No.: US 12,386,321 B2
(45) Date of Patent: Aug. 12, 2025

(54) ADAPTIVE ENGINE FOR TRACKING AND REGULATION CONTROL USING A CONTROL LAW SELECTOR AND COMBINER

(71) Applicant: Advanced Energy Industries, Inc., Denver, CO (US)

(72) Inventor: Chad S. Samuels, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 562 days.

(21) Appl. No.: 17/855,587

(22) Filed: Jun. 30, 2022

(65) Prior Publication Data
US 2024/0019819 A1    Jan. 18, 2024

(51) Int. Cl.
     *G05B 13/04*      (2006.01)
     *H01J 37/32*      (2006.01)

(52) U.S. Cl.
     CPC ............ *G05B 13/042* (2013.01); *G05B 13/04* (2013.01); *G05B 2219/23292* (2013.01); *G05B 2219/31464* (2013.01); *G05B 2219/41039* (2013.01); *H01J 37/32183* (2013.01); *H01J 37/32266* (2013.01); *H01J 37/32293* (2013.01)

(58) Field of Classification Search
     CPC .................. G05B 13/042; G05B 13/04; G05B 2219/23292; G05B 2219/31464; G05B 2219/41039; H01J 37/32183; H01J 37/32266; H01J 37/32293
See application file for complete search history.

(56) References Cited

U.S. PATENT DOCUMENTS

| | | | |
|---|---|---|---|
| 4,860,215 A | | 8/1989 | Seraji |
| 5,842,154 A | | 11/1998 | Harnett |
| 5,991,525 A | * | 11/1999 | Shah ...................... G05B 13/04 703/2 |
| 8,040,068 B2 | | 10/2011 | Coumou |
| 8,258,874 B2 | | 9/2012 | van Zyl |

(Continued)

FOREIGN PATENT DOCUMENTS

| | | | | |
|---|---|---|---|---|
| CN | 114527660 A | * | 5/2022 | |
| CN | 109460043 B | * | 8/2022 | ........... G05B 13/042 |

OTHER PUBLICATIONS

Guo, J. English translation of CN-109460043-B, Aug. 19, 2022 machine translation from PE2E (Year: 2022).*

(Continued)

*Primary Examiner* — Kamini S Shah
*Assistant Examiner* — Jonathan Michael Skrzycki
(74) *Attorney, Agent, or Firm* — NOD Law PC

(57) ABSTRACT

An adaptive engine and a method of adaptive control are disclosed. The method comprises receiving an input regressor, where the input regressor comprises a reference signal, a system output measurement, and a control output. The method includes applying one or more estimation laws to the input regressor to estimate two or more sets of estimated model parameter tensors, $\Theta$; receiving two or more possible control signals; generating two or more estimated system outputs; and selecting a control signal from a set comprising at least the first possible control signal and the second possible control signal, or a combination of possible control signals blended from two or more of the sets.

20 Claims, 61 Drawing Sheets

(56) References Cited

U.S. PATENT DOCUMENTS

| | | | |
|---|---|---|---|
| 8,716,984 B2 | 5/2014 | Mueller | |
| 8,912,835 B2 | 12/2014 | Nagarkatti | |
| 9,225,299 B2 | 12/2015 | van Zyl | |
| 9,721,758 B2 | 8/2017 | Coumou | |
| 10,049,857 B2 | 8/2018 | Fisk, II | |
| 10,095,198 B1 | 10/2018 | Ross et al. | |
| 2002/0132479 A1 | 9/2002 | Coumou | |
| 2004/0024750 A1 | 2/2004 | Ulyanov et al. | |
| 2004/0088059 A1 | 5/2004 | Johnson et al. | |
| 2005/0221514 A1 | 10/2005 | Pasadyn et al. | |
| 2009/0254202 A1* | 10/2009 | Pekar | G05B 13/048 700/29 |
| 2011/0054704 A1 | 3/2011 | Karpman et al. | |
| 2011/0196514 A1 | 8/2011 | Cao et al. | |
| 2012/0218042 A1 | 8/2012 | Mueller et al. | |
| 2014/0269809 A1 | 9/2014 | Makrides | |
| 2014/0300470 A1 | 10/2014 | Toncrey | |
| 2015/0319837 A1 | 11/2015 | Bhutta | |
| 2016/0147201 A1 | 5/2016 | Crncich-DeWolf et al. | |
| 2016/0161950 A1 | 6/2016 | Frangou | |
| 2017/0243322 A1 | 8/2017 | Sigrist et al. | |
| 2018/0017044 A1 | 1/2018 | Faler | |
| 2018/0119628 A1 | 5/2018 | Zeller et al. | |
| 2018/0119629 A1* | 5/2018 | Cline | F02D 41/26 |
| 2019/0391547 A1 | 12/2019 | Coumou et al. | |
| 2020/0102902 A1 | 4/2020 | Piche et al. | |
| 2020/0141267 A1 | 5/2020 | Wilson et al. | |
| 2021/0159833 A1 | 5/2021 | Qian et al. | |
| 2022/0092426 A1 | 3/2022 | Pang et al. | |
| 2024/0004353 A1 | 1/2024 | Samuels | |
| 2024/0004354 A1 | 1/2024 | Samuels | |
| 2024/0006151 A1 | 1/2024 | Samuels | |
| 2024/0006169 A1 | 1/2024 | Samuels | |
| 2024/0012370 A1 | 1/2024 | Samuels | |
| 2024/0012371 A1 | 1/2024 | Samuels | |
| 2024/0012372 A1 | 1/2024 | Samuels | |
| 2024/0014017 A1 | 1/2024 | Samuels | |
| 2024/0019818 A1 | 1/2024 | Samuels | |
| 2024/0019819 A1 | 1/2024 | Samuels | |

OTHER PUBLICATIONS

Sun, J. English translation of CN-114527660-A, May 24, 2022 machine translation from PE2E (Year: 2022).*

Qi, R. "Chapter 3: Adaptive Control A tutorial introduction", 2019, Communication and Control Engineering, URL:<https://link.springer.com/content/pdf/10.1007/978-3-030-19882-4_3.pdf> (Year: 2019).*

ISA, "International Search Report and Written Opinion Regarding International Application No. PCT/US23/69393", Nov. 20, 2023, p. 11, Published in: US.

Lindsay, Bernard G, Office Action issued in U.S. Appl. No. 17/855,577, Jun. 10, 2024, 98 pages.

Salmanpour et al. Event-Triggered Fuzzy Adaptive Leader-Following Tracking Control of Nonaffine Multiagent Systems With Finite-Time Output Constraint and Input Saturation, Apr. 2022, IEEE Transactions on Fuzzy Systems, vol. 30, No. 4.

Zeng et al., 'A functional variable universe fuzzy PID controller for load following operation of PWR with the multiple model', 2020, Annals of Nuclear Energy, 140 (2020) 107174.

Chung, Mong-Shune, Office Action issued in U.S. Appl. No. 17/855,644, Oct. 15, 2024, 47 pages.

Lindsay, Bernard G, Final Office Action issued in U.S. Appl. No. 17/855,577, Nov. 8, 2024, 74 pages.

Lindsay, Bernard G, Office Action issued in U.S. Appl. No. 17/855,683, Nov. 29, 2024, 70 pages.

Patel, Dhruvkumar, Office Action issued in U.S. Appl. No. 17/855,542, Sep. 29, 2024, 61 pages.

Klicos, Nicholas George, Non-final Office Action issued in U.S. Appl. No. 17/855,663, Apr. 21, 2025, 74 pages.

\* cited by examiner

Boot Up Phase

ADAPTIVE ENGINE FOR TRACKING AND REGULATION CONTROL USING A CONTROL LAW SELECTOR AND COMBINER

FIELD OF THE DISCLOSURE

The present disclosure relates generally to controller design. In particular, but not by way of limitation, the present disclosure relates to systems, methods and apparatuses for designing an adaptive controller.

DESCRIPTION OF RELATED ART

Control systems have important applications in many technology areas, including plasma applications, semiconductor processing and other materials processing, robotics, vehicle control systems for automobiles, aircraft, and spacecraft, and other electronic, manufacturing, and industrial systems. Semiconductor processing and other advanced materials processing rely on increasingly sophisticated plasma processes. Such plasma processes, in turn, require increasingly sophisticated power systems and control systems, to subject inherently unstable and nonlinear plasmas to increasing precision and consistency. Such plasmas are used for processes such as plasma etch processes, plasma-enhanced chemical vapor deposition (CEPVD) processes, plasma-enhanced atomic layer deposition (PEALD) processes, plasma-assisted atomic-layer deposition (PA-ALD), RF sputtering deposition, and other plasma processing applications.

In some plasma processing recipes, it is desirable to provide a pulsed waveform having multiple states (or power levels) as exemplified by the illustrative waveform in FIG. 2. Each recipe includes a number of pulse cycles (PC), number of pulses per pulse cycle, and a number of states per pulse. Each state has a different target power level. In this example, two pulse cycles are shown, the first pulse cycle having six pulses and each of those pulses having three states. The second pulse cycle has four pulses each having four states. Plasma processing systems comprise many actuators to achieve a desired application of power such as is shown in FIG. 2. But in many instances, the actuators respond differently to control signals because different actuators inherently have different response times (e.g., some actuators respond much faster than other actuators) and/or the actuators operate in an asynchronous manner. In the context of this disclosure, actuators may include, without limitation, higher-level constructs such as generators, match networks, remote plasma sources, and bias supplies. In addition, actuators may include, without limitation, lower-level constructs such as DC rail supplies, RF amplifiers, variable capacitors, and power supplies within bias supplies and remote plasma source. In today's plasma processing systems, control (e.g., for precision and consistency) over the high-level actuators and low-level actuators is critical in view of the increasing speeds of the actuators and the ever-decreasing dimensions of the resultant processed-workpieces.

As an additional example, an RF generator for providing the pulsed waveform in FIG. 2 may have actuators that include a DC section and a power amplifier where the DC section provides a rail voltage to the power amplifier and the power amplifier provides the desired pulsed waveform (e.g., FIG. 2) using the rail voltage. The power amplifier is relatively fast (e.g., ~250 ns) compared to changes in the target voltage, but the DC section or the rail, is relatively slow (e.g., ~1 ms). As a consequence, existing control systems tend to hold the rail at a high level for much of a pulse cycle (e.g., at a highest level needed for a given pulse cycle). However, this can lead to overheating of components and premature system failure and maintenance needs as well as inefficiency since the rail is often far above the level needed at any moment in time (i.e., for a given state within a pulse of a pulse cycle).

Current adaptive controllers do not have inherent stability or the guarantee that they will converge. Further, existing adaptive controllers utilize transfer functions, and are thus difficult to scale to arbitrary waveforms and coupled inputs and outputs (MIMO). They also tend to be limited to a single control law and thus lack adaptability to various situations that may arise even within a given recipe. Further, existing adaptive engines struggle with unstable systems as well as unbounded computed control values as well as modeling uncertainties and input and output bounded disturbances that can be arbitrary. Lastly, they struggle with handling different modeling/parameterizations of the process to be controlled.

SUMMARY OF THE DISCLOSURE

Some aspects of the disclosure may be characterized as an adaptive engine configured to receive a reference waveform and provide a control to one or more actuators, the adaptive engine comprising an estimation law module configured to receive an input regressor. The the input regressor comprises a reference signal, r, a system output measurement, $y_{meas}$, and a control output, $u_{out\_k-1}$, from a previous iteration. In some embodiments, the estimation law module is configured to apply one or more estimation laws to the input regressor to produce one or more sets of estimated parameter tensors, $\Theta$, for a non-linear (NL) model of the one or more actuators or a power system controlled by the one or more actuators. In some implementations, the adaptive engine comprises a control law sub-engine comprising a first control law module and a second control law module; a control law selector and combiner (CSC) coupled to the outputs of the first and second control law modules and configured to receive a possible control signal, $u_{SE\_k}$ from each of the first and second control law modules. The non-linear model is configured to produce two or more possible estimated system outputs, $y_{est\_SE}$ based upon applying (1) a previous iteration of the possible control signal, $u_{SE\_k-1}$, or (2) the possible control signal $u_{SE\_k}$, to the non-linear model. In some implementations, the CSC is configured to provide one of, or a combination of, the two or more possible control signals, $u_{SE\_k}$, to a selector module based at least in part on an estimation or prediction error derived from each of the possible estimated system outputs, $y_{est\_SE}$.

Other aspects of the disclosure may be characterized as a method of adaptive control, the method comprising: receiving an input regressor, where the input regressor comprises a reference signal, r, a system output measurement, $y_{meas}$, and a control output, $u_{out\_k-1}$, from a previous iteration; applying one or more estimation laws to the input regressor to estimate two or more sets of estimated model parameter tensors, $\Theta$, for a nonlinear model, wherein the nonlinear model is a function of the two or more sets of estimated model parameter tensors, $\Theta$, and wherein each of the two or more sets of estimated model parameter tensors, $\Theta$, comprises estimated parameters of the nonlinear model; receiving two or more possible control signals, $u_{SE\_k}$, each using a corresponding control portion of the nonlinear model, and wherein each control portion is a function of one of the two or more sets of estimated parameter tensors, $\Theta$, of the nonlinear model; generating two or more estimated system outputs, $y_{est\_SE}$, each using a corresponding estimation portion of the nonlinear model, and wherein each estimation portion is a function of one of the two or more sets of estimated model parameter tensors, $\Theta$; and selecting (1) a best possible control signal, $u_{SE}$, from a set comprising at least the first possible control signal and the second possible control signal, or (2) a best combination of possible control signals, $u_{SE}$, blended from two or more of the set.

Yet other aspects of the disclosure may be characterized as a non-transient computer-readable storage medium having instructions embodied thereon, the instructions being executable by one or more processors to perform a method of adaptive control, the method comprising: receiving an input regressor, where the input regressor comprises a reference signal, r, a system output measurement, $y_{meas}$, and a control output, $u_{out\_k-1}$, from a previous iteration; applying one or more estimation laws to the input regressor to estimate two or more sets of estimated model parameter tensors, $\Theta$, for a nonlinear model, wherein the nonlinear model is a function of the two or more sets of estimated model parameter tensors, $\Theta$, and wherein each of the two or more sets of estimated model parameter tensors, $\Theta$, comprises estimated parameters of the nonlinear model; receiving two or more possible control signals, $u_{SE\_k}$, each using a corresponding control portion of the nonlinear model, and wherein each control portion is a function of one of the two or more sets of estimated parameter tensors, $\Theta$, of the nonlinear model; generating two or more estimated system outputs, $y_{est\_SE}$, each using a corresponding estimation portion of the nonlinear model, and wherein each estimation portion is a function of one of the two or more sets of estimated model parameter tensors, $\Theta$; and selecting (1) a best possible control signal, $u_{SE}$, from a set comprising at least the first possible control signal and the second possible control signal, or (2) a best combination of possible control signals, $u_{SE}$, blended from two or more of the set.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

DETAILED DESCRIPTION

Figure 1:
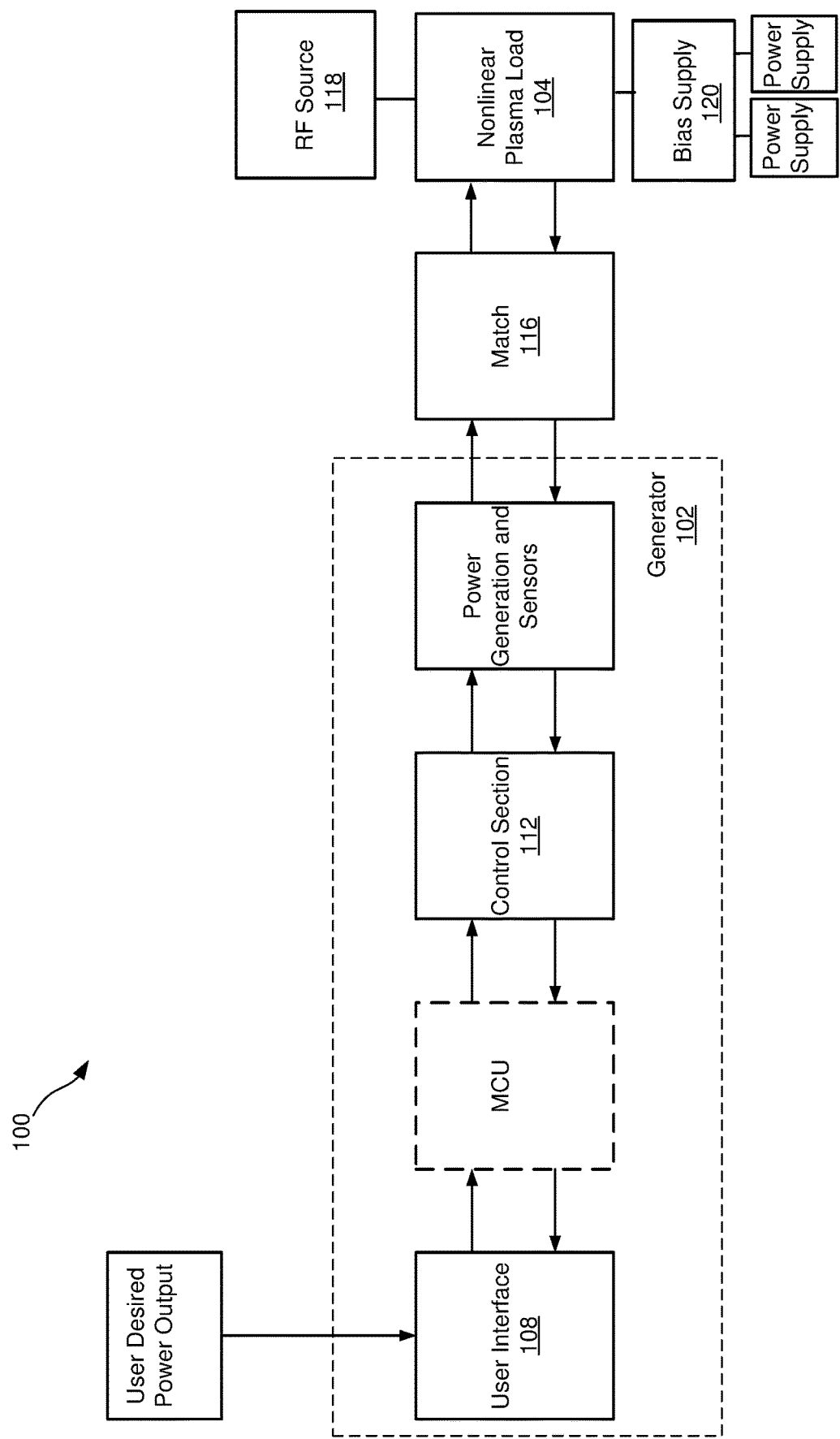
FIG. 1 illustrates a plasma processing system.

A tensor is a multi-dimensional array with a uniform type. In other words, a tensor is an algebraic object that describes a multilinear relationship between sets of algebraic objects related to a vector space. Objects that tensors may map between include vectors and scalars, and even other tensors. An example of a zero-order tensor is a fixed power setpoint, while a first-order tensor is a vector, such as phasor representing the phase shift between two waveforms (e.g., voltage and current). A second-order tensors is a matrix, where two matrices might be used to represent estimated future values of reflected power and load impedance at two future times, and where multiplying those matrices together may be used as a simplified mathematical operation to predict a trajectory of reflected power and load impedance into the future. As can be seen, tensors provide a way to simplify complex sets of data and mathematical operations, which not only helps simplify complex MIMO applications in this disclosure, but also allows for parallel processing and more efficient use of limited processing resources for predicting nonlinear dynamics in power and plasma systems.

The index "k" will be used to specify an iteration, such that a timing of a generalized variable can be described with the addition of k. For instance, the control for a previous iteration may be denoted $u_{out\_k-1}$ and $u_{out\_k}$ for a current iteration. This exemplary use of iteration index k can be used across all variables to provide clarity when a discussion of multiple iterations of the same variables is needed, but otherwise, generalized versions of variables will not use the iteration index k.

For the purposes of this disclosure, an estimation error, ê, and an estimated system output error, $ê_{out}$, can each be replaced by a cost function, J or $J_{out}$, respectively. Accordingly, this disclosure will often only discuss an estimation error e and a system output error $ê_{out}$, and these references should be understood to also include cost function variations of these errors. It should be noted that the hat symbol over the "e" represents an estimation. An actual system error, $e_{out}$, will also be discussed and this should not be confused with the estimated system error, $\hat{e}_{out}$.

Traditional control systems often look at an error, $\hat{e}$, between the reference signal, r, and the measurements of delivered power, $y_{meas}$, and produce a control, $u_{out}$, proportional to the error, e. However, such controls can suffer when presented with nonlinearities and unknown disturbances, among other challenges. To address nonlinear systems, nonlinear systems with uncertainty, linear systems with uncertainty, and systems with unknown variations in plant parameters, adaptive controls have been developed. The basic aim of adaptive control is to maintain a consistent performance of a system in the presence of uncertainty or unknown variation in plant parameters, but with changes in the controller parameters, adapting to the changes in the performance of the control system. Hence, there is an adaptation in the controller setting subject to the performance of the closed-loop system. How the controller parameters change is decided by the adaptive laws, which are often designed based on the stability analysis of the adaptive control system.

A number of design methods have been developed for adaptive control. Model Reference Adaptive Control (MRAC) consists of a reference model which produces the desired output, and the difference between the plant output and the reference output is then used to adjust the control parameters and the control input directly. MRAC is often in continuous-time domain, and for deterministic plants. Self-Tuning Control (STC) estimates system parameters and then computes the control input from the estimated parameters. STC is often in discrete-time and for stochastic plants. Furthermore, STC often has a separate identification procedure for estimation of the system parameters, and is referred to as indirect adaptive control, while MRAC adapts to the changes in the controller parameters, and is referred to as direct adaptive control. However, the development of a general robust adaptive controller remains at present an open problem. Martin Guay et al. *Robust and Adaptive Model Predictive Control of Nonlinear Systems, Control, Robotics and Sensors* Series 83, page 76.

This disclosure presents an updated adaptive engine that can combine influences from multiple estimation laws in a manner that addresses certain challenges of an input waveform and/or system to be controlled, such as nonlinear systems, nonlinear systems with uncertainty, linear systems with uncertainty, and systems with unknown variations in plant parameters. Further, changes to the blending of these influences can be adjusted in real-time to cope with the often nearly instant changes seen in nonlinear systems.

Figure 4:
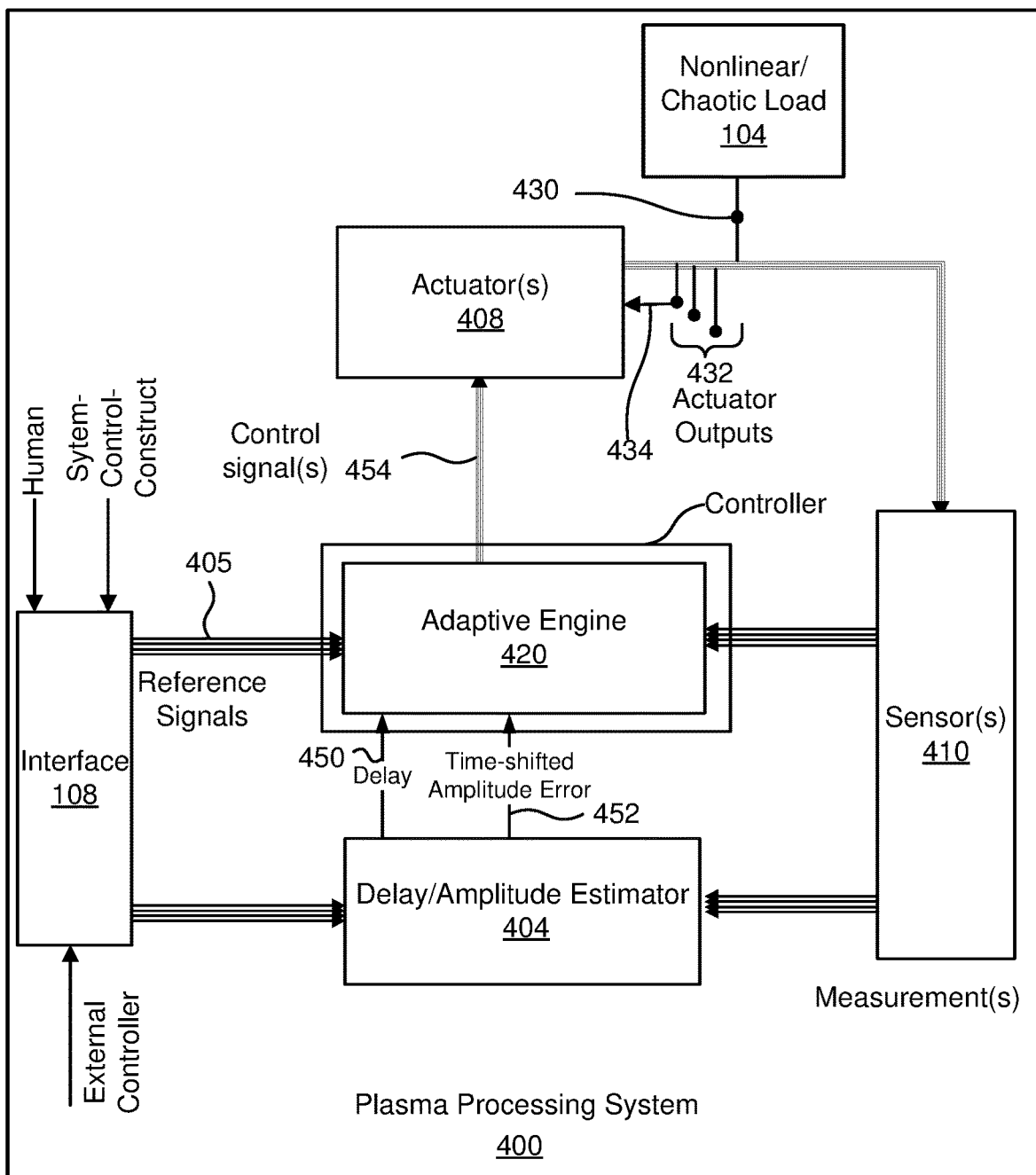
FIG. 4 Illustrates a plasma processing system having an adaptive engine configured to control one or more actuators.

Referring to FIG. 4 shown is a block diagram depicting aspects of a predictive and tensorial control approach that may be utilized in connection within a plasma processing system 400 (though systems other than a plasma load can also be controlled by the actuator(s) 408). Shown in FIG. 4 is an adaptive engine 420, which is coupled to a user interface 108, one or more actuator(s) 408, and sensors 410. Also coupled to the adaptive engine 420 is a delay/amplitude estimator 404. As discussed further herein, the delay/amplitude estimator 404 may be further separated into functional subcomponents or consolidated, and the functionality of the delay/amplitude estimator 404 may be carried out in pipelining-type approaches or may be serially effectuated, which one of ordinary skill in the art, in view of this disclosure, will understand.

Figure 3:
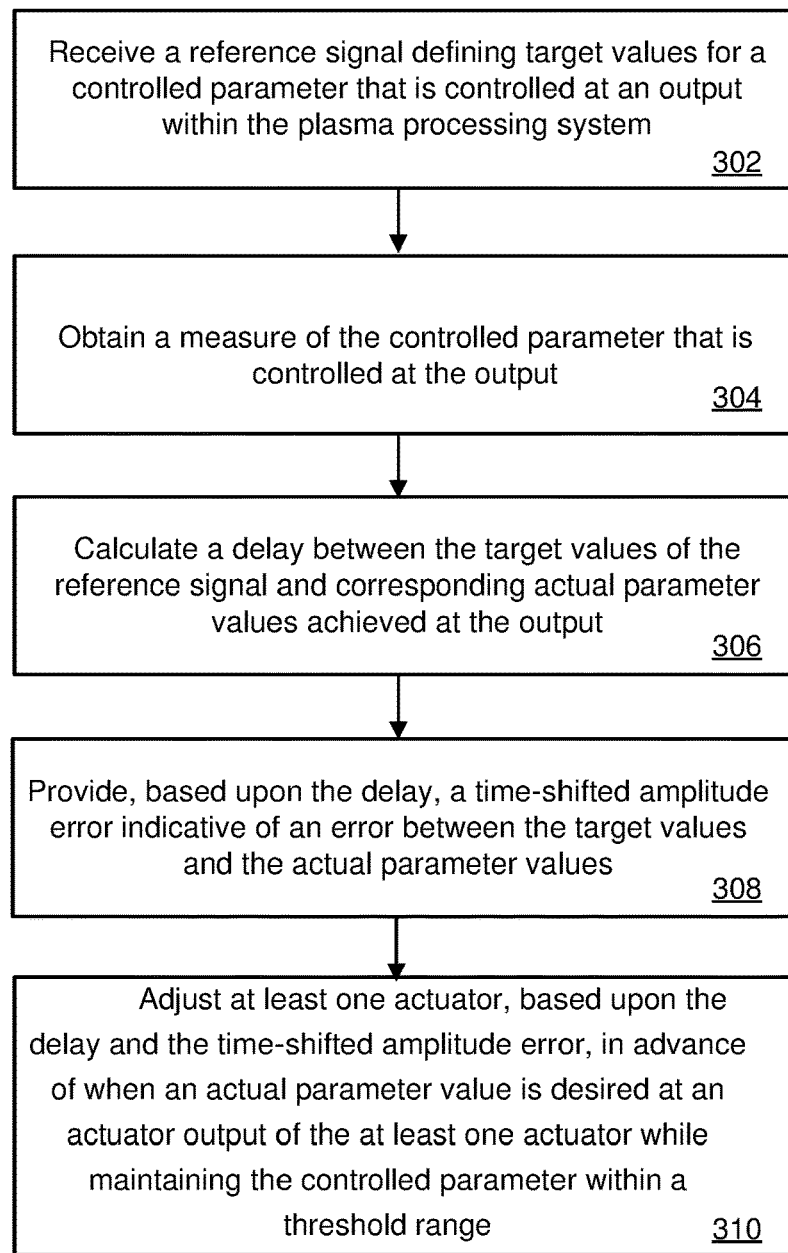
FIG. 3 illustrates a method of controlling the system of FIG. 1.

While referring to FIG. 4, simultaneous reference is made to FIG. 3, which is a flow chart depicting steps that may be traversed in connection with embodiments of the disclosure herein. The user interface 108 is configured to receive (Block 302) a reference signal, r, defining target values (or reference signals) for one or more controlled parameters that is applied to one or more controlled outputs within the system. In other words, the reference signal, r, can be an n-dimensional entity where n>0. For instance, a one-dimensional reference signal, r, is more typically referred to as a reference signal. In some embodiments, r, can also refer to a series of setpoints or a setpoint stream. The target values may represent multi-level pulsed waveforms or any arbitrary waveform. As shown, the controlled outputs within the system 400 may include a load output 430, which is a node that is coupled to the nonlinear and/or chaotic load 104, and/or the controlled outputs may include one or more actuator(s) outputs 432. In other words, the adaptive engine 420 may be used to control one or more controlled parameters at the load output 430 that may include power-related parameters including, for example and without limitation, DC power, forward power, reflected power, reflection coefficient, frequency, and current. In addition, the adaptive engine 420 may be used to control controlled parameters that are applied at the actuator(s) outputs 432. The controlled parameters applied to actuator(s) outputs 432 may include the power-related parameters listed above (in connection with the output 430 (load output)) and control-related parameters such as a phase-control signal, frequency control signal, and voltage-control signals. In addition, one or more particular actuator outputs 432 may feed as an input 434 to one or more other actuators 408. The actuator outputs 432 need not have similar response times, for instance, but not limited to, where one actuator drives a fast power source and a second actuator drives a slower rail voltage.

As shown, at least one sensor 410 is configured to obtain a measure (Block 304) of the parameters such as the power-related parameters and the control-related parameters listed above. The at least one sensor 410 may include, for example and without limitation, directional couplers, VI sensors, current transducers, and simple voltage sensors. Those of ordinary skill in the art will appreciate that the signals from the at least one sensor 410 may be sampled and converted into digital format for use by the adaptive engine 420.

A delay/amplitude estimator 404 is configured to calculate a delay (Block 306) between the target values of the reference signal 405 and corresponding actual parameter values achieved at the controlled output (i.e., measured system outputs). The delay/amplitude estimator 404 is also configured to provide, based upon the delay, a time-shifted amplitude error 452 indicative of an error between the target values and the actual parameter values (Block 308). According to one aspect, the adaptive engine 420 is beneficially configured to adjust at least one of the actuators 408 (based upon the delay 450 (at Block 306) and the time-shifted amplitude error 452 (at Block 308)) in advance of when an actual parameter value is needed (at an actuator output of the at least one actuator 408) while maintaining the controlled parameter at the controlled output within a threshold range (Block 301).

Figure 45:
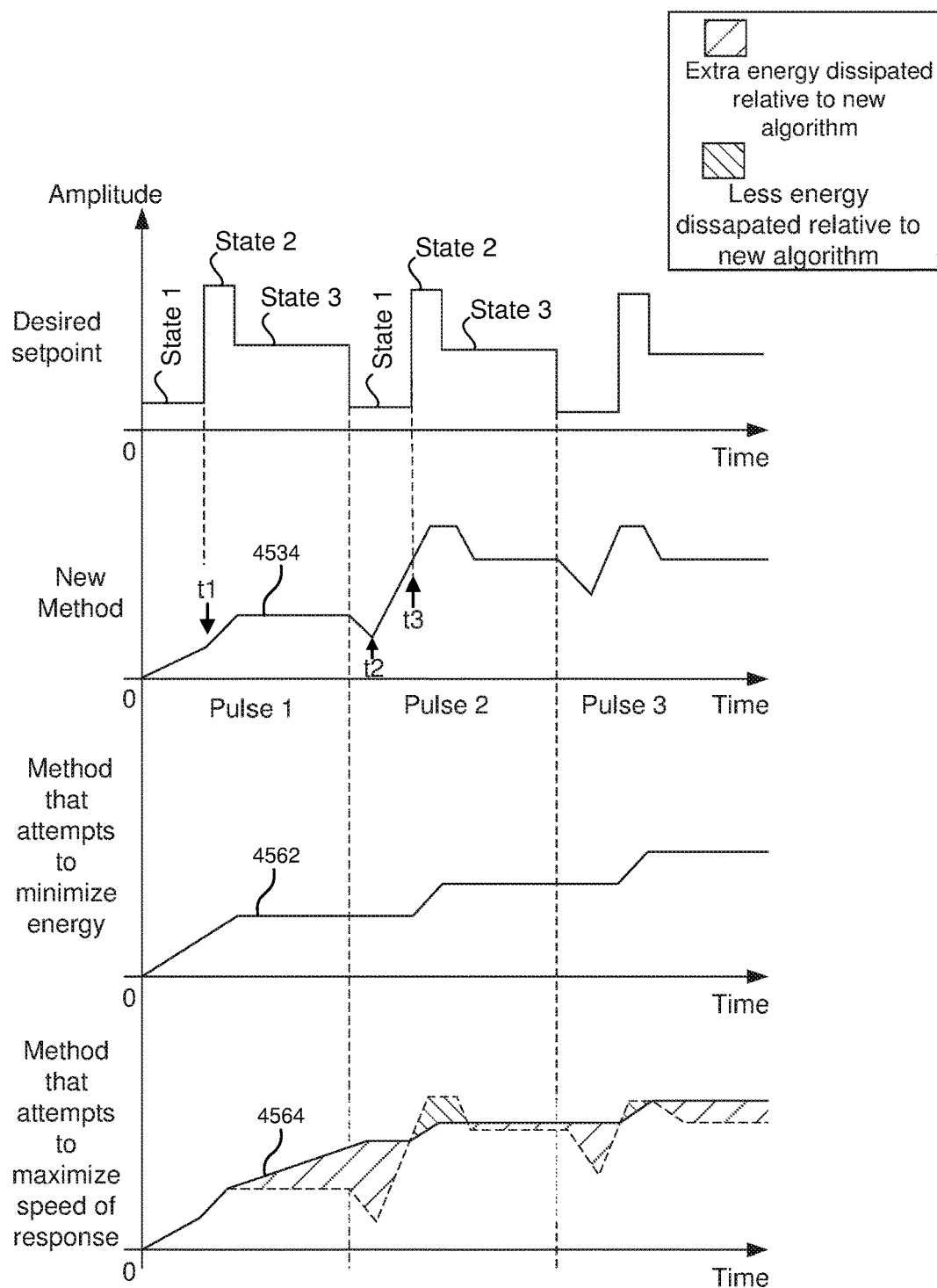
FIG. 45 shows an example of an actuator output that is produced in response to a desired reference signal where the desired reference signal.

Referring briefly to FIG. 45 for example, shown is an example of an actuator output 4534 (e.g., rail voltage, $V_{rail}$) that is produced (using the adaptive engine 420) in response to a desired reference signal where the desired reference signal comprises three pulses and each pulse includes three target values (desired at the controlled output for a controlled parameter): state 1, state 2, and state 3. Each state of the desired reference signal corresponds to a target value of a controlled parameter at the output 430 (e.g., forward power). As shown, during pulse 1, the actuator output 4534 is adjusted, at $t_1$, in very close connection with a time when it is needed—at the change in the reference signal from state 1 to state 2. But during pulse 2, the actuator output is adjusted, at $t_2$, in advance of when the actuator output 4534 needs to be increased to produce the target value of state 2 at the output 430. As a consequence, the controlled parameter (e.g., forward power) at the controlled output (e.g., load output 430) will reach the desired reference signal faster than prior control methodologies that attempt to minimize energy dissipation (using actuator output 4562), and faster than prior methods that attempt to maximize a speed of response (using actuator output 4564). The predictive functionality of the delay/amplitude estimator 404 enables the adaptive engine 420 to adjust the actuator (e.g., rail voltage) in advance of when it is needed by predicting the effects of adjusting the actuator in advance of when it is needed so that adverse consequences (e.g., reference signal errors or over voltage conditions) are avoided.

Figure 44A:
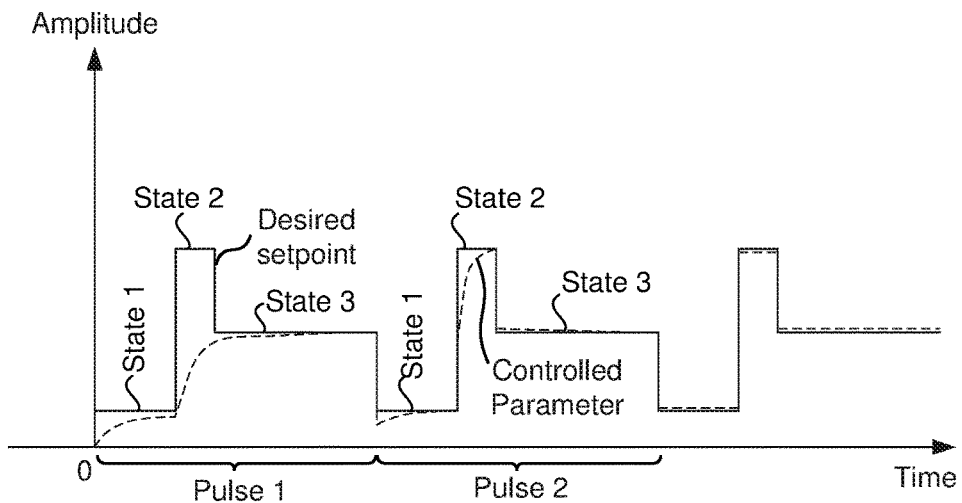
FIG. 44A shows a graph of the desired reference signal in FIG. 45, where a control parameter is closer to the desired reference signal during pulse 2.
Figure 44B:
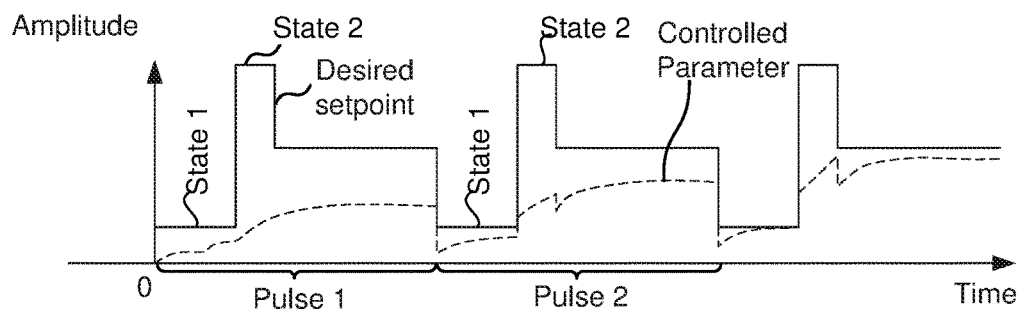
FIG. 44B shows a graph of the desired reference signal of FIG. 45, where the controlled parameter achieves the controlled output.
Figure 44C:
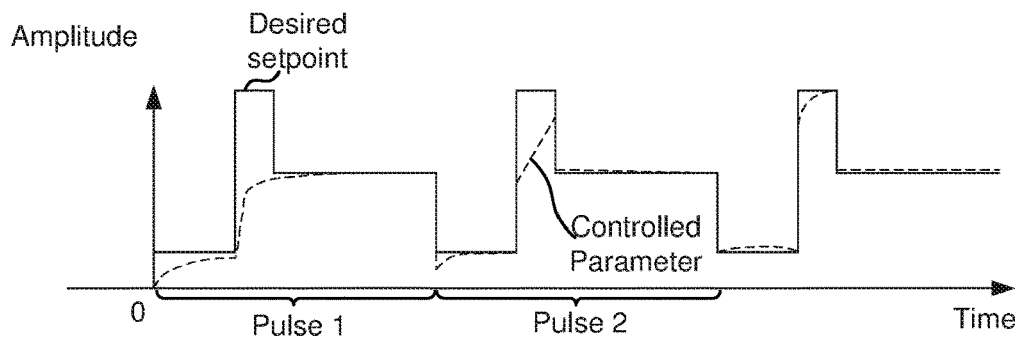
FIG. 44C shows a graph of the desired reference signal of FIG. 45, where the controlled parameter achieving the controlled output.

Referring to FIGS. 44A, 44B, 44C for example, shown are three graphs, and each of the three graphs depicts the same desired reference signal that is shown in FIG. 45 with the same three desired states per pulse. FIG. 44A depicts the controlled parameter actually achieved at the controlled output using the predictively produced actuator output 4534; FIG. 44B depicts the controlled parameter actually achieved at the controlled output using the actuator output 4562; and FIG. 44C depicts the controlled parameter actually achieved at the controlled output using the actuator output 4564. As shown in FIG. 44A, the controlled parameter is closer to the desired reference signal during pulse 2 when the controlled actuator is controlled (in advance of when it is needed) to produce the actuator output 4534 as compared to both the controlled parameter values in FIGS. 44B and 44C.

As discussed further herein, the delay/amplitude estimator 404 may be implemented with different levels of complexity, but in general, the delay/amplitude estimator 404 is configured to detect a delay 450 between a desired reference signal (from the user interface 108) and the time when the actual output of one or more actuators 408 reaches the reference signal. As discussed further herein, the reference may be a time varying streaming reference signal (e.g., a reference signal that mirrors the pulses and states in FIG. 2) and, as discussed further herein, the delay 450 may be determined based upon a cross correlation between the streaming reference signal and the actual time-varying output of one or more actuators 408 in the system. Moreover, as discussed further herein, the delay 450 may be a simple delay (e.g., between a reference signal and an output when the reference signal is achieved) or the delay 450 based on several constituent delay components including delays within an actuator 408 and/or external delays outside of the actuator 408. With knowledge of the delay 450, the delay/amplitude estimator 404 may determine a time-shifted amplitude error 452, which is generally indicative of an error value based upon a difference between the streaming reference signal and the output that is determined after the streaming input waveform and an output waveform are relatively time-shifted (based upon the delay 450) so that, on an ongoing basis, a portion of the output waveform is aligned with the corresponding portion of the reference signal that effectuated the portion of the output waveform. Once the output waveform is aligned with the streaming reference signal, an error value, represented as the time-shifted amplitude error 452, may be calculated.

The adaptive engine 420 utilizes the delay 450 and the time-shifted amplitude error 452 to predict how the control signal(s) and or actuator output(s) will react to potential control signal changes—in advance of actually changing the control signals. By predicting how the actuator outputs will be affected (in advance of actually changing the control signals to the actuators 408) the adaptive engine 420 may adjust the control signals to achieve desired results. For example, based upon predicted-control-signal outputs, the adaptive engine 420 may adjust the control outputs to: reduce a time it takes to achieve a desired output of the actuator(s); to reduce energy dissipation; to prevent damaging over voltage and/or over current conditions; and/or to achieve any desired balance between speed, accuracy, and energy.

It should be recognized that FIG. 4 is a simplified depiction of what may be implemented on a tensorial level with many reference signals, many control signals, and many actuators 408. It should also be recognized that the actuators may be higher-level actuators (such as generators, match networks, RF sources, and bias supplies) and lower-level constructs within the higher-level actuators. For example, a DC section and the power amplifier are examples of actuators within a generator that may be controlled (as discussed further herein as a non-limiting example). By way of further example, the voltage of the DC section may be controlled, and a frequency of the power amplifier may be controlled using the adaptive engine 420.

As another example, the match network 116 is an example of an actuator 408, which also comprises actuators such as variable capacitors that may be controlled using the delay estimation and predictive control aspects of the delay/amplitude estimator 404 and the adaptive engine 420, respectively. It is contemplated, for example, that variable capacitors of the match network 116 may be controlled in isolation (e.g., based upon reflected power) or in connection with a variable frequency drive of the generator 102 using one of the delay/amplitude estimator 404 and adaptive engine 420. As a further example, the bias supply 120 is an actuator 408, and the bias supply 120 comprises actuators 408 such as a power supply (e.g., to establish a rail voltage) and a switching-section to establish timing of a periodic asymmetrical voltage waveform. These actuators 408 of a bias supply may be controlled (using the estimation and prediction techniques of the delay/amplitude estimator 404 and adaptive engine, respectively) to control the bias supply 120. Or other actuators of the bias supply may be controlled in view of other actuators such as the RF source 118 and/or generator 102 to synchronize the bias supply 120, the RF source 118, and/or the generator 102 to achieve desired plasma processing recipe results and/or to prevent undesired plasma modulation (e.g., due to intermodulation frequencies).

In more general terms, various aspects of the delay estimation and predictive control, and/or adaptive control, may enable direct, unhindered (or without response delay) control of a parallel multi-actuator or multi-knob nonlinear control system (such as the plasma processing systems 100, 400). A controller utilizing the delay estimation, prediction, and/or adaptation, may enable more responsiveness (e.g., maximize dynamic range in real time) and adaptability of a parallel multi-actuator nonlinear and/or chaotic control system. Moreover, the delay estimation and predictive aspects, as well as the adaptation aspects of this disclosure may enable improved controls (e.g., to maximize the speed of the response and achieve the shortest response time to reach a desired reference signal value, while also enabling stability and robustness) of a parallel multi-actuator nonlinear and/or chaotic control system. The delay estimation and predictive aspects and adaptation aspects may also enable all of the above functions and advantages to be achieved even when some of the actuators of the control system are arbitrarily slower than other actuators of the control system.

Another aspect of the delay estimation and predictive and/or adaptive control of this disclosure may enable all of the above functions and advantages to be achieved even when multi-level pulsing with a number of states (going up to an arbitrary number) is desired, and/or arbitrary waveform tracking is required on a nonlinear and/or chaotic dynamic load. Yet another aspect may also enable all of the above functions and advantages to be achieved even while minimizing the control energy expended in the system. As discussed further herein, the delay estimation and predictive control aspects and/or adaptation aspects may also enable all of the above functions and advantages to be achieved while protecting hardware from faults relating to high dissipation, high currents, and/or high voltages. Moreover, another aspect of the delay estimation and predictive control and/or adaptation methodologies may also enable all of the above functions and advantages to be achieved even while making sure all the different actuators work cooperatively together such that no actuator is controlling itself in a manner that hinders, impedes, or interferes with the control of the other actuators in such a way that would cause the system response to become slower, or require more energy to be achieved from any or all of the other actuators.

Adaptive Engine

At a high level, the adaptive engine splits, or bifurcates, adaptive control for highly nonlinear and/or chaotic systems, such as power supplies for plasma processing. The adaptive engine starts with a nonlinear model of one or more actuators and/or a power system controlled by the one or more actuators, and defines two outputs of this nonlinear model: one for control, $u_{se}$, and one for an estimated system output, $y_{est\_se}$, based on that control, $u_{se}$. Two parts of the nonlinear model that achieve these outputs can be referred to as a control portion and an estimation portion. There are different ways of expressing these two portions as will be discussed later, but for the purposes of illustration, one form of the control and estimation portions of the nonlinear model can be written as:

$u_{se} = \theta \cdot \emptyset$  (Control Portion of Nonlinear Model)

$y_{est\_se} = W_m\{u_{se}\}$  (Estimation Portion of Nonlinear Model)

The control portion is a function of estimated parameter values for the nonlinear model, referred to as an estimated model parameter tensor, $\Theta$, as well as an input regressor, $\emptyset$, that can include elements such as a reference waveform, r. As seen, the estimation portion is dependent on the answer to the control portion as well as a time-varying linear system, $W_m$. The time-varying linear system, $W_m$, is composed of the following system of equations:

$$\begin{cases} \dot{x} = Ax + Bu_{se} \\ y_{est\_se} = Cx \end{cases} \text{(Time-Varying Linear System, } W_m\text{)}$$

Where x is an internal state and where A, B, and C are matrices whose structure defines characteristics of the nonlinear model, and whose elements can include 1, 0, $\Theta$, and fixed coefficients. In some cases, the structure may include changing an element from $\Theta$ to a fixed coefficient, where it is known that adaptation of this element of the estimated model parameter tensor, $\Theta$, is not needed or doesn't provide significant improvement. One sees that with knowledge of the A, B, and C matrices, and a value for the possible control signal, $u_{se}$, the system can be solved for the estimated system output, $y_{est\_se}$. More specifically:

$\dot{y} = Ay + Bu_{se}$

So, $W_m\{u_{se}\}$ leads to $y_{est\_se}$ by integrating $\dot{y}$.

Although C can vary, in some embodiments C can be the identity matrix for improved performance. At the start of each frame, x can take the last value of x from the previous frame.

This disclosure improves on existing nonlinear modeling techniques by bifurcating the time-varying linear system, $W_m$, into a linear and a nonlinear portion. The nonlinear portion is unknown, and this disclosure's adaptive control seeks to minimize this unknown nonlinear portion via adaptation of the linear portion. Adaptation of the linear portion can also be bifurcated via the use of frames. The reference signal, r, can be split into frames, each potentially having a different number of control samples or iterations, such that each frame allows a time-varying linear approximation of the nonlinear system behavior resulting from the reference signal, r, for that frame. Thus, each frame's length is selected so as to optimize the linear approximation. The time-varying linear approximation, or $W_m$, has a structure as noted above, that is selected for each frame. This structure, or the structure of the A, B, and C matrices, determines large scale changes or shapes of the model. Yet, the time-varying linear system, $W_m$, is also a function of the estimated model parameter tensor, $\Theta$, which is modified, or adapted, at each control sample or iteration of the adaptive engine. So, while the structure of the time-varying linear system, $W_m$, remains constant through a frame, $\Theta$ changes, and thus $W_m$ changes. These changes resulting from adaptation of $\Theta$ tend to be small compared to the changes resulting from the structure changing. Thus, adaptation of the estimation model parameter tensor, $\Theta$, allows small nonlinear variations in system behavior to be modeled and processed in real-time, while larger variations in system behavior are modeled by changes in the $W_m$ structure, which change every frame. Because the structure only changes frame-by-frame, these values can be pre-processed and can use a processing resource with less power than one needed to process the estimated model parameter tensor, $\Theta$, adaptation. For instance, the structure of the time-varying linear system, $W_m$, can be processed on a CPU, while the adaptation of the estimated model parameter tensor, $\Theta$, can be processed in real-time on an FPGA.

At the start of each frame, the estimated model parameter tensor, $\Theta$, begins with a set of initial conditions, and thus, the time-varying linear system, $W_m$, and hence the nonlinear model, may form a very rough approximation of the nonlinear system behavior (i.e., outputs of the model may see some error from actual system behavior). However, the adaptive engine guesses and tests values for the estimated parameter tensor, $\Theta$, or adapts them, during a plurality of control samples or iterations, and as this occurs, the time-varying linear system, $W_m$, becomes a better and better approximation of the nonlinear system behavior until the error (or the unknown nonlinear portion of $W_m$) fall below a threshold at which $W_m$ is considered to have converged and no further adaptation is needed (i.e., no further changes to $\Theta$ are performed). Said another way, the adaptive engine pre-processes a different nonlinear approximation (dependent on $\Theta$) of the system's nonlinear behavior for each frame, and then within each frame, the adaptive engine adjusts the nonlinear approximation via adaptation of the estimated model parameter tensor, Θ, to bring the linear approximation into even closer alignment with the system's nonlinear behavior. This bifurcation of calculating the linear approximation (the structure of the A, B, and C matrices) on a frame-by-frame basis, and real-time adaptation of the estimated model parameter tensor, Θ, of the time-varying linear approximation, allows different processing resources to be applied to their best functions: slower resources like a CPU can process the structure of the time-varying linear system at a slower pace, and faster resources like an FPGA can process adaptation or modification of the time-varying linear system (via Θ) within each frame at a faster pace. This bifurcation allows faster and more robust convergence on nonlinear behavior than has been possible in existing adaptive controllers.

Figure 43:
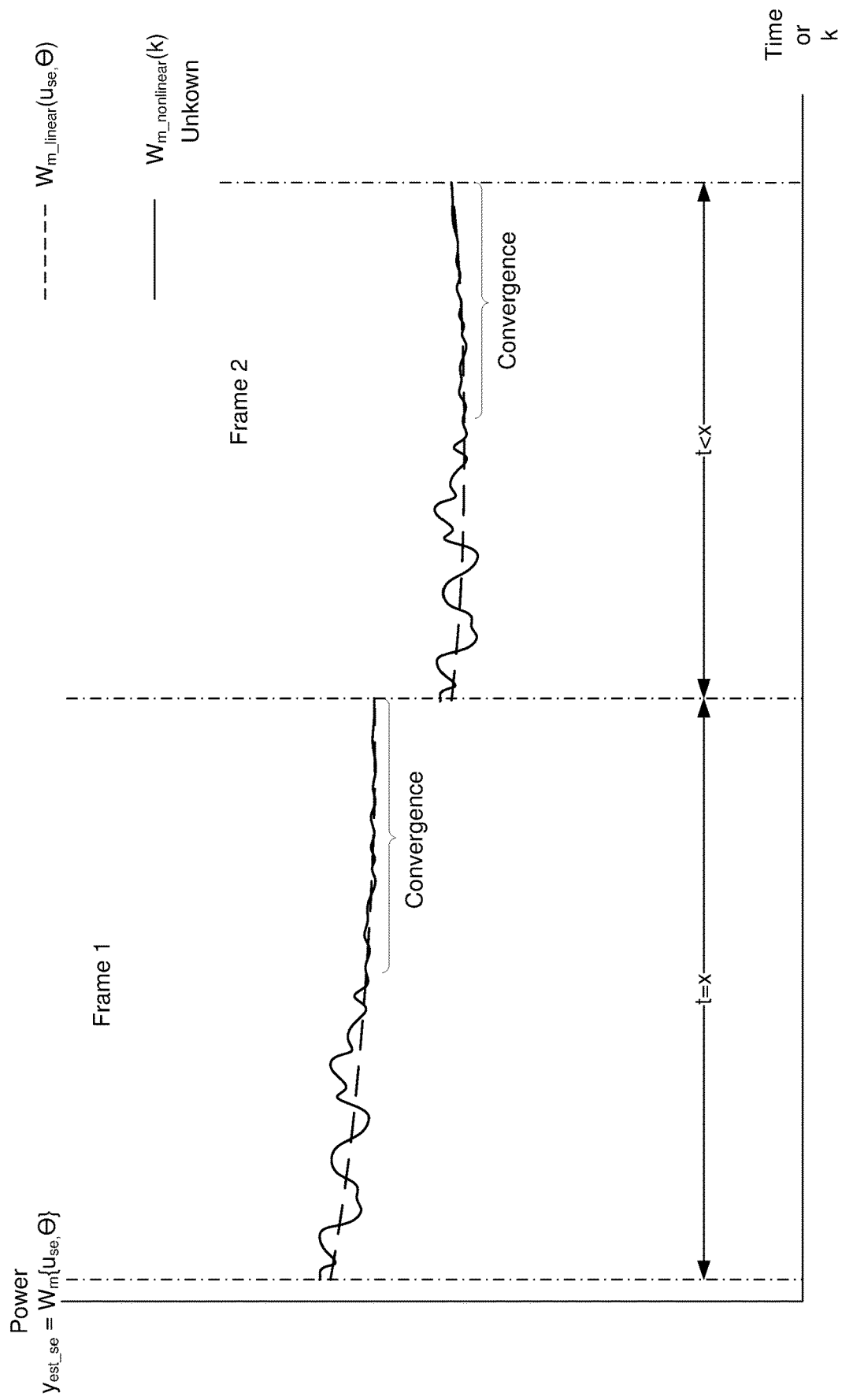
FIG. 43 shows a plot illustrating the concept of the bifurcated model for the estimation portion.

FIG. 43 shows a plot illustrating the concept of the bifurcated model for the estimation portion. In this plot, the model output is power, and this can be estimated using an estimation portion of the model, which depends on $W_m$ and $u_{se}$, though other outputs can also be handled by the models of this disclosure. The time-varying linear system, $W_m$, can be bifurcated into a linear (dashed lines) and a nonlinear part (solid lines). The linear part can be referred to as $W_{m\_linear}(u_{se}, \Theta)$, and depends on the estimated model parameter tensor, Θ, and the possible control signal, $u_{se}$, both of which vary per control sample or iteration, and where the structure of this linear part changes with each new frame. The unknown nonlinear part can be referred to as $W_{m\_non-linear}(k)$, and oscillates with every control sample or iteration due to adaptation of the estimated model parameter tensor, Θ, but whose oscillation becomes smaller as the linear portion is adapted and the nonlinear model becomes a better and better approximation of the actual nonlinear system behavior. As the adaptation improves, the unknown nonlinear portion $W_{m\_non-linear}(k)$ of the time-varying linear system, $W_m$, becomes small enough to be ignored. In other words, while the structure of the linear portion does not change within a frame, its overall influence on the model output does change as the adaptation of Θ brings the linear portion into better alignment with the system's nonlinear behavior. Thus, at the start of each frame, the nonlinear portion is likely large, but as the linear portion is adapted (as the estimated model parameter tensor, Θ, is adapted), the linear portion, $W_{m\_linear}(u_{se}, \Theta)$, becomes a better approximation of actual behavior and the unknown nonlinear portion or error is reduced until it falls below a threshold and the adaption is considered complete for that frame (i.e., convergence). In other words, at some point in each frame the adaptive engine adapts the linear portion $W_{m\_linear}(u_{se}, \Theta)$ of the time-varying linear system, $W_m$, to be a very good approximation of $W_m$, and the unknown nonlinear portion $W_{m\_non-linear}(k)$ is small enough to ignore. Said another way, the net effect of this structural change from frame-to-frame and the adaptation of the linear portion within each frame, allows the overall model ($W_m\{u_{se}, \Theta\}$) to quickly converge on nonlinear system behavior since the structure of each frame can be pre-computed (e.g., on a CPU) or empirically derived, and thus only the adaption of the linear portion $W_{m\_linear}(u_{se}, \Theta)$ is performed with real-time processing resources (e.g., FPGA).

Figure 9:
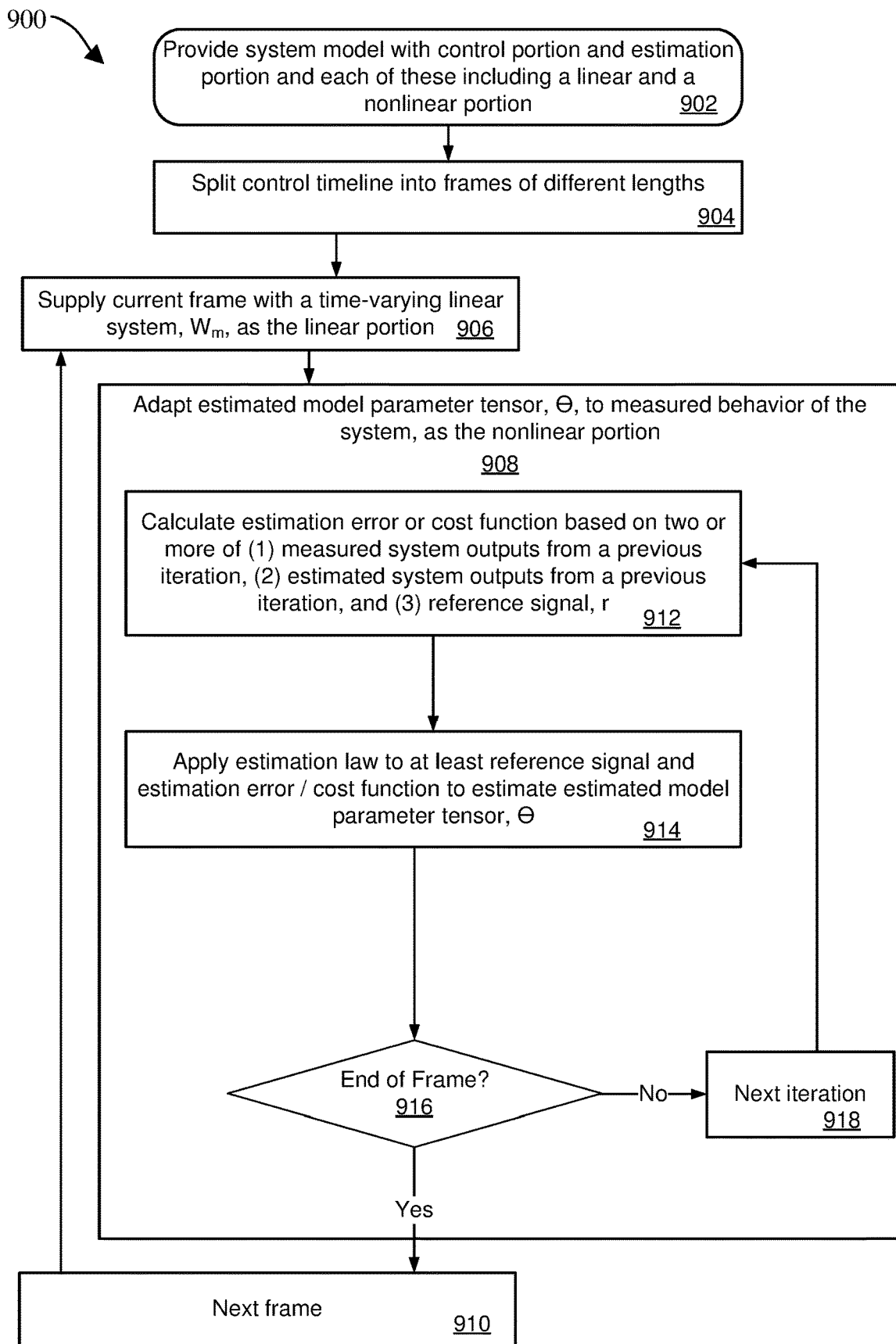
FIG. 9 illustrates a method of operating the herein disclosed adaptive engine having a bifurcated nonlinear model.

FIG. 9 illustrates a method of operating the herein disclosed adaptive engine having a bifurcated nonlinear model. The method 900 can include providing a system model (or "nonlinear model") with a control portion, for generating possible control signals, $u_{se}$, and an estimation portion for estimating estimated system outputs, $y_{est\_se}$ (Block 902). The time-varying linear system, $W_m$, can be bifurcated or split into a sum of a linear and a nonlinear portion and the control timeline can be split into frames of differing lengths (or number of control samples or adaptation iterations) (Block 904) with some processing of the nonlinear model occurring on a CPU or other slower resource and real-time aspects of the nonlinear model occurring on an FPGA or other faster resource. A current frame can be supplied with a structure of the time-varying linear system, $W_m$ (Block 906). As noted relative to FIG. 43, the nonlinear portion of the time-varying linear system, $W_m$, is effectively an unknown error and thus not used or considered in the processing (other than in attempt to minimize this error). For this reason, the terms time-varying linear system, $W_m$, and the linear portion thereof, $W_{m\_linear}(u_{se}, \Theta)$, will be used interchangeably, with this simplification becoming more accurate as convergence occurs in each frame. The structure of the time-varying linear system, $W_m$, can be pre-processed, for instance on a CPU, though it can also be accessed from an empirically-derived lookup table. The structure of the time-varying linear system, $W_m$, remains constant through the current frame. Yet, since the time-varying linear system, $W_m$, is also dependent on the estimated model parameter tensor, Θ, the estimation portion of the nonlinear model adapts within a frame as Θ changes (as the adaptive engine modifies Θ to minimize an error relative to measured system behavior) (Block 908). This can involve calculating an estimation error, ê, or cost function, J, based on two or more of (1) measured system outputs, $y_{meas}$, from a previous iteration, (2) estimated system outputs, $y_{est\_se}$, from a previous iteration, and (3) reference signal, r (Block 912). Adaption can then involve applying an estimation law to at least the reference signal, r, and the estimation error, ê, or cost function, J, to estimate an estimated model parameter tensor, Θ (Block 914). This adaption (Blocks 912, 914, and 918 and Decision 916) continues through the entirety of the frame, and in turn, $W_m$, is adapted throughout the frame (or until convergence is achieved). Once a frame is complete (Decision 916=Yes), the method 900 selects a next frame (Block 910), and a new structure of the time-varying linear system, $W_m$, is provided into the model (Block 906), and adaptation of the estimated model parameter tensor, Θ, (Block 908) is carried out through this next frame until convergence. As noted earlier, the structure of the time-varying linear system, $W_m$, can include the structure of the A, B, and C matrices that are part of the system of equations making up $W_m$. This simplified overview of the bifurcated nonlinear model operation will be further detailed with reference to the various figures that follow.

FIG. 5 shows an embodiment of an adaptive engine such as the one shown in FIG. 4. The adaptive engine 500 is configured to provide an adapted control signal, $u_{out}$, to one or more actuators (e.g., actuator(s) 408 in FIG. 4), where the adapted control signal, $u_{out}$, is configured to converge on a target parameter more quickly, such as a reference signal waveform, than is possible via known controllers. Although the adapted control signal, $u_{out}$, (hereinafter "control signal" or "control") may have multiple components in a MIMO system (i.e., may be a tensor or may be tensorized), for simplicity it will be referenced in the singular throughout this disclosure, and those of skill in the art will be able to apply the adapted control signal, $u_{out}$, to situations where one or more control signals are implemented (i.e., to a tensorial adapted control signs, $u_{out}$). Further, where the system being controlled presents nonlinearities and instabilities, such as found in a plasma control system, the adaptive engine 500 is able to adjust the amount and means of adaptation to avoid instability, even for instance, at the cost of slower convergence. This will be referred to as "adaptation gain".

At the same time, different ones, numbers, and combinations of control laws can be applied to optimize the control signal, $u_{out}$, for different signals and situations. Similarly, different estimation laws can be used to estimate parameters of a nonlinear model of the actuators and/or system controlled by the actuators. The nonlinear model can be a function of an input regressor, including values such as a reference signal, and can also be a function of the estimated model parameters. Both the input regressor and the estimated model parameters are updated for each iteration, such that the nonlinear model is "adapted" for each iteration. Further, in some embodiments, processing of the nonlinear model can be improved by creating frames of control samples or iterations, providing a different structure for the nonlinear model for each frame, and adapting the estimated model parameters for each iteration within a given frame. In this way, a linear approximation of the nonlinear model can be used for each frame, thereby easing the resource usage of adapting the nonlinear model at each iteration. More specifically, the estimated model parameters can be used in the control laws, each control law applying the nonlinear model in a different way, to determine possible control signals, $u_{se}$, and predict estimated system outputs, $y_{est\_se}$. In particular, the nonlinear model can include a control portion, or calculation for a possible control signal, $u_{se}$, and a prediction portion, or prediction of the system output, $y_{est\_se}$. The nonlinear model can take the estimated model parameter tensor, $\Theta$, as one of its inputs. The first output, the possible control signal, $u_{se}$, can be passed from the control portion of the nonlinear model to the prediction portion of the nonlinear model to be used in the prediction of $y_{est\_se}$ (the second output of the nonlinear model). The possible control signal, $u_{se}$, and the estimated system output, $y_{est\_se}$, are then passed to the selector module and used to identify the different ones, numbers, and combinations of control laws (i.e., the possible control signals generated therefrom) to apply to generate the control signal, $u_{out}$.

In this disclosure, a nonlinear model, and two derivations thereof, seven estimation laws, and eight control laws will be used as examples, but these are in no way limiting of the vast numbers of models, estimation laws, and control laws that can be implemented. More important, is how the models, estimation laws, and control laws work together to generate a control signal, $u_{out}$, from inputs such as reference signal, system output measurements, and previous control signals, to name a few non-limiting examples.

As just one non-limiting example of how models, estimation laws, and control laws interoperate, at startup, when a system's output is far from a desired reference signal, the adaptive engine 500 may $u_{se}$ more aggressive means of adapting the control signal such that speed of convergence is prioritized over stability (i.e., some combinations of estimation laws and control laws may be given greater weight). As the measured signal approaches the reference signal, the adaptive engine 500 may decrease the priority given to rapid convergence, and instead turn more to control that favors stability (i.e., different estimation laws and control laws may be given greater weight). Eventually, those aspects of the adaptive engine 500 that focus on rapid convergence may be almost entirely (or entirely) turned off, such that that influence on the control, $u_{out}$, is almost entirely (or entirely) stability oriented. This is an example of just two priorities that can be balanced with time in the adaptive engine 500, and as one will see, there are numerous other priorities that can be selected or blended to generate the control signal based on the estimation laws and control laws that are given priority. As a more specific example, when a plasma processing recipe is running, it may start in an operation region that is relatively easy to model and track, and thus the adaptive engine 500 can primarily rely on estimation laws and control laws geared toward this operating region. However, after a period of time, the recipe may change the chamber gas, chamber pressure, power of the chuck, then the adaptive engine 500 may shift toward different estimation laws and control laws geared toward the new operating region. These adaptations are in addition to the adaptation seen in the estimated model parameter tensor, $\Theta$, alone, which will start to see smaller changes from iteration-to-iteration as the nonlinear model approaches the actual behavior of the system. Thus, one sees that there are multiple ways that the adaptation engine 500 can adapt to nonlinear and dynamic system behavior.

In its most basic form, the adaptive engine 500 is a system that receives or accesses from memory, a reference signal, r (or stream of reference signal signals), a measurement, $y_{meas}$ (or stream of measurements) of an output of the system being controlled (e.g., the nonlinear plasma load 104 in FIG. 4), a control signal, $u_{out}$, from a previous iteration, and produces a control signal (or "control"), $u_{out}$, that is most likely to achieve a desired system response correlating to the reference signal, r, rapidly and/or in a robust manner (i.e., without instability). For instance, the adaptive engine 500 could be used to control a plasma processing system 100, where the reference signal is a desired power being delivered to the plasma, such as 1000 W, and the measurements are measures of power being delivered. The control, $u_{out}$, may control power of a power supply, or in a MIMO situation, may include the power and frequency of the power supply as well as variable capacitor positions within a match network configured to match impedance of the power supply to a nonlinear plasma load. Again, each of the reference signal, r, measurement, $y_{meas}$, and control signal, $u_{out}$, can be a vector or tensor in embodiments with more than one input and output, though for simplicity they will be discussed in the singular throughout this disclosure.

Figure 5A:
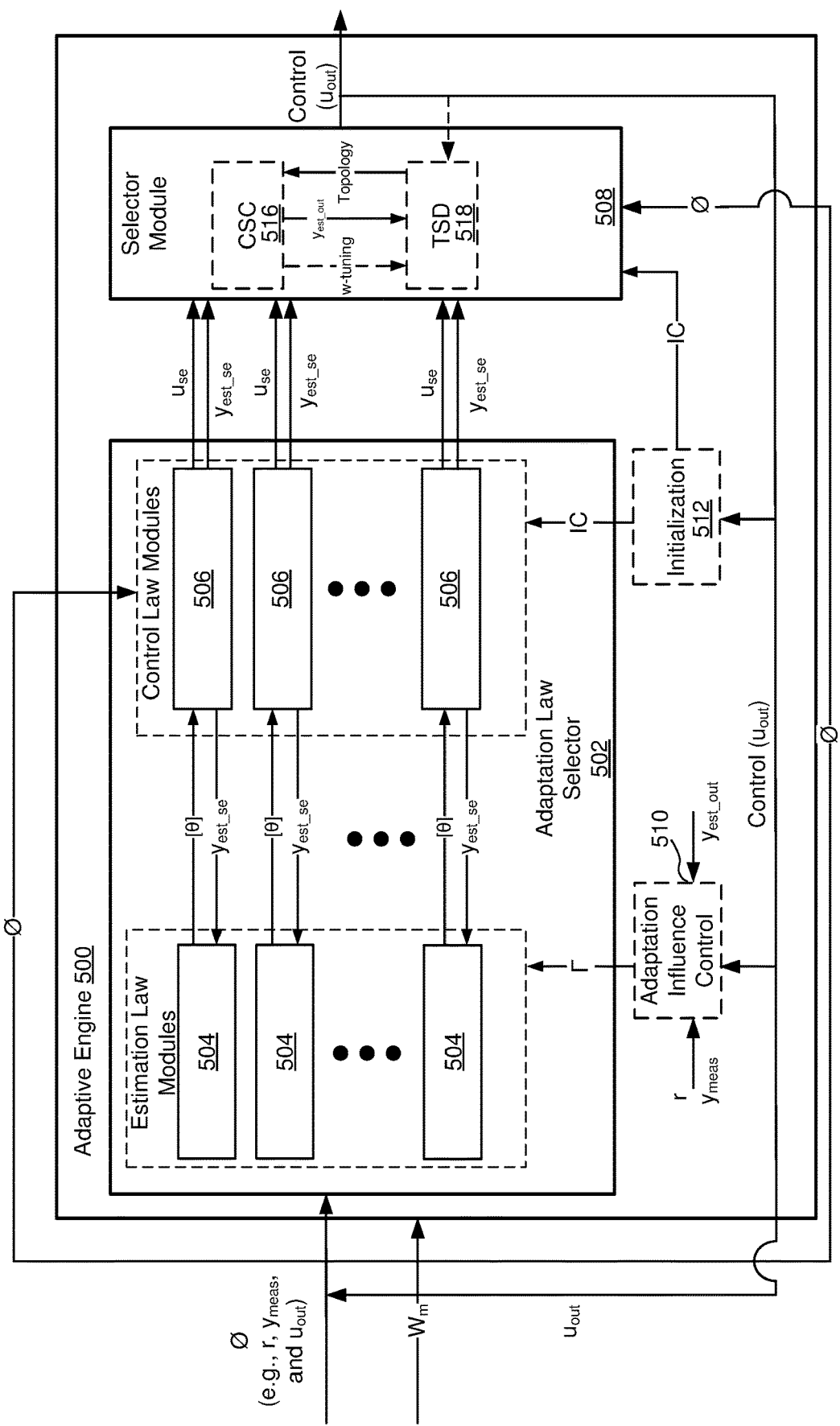
FIG. 5A shows an embodiment of an adaptive engine such as the one shown in FIG. 4.
Figure 5B:
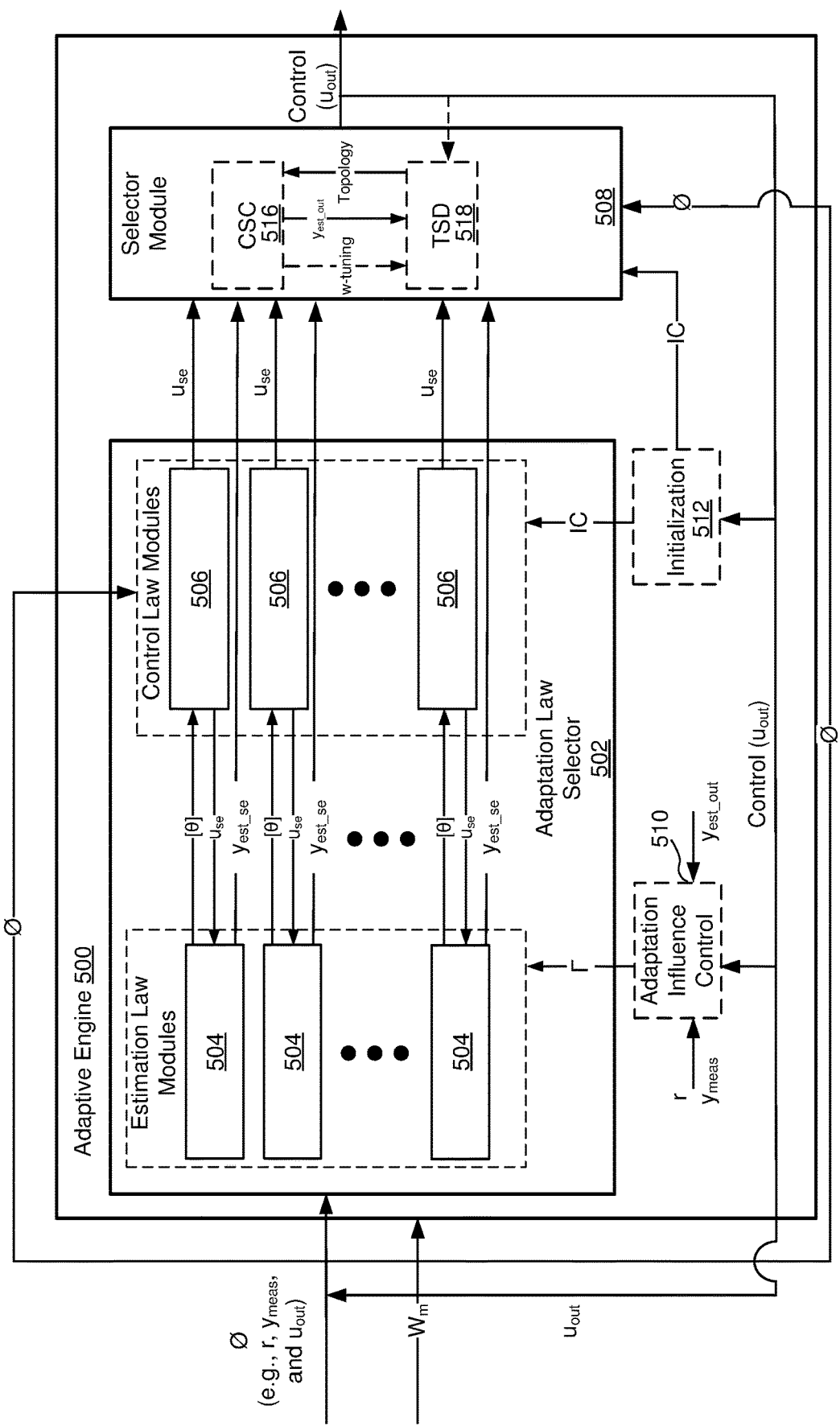
FIG. 5B shows an embodiment of an adaptive engine where an estimation portion of the nonlinear model is processed in the estimation law modules.
Figure 5C:
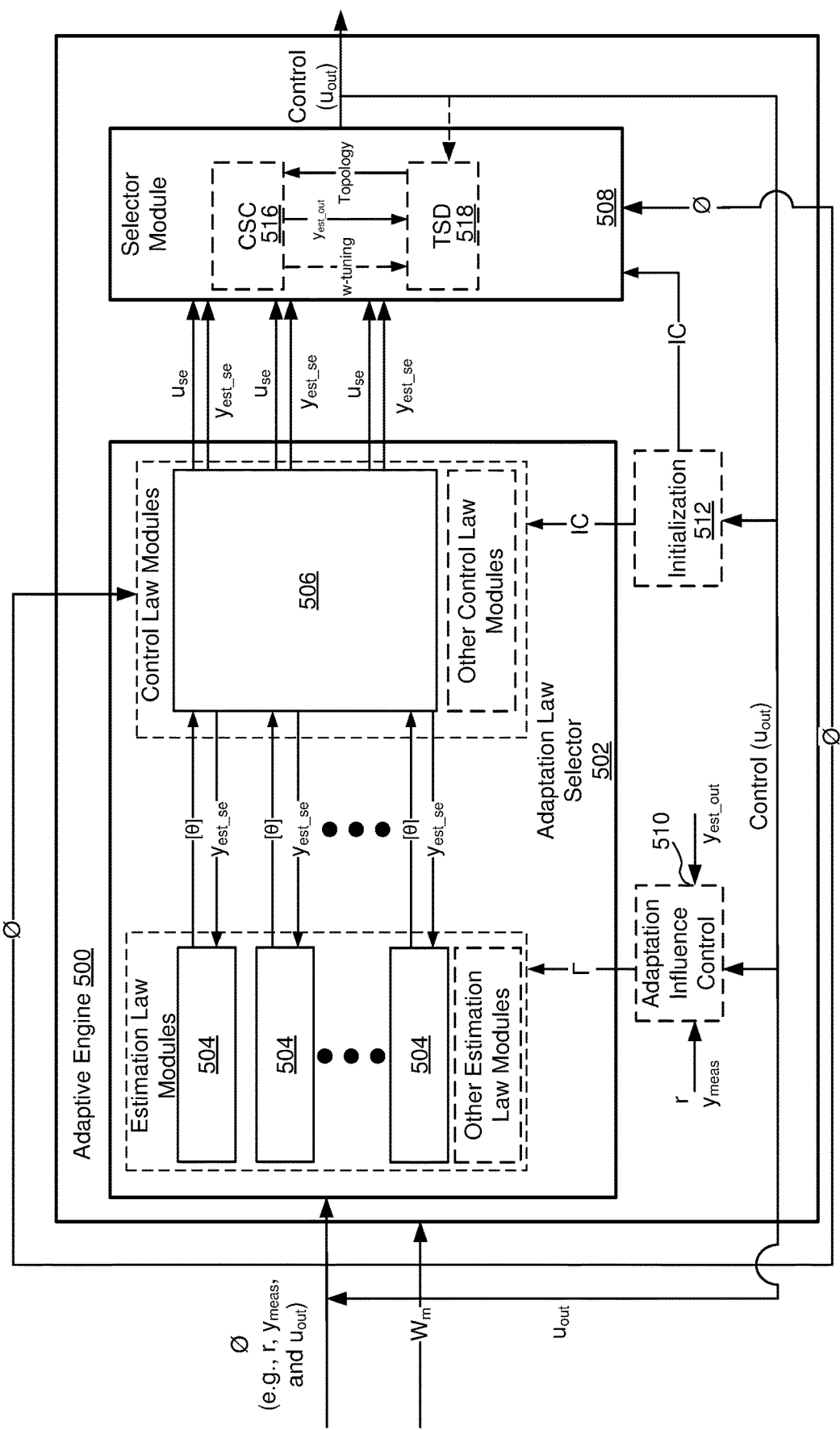
FIG. 5C shows an embodiment of an adaptive engine where multiple estimation law modules provide outputs to a single control law module.

The present disclosure, illustrated at a high level in FIGS. 5A-C, provides an adaptive engine 500 (or adaptation engine) including an adaptation law selector 502 and a selector module 508. The adaptation law selector 502 effectively selects a set of adaptation laws, each comprising a different combination of an estimation law and a control law.

Estimation Law Modules

The estimation laws are embodied in and implemented by estimation law modules 504 and the control laws are embodied in and implemented by control law modules 506 (or sub-engines). The estimation law modules 504 take an input regressor Ø and apply an estimation law to the input regressor Ø to produce an estimated model parameter tensor, $\Theta$, for a nonlinear model of the actuators and/or system (e.g., a plasma processing system). The estimated model parameter tensor, $\Theta$, is determined for most estimation laws using at least a portion of the input regressor, Ø, and an estimation error, ê, or cost function, J, either of which can be written in various forms, but typically comprise some combination of two or more of the measured system output, $y_{meas}$, an estimated system output for a given control law module, $y_{est\_se}$, and a reference signal, r. Typically, the measured system output, $y_{meas}$, and the estimated system output, $y_{est\_se}$, are for a previous iteration and thus in some cases can be written as $y_{meas}(k-1)$ and $y_{est\_se}(k-1)$. Said another way, each estimation law module estimates an estimated model parameter tensor, Θ, that minimizes an estimation error, ê, or cost function, J. This estimation is then used by the nonlinear model in a corresponding control law module to generate a possible control signal, $u_{se}$, and to estimate an estimated system output, $y_{est\_se}$, both of which are then used by the selector module to select a best one or combination of possible control signals as the control, $u_{out}$.

The estimated model parameter tensor, Θ, is described generally, but will include values that are consistent between the estimation law modules 504 and the control law modules 506. In other words, the values of Ø at the control law modules 506 will match those values in Θ. For instance, a first control law may use r and $y_{meas}$, so the incident Ø is [r, $y_{meas}$] and the incoming Θ is [$Θ_r$, $Θ_{y\_meas}$]. Another control law may use r, $y_{meas}$, and $y_d$ (a filtered version of $y_{meas}$), and thus Ø is [r, $y_{meas}$, $y_d$] and the incoming Θ is [$Θ_r$, $Θ_{y\_meas}$, $Θ_{y\_d}$]. Further, because Θ is a tensor, it can take the form of a 2-dimensional matrix such as the following:

$$\Theta = \begin{bmatrix} \theta_{11} & \cdots & \theta_{1n} \\ \vdots & \ddots & \vdots \\ \theta_{m1} & \cdots & \theta_{mn} \end{bmatrix}$$

Or multi-dimensional matrices (not shown).

The controlled system can be the ones shown in FIGS. 1 and 4 or any other system where the adaptive engine 500 provides a control signal, $u_{out}$, (e.g., 454 in FIG. 4 or output of the control section 112 in FIG. 1) to one or more actuators. The input regressor Ø can include, for instance, a reference signal, r, a measurement of system output, $y_{meas}$, an estimated system output for a control law module, $y_{est\_se}$, and a control signal $u_{out}$ from a previous iteration (e.g., $u_{out}(k-1)$). However, other input regressors Ø can also be implemented, for instance excluding the estimated system output $y_{est\_se}$, and the input regressor Ø is typically a tensor. In more detailed discussions of the control law modules 506 that will be seen later, the input regressor Ø may be filtered at times, and the filtered version of Ø can be referred to as ω—though both are an input regressor. Filtering may be advantageous when a control law module (control law) is sensitive to small perturbations, such that a filtered or smoothed input regressor leads to more robust operation.

Control Law Modules

This disclosure now provides great detail surrounding the control law modules 506. Having calculated estimated model parameter tensors, Θ, by applying estimation laws to the input regressor, Ø, the estimation law modules 504 for a given control law module 506, pass the estimated model parameter tensors, Θ, to the corresponding control law module 506, which then applies the estimated model parameter tensors, Θ, to a control law to generate a possible control signal, $u_{se}$, or sub-engine control signal, for each estimation law (i.e., for each estimation law module 504). There are typically one or more estimation law modules 504 (or estimation laws) for every control law module 506 (or control law). For instance, if seven estimation law modules 504 are implemented for each of six control law modules 506, then at least forty-two possible control signals, $u_{se}$, are generated and passed to the selector module 508. However, in some control law modules 506, more than one control law can be implemented (e.g., see the TARC and Adaptive PID control law modules described later). Yet, even where multiple control laws are implemented in a single control law module 506, a possible control signal, $u_{se}$, can be generated for each estimation law (i.e., for each estimation law module 504).

The possible control signals, $u_{se}$, from the one or more control law modules 506 are passed to a selector module 508 that provides a total system control, or control, $\underline{u}_{out}$, as a best of the possible control signals, $u_{se}$, or a best combination or blending of two or more of the possible control signals, $u_{se}$ (e.g., a weighted average, multiplication, or summation). This selection can be based on an estimated system error, $\hat{e}_{out}$, or estimated system cost function, $J_{out}$. The control, $u_{out}$, is also the output of the adaptive engine 500. As noted earlier, the control, $u_{out}$, is typically a tensor for MIMO systems, although a single signal is possible, and in certain embodiments, can be implemented as the control signal(s) 454 seen in FIG. 4.

The estimation error, ê, which is used by the estimation law modules 504 to calculate the estimated model parameter tensor, Θ, can be calculated from two or more of: (1) measured system output, $y_{meas}$, (2) estimated system output, $y_{est\_se}$, and (3) a reference signal, r. More specifically, the estimation error, ê, and hence Θ, can be based on a difference between two or more of these values. Each combination of an estimation law module 504 and a control law module 506 is associated with an estimated system output, $y_{est\_se}$, and the estimated system output, $y_{est\_se}$, is calculated from the nonlinear model with the corresponding possible control signal, $u_{se}$, and estimated model parameter tensor, Θ, as inputs. Thus, each combination of estimation law module 504 and control law module 506 can produce distinct estimation errors, ê, and hence a distinct estimated model parameter tensor, Θ. In some determinations of the estimation error, ê, the estimated system output, $y_{est\_se}$, calculated for each adaption law, can be passed to the corresponding estimation law module 504 and used to calculate the estimation error, ê. As an example, the estimated system output, $y_{est\_se}$, could be an estimate of a measured power delivery to a nonlinear plasma load such as 104 (e.g., estimate of signals measured by sensors 410). As noted earlier, the estimated system output, $y_{est\_se}$, is not limited to power parameters of a plasma processing system, and in other non-limiting examples, could include estimates of noise and disturbance.

As seen, the adaptive engine 500 takes an input regressor, Ø, and produces a control, $u_{out}$, that is tailored to a given operating region (e.g., fast convergence v. stability; stable v. unstable zero-dynamics) based on selection of a best combination of estimation and control laws—this combination being referred to as an adaptation law. More specifically, the adaptive engine 500 provides a plurality of combinations of estimation law modules 504 and control law modules 506 (i.e., a plurality of adaptation laws) that provide a plurality of possible control signals, $u_{se}$, where each of these possible control signals, $u_{se}$, are tailored for different control scenarios, and the selector module 508 then selects a one, or a combination, of the possible control signals, $u_{se}$, based on an estimated system error, $\hat{e}_{out}$, as the control, $u_{out}$.

Nonlinear Model

Figure 8A:
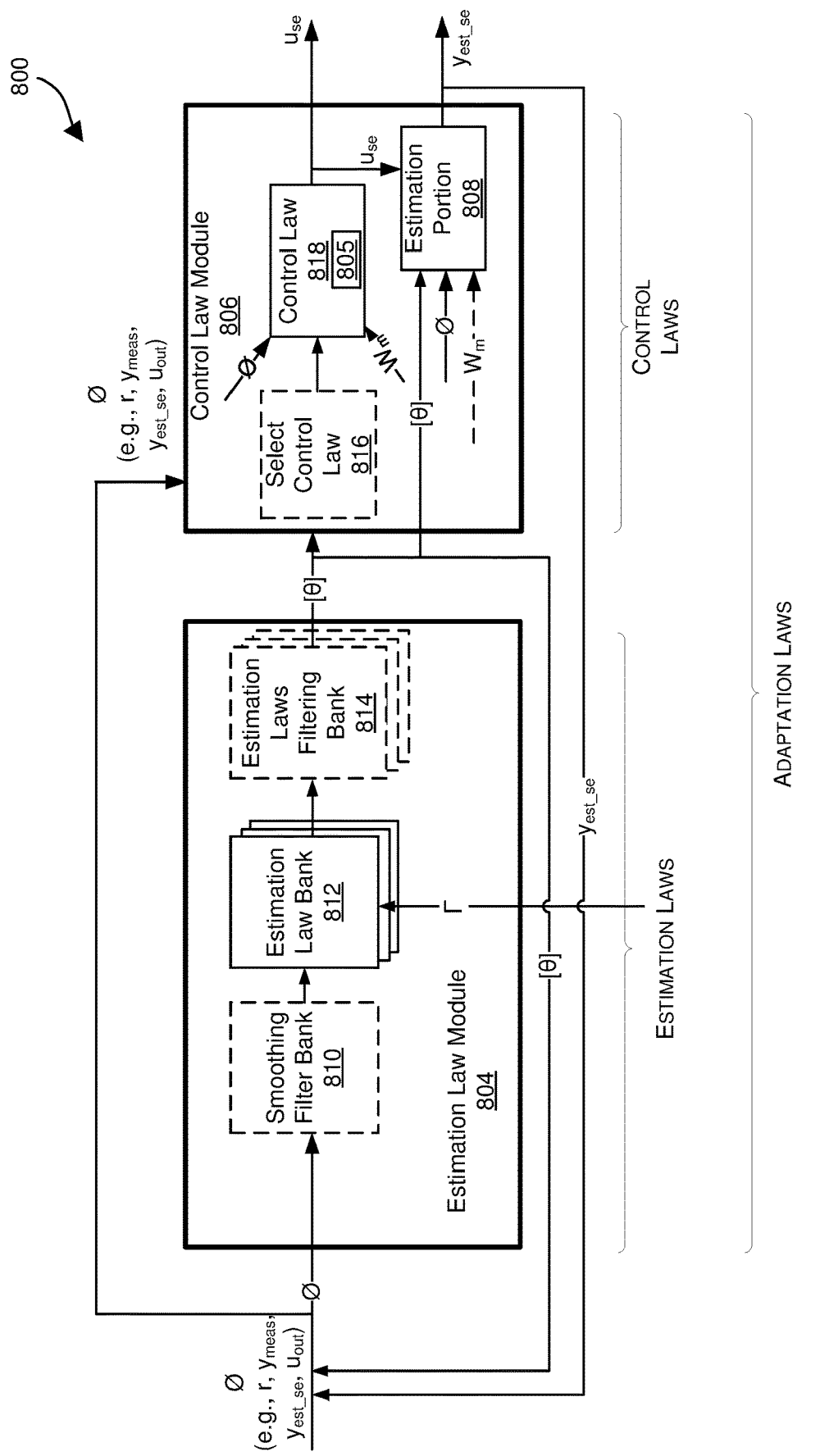
FIG. 8A illustrates further detail of certain embodiments of the estimation law modules and the corresponding estimation laws.
Figure 8B:
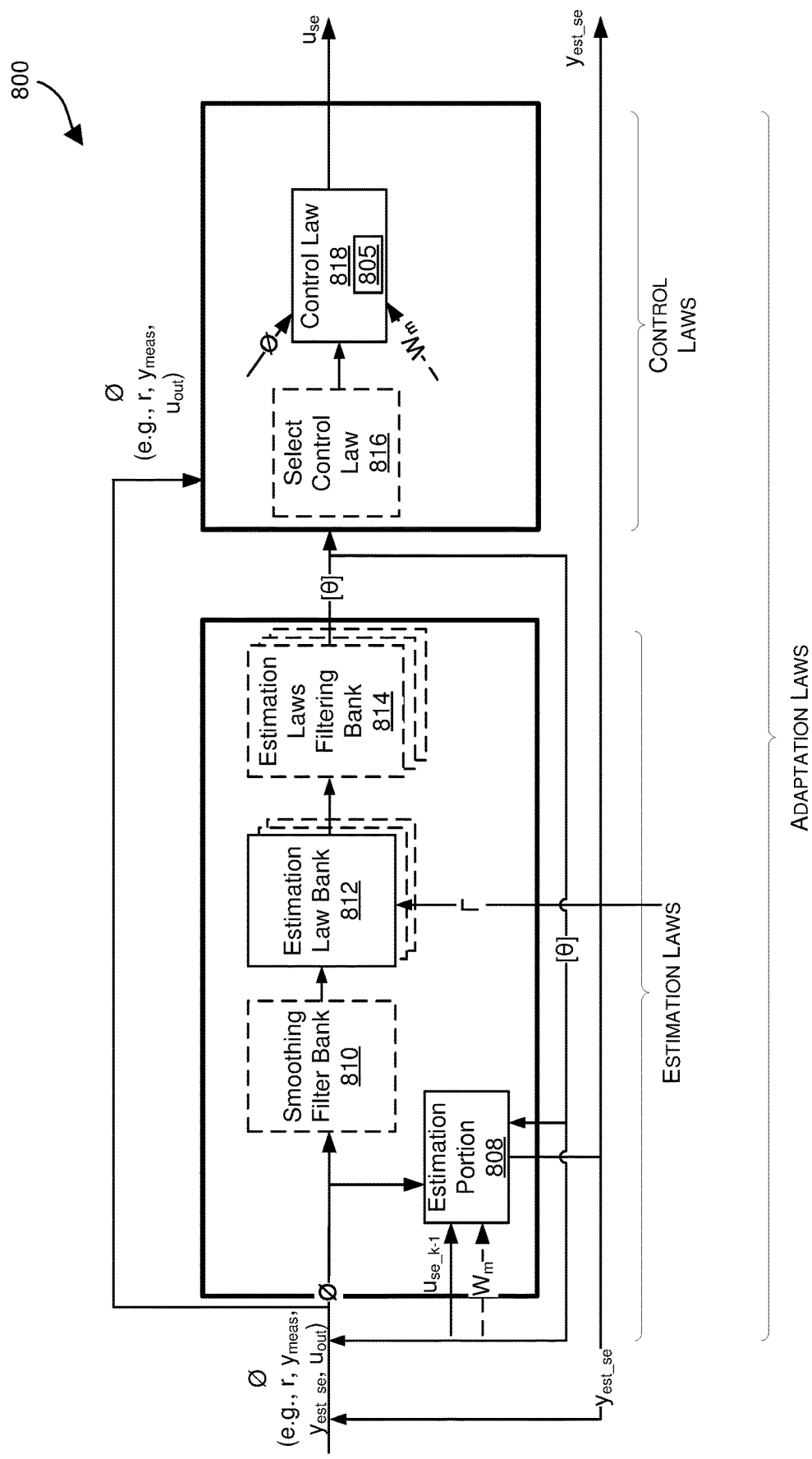
FIG. 8B illustrates further detail of certain embodiments of the estimation law modules and the corresponding estimation laws.

Further details of the nonlinear model are now provided. As described above, the estimation error, ê, is calculated from two or more of (1) measured system output, $y_{meas}$, (2) estimated system output, $y_{est\_se}$, and (3) a reference signal, r, and where the estimated system output, $y_{est\_se}$ is used, the estimation portion of the nonlinear model is used to estimate this value. Although the nonlinear model is not shown in FIG. 5A, it is a sub-component of each of the control law modules 506. The location of the nonlinear model is not limiting however, though the location may influence timing and resource usage as well as the iteration of the estimated system output, $y_{est\_se}$, used. For instance, if the estimation portion of the nonlinear model estimates system output, $y_{est\_se}$, in the control law modules, as shown in FIG. 5A, then the possible control signals, $u_{se}(k)$ (where k represents a value of the iteration), for a current iteration are fed into the estimation portion of the nonlinear model to estimate $y_{est\_se}$. On the other hand, if the estimation portion of the nonlinear model estimated system outputs, $y_{est\_se}$, in the estimation law modules, as shown in FIG. 5B, then the possible control signals, $u_{se(k-1)}$, for a previous iteration is fed back to the estimation portion of the nonlinear model to estimate $y_{est\_se}$. In either case, the estimated system outputs, $y_{est\_se}$, are used in the estimation law modules 504 to determine the estimation error, ê, and also passed to the selector module 508 to aid in determining which possible control signal, $u_{se}$, to select, or which combination of possible control signals, $u_{se}$, to combine and how to combine them (e.g., weighted average, multiplication, summation, etc.). Thus, the only differences between FIGS. 5A and 5B are the locations and directions of the estimated system output, $y_{est\_se}$, arrows and the possible control signal, $u_{se}$, arrows. For instance, the possible control signals, $u_{se}$, are passed from the control law modules 506 to the estimation law modules 504 in FIG. 5B so that they can be used in in the estimation portion of the nonlinear models to calculate the estimated system outputs, $y_{est\_se}$. In FIG. 5A, the possible control signals, $u_{se}$, are internally provided to the estimation portion of the nonlinear model in the control law modules 506. FIGS. 8A and 8B will provide further details to help illustrate operation of the nonlinear models with 8A showing $u_{se}$ of the current iteration's $u_{se}(k)$ and the nonlinear model in the control law module, and 8B showing the previous iterations' $u_{se}(k-1)$ and the nonlinear in the estimation law module. Although the estimation portion of the nonlinear model can execute in either the control law modules, the estimation law modules, or elsewhere, the control portion of the nonlinear model is part of the control law modules. For instance, in some embodiments, the operation of the estimation portion of the nonlinear model can occur somewhere within the adaptation law selector 502, but outside either of the estimation law modules 504 and the control law modules 506.

In FIGS. 5A and 5B there is one estimation law module 504 for each control law module 506. However, as shown in FIG. 5C, multiple estimation law modules 504 can provide outputs (e.g., Θ) to a given control law module 506. Although only a first control law module 506 and its corresponding one or more estimation law modules 504 are explicitly shown in FIG. 5C. Additional sets of one or more estimation law modules 504 and corresponding control law modules 506 can also be implemented as shown via the "other estimation law modules" and "other control law modules" boxes. Each estimation law module 504 takes in input regressor, Ø, or a subset thereof, including values such as the reference signal, r, and the measured system output, $y_{meas}$, and an estimated error, ê, and processes these through an estimation law to produce an estimated model parameter tensor, Θ, for each estimation law module 504. Each of the estimated model parameter tensors, Θ, is passed to one of a plurality of control law modules 506, where two or more estimation law modules 504 can feed a single control law module 506. Each estimation law module 504 applies an estimation law, and each control law module 506 applies a control law, such that every combination of an estimation law module 504 and a control law module 506 effectively implements an "adaptation law" and generates a distinct possible control signal, $u_{se}$. Although multiple estimation law modules 504 can feed a single control law module 506 as seen in FIG. 5C, for simplicity, the remainder of this disclosure will extend the description of FIGS. 5A and 5B, where one estimation law module 504 feeds one control law module 506. In light of FIG. 5C and its description, those of skill in the art will also be able to implement the remainder of this disclosure as extensions of FIG. 5C.

Referring to any of FIGS. 5A-C, a control law module 506 receives an estimated model parameter tensor, Θ, from each of one or more estimation law modules 504, along with the input regressor, Ø, or a subset thereof. It then applies these inputs to a control law to calculate a possible control signal, $u_{se}$, for each of the estimated model parameter tensors, Θ (i.e., for each of its corresponding estimation law modules 504). The control law takes the form of a control portion of the nonlinear model where each control law uses a different variation of the same basic control law portion of the nonlinear model. For instance, the Control Laws 1-4 described later in this disclosure are all variations of the Model 1. However, these Control Laws can be modified/transformed to operate with other models, such as, but not limited to, Model 2. The possible control signals, $u_{se}$, are then passed to the selector module 508.

The input regressor, Ø, and subsets thereof are described generally relative to FIGS. 5A-5C since the estimation law module 504 or the control law module 506, where the input regressor, Ø, or a subset thereof, is provided, may dictate the values in the input regressor, Ø, or a subset thereof. For instance, the estimation law modules 504 often $u_{se}$ two or more of the following, r, $y_{est\_se}$, and $y_{meas\_out}$, to determine the estimation error, ê, which is then used, along with other values depending on the estimation law implemented in a given estimation law module 504, to determine estimation model parameter tensors, Θ. In other words, Ø can be [r, $y_{est\_se}$, $y_{meas}$] when provided to the estimation law modules 504 in some embodiments, but [$u_{out\_k-1}$, r, $y_{meas}$ out] when provided to the control law modules 506. Thus, functionality is roughly the same whether Ø or a subset thereof is provided to the estimation law modules 504 and the control law modules 506. To better cover the various estimation law modules 504 and control law modules 506, this disclosure will continue to generalize the inputs to both modules as Ø, and those of skill in the art can easily optimize resources and pipelining by providing more specific subsets thereof to the two distinct sets of modules.

A more detailed understanding of the estimation portion of the nonlinear model will be had through understanding that the control samples can be broken up into groups of frames, where each frame uses a different time-varying linear system, dependent on Θ, to approximate nonlinear behavior over the frame. When these different linearized frames are considered as a whole, the net effect is an approximation of nonlinear behavior, but where the adaptive engine 500 can process simpler, linearized versions of a nonlinear model. The time-varying linear system can be denoted by $W_m$, and represents the solution to the system of equations for ẋ and $y_{est\_se}$ shown earlier. The structure of the time-varying linear system, $W_m$, or the structure of the A, B, and C matrices used in the system of equations for ẋ and $y_{est\_se}$, can be updated every frame—meaning that the structure is constant within each frame. One illustrative structure of $W_m$ can be written as:

$$W_m = \begin{cases} \dot{x} = Ax + Bu_{se} \\ y_{est\_se} = Cx \end{cases} = \begin{cases} \begin{bmatrix} 1 & 0 & \theta_1 \\ 1 & 0 & 0 \\ 0 & \theta_2 & 1 \end{bmatrix} x + \begin{bmatrix} 1 \\ 1 \\ 1 \end{bmatrix} u_{se} \\ \begin{bmatrix} 1 & 0 & 0 \\ 0 & 1 & 0 \\ 0 & 0 & 1 \end{bmatrix} x \end{cases}$$

See a similar form of this system written as Equations 12 and 13 in the TARC control law module discussion. One can see in this example that the C matrix is the identity matrix, that three controls are implemented (since the B matrix is of size 3), and that the A matrix includes two components of the estimated model parameter tensor, $\Theta$. Changing the structure of $W_m$ means that the locations of 1, 0, $\Theta$, and fixed coefficients (none are seen in the example above) in matrices A and B and optionally C (where the identity matrix is not used) are altered. For instance, if the above example structure was used in a first frame, changing the structure in a second frame could mean that the $W_m$ structure is as follows:

$$W_m = \begin{cases} \begin{bmatrix} 1 & 0 & \theta_1 \\ 0 & 1 & 1 \\ 0 & \theta_2 & 0 \end{bmatrix} x + \begin{bmatrix} 1 \\ 1 \\ 1 \end{bmatrix} u_{se} \\ \begin{bmatrix} 1 & 0 & 0 \\ 0 & 1 & 0 \\ 0 & 0 & 1 \end{bmatrix} x \end{cases}$$

As yet another example of changing the structure of $W_m$, the adaptive engine may determine that further adaptation of $\Theta_2$ does not lead to significant improvement, and thus $\Theta_2$ can be replaced with a fixed coefficient (e.g., 0.88 in the below example)—meaning that it will no longer be adapted.

$$W_m = \begin{cases} \begin{bmatrix} 1 & 0 & \theta_1 \\ 0 & 1 & 1 \\ 0 & .88 & 0 \end{bmatrix} x + \begin{bmatrix} 1 \\ 1 \\ 1 \end{bmatrix} u_{se} \\ \begin{bmatrix} 1 & 0 & 0 \\ 0 & 1 & 0 \\ 0 & 0 & 1 \end{bmatrix} x \end{cases}$$

One will appreciate that since $\Theta_1$ and $\Theta_2$ are adapted or adjusted at each control sample or iteration, the overall effect of $W_m$ sees small adjustments in time. One also can see that when the structure changes, a large change in $W_m$ is seen. Since the nonlinear model depends on the time-varying linear system, $W_m$, structural changes to $W_m$ at each frame allow large changes in nonlinear behavior to be approximated by the nonlinear model while sample-by-sample changes to the estimated model parameter tensor, $\Theta$, allow smaller nonlinearities to be approximated by the nonlinear model.

The time-varying linear system, $W_m$, can be calculated in a frame resynthesizer (see FIG. 6) or looked up in a table pre-populated by the controller designer. The time-varying linear system can then be passed to the nonlinear model at the control law modules 506 (FIGS. 5A and 5C) or the estimation law modules (FIG. 5B) at the start of each frame and then held constant through a given frame. In some embodiments, different time-varying linear systems, $W_m$, can be used for different control law modules 506, where the differences involve expansions of a fundamental or most general form of the time-varying linear system, $W_m$. For instance, see the differences between Model 1 and Model 2 later in this disclosure. So, not only will the time-varying linear system, $W_m$, change from frame to frame, but different combinations of estimation law modules and control law modules can use different forms of the time-varying linear system, $W_m$, allowing different combinations of estimation and control law modules to achieve differing goals in the linear approximations of the system's nonlinear behavior. This gives the adaptive engine 500 the ability to develop control signals, $u_{out}$, for a wider variety of operating regions and conditions.

In the figures, providing the time-varying linear system as well as changes to the structure thereof may both be symbolized by the same $W_m$.

Although this disclosure often uses Model 1, where the time-varying linear system, $W_m$, is part of the estimation portion, Model 2 can also be used, and will merely see the time-varying linear system, $W_m$, used in the control portion instead. Details of both models are discussed later in the disclosure.

Selector Module

The selector module 508 receives one or more possible control signals, $u_{se}$, from the control law modules 506 and selects one or a combination of these possible control signals, $u_{se}$, for output as the control, $u_{out}$. The selector module 508 can use the possible control signals, $u_{se}$, the estimated system outputs, $y_{est\_se}$, and at least parts of the input regressor Ø including the reference signal, r, and the system output measurement, $y_{meas}$, in an estimated system error, $\hat{e}_{out}$, or estimated system cost function, $J_{out}$, to select the possible control signal, $u_{se}$, or to select a combination of possible control signals, $u_{se}$, (e.g., a weighted average thereof) that minimizes the error or cost function. For instance, Equation 4 discussed later will present a detailed example of an estimated system cost function, $J_{out}$, that can be used to select the best possible control signal, $u_{se}$, or best combination of possible control signals, $u_{se}$. Where processing resources are more limited, the selector module 508 may select a best possible control signal, $u_{se}$, rather than a combination of multiple possible control signals, $u_{se}$. Where additional processing resources are available, the selector module 508 may select a best combination of possible control signals, $u_{se}$, which may include selecting not only different combinations but different ways to combine the possible control signals, $u_{se}$.

Where a single possible control signal, $u_{se}$, is selected, this signal is selected as the control, $u_{out}$. However, where two or more possible control signals, $u_{se}$, are selected, the control, $u_{out}$, is formed by a blending of the possible control signals, $u_{se}$. For instance, multiple possible control signals, $u_{se}$, can be combined or blended via a "topology" such as, but not limited to, a weighted average, other averages, multiplication, summations, differences, divisions, integrals, derivatives, exponentials, complex functions, logarithms, series, statistical distributions, matrices, tensors, neural networks, nonlinear functions, graphs, maps, transformations, trees, to name a few non-limiting examples, or combinations thereof. For instance, Equation 5 presents a detailed example of a means to combine possible control signals, $u_{se}$, via a complex weighted average. However formed, the control, $u_{out}$, is then passed to the one or more actuators (e.g., 308) and fed back to the adaptation law selector 502 as an input to the estimation law modules 504 and the control law modules 506 to determine a next iteration of the $u_{out}$. Because the control, $u_{out}$, is used as feedback for the next iteration, when input to the estimation law modules 504 and the control law modules 506, it may sometimes be referred to as $u_{out}(k-1)$.

Once the topology is selected, the selector module 508 can also calculate a total estimated system output, $y_{est\_out}$, in the same way that the control, $u_{out}$, was calculated (e.g., using Equation 7, which is structurally similar to Equation 5). In other words, the total estimated system output, $y_{est\_out}$, can be the estimated system output, $y_{est\_se}$, corresponding to the selected one of the possible control signals, $u_{se}$ (or selected adaptation law). Or where two or more possible control signals, $u_{se}$, are combined, the corresponding estimated system outputs, $y_{est\_se}$, can be combined in the same fashion to produce the total estimated system output, $y_{est\_out}$.

In some embodiments, one or more memory components (not shown), such as pipeline registers, can be arranged between the control law modules 506 and the selector module 508, such that possible control signals, $u_{se}$, and estimated system outputs, $y_{est\_se}$, can be temporarily stored, which either assists in parallelization in the selector module 508 or allows the selector module 508 to pull from previous outputs of the control law modules 506 when the adaptive engine 500 sees repeated input iterations (e.g., the same reference signal waveform repeats).

To carry out the above noted functionality, the selector module 508 may implement an optional control selector and combiner 516 ("CSC") and an optional topology selector and designer 518 ("TSD"). The TSD 518 can look at previous controls (e.g., $u_{out\_k-1}$, $u_{out\_k-2}$, $u_{out\_k-3}$, etc.) and a total estimated system output, $y_{est\_out}$, for various possible topologies, and select a best topology, or the one most likely to, when applied in the selector module 508, lead to a control, $u_{out}$, that causes a measured system output, $y_{meas}$, that is close to the total estimated system output, $y_{est\_out}$, or the reference signal, r. This may involve an error or cost function that compares the measured system output, $y_{meas}$, for a previous iteration, or the reference signal, r, to the total estimated system outputs, $y_{est\_out}$, calculated for various possible topologies. More specifically, the TSD 518 may analyze a cost function, such as Equation 4, to select an optimal possible control signal, $u_{se}$, or combination of possible control signals, $u_{se}$ (in the form of a topology for combining the possible control signals). The TSD 518 may provide this selection to the CSC 516, which then applies this topology to generate the control, $u_{out}$, based on the topology and the possible control signals, $u_{se}$. The topology may be embodied as a set of weights to be provided to the CSC 516, where the weights determine how possible control signals, $u_{se}$, are combined or blended. In some embodiments, the topology can include averaging, multiplication, summations, differences, divisions, integrals, derivatives, exponentials, complex functions, logarithms, series, statistical distributions, matrices, tensors, neural networks, non-linear functions, graphs, maps, transformations, trees, to name a few non-limiting examples, or combinations thereof. In other words, the selector module 508 predicts an output of the system that will result from different control signals generated by different topologies, and then selects the topology corresponding to a predicted output that minimizes an error or cost function.

As part of the selection (or topology selection), the CSC 516 can use the estimated system outputs, $y_{est\_se}$, for each possible control signal, $u_{se}$, (i.e., for each adaptation law) to determine an estimated system error, $\hat{e}_{out}$, based on a measured system output, $y_{meas\_out}$, and use the estimated system error, $\hat{e}_{out}$, to identify the best of the possible control signals, $u_{se}$, for selection as the control, $u_{out}$. Alternatively, or at the same time, a total estimated system output, $y_{est\_out}$, can be found for each of various combinations of possible control signals, $u_{se}$, and the combination providing a total estimated system output, $y_{est\_out}$, with the smallest error from the measured system output, $y_{meas}$, or the combination providing a smallest error between the reference signal, r, and the measured system output, $y_{meas}$, can be selected as the topology that the CSC 516 uses to generate the control, $u_{out}$.

Alternatively, the possible system outputs, $y_{est\_se}$ and/or the total estimated system output $y_{est\_out}$, can be provided to the TSD 518, which can determine a possible control signal, $u_{se}$, or combination of possible control signals, $u_{se}$, that minimizes a cost function relative to the measured system output, $y_{meas}$, or the reference signal, r. If the TSD 518 selects the best possible control signal, $u_{se}$, or combination thereof, the TSD 518 can send this selection back to the CSC 516 as a topology or set of weights. In turn, the CSC 516 can return weight-tuning values (w-tuning) to the TSD 518 that can be used to adjust weights in a next iteration of topology selection. Weight tuning can increase the speed of the adaptive engine 500 and/or be used to smooth transitions between control laws. Weight tuning can also be used to smooth transitions between $u_{se}$.

It should be appreciated that the measured system output, $y_{meas\_out}$, can be n-dimensional and is not limited to a power output from a power supply or match network, or power delivered to a plasma load. Other measured system outputs, $y_{meas\_out}$, can be composites of multiple measured values as well as internal actuator measurements such as power dissipation in a DC section, to name one non-limiting example.

In some embodiments, adaptation or adaptation gain, or the influence of the adaptive engine 500, can be selected based on the measured system output, $y_{meas}$, approaching a target value(s) (e.g., reference signal, r, or total estimated system output, $y_{est\_out}$). In other words, the adaptation or adaptation gain, or the influence of the adaptive engine 500, can be selected based on an actual system error, $e_{out}$. In particular, some, but not all estimation laws can include an adaptation gain, $\Gamma$, that influences the adaptation from a given estimation law. When the measured system output, $y_{meas}$, is far from the target value(s), the adaptation gain, $\Gamma$, can be large (or increased) and thus the estimation laws in the estimation law modules 504 have a strong influence on the control signal, $u_{out}$. As the measured system output, $y_{meas}$, approaches the target value(s), the adaptation gain, F, can be decreased, similar to how one pulls back on a boat's throttle when approaching a dock. Said another way, when the actual system error, $e_{out}$, is greater than a threshold, the adaptation gain, $\Gamma$, can be increased, and when the actual system error, $e_{out}$, is less than the threshold, then the adaptation gain, $\Gamma$, can remain unchanged. In one embodiment, an optional adaptation influence control 510 can look at the actual system error, $e_{out}$, or difference between a reference signal (e.g., r) or reference signal stream and a measured system output (e.g., $y_{meas}$) and generate the adaptation gain, $\Gamma$, based on the actual system error, $e_{out}$. Alternatively, the optional adaptation influence control 510 can look at an error or difference between the reference signal, r, and a total estimated system output, $y_{est\_out}$ (see Equation 4 for instance). In yet other embodiments, the error or difference can be based on the estimated system output, $y_{est}$, and the measured system output, $y_{meas}$. In some embodiments, the adaptation influence control 510 can look at two or more of these errors (e.g., Equation 4 is a cost function that considers two of these errors). The adaptation gain, $\Gamma$, can be passed to the estimation law modules 504 and used in certain ones of the estimation laws to determine the estimated parameter tensors, $\Theta$. The adaptation gain, $\Gamma$, can be positive values $\leq 1$.

Optional initialization 512 can store previous values such as a control, $u_{out}$, total estimated system output, $y_{est\_out}$, and the adaptation gain, Γ, to name three non-limiting examples. These can be accessed as initial conditions for a subsequent frame when the adaptation law selector 502 returns to the same operating conditions. In an embodiment, the initialization 512 can store these initial conditions in a TSP-RAM. The initialization 512 can pass these values to the adaptation law selector 502 and/or the selector module 508, and more specifically to the control law modules 506.

There are at least two feedback loops illustrated in FIGS. 5A-C. First, the control, $u_{out}$, can be fed back to the adaptation law selector 502, for instance, as part of the input regressor, Ø, to aid in generating a next iteration of the estimated model parameter tensors, Θ. Second, the estimation portion of the nonlinear model can pass an estimated system output, $y_{est\_se}$, based on the possible control signals, $u_{se}$, back to the corresponding estimation law modules 504. Like the control, $u_{out}$, that is fed back, the estimated system outputs, $y_{est\_se}$, can be used in the estimation law modules 504 to generate the next iteration of estimated model parameters, Θ. The estimated system output, $y_{est\_se}$, can also be passed forward to the selector module 508. An additional optional feedback loop may provide the control, $u_{out}$, to the optional adaption influence control 510, along with inputs such as r, $y_{meas}$, and $y_{est\_out}$. These inputs can be used to generate an adaptation gain, Γ, that influences the strength of adaptation of certain of the estimation laws in the estimation law modules 504. Yet another optional feedback loop can provide the control, $u_{out}$, to an initialization 512, which, as discussed earlier, uses this to provide initial conditions to the control law modules 506 and the selector module 508.

While most of this disclosure discusses the passing of estimation parameters, Θ, to the control law modules, in some embodiments, each estimation law module can also pass derivatives, Θ', of the estimation parameters, Θ. The derivatives, Θ', can be used to increase an accuracy and speed of convergence to a target system behavior. Thus, where [Θ] is seen in the figures, this tensor can be replaced by [Θ, Θ'] in some implementations.

Synthesized Frames

Figure 6:
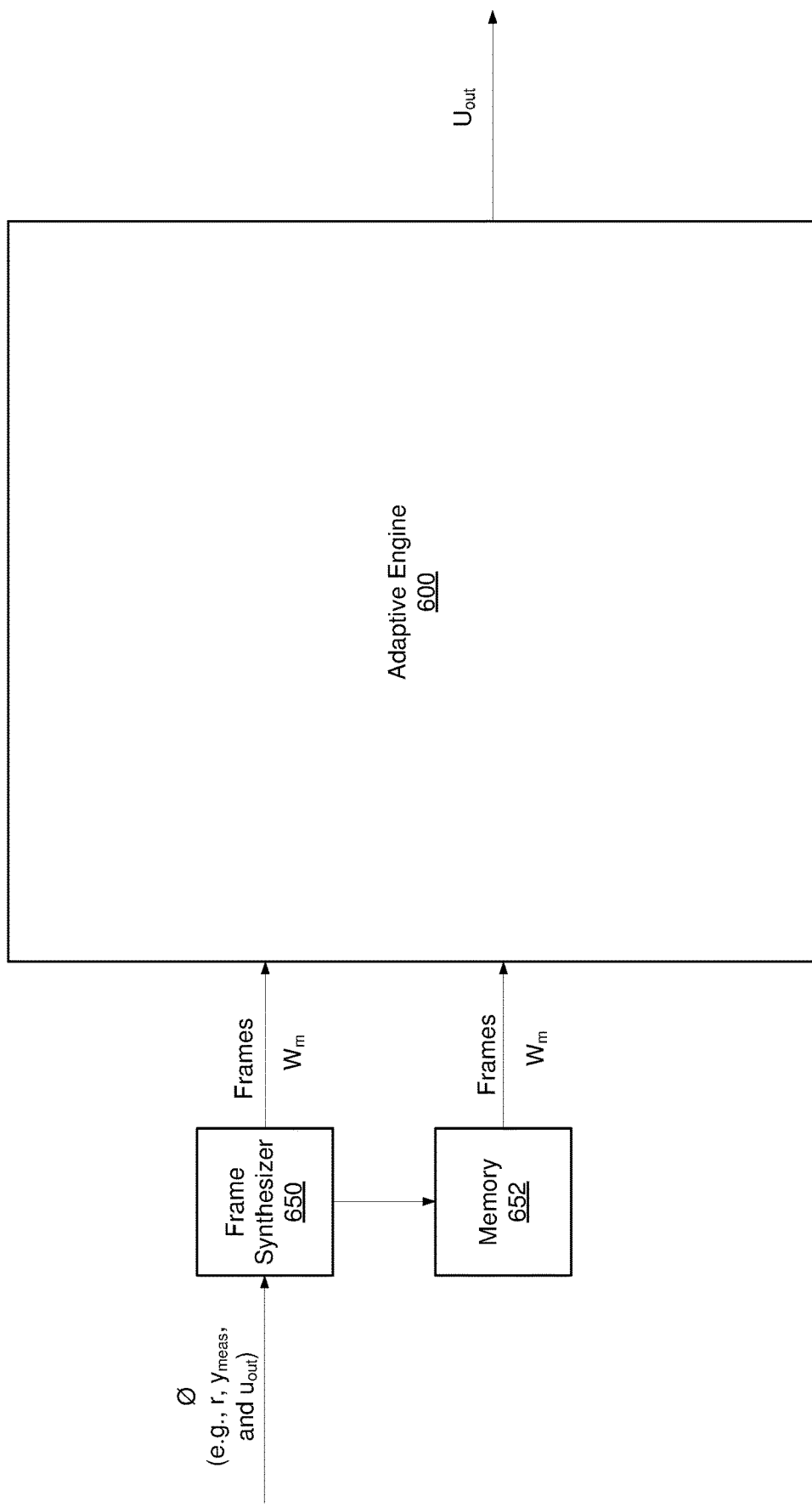
FIG. 6 illustrates an alternative adaptive engine that splits control samples, and certain aspects of the nonlinear model, into frames.

FIG. 6 illustrates an alternative adaptive engine that splits control samples, and certain aspects of the nonlinear model, into frames. The adaptive engine 600 can include details as shown and described, for instance, in any of FIGS. 5A-C. However, a frame resynthesizer 650 can be arranged to precede the adaptive engine 600 and create synthesized frames from the input regressor, such as, but not limited to including, the reference signal, r, and the measured system output, $y_{meas}$. Synthesized frames can include blocks of input data that may or may not be repeated in time. For instance, for a triangle wave reference signal waveform, a synthesized frame might capture the rising and falling edges of the triangle wave and might apply filters, such as smoothing filters to make the synthesized frame easier to work with (e.g., smoother or more linearized). More importantly, each frame can correspond to a number of control samples or samples of the reference signal, r. Further, certain operations of the adaptive engine 600 can be preprocessed or only processed once per frame. For instance, a time-varying linear system, $W_m$, of the nonlinear model can be predetermined or set by a controller designer and stored in a lookup table, such that during operation, the adaptive engine 600 can access a time-varying linear system, $W_m$, for every frame that is processed in the adaptive engine 600. Alternatively, the frame resynthesizer 650 can calculate the time-varying linear system, $W_m$, of the nonlinear model for each frame and the adaptive engine 600 can then use the frame-specific time-varying linear system, $W_m$, for the lifetime of a frame, and then switch to a new time-varying linear system, $W_m$, when a new frame begins.

This time-varying linear system, $W_m$, can also be thought of as the linear approximation of the nonlinear model, and it stays constant throughout a frame, while a nonlinear portion of the model, as represented by the estimated model parameter tensor, Θ, adapts throughout a frame. In other words, the model has a linear and nonlinear portion, and starts each frame with the linear portion known, but adapting the nonlinear portion toward convergence. Thus, adaptation is limited to the small unknown nonlinear portion, and does not need to also adapt to the linear portion. Thus, adaptation is kept smaller than in a non-bifurcated model, and as a result achieves convergence faster and/or with use of loess processing resources.

Application of frames also assists in parallelization within the adaptive engine 600. A memory 652 can be used in combination with the frame resynthesizer 650 such that when a waveform returns to a previously synthesized frame, the adaptive engine 600 can draw from the synthesized frame in memory rather than requiring the frame resynthesizer 650 to resynthesize the inputs. This not only reduces processing resources, but can also decrease latency since less input processing occurs when frames are accessed from the memory 652. FIG. 6 helps to illustrate that any of the input regressors, Ø, in FIGS. 5A-C, or anywhere later in this disclosure, can also be implemented by those of skill in the art as synthesized frames.

Finding the time-varying linear system, $W_m$, not only involves determining a best linear model to approximate a region of the nonlinear model, but also finding a frame (or frame size) that leads to a best linear approximation. More specifically, the frame resynthesizer 650 finds the largest frames that still allow accurate linear approximations of the nonlinear behavior of the system. In other words, the frame resynthesizer 650 approximates the nonlinear system using a set of linear models, but each frame and its linearization, may map to different numbers of control samples. More specifically, the frame resynthesizer 650 carries out an optimization procedure to find the best coefficients that describe the reference signal, r, and system output measurements, $y_{meas}$, for instance, by Equation 1A:

$$\begin{bmatrix} \dot{r} \\ \dot{x} \end{bmatrix} = \begin{bmatrix} 0 & 1 \\ -\omega_{n_r}^2 & -2\xi_r\omega_{n_r} \end{bmatrix} \begin{bmatrix} r \\ x \end{bmatrix} + \begin{bmatrix} 0 & 0 & \ldots & 0 \\ \omega_{n_r}^2 & \omega_{n_r}^2 & \ldots & \omega_{n_r}^2 \end{bmatrix} \{u\} \quad \text{(Equation 1A)}$$

For the largest number of samples $n_{new}$ in a frame.

Where:

r is the reference signal;

x is the internal mathematically constructed state to represent a second order linear system;

$\omega_n$ is a natural frequency in [rad/s] for the reference signal's linear approximation and is different than the filter input regressor ω used elsewhere in this disclosure;

$\xi_r$ is the damping ratio [unitless] of the reference signal's linear approximation;

$\omega_n$ and $\xi_r$ are determined through the reference signal's shape and/or desired user-specified waveform; and {u} This is the input tensor (control inputs) and is different from the $u_{se}$ and $u_{out}$ discussed elsewhere in the disclosure. In most cases, {u} is a filtered version of the reference signal, r.

The frame resynthesizer 650 can carry out an optimization procedure to find the best coefficients that describe the reference signal, r, and system output measurements, $y_{meas}$, for instance, by Equation 1B:

$$\begin{bmatrix} \dot{y} \\ \dot{x} \end{bmatrix} = \begin{bmatrix} 0 & 1 \\ -\omega_{n_y}^2 & -2\xi_y \omega_{n_y} \end{bmatrix} \begin{bmatrix} y \\ x \end{bmatrix} + \begin{bmatrix} 0 & 0 & \ldots & 0 \\ \omega_{n_y}^2 & \omega_{n_y}^2 & \ldots & \omega_{n_y}^2 \end{bmatrix} \{u\} \quad \text{(Equation 1B)}$$

Where:
- y is the measured system output ($y_{meas}$ elsewhere in this disclosure);
- x is the internal mathematically constructed state to represent a second order linear system;
- $\omega_n$ is a natural frequency in [rad/s] for the measured system output linear approximation and is different than the filter input regressor ω used elsewhere in this disclosure;
- $\xi_r$ is the damping ratio [unitless] of the measured system output linear approximation;
- $\omega_n$ and $\xi_r$ are determined through the reference signal shape and/or desired user-specified waveform; and
- {u} is the input tensor (control inputs) and is different from the $u_{se}$ and $u_{out}$ discussed elsewhere in the disclosure.

Outputs of the frame synthesizer 650 can also include tensors $W_m$ (and its filtered variation $Q_m$), and the L, A, B, and C matrices. The matrices A, B, and C can be used whenever the system is parametrized by the state equations given by $\dot{x}$ and x.

The new resynthesized frames will consist of the coefficients in Equation 1A or 1B whose duration is $n_{new}$ in addition for the reference signal, r, system output measurements, $y_{meas}$, and controls, $u_{out}$, over that length of time. This ensures that each frame is a linear region of the process. Thus, all frames will use different time-varying linearized approximations of nonlinear system behavior that closely approximate the nonlinear system behavior. Adaptation in a frame means that the time-varying linear system starts each frame from this linear approximation and adapts toward an approximation of the true nonlinear process model via adaptation of the model parameter tensor, Θ. This makes the adaptation much faster and can guarantee convergence (since the adaptation does not have to estimate the linear part, only the nonlinear augmentation). The parameters resulting after adaptation converges within a frame and Θ becomes virtually constant, can be stored in a memory, such as memory 652, to be used whenever the reference signal, r, returns to these resynthesized frames during the reference signal sequence. In other words, the estimated parameter tensor, Θ, once convergence is achieved, along with the corresponding structure of the time-varying linear system, can be reused if a similar or identical frame of the reference signal, r, is seen again. Said another way, once adaptation of a frame is complete or converges, the knowledge gained from that adaptation can be used again in subsequent similar frames, thus avoiding the need to perform adaptation again when similar frames are seen.

Although this disclosure often discusses a reference signal, r, it is also feasible for a user to specify more abstract or general desires of the system output. In these cases, the adaptive engine can synthesize the user's specifications into a desired reference waveform, $y_{est\_se}$, and this can replace or be used alongside the reference signals, r. The desired reference waveform, $y_{ref}$, can be written as:

$$y_{est\_se} = W_m(t)u_{se} + \Delta \quad \text{(Equation 2)}$$

Where $\|\Delta\|$ is finite and represents the plasma generator/match/chamber nonlinearity or uncertainty beyond any linear representation given by $W_m(t)u_{se}$. The value $u_{se}$ is the state's desired steady state value which in standard plasma generator terminology is referred to as the power state and is a set of values provided by the user. In other words, the adaptive engine can provide at every collocation time or every control sample, a linear model $W_m(t)$ that makes/forms the closest linear model of $y_{est\_se}$. Said another way, the adaptive engine provides models that are time-varying stable and strictly proper rational linear sample time invariant.

In some embodiments, one or more of a setpoint streaming module, a precomputing engine (e.g., used to determine the A(t), B(t), C(t), K(t), L(t), F(t) matrices/tensors), and a frame synthesizer may be implemented on a Central Processing Unit (CPU). This allows the CPU, rather than an Field Programmable Gate Array (FPGA), to handle the heavy/intensive computations in an offline (or pseudo-offline) manner. On the other hand, the FPGA is better suited for performing simpler calculations in a very rapid manner (e.g., real-time or substantially real-time). The precomputing engine on the CPU sends the A(t), B(t), C(t), K(t), L(t), and/or F(t) matrices/tensors to the adaptive engine running on the FPGA. In some cases, the CPU also stores these matrices/tensors at a frame processor of the FPGA, for instance, in a TSP RAM of the frame processor. This allows the adaptive engine and/or the control law module/sub-engine to access the precomputed matrices in real time or substantially real time. Said another way, the precomputing engine on the CPU generates the structure of the A, B, and C matrices, and hence the time-varying linear system, $W_m$, for every frame.

Figure 7:
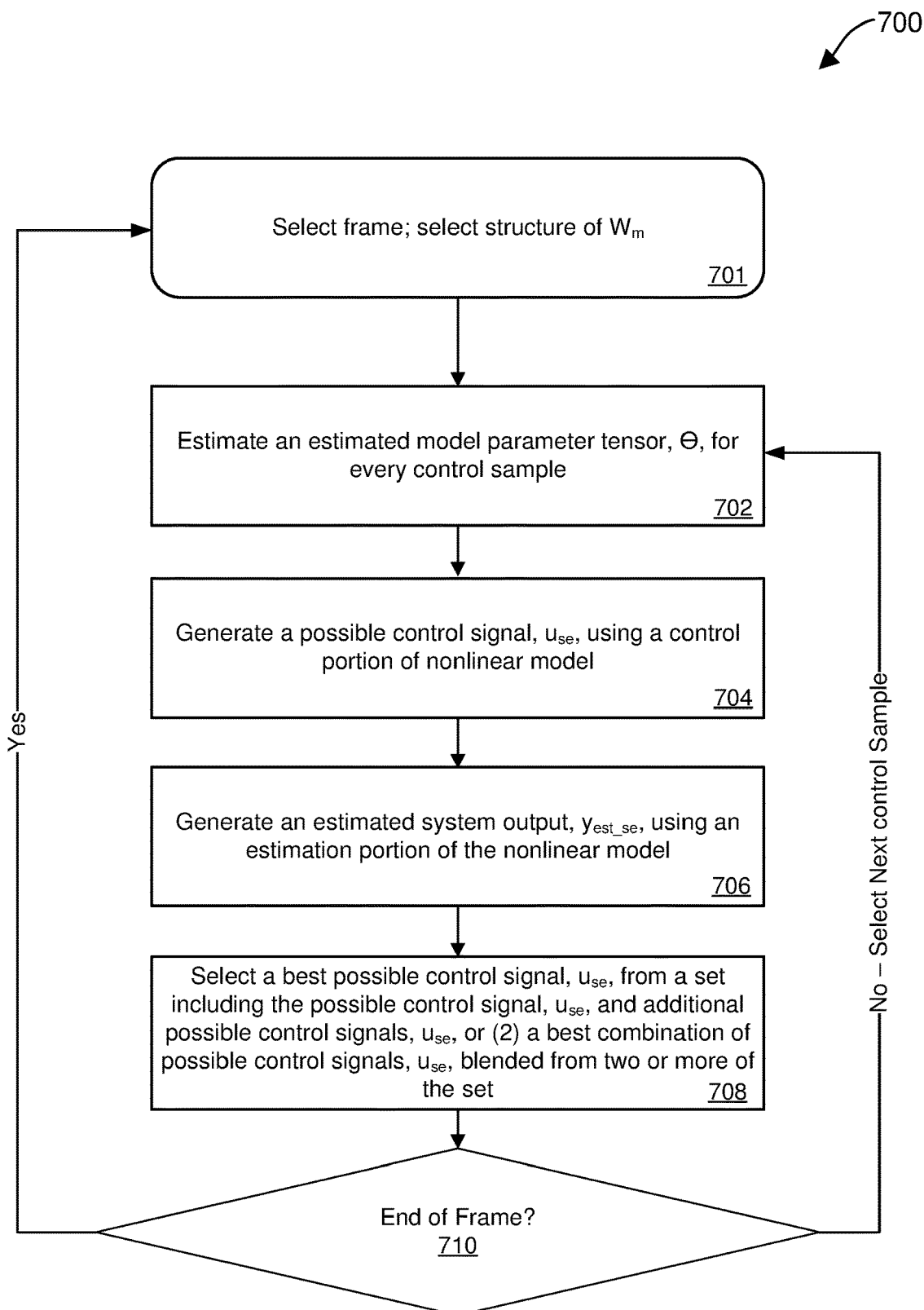
FIG. 7 illustrates a method of adaptive control.

FIG. 7 illustrates a method of adaptive control, and in some particular embodiments, of controlling one or more actuators controlling a system (e.g., a plasma processing system and/or power supply for the plasma processing system) via an adaptive engine. The method 700 can start with selection of a new frame and a best linear approximation of the system behavior over the new frame (Block 701). In other words, a structure of $W_m$ is selected. This structure can be calculated in a frame resynthesizer or accessed from an empirically derived lookup table. The method 700 can include estimating an estimated model parameter tensor, Θ, for every control sample of a nonlinear model (Block 702). The estimating can be based on an estimation law that is a function of an estimated error, ê, or cost function, J, and can be implemented in an estimation law module. The estimated model parameter tensor, Θ, comprises estimated parameters of a nonlinear model such as, but not limited to, r, $y_{meas}$, $y_{est\_se}$, and $u_{out}$. The method 700 can further generate a possible control signal, $u_{se}$, using a control portion of the nonlinear model (Block 704) and generate an estimated system output, $y_{est\_se}$, using an estimation portion of the nonlinear model (Block 706). These two values can be calculated from a control portion and an estimation portion of the nonlinear model, respectively. Both portions of the nonlinear model are functions of at least the estimated model parameter tensor, and the estimation portion can also be a function of the possible control signal, $u_{se}$, from the control portion. The control portion can also take the input regressor, Ø, as one of its inputs. The control portion of the nonlinear model can be implemented in a control law and more specifically in a control law module. The estimation portion of the nonlinear model can also be implemented in the control law and the control law module, though it can also be implemented in the estimation law module or outside of both the control law module and the estimation law module. The method 700 can then select (1) a best possible control signal, $u_{se}$, from a set including the possible control signal, $u_{se}$, and additional possible control signals, $u_{se}$, or (2) a best combination of possible control signals, $u_{se}$, blended from two or more of the set (Block 708). The blending can be based on a topology that can include averaging, multiplication, summations, differences, divisions, integrals, derivatives, exponentials, complex functions, logarithms, series, statistical distributions, matrices, tensors, neural networks, nonlinear functions, graphs, maps, transformations, trees, to name a few non-limiting examples, or combinations thereof. The topology can be selected based on total estimated system output, $y_{est\_out}$, for each of multiple possible topologies, and then comparing this estimate, $y_{est\_out}$, to the reference signal, r, the measured system output, $y_{meas}$, or a combination of these (referred to as estimated system error, $\hat{e}_{out}$). For instance, a specific example using all three of these values is shown in Equation 4, where a cost function, $J_{out}$ of two errors is used.

The adaptation of $\Theta$ described in Blocks 702-708 can be repeated for all iterations or control samples in a frame (repeat 702-708 until Decision 710=Yes). This adaptation leaves the linear approximation (or structure of $W_m$) constant through a frame, but adapts $\Theta$ at each control sample in the frame until the bifurcated nonlinear model converges on the system's nonlinear behavior. At the end of the frame (Decision 710=Yes), a new linear approximation (structure of $W_m$) is calculated or accessed, and adaptation of $\Theta$ again restarts from the baseline of the linear approximation until convergence on the nonlinear system behavior is achieved. The final $\Theta$ can be stored along with a mapping to the frame and the structure of $W_m$, such that these values can be recalled should the reference signal underlying the frame be subsequently seen.

Estimation Law Modules

FIGS. 8A and 8B can be used to provide further detail of certain embodiments of the estimation law modules and the corresponding estimation laws. At a high level, an estimation law is a means of estimating parameters for a nonlinear portion of a nonlinear model of the system (this model having a linear and a nonlinear portion). Control laws take these estimated parameters and generate possible control signals therefrom, predicted to achieve a desired outcome from the system (e.g., minimize an error between a reference signal and a measured output of the system). The estimated parameters along with the possible control signals can also be used in an estimation portion of the nonlinear model to estimate one or more system outputs predicted to result from the possible control signals.

Both modules 804, 806 can operate and be described similarly to the corresponding components in FIGS. 5A-C. Although only one estimation law module 804 and one control law module 806 are shown, multiple estimation law modules 804 and control law modules 806 would be found in a typical adaptation law selector. One or more estimation law modules 804 can be paired with each of the control law modules 806. Using different combinations of estimation law modules 804 and control law modules 806, the adaptive engine 500 effectively enables handling a wide variety of controller needs and the ability to quickly switch between combinations of estimation laws and control laws—the combinations being referred to as adaptation laws as shown via brackets in FIGS. 8A and 8B.

The estimation law module 804 can include an optional smoothing filter bank 810, one or more estimation law banks 812, and optionally one or more estimation laws filtering banks 814. The optional filters 810, 814 can provide filtering of the input and outputs from the one or more estimation law banks 812. Namely, the optional smoothing filter bank 810 can apply $H\{\circ\}$, $L^{-1}\{\circ\}$ and $WL\{\circ\}$ to the input signals/regressors such that derivative terms are not noisy and do not have instantaneous spikes. H is a filtering operator and is designed by the user to achieve the fastest response possible for a given process time constant. For different control entities (e.g., rail, drive, frequency, match network, etc.), $H\{\circ\}$ will generate different filter parameters. It can be implemented as a zero-phase lag filter. This guarantees smoothness and continuity of the inputs/regressors. This filter can be as simple as a biquad, or a first order time constant, though these two examples are not limiting. However, in other filters, adaptive time constant filters can be used based on a cost function. Each filter is designed to be best suited for the corresponding estimation portion 808 in FIG. 8A or FIG. 8B.

The one or more estimation law banks 812 can take the input regressor, $\emptyset$, or an unfiltered version thereof (e.g., $\psi$), and apply it to an estimation law to estimate model parameter tensors, $\Theta$, of the nonlinear model. Depending on the estimation law, the estimation law bank 812 may also receive the adaptive gain, $\Gamma$, and use this in the estimation of the estimated model parameter tensors, $\Theta$. The input regressor, $\emptyset$, may include components such as r, $y_{est\_se}$, and $y_{meas}$, and from these an estimation error, $\hat{e}$, can be determined. Depending on design, the estimation error, $\hat{e}$, can be determined from various differences between two of these three values, for instance, the four estimation errors 1-4 described below relative to the Estimation Law 1. In one embodiment, three estimation law modules 804 each having one of three nonlinear models can feed a single control law module 806. Seven estimation laws can be distributed amongst these three estimation law modules 804 in one example, such that one or more estimation laws are applied to each of the nonlinear models, and the three estimation law modules 804 produce seven estimated model parameter tensors, $\Theta$.

One or more estimation laws filtering banks(s) 814, one for each of the one or more estimation law banks 812, can be included at an output of the one or more estimation law banks 812. These optional filters 814 can smooth the resulting estimated model parameter tensors, $\Theta$, or create persistent excitations such that the estimated model parameter tensors, $\Theta$, converge to their actual values, and/or pass them through a projection operator to make their values bounded and avoid drift. The purpose of this filtering 814 is to ensure that the possible control signal, $u_{se}$, computed in the corresponding control law module 806, is sufficiently rich of order N (i.e., contains N/2 distinct frequencies) which enforces the input regressor signal given by:

$$\emptyset_u = H_{Pe}\{u\} \qquad \text{(Equation 3)}$$

Where $\emptyset = [\emptyset_u, \emptyset_y, \emptyset_{r0}]$ is a tensor of the $\emptyset_u$, $\emptyset_y$, $\emptyset_{r0}$ tensors, and $\emptyset = H\{\varphi\}$ with $H = [H_u, H_y, H_{r0}]$ and $\varphi = [u, y, r_0]$. Where u is a tensor of all inputs (control) and their derivatives, y is a tensor of all measurements and their derivatives, and $r_0$ is a tensor of all extraneous entities (exogenous or internal) and their derivatives.

In some embodiments, an estimated model parameter tensor, $\Theta$, can be another input to the nonlinear model.

An optional and non-illustrated feature is to select a law combination in the optional one or more estimation law filtering banks 814 that differs from iteration to iteration so as to minimize a cost function, such as a cost function that includes multiple summation operation at least one of which is a function of ê(k).

The control law module 806 passes the possible control signal, $u_{se}$, to the selector module (e.g., 508), which determines which possible control signal, $u_{se}$, or which combination of possible control signals, $u_{se}$, is used to generate the control, $u_{out}$. Each estimation law module 804 also passes its estimation model parameter tensor, $\Theta$, back to its input, either in real-time or via memory (not shown). This feedback allows the value to used in the next adaptation iteration. The memory can be a pipeline register, such as a TSP-RAM block.

The nonlinear model can be split into a control portion 805 and an estimation portion 808. The control portion 805 can be found in the control law 818 and the estimation portion 808 can be found in the control law module 806 (in FIG. 8A) or in the estimation law module 804 (in FIG. 8B). The estimation portion 808 can be used to generate an estimated system output, $y_{est\_se}$, for each combination of estimation law module 804 and control law module 806 (i.e., for each adaption law). The result can be passed forward to the selector module (not shown) and back as an input to a next iteration of the estimation law module 804, for instance, as part of the input regressor, $\emptyset$. This estimation can occur almost anywhere, and thus FIGS. 8A and 8B provide but two examples of where the estimation portion 808 can be used to estimate the estimated system output, $y_{est\_se}$ (in the control law module 806 in FIG. 8A and in the estimation law module 804 in FIG. 8B). However, this estimation could also take place outside either of these modules. One distinction between FIGS. 8A and 8B, is that different iterations of the possible control signal ($u_{se\_k}$ versus $u_{se\_k-1}$) are used in the estimation, depending on where it takes place. In FIG. 8B, where the estimation using the estimation portion 808 occurs in the estimation law module 804, the possible control signal, $u_{se\_k-1}$, for a previous iteration can be used, whereas in FIG. 8A, where the estimation using the estimation portion 808 occurs in the control law module 806, the possible control signal, $u_{se}$ k, for the current iteration can be used. The possible control signal, $u_{se}$ k or $u_{se\_k-1}$, can be generated by the control law 818 in the control law module 806 and can be fed back to the estimation portion 808 in real time or via memory. In some variations of the estimation portion, a linear portion of the model, $W_m$, may be used in the estimation, and this linear portion, $W_m$, may be pre-calculated in a frame resynthesizer or access from an empirically derived lookup table. The same linear portion of the model, $W_m$, is used for all iterations of a given frame, and then changed for a next frame.

Lower latency may be possible, and fewer memory resources used, if the estimation portion 808 is applied to generate the estimated system output, $y_{est\_se}$, in the control law module 806 as shown in FIG. 8A. In this case, the estimation portion 808 can take the possible control signal, $u_{se}$ k, for the current iteration and estimate a possible system output, $y_{est\_se}$. In some instances, this may be faster than the variation shown in FIG. 8B.

While most of this disclosure discusses the passing of estimated model parameter tensors, $\Theta$, to the control law modules, in some embodiments, each estimation law module can also pass derivatives, $\dot{\Theta}$, of the estimated model parameter tensors, $\Theta$. The derivatives, $\dot{\Theta}$, can be used to increase an accuracy and speed of convergence to the system behavior. Thus, where [$\Theta$] is seen in the figures, this tensor can be replaced by the more effective tensor [$\Theta, \dot{\Theta}$] in some implementations.

Exemplary estimation laws 1-6 below show some non-limiting examples of estimation laws that can each be implemented in the estimation law module(s) 804 or 504. As seen, estimation laws are generally a function of the estimation error, ê, and/or the input regressor, $\emptyset$, and produce an estimated model parameter tensor, $\Theta$, and optionally its derivative, $\dot{\Theta}$. Estimation laws can be implemented in the estimation law banks 812 and can be embodied in software, firmware, physical logic circuits, or a combination of these. For instance, in a simplest case, an estimation law may involve matrix multiplication of the estimation error, ê, and the input regressor, $\emptyset$ (e.g., see Estimation Law 1). However, other estimation laws may involve more complicated interactions between these values as well as intermediary steps and decisions en route to generating the estimated model parameter tensor, $\Theta$.

Although the estimation law banks 812 can implement any number of estimation laws, below are a few non-limiting examples:

$$\dot{\theta} = \Gamma \hat{e} \emptyset \qquad \text{(Estimation Law 1)}$$

Where the estimation error, ê, can be written as any of the following:

$$\hat{e} \overset{\Delta}{=} y_{meas} - y_{est\_se} \qquad \text{(Estimation Error 1)}$$

$$\hat{e} = r - y_{est\_se} \qquad \text{(Estimation Error 2)}$$

$$\hat{e} = y_{meas} - y_{est\_se} - W_m L \hat{e}_{km} n_s^2 \qquad \text{(Estimation Error 3)}$$

$$\hat{e} = \frac{y_{meas} - y_{est\_se}}{m^2} \qquad \text{(Estimation Error 4)}$$

In other words, the estimation error, ê, can involve a difference between two of the following three values or tensors: r, $y_{meas}$, $y_{est\_se}$.

The certainty equivalence principle suggests that unknown parameters in a control design can be replaced by their estimates. A hat above a variable or parameter indicates an estimate of an unknown parameter.

Where m and ns are normalization terms, and the input regressor $\emptyset$ has been discussed previously and can include values such as, but not limited to, r, $y_{meas}$, and $u_{out}$.

Another exemplary estimation law can be written as:

$$\dot{\theta} = -\Gamma(R\theta + Q) \qquad \text{(Estimation Law 2)}$$

$$\dot{R} = -\beta Q + \frac{\emptyset \emptyset^T}{m^2} \bigg| R(0) = R_0$$

$$\dot{Q} = -\beta Q + \frac{y_{meas}\emptyset}{m^2} \bigg| R(0) = Q_0$$

And a third can be written as:

$$\dot{\theta} = P\hat{e}\emptyset \qquad \text{(Estimation Law 3)}$$

$$\dot{P} = -P\frac{\emptyset \emptyset^T P}{m^2} \bigg| P(0) = P_0$$

$$\text{And } \hat{e} = \frac{y_{meas} - y_{est\_se}}{m^2} \text{ or } \hat{e} = y_{meas} - y_{est\_se} - W_m L \hat{e}_{km-1} n_s^2$$

Where m and $n_s$ are normalization signals.

Another estimation law can be written as:

$$\dot{\theta} = P\hat{e}\varnothing \quad \text{(Estimation Law 4)}$$

$$\dot{P} = -P\frac{\varnothing\varnothing^T P}{m^2} \bigg| P(\text{reset}) = P_0 = \infty I$$

$$\dot{\theta} = P\hat{e}\varnothing \quad \text{(Estimation Law 5)}$$

$$\dot{P} = \begin{cases} \beta P - P\frac{\varnothing\varnothing^T P}{m^2} | | \|P(t)\| \leq R_0 \\ 0 \end{cases}$$

$$\dot{\theta} = \Gamma_1 \hat{e}\varnothing \text{ signum }(r_{est}) \quad \text{(Estimation Law 6)}$$

$$\dot{r} = \Gamma_2 \hat{e}\varepsilon$$

$$\dot{\varepsilon} = \theta\varnothing + r_0$$

With $\hat{e} = y_{meas} - y_{est\_se} - W_m L \hat{e} n_s^2$ or $\hat{e} = \frac{y_{meas} - y_{est\_se}}{m^2}$ Where $\Gamma_1$, $\Gamma_2$, and $\Gamma_3$ are different ones of the adaptation gain, $\Gamma$, provided by the adaptive engine where they are generated.

Yet a final non-limiting example of an estimation law can be written as:

$$\dot{\theta} = N(x)\Gamma_1 \hat{e}\varnothing$$

$$N(x) = x^2 \cos(x)$$

$$x = w + r^2 \Gamma_2$$

$$\dot{W}_m = \hat{e}^2 m^2 | W(0) = W_0$$

$$\dot{r} = N(x)\Gamma_2 \hat{e}\varepsilon$$

$$\dot{\varepsilon} = \theta\varnothing + r_0 \quad \text{(Estimation Law 7)}$$

One sees that most of the exemplary estimation laws are written in terms of the derivative of the model estimation parameter tensor, $\dot{\theta}$, and yet the model estimation parameter tensor, $\theta$, is the output of the estimation law modules. Any estimation law of this sort can be rewritten to give $\theta$ by taking the integral of $\dot{\theta}$ and hence the estimation law module output for a given estimation law. In other embodiments, as described earlier, $\theta$ and $\dot{\theta}$ can both be generated by the estimation law modules, and hence by the estimation laws. More specifically, the integral of $\dot{\theta}$ is $\theta_{k-1} + \dot{\theta}$, or the sum of $\Theta$ of the previous iteration and the derivative of $\Theta$.

Further, each estimation law, whether one of the examples above, or any other estimation law, may have two versions. In a first version, $m^2 = 1$ and $n_s = 0$ such that no normalization occurs, which has the advantage of faster adaption but less applicability to unstable plants and/or unbounded control signals. In a second version, $m^2 = 1 + n_s^2 > 0$, which leads to slower convergence for stable plants and/or bounded control signals, but will allow control of unstable plants and/or unbounded control signals. The adaptive engine can switch between these two versions of any estimation law in real time to enable faster control.

Estimation laws can be modified to include robustness measures that can be pipelined/resource shared/streamed when implemented in a real-time hardware (e.g., ASIC/FPGA) in a generic way that benefits from oversampling. For instance, all can be processed within a control cycle.

Nonlinear Models

As noted earlier, the nonlinear model takes the estimated model parameter tensor, $\Theta$, and an estimation error, $\hat{e}$, or cost function, J, and generates a possible control signal, $u_{se}$, and an estimated system output, $y_{est\_se}$, estimated to result from the possible control signal, $u_{se}$. The combination of the nonlinear model, an estimation law, and a control law can be referred to as an adaptation law.

The nonlinear model can be used to provide a possible control signal and an estimated system output (e.g., reflected power, phase offset between delivered and reflected power, etc.). To this end, the nonlinear model has a control portion and an estimation portion, that in a most general form can be written as:

$$u_{se} = \theta \cdot \varnothing \quad \text{(Control Portion of the Nonlinear Model)}$$

$$y_{est\_se} = \theta \cdot \varnothing \text{ or } W_m\{u_{se}, \Theta\} \text{(Estimation Portion of the Nonlinear Model)}$$

In some cases, both parts are processed in the control law module, and in other cases the estimation portion can be processed outside the control law module (e.g., sees FIGS. 5A and 8A). However, in others, the control portion can be processed in the control law modules and the estimation portion can be processed in the estimation law modules (e.g., see FIGS. 5B and 8B) or elsewhere in the adaptation engine.

From this generalized from of the model, one sees that both the control portion and the estimation portion are functions of the estimated model parameter tensor, $\Theta$, and the input regressor, $\varnothing$. The control portion gives a control that a given sub-engine believes is most likely to produce a system behavior most in line with the reference signal, r. The estimation portion is an estimate of the system output should the possible control signal, $u_{se}$, be provided to the one or more actuators.

However, this generalized form is actually a circular definition because $\varnothing$ for the control portion takes $y_{est\_se}$ as an input, and $\varnothing$ for the estimation portion takes $u_{se}$ as an input. To avoid this circular definition, there are two solutions: (1) either the control or the estimation portion can be rewritten as a function of inputs from a previous iteration (e.g., $\Theta_{k-1}$ and $\varnothing_{k-1}$) while the other is based on current iteration inputs (e.g., $\Theta_k$ and $\varnothing_k$); or (2) one of the control or estimation portions can be written in terms of the other portion. More specifically, this second solution may lead to Model 1 being rewritten in terms of the possible control signal, $u_{se}$, as:

$$y_{est\_se} = W_m \cdot \theta \cdot \psi = W_m\{u_{se}, \Theta\} \quad \text{(Estimation Portion Model 1)}$$

Where this expansion is made possible via knowledge that $u_{se} = \theta \cdot \psi$, and $W_m$ is a time-varying linear system and is a strictly positive real (SPR) that is a solution to the Lyapunov Equations and is a function of the possible control signal, $u_{se}$, and the estimated model parameter tensor, $\Theta$. The time-varying linear system, $W_m$, can also be thought of as a transfer function or a linear operator. The time-varying linear system, $W_m$, can have a different structure for different frames such that its global effect is to approximate the nonlinear system, but to do so using different time-varying linear approximations at each frame, where the time-varying linear system, $W_m$, changes with $\Theta$ at each control sample or iteration within a frame. For instance, $W_m$ could be $$\frac{s+20}{(s+1)(s+2)}$$

for a first frame, $$\frac{1}{s+5}$$

for a second frame, and $$\frac{1}{s^2+2s+1}$$

for a third frame. While the time-varying linear system, $W_m$, has a constant structure for a given frame, it is a function of $\Theta$, which adjusts or is adapted at every iteration or control sample. Recalling FIG. 43, the time-varying linear system, $W_m$, is adapted as a function of $\Theta$ during each frame until convergence (where an unknown nonlinear portion of $W_m$ is small enough to be ignored). The structure of this time-varying linear system, $W_m$, changes from frame to frame. The net effect is a bifurcated nonlinear model that uses a different linear approximation in each different frame to account for large changes in system nonlinear behavior and a nonlinear approximation achieved through adaptation of the estimated model parameter tensor, $\Theta$, at each control sample or iteration of a frame to account for small changes in system nonlinear behavior.

For clarity, the control portion of Model 1 is the same as its generalized form noted earlier:

$$u_{se}=\theta\cdot\varnothing \qquad \text{(Control Portion of the Model 1)}$$

As noted above, avoiding a circular definition of the generalized model can also be achieve by writing the control portion in terms of the estimation portion:

$$u_{se}=W_m^{-1}\{y_{est\_out}\} \qquad \text{(Control Portion of the Model 2)}$$

$$y_{est\_se}=\theta\cdot\varnothing \qquad \text{(Estimation Portion of the Model 2)}$$

The control portion of Model 2 can also be written in terms of $y_{meas}$ instead of the total estimated system output, $y_{est\_out}$. The control portion of Model 2 may use $W_m^{-1}$ as shown or an approximation thereof.

Regardless of whether Model 1 or 2 is used, the time-varying linear system, $W_m$, is an input to either the estimation portion (Model 1) or the control portion (Model 2).

Expanding on the estimation portion of Model 1, it will be appreciated that $u_{se}$ is an input to the system $W_m$, and this operation gives the estimated system output, $y_{est\_se}$, based on the dynamic equation:

$$\dot{x}=Ax+Bu_{se}$$

$$y_{est\_se}=Cx$$

where C can be the identity matrix for improved performance.

This means that $$\dot{y}=Ay_{est\_se}+Bu_{se}$$

So, $W_m\{u_{se}, \Theta\}$ leads to $y_{est\_se}$ by integrating $\dot{y}$.

Control Laws (Control Law Modules)

Each control law is implemented as a control law module, and specifically as the control law 818 within that control law module. Each control law module applies the control portion of the nonlinear model, as modified into a distinct control law, to an estimated model parameter tensor, $\Theta$, and at least part of the input regressor, $\varnothing$, to generate a possible control signal, $u_{se}$. In some cases, a control law module may be configured to apply more than one control law (e.g., the TARC control law module discussed later can apply adaptive inversion laws, Eigen laws, and Penalty laws) and produce a corresponding number of possible control signals, $u_{se}$. Alternatively, an optional select control law 816 may be used to select a preferred control law for the control law module to apply such that the number of possible control signals, $u_{se}$, is the same as seen in other control law modules. The optional select control law 816 is shown as preceding the control law 818, but could also be arranged after the control law 818 and thereby filter multiple $u_{se}$ into a single $u_{se}$.

Control laws take the estimated model parameter tensors, $\Theta$, estimated by the estimation laws in the estimation law modules, which are variations on the control portion of the nonlinear model, and generate possible control signals, $u_{se}$, predicted to achieve a desired behavior from the system (e.g., minimize an error between a reference signal and a measured output of the system).

The control law modules, examples of which will be detailed in FIGS. 10-42 (also called sub-engines), implement control laws to generate the possible control signals, $u_{se}$, that are then passed from all control law modules to the selector module. Each control law module takes one or more estimated model parameter tensors, $\Theta$, from one or more estimation law modules, and passes each of the one or more estimated model parameter tensors, $\Theta$, through a control law (control portion of the nonlinear model) to give a possible control signal, $u_{se}$. In other words, each estimation law leads to a at least one possible control signal, $u_{se}$. These control laws can be implemented in software, firmware, physical logic, or a combination of these. The examples that will be described below and illustrated in FIGS. 10-42 provide functional descriptions of the control laws as implemented in control law modules, and any of this functionality may be coded in software or firmware, fabricated in physical logic, or some combination of these. Further, while the control law modules or sub-engines are described as part of a larger adaptive engine, in some embodiments, the control law modules or sub-engines can operate independently, such that each on its own can control one or more actuators of a power system.

To better appreciate control laws, their influence on the adaptive engine, and the breadth of their variations, six exemplary, but non-limiting, control laws can be written as follows starting with Control Law 1A for a TLMC (or Lyapunov) control module:

$$u_{se}=\theta\omega \qquad \text{(Control Law 1A)}$$

Each of these control laws is based on a control portion of the nonlinear model that complements a corresponding estimation portion of the nonlinear model and typically the output of the control portion is an input to the estimation portion (or vice versa).

In Control Law 1A, w overlaps with but is not identical to $\varnothing$. In particular, $\omega$ is a concatenation that can include some form of $u_{out\_k-1}$, $y_{meas}$, and r (i.e., often components of $\varnothing$). For instance, one or more of these values can be filtered before being concatenated into $\omega$. For instance, $\omega$ may equal $[u_d, y_d, y_{meas}, r]$ where $u_d$ and $y_d$ are filtered or smoothed versions of $u_{out}$ and $y_{meas}$, respectively. Where Control Law 1A also makes use of the derivative of $\Theta$, it can be written in the alternative as:

$$u_{se} = \theta\omega + \dot{\theta}\chi \quad \text{(Control Law 1B)}$$

$$\text{Where } \chi = \begin{cases} H\{\omega\} = \mathcal{L}^{-1}\{\omega\} & |dim_{-1}(\ominus) > 1 \\ 0 & |dim_{-1}(\ominus) = 1 \end{cases}$$

Figure 10A:
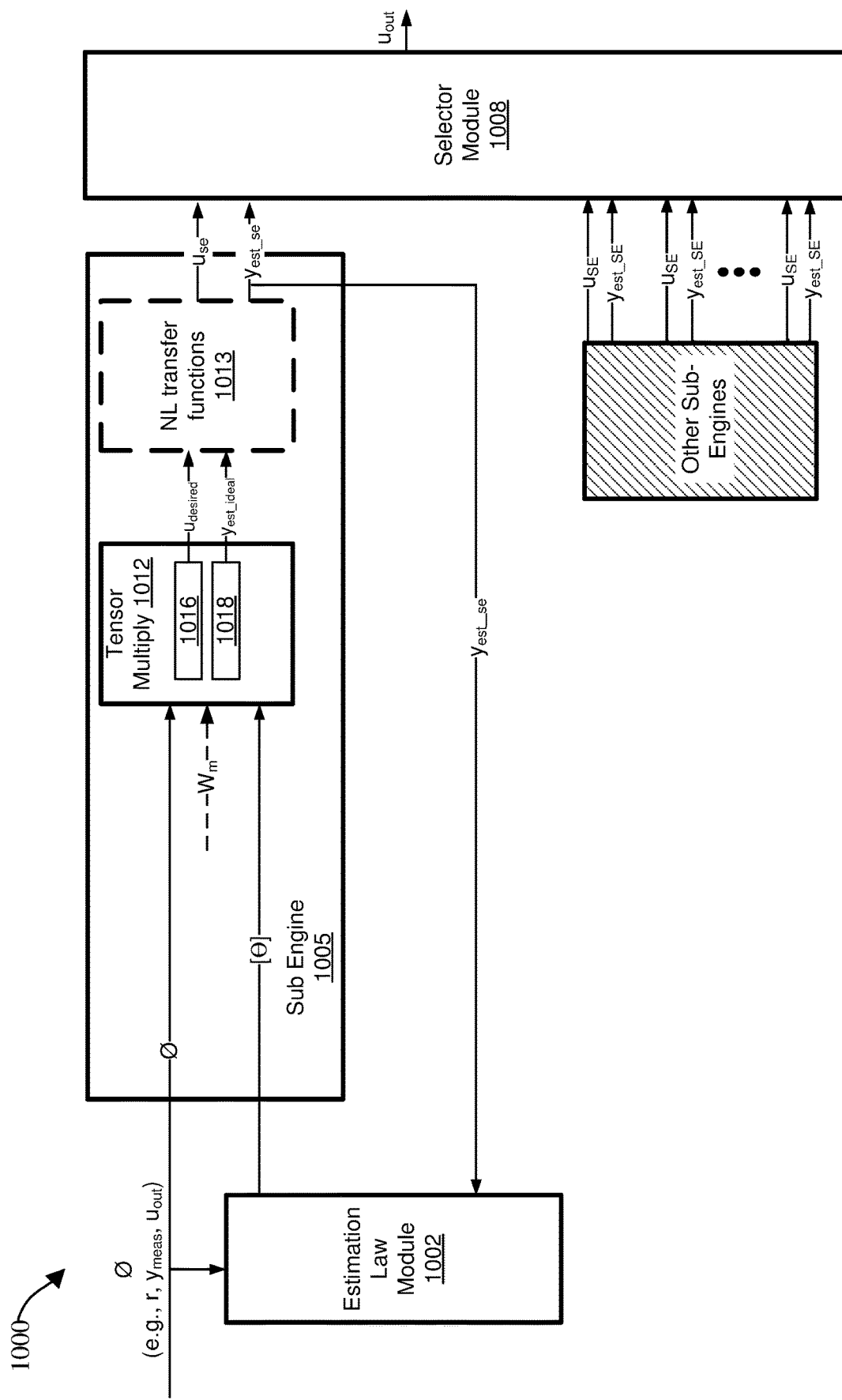
FIG. 10A shows an embodiment of an adaptive engine focusing on details of a Lyapunov control law module or sub-engine.
Figure 10B:
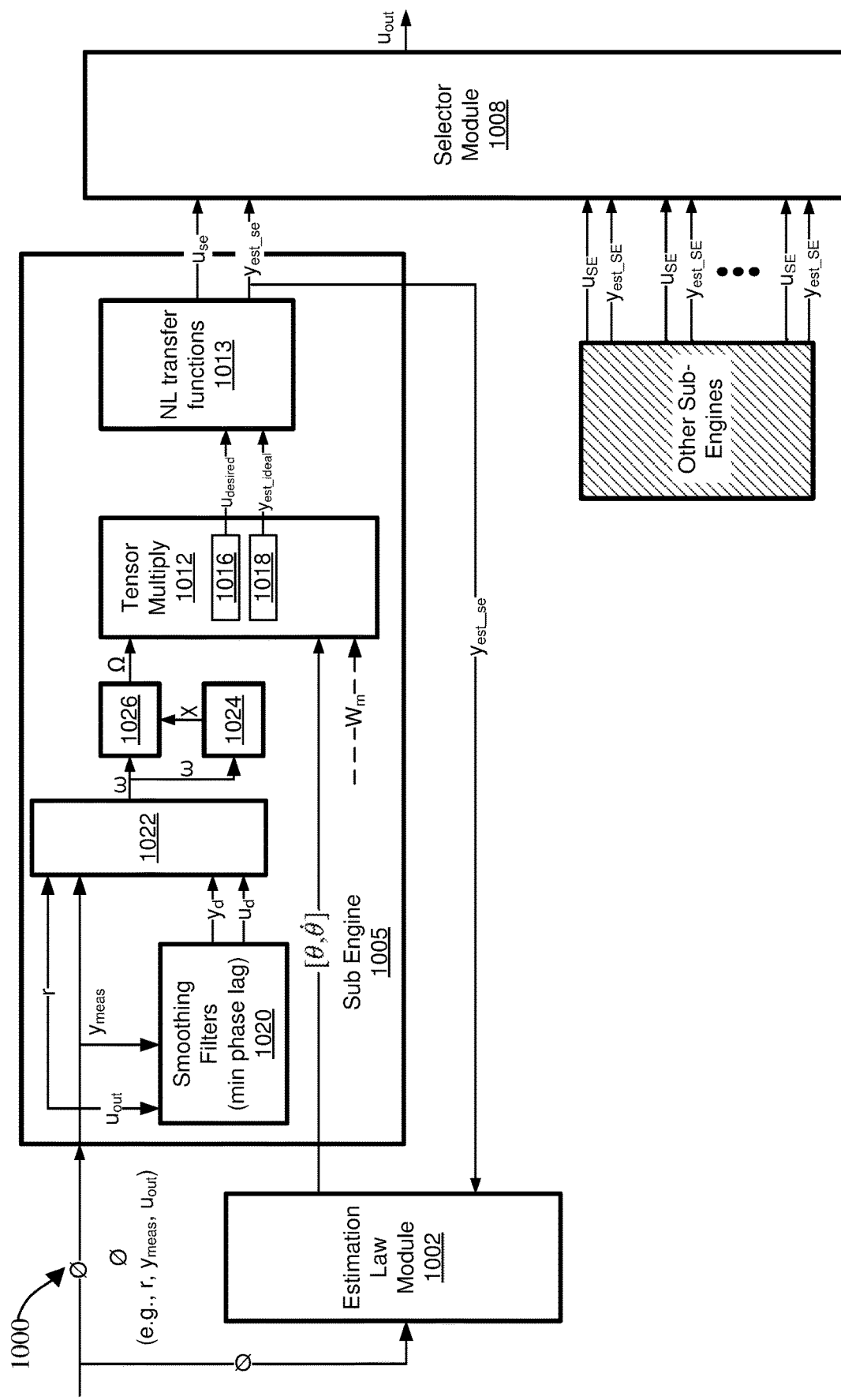
FIG. 10B shows a variation on FIG. 10A, where a derivative of the estimated model parameter tensor is also calculated and used.

Control Laws 1A and 1B are detailed further in FIGS. 10A and 10B. A second exemplary control law for a TARC control law module, can actually be selected from three control laws 2A, 2B, and 2C and they can be written as:

$$u_{se} = [H\{u_{out}\} - \hat{\mathcal{L}}Q_m]H^{-1}\{u_{out}\} - \hat{P}H^{-1}\{e\} \quad \text{(Control Law 2A)}$$

$$u_{se} = H\{Q_m\Omega\} \quad \text{(Control Law 2B)}$$

$$u_{se} = H\{-Q_m\text{pinv}(R)\hat{B}P\hat{e}_{out}\} \quad \text{(Control Law 2C)}$$

In one embodiment, a best of Control Law 2B and 2C can be selected as:

$$\begin{bmatrix} H\{Q_m\Omega\} \\ H\{-Q_m\text{pinv}(R)\hat{B}P\hat{e}_{out}\} \end{bmatrix} \quad \text{(Control Law 2B/2C)}$$

And a total control law based on 2A and the combination of 2B and 2C can be written as a selection or combination of:

$$\begin{bmatrix} [H\{u_{out}\} - \hat{\mathcal{L}}Q_m]H^{-1}\{u_{out}\} - \hat{P}H^{-1}\{e\} \\ H\{Q_m\Omega\} \\ H\{-Q_m\text{pinv}(R)\hat{B}P\hat{e}_{out}\} \end{bmatrix} \quad \text{(Control Law 2A/B/C)}$$

An augmentation of the above can be written as $$\begin{bmatrix} [H\{u_{out}\} - \hat{\mathcal{L}}Q_m]H^{-1}\{u_{out}\} - \hat{P}H^{-1}\{e\} \\ H\{Q_m\Omega\} \\ H\{-Q_m\text{pinv}(R)\hat{B}P\hat{e}_{out}\} \end{bmatrix} \quad \text{(Control Law 2A/B/C Augmented)}$$

Control Laws 2A, 2B, and 2C are detailed further in FIGS. 11A-13.

A third exemplary control law for an L1 control law module can be written as:

$$u_{se} = \theta_{u_{out}}u_{out} + \theta_{y_d}y_d + \theta_{y_{pred}}y_{pred} + \theta_r r \quad \text{(Control Law 3)}$$

Figure 14:
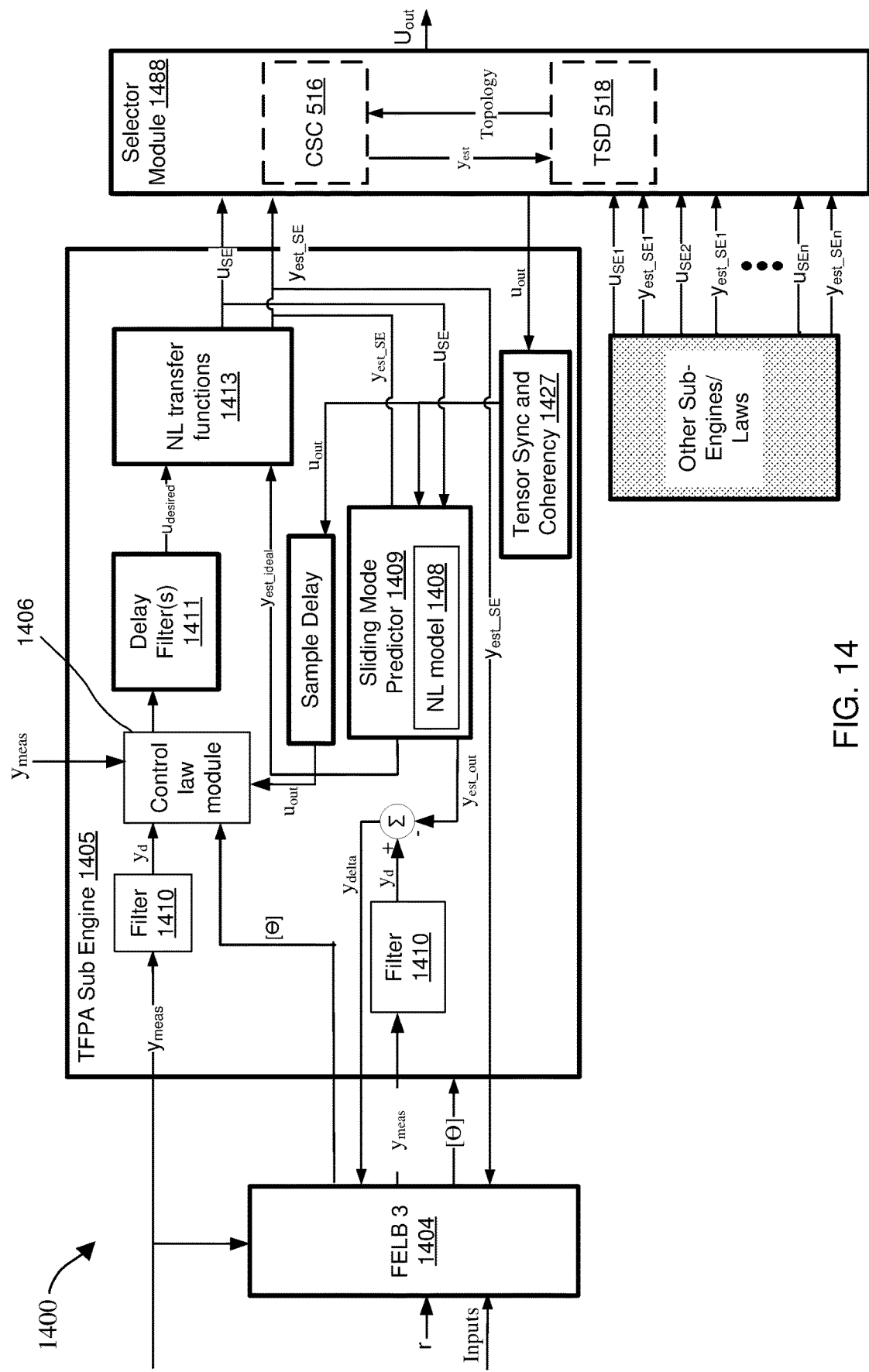
FIG. 14 depicts a block diagram of an adaptive engine showing the details of the TFPA control law sub-engine, in accordance with one or more implementations.
Figure 15:
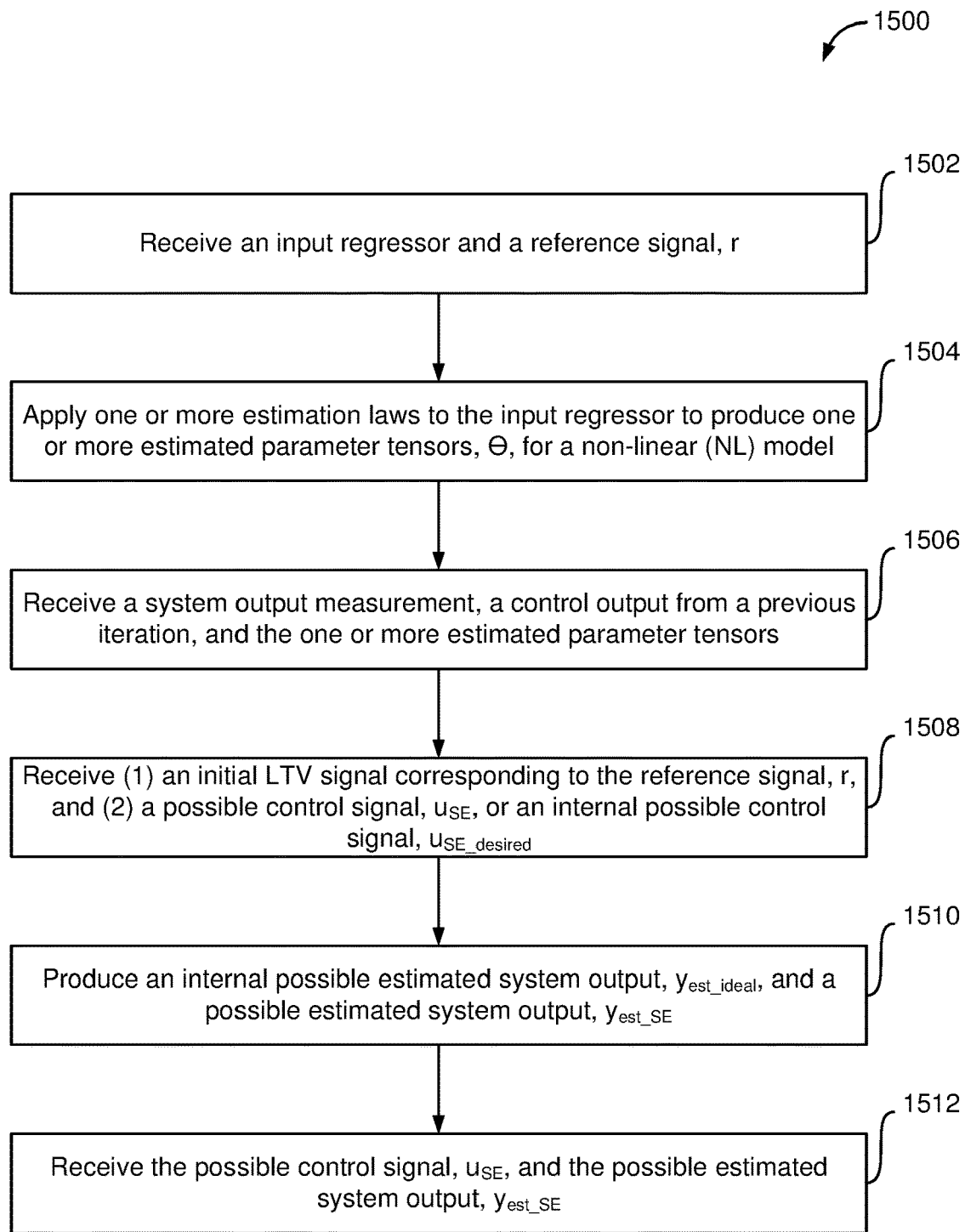
FIG. 15 illustrates an example of a method for controlling a nonlinear system using the TFPA control law sub-engine, in accordance with one or more implementations.

And details of this Control Law 3 can be seen in FIGS. 14-15.

A fourth exemplary control law for an Adaptive PID control law module can be written as:

$$u_{se} = u_{PID_k} - u_{FF_k} = [\theta, \theta_7][\omega, \omega_7] \quad \text{(Control Law 4)}$$

Where $\omega_7 = H\{u_{n_{k-1}}\}$

Details of the Control Law 4 can be seen in FIGS. 16-21.

The input regressor, Ø, and subsets thereof are described generally relative to FIGS. 8A and 8B since the estimation law module 804 or the control law module 806, where the input regressor, Ø, or a subset thereof, is provided, may dictate the values in the input regressor, Ø, or a subset thereof. For instance, the estimation law modules 804 often use two or more of the following, r, $y_{est\_se}$, and $y_{meas}$, to determine the estimation error, ê, which is then used, along with other values depending on the estimation law implemented in a given estimation law module 804, to determine estimation model parameter tensors, Θ. In other words, Ø can be [r, $y_{est\_se}$, $y_{meas}$] when provided to the estimation law modules 804 in some embodiments, but [$u_{out\_k-1}$, r, $y_{meas}$] when provided to the control law modules 806. Thus, functionality is roughly the same whether Ø or a subset thereof is provided to the estimation law modules 804 and the control law modules 806. To better cover the various estimation law modules 804 and control law modules 806, this disclosure will continue to generalize the inputs to both modules as Ø, and those of skill in the art can easily optimize resources and pipelining by providing more specific subsets thereof to the two distinct sets of modules.

Selection of Topology to Generate the Control

Returning to FIG. 5A, additional details of the selector module 508 are presented. After the control law modules 506 select possible control signals, $u_{se}$, the selector module 508 receives the one or more possible control signals, $u_{se}$, and performs further estimations to select a best one of the possible control signals, $u_{se}$, or a best combination of the possible control signals, $u_{se}$, as the control, $u_{out}$. In particular, the selector module 508 estimates a system output based on different ones of the possible control signals, $u_{se}$, or different combinations of multiple possible control signals, $u_{se}$, and resulting error values for each of these estimations relative to a desired system outcome (e.g., minimizing an error between reference signal and measured system output and/or minimizing an error between reference signal and estimated system output). This error is the system output error, $\bar{e}_{out}$, previously referred to. As an example of this estimation and error determination, the selector module 508 can use the possible control signals, $u_{se}$, the estimated system outputs, $y_{est\_se}$, the reference signal, r, and the system output measurement, $y_{meas}$, in an error or cost function to select the possible control signal, $u_{se}$, or to select a combination of possible control signals (e.g., a weighted average thereof) that minimizes the cost error or cost function. For instance, Equation 4 discussed later will present a detailed example of a cost function that can be used to select the best possible control signal, $u_{se}$, or best combination of possible control signals, $u_{se}$. Where processing resources are more limited, it may be preferable for the selector module 508 to select a best possible control signal, $u_{se}$. Where additional processing resources are available, the selector module 508 may select a best combination of possible control signals, $u_{se}$ (which may include selecting not only different combinations but different ways to combine the possible control signals, $u_{se}$). The combination or blending of multiple possible control signals, $u_{se}$, can be governed by a topology such as, but not limited to, a weighted average. In an embodiment, Equation 5 presents a detailed example of a means to combine possible control signals, $u_{se}$, via a complex weighted average. Other forms of combination or blending can include, but are not limited to, other types of averages, multiplication, summations, differences, divisions, integrals, derivatives, exponentials, complex functions, logarithms, series, statistical distributions, matrices, tensors, neural networks, nonlinear functions, graphs, maps, transformations, trees, or combinations thereof.

Whatever topology, or method of combining/blending is used to determine the control, $u_{out}$, is also used to estimate a total estimated system output, $y_{est\_out}$. Specifically, the selector module 508 determines a number and combination (or blending) of control law module 506 outputs (e.g., $u_{se}$ and/or $y_{est\_se}$) that minimizes the estimated system error, $\hat{e}_{out}$, or estimated system cost function, $J_{out}$. For instance, in a first iteration, a blending of three out of seven control law module 506 outputs may produce an total estimated system output $y_{est\_out}$ (or estimated output) that is closest to the reference signal r (that minimizes the estimated system error, $ê_{out}$), while in a second iteration, a blending of five out of seven control law module 506 outputs may produce a total estimated system output $y_{est\_out}$ that is closest to the reference signal r. Each of these represents a different topology and thus one sees that the selector module 508 may select a different topology for generating the control signal, $u_{out}$, and estimated system output, $y_{est\_se}$, at each iteration (e.g., using Equation 7, which largely mimics Equation 5).

The selected or blended control, $u_{out}$, is then passed to the one or more actuators (e.g., 308) and fed back to the adaptation law selector 502 as an input to the estimation law modules 506 for use in determining a next iteration of the control, $u_{out}$.

In some embodiments, one or more memory components (not shown), such as pipeline registers, can be arranged between the control law modules 506 and the selector module 508, such that possible control signals, $u_{se}$, and estimated system outputs, $y_{est\_se}$, can be temporarily stored, which either assists in parallelization in the selector module 508 or allows the selector module 508 to pull from previous outputs of the control law modules 506 when the adaptive engine 500 sees repeated input iterations (e.g., the same frame or reference signal repeats).

In some implementations, the selector module 508 can distribute the above-noted functionality between an optional control selector and combiner 516 ("CSC") and an optional topology selector and designer 518 ("TSD"). The TSD 518 can look at previous controls, $u_{out}$, and a total estimated system output, $y_{est\_out}$, for various topologies, and select a best topology, or the one most likely to, when applied in the selector module 508, lead to a control, $u_{out}$, that causes a measured system output, $y_{meas}$, that is close to the total estimated system output, $y_{est\_out}$, or the reference signal, r. For instance, the TSD 518 may analyze an estimated system cost function, $J_{out}$, such as Equation 4, to select an optimal possible control signal, $u_{se}$, or combination of possible control signals, $u_{se}$ (in the form of a topology for combining the possible control signals). The TSD 518 may provide this selection to the CSC 516, which dictates how selected possible control signals, $u_{se}$, are to be combined or blended in the CSC 516 (also referred to as applying the topology). For instance, the TSD 518 may provide a topology to the CSC 516, which looks at different topologies for combining or blending the possible control signals, $u_{se}$, in the CSC 516 (e.g., a weighted average), and determines a best topology. This topology may be embodied as a set of weights to be provided to the CSC 516, where the weights determine how possible control signals, $u_{se}$, are combined or blended. In some embodiments, the topology can include averaging, multiplication, summations, differences, divisions, integrals, derivatives, exponentials, complex functions, logarithms, series, statistical distributions, matrices, tensors, neural networks, nonlinear functions, graphs, maps, transformations, trees, to name a few non-limiting examples, or combinations thereof. Equation 5 presents one non-limiting example of applying a topology with weights, $w_{nj}$ and $w_{nn}$.

The CSC 516 in turn can estimate a total estimated system output, $y_{est\_out}$, based on the topology or weights and the total estimated system outputs, $y_{est\_se}$, and provide this estimate, $y_{est\_out}$, to the TSD 518 for use in determining a next iteration of the topology (e.g., in the cost function of Equation 4). Where the TSD 518 passes weights to the CSC 516, the CSC 516 can return weight-tuning values, w-tuning, to the TSD 518 that can be used to adjust weights in a next iteration.

Alternatively, these estimates, $y_{est\_se}$ and/or $y_{est\_out}$, can be provided to the TSD 518, which can determine a possible control signal, $u_{se}$, or combination of possible control signals, that minimizes a cost function relative to the measured system output, $y_{meas}$, and/or the reference signal, r. If the TSD 518 selects the best possible control signal, $u_{se}$, or combination thereof, the TSD 518 can send this selection back to the CSC 516 as a topology or set of weights. In turn, the CSC 516 can return weight-tuning values to the TSD 518 that can be used to adjust weights in a next iteration of topology selection.

In some embodiments, the selector module 508 can optimize the estimated system cost function, $J_{out}$, associated with topologies of the control laws implemented by the control law modules 506. It does this by considering the possible control signals, $u_{se}$, and finding a combination and means of combining them that optimizes the estimated system cost function, $J_{out}$. For instance, the estimated system cost function, $J_{out}$, may look at a difference or error between the reference signal, r, and a measured output, $y_{meas}$, or between the reference signal, r, and a total estimated system output, $y_{est\_out}$. In another instance, the estimated system cost function, $J_{out}$, can look at both of these errors, for instance, as presented in Equation 4:

$$J_{outk_p} = \left[ \begin{array}{c} |r_k - y_{est\_out_{k_p}}| \\ |r_k - y_{meas_k}| \end{array} \right] \quad \text{(Equation 4)}$$

Where k is a value representing the iteration being analyzed, $y_{est\_out\_k\_p}$, is an estimated total output of the controlled system based on a one of p topologies being analyzed, and the estimated system cost function, $J_{outk\_p}$, can be analyzed for each of the p topologies. The one of the p topologies resulting in the minimum estimated system cost function, $J_{outk\_p}$, is selected for generating the control $u_{out}$.

Each of the p topologies can involve a different weighted input of the estimated output, $y_{est\_se}$ from each of the control law modules. In some cases, this can be a weighted average of the control law module outputs, or a more complex mixing, such as multiplication of some outputs and summing of other outputs. The weights can be denoted, w (distinct from ω), and are the ones used in a previous iteration, k−1.

While it is possible to try every permutation of topologies, this would be highly resource-consuming, and thus a preferred method uses an optimization of the weights applied to the different control law module outputs to analyze the cost function of Equation 4.

Given the weights, the selector module 508 can generate a control signal, $u_{out}$, which in one embodiment, is given by the weighted sum shown in Equation 5:

$$u_{out} = (\Sigma_{n=1}^{N} \Sigma_{j=1}^{N} w_{nj} u_j) + (\Sigma_{n=1}^{N} w_{nn} u_{se_n}) \quad \text{(Equation 5)}$$

Where n is an index for the current possible control signal, $u_{se}$, and j is an index for all other possible control signal, $u_{se}$, and where N is a total number of control laws. For instance, N=3 or N=7 in two non-limiting embodiments. Recall that a control law is implemented by each control law module, so another way to describe n and j is that n represents the possible control signal, $u_{se}$, for a current control law module, and j represents the possible control signals, $u_{se}$, for all other control law modules. The weights, $w_{nj}$, and $w_n$ can be selected to minimize at each control sample, an estimated system error, $\hat{e}_{out}$, for instance as calculated via Equation 6:

$$|y_{meas} - y_{est\_out}| = |y_{meas} - (\Sigma_{n=1}^{N} \Sigma_{j=1}^{N} w_{nj} y_{est\_out_j}) + (\Sigma_{se=1}^{N} w_{nn} y_{est\_out_n})| \quad \text{(Equation 6)}$$

Those of skill in the art will appreciate that the estimated system error, $\hat{e}_{out}$ can be calculated in other ways. For instance, $y_{meas}$ can be replaced by r in some embodiments. From Equation 6 it can be seen that the total estimated system output, $y_{est\_out}$, can be given by Equation 7:

$$y_{est\_out} = (\Sigma_{n=1}^{N} \Sigma_{j=1}^{N} w_{nj} y_{est\_out_j}) + (\Sigma_{n=1}^{N} w_{nn} y_{est\_out_n}) \quad \text{(Equation 7)}$$

Equation 7 can be seen to nearly mimic Equation 5—in other words the topology applied to the possible control signals, $u_{se}$, is also applied to the estimates of total system output, $y_{est\_se}$. For both Equations 5 and 7, the weights, $w_{nj}$, and $\omega_n$ can be set to 1 for an initial iteration of the selector module 508, and in subsequent iterations, Equation 6 can be used to narrow in on more effective weights until the cost function in Equation 4 is minimized. Equation 5 can then be used to provide a control signal, $u_{out}$, from the selector module 508 based on the topology dictated by the optimized weights, $w_{nj}$, and $w_{nn}$.

Although not shown, the adaptive engine 500 can further include a CCS engine coupled to the selector module 508 that generates an exogenous signal, that tries to enforce coherency, consensus, and synchronization among the different potential control signals, $u_{se}$, based on the selected topology. In other words, the CCS engine provides an exogenous signal to the selector module 508 to smooth discontinuities that might arise as it switches between possible control signals, $u_{se}$. The CCS engine can $u_{se}$ the system output measurement, $y_{meas}$, and aspects of the input regressor, Ø, such as the reference signal, r, to determine the exogenous. It should be appreciated that the exogenous is calculated for and applied to each of the possible control signals, $u_{se}$. For instance, the exogenous can be a modifier of the weights applied to each possible control signal, $u_{se}$, when multiple possible control signals, $u_{se}$, are being combined or blended. For instance, in Equation 5, the weights, w, can be modified by the exogenous for each possible control signal, $u_{se}$. In some embodiments, the functionality of the CCS engine and the exogenous can be implemented in the w-tuning.

Figure 46:
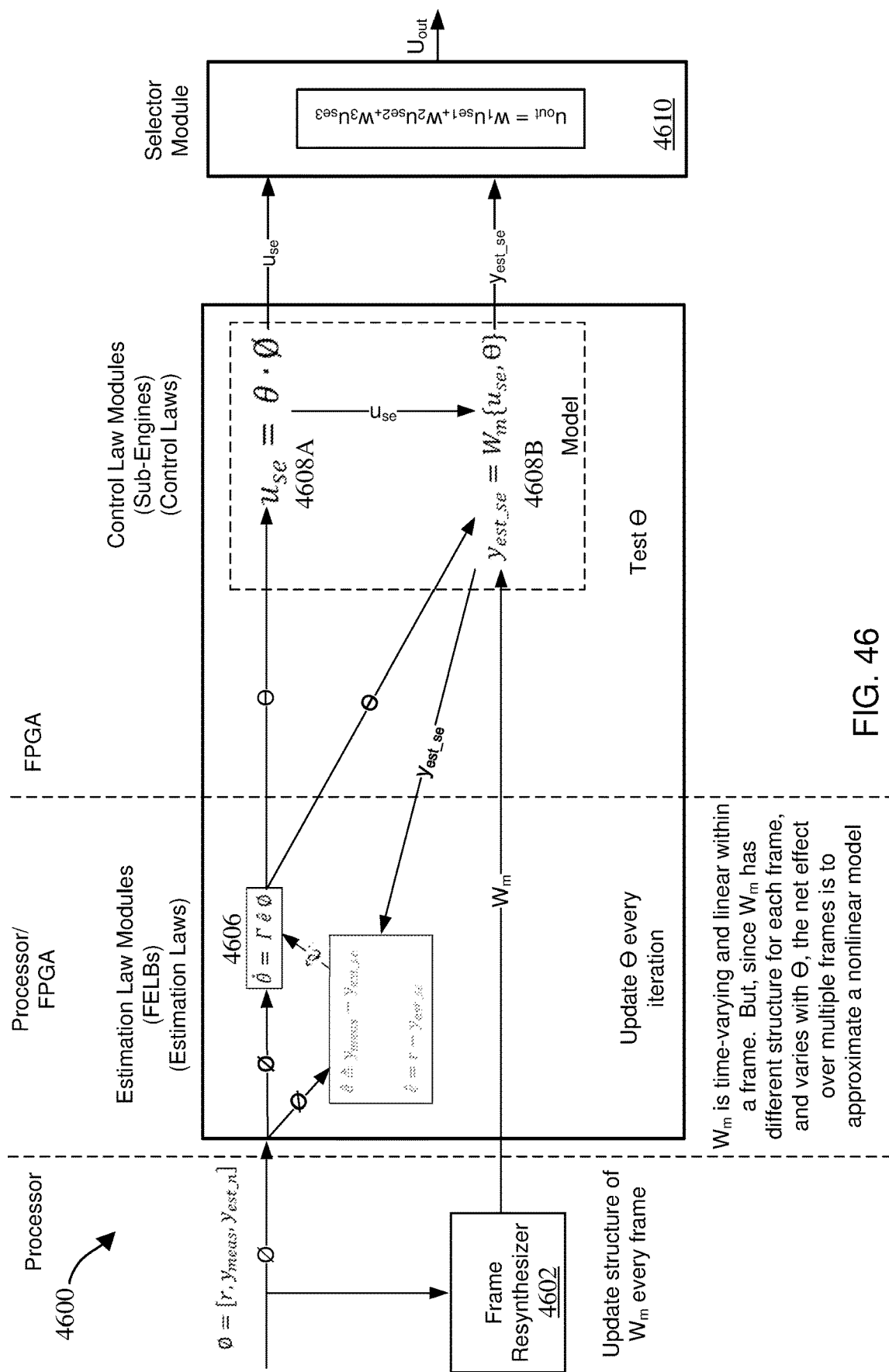
FIG. 46 shows an illustrative example of operation of an adaptive engine according to embodiments of this disclosure.

With a more detailed appreciation of the nonlinear model, the estimation laws, the estimation law modules, control laws and the control law modules, and the selector and combiner, an illustrative representation in FIG. 46 may further help explain these various aspects of the disclosure. FIG. 46 shows an illustrative example of operation of an adaptive engine according to embodiments of this disclosure. The adaptive engine 4600 enables multiple combinations of estimation and control laws to be combined and then a best combination or combinations are selected for $u_{se}$ in determining a control signal, $u_{se}$, for one or more actuators, such as the actuators described in FIG. 4. Inputs to the adaptive engine 4600 can include a reference signal, r, (e.g., a stream of setpoints), measurements of the system being controlled by the one or more actuators, $y_{meas}$, and an estimated system output as determined by the adaptive engine 4600 in a previous iteration. These and other inputs can be concatenated or stored in tensor form, as input regressor, Ø. Thus, one sees that the adaptive engine 4600 at the most basic level, takes an input regressor, Ø, and produces a control signal, $u_{out}$. But the adaptive engine 4600 also achieves this using unique bifurcation of duties such that parallelization is optimized, and certain calculations are pre-processed, or processed at lower speeds, while others are calculated in real-time. For instance, the nonlinear model of the actuator(s) and/or system controlled by the actuator(s) can be difficult to describe in one or even a small series of equations. Instead, the nonlinear model is broken into frames of sample points and for each frame, the nonlinear model is approximated by a time-varying linear system, $W_m$, that is based on the estimated model parameter tensor, Θ, and is adapted through the frame until the time-varying linear system, $W_m$, represents an accurate approximation of the nonlinear behavior for that frame (i.e., when θ becomes constant for multiple control samples or iterations). In this way, the model approximates the nonlinear nature of the actuator(s) and/or system, while easing the processing burden of control by using a linear approximation that is adapted toward the nonlinear system behavior with every iteration of Θ. More specifically, for each frame of sample points, a frame resynthesizer 4602, selects a structure of a time-varying linear system, $W_m$, (i.e., which elements in a given frame's $W_m$ matrix or matrices are ones and zeros). Alternatively, the structure of the time-varying linear system for each frame can be selected by a designer based on empirical study of the actuator(s) and system. Either way, for the sample points of a given frame, a time-varying linear model is used that approximates the nonlinear behavior while converging on that nonlinear behavior via adaptation of Θ. In other words, any unpredicted or averaged out nonlinear behavior is approximated through the "theta" parameter adaptation at every control sample.

The engine 4600 can include various estimation law modules 4606, though only one is shown in this abbreviated illustration. The estimation law module 4606 applies an estimation law, such as $\dot{\theta} = \Gamma \hat{e} \emptyset$, to estimate a best value for the parameters (estimated model parameter tensor, Θ) of the nonlinear model, or more specifically, the linearized version of the nonlinear model for the given frame. Each estimation law, not just the one shown, is a function of an error, ê, or a cost function, J. Whichever one is used, the error or cost function is a function of two or three of the following: (1) reference signal, r; (2) measured system output, $y_{meas}$, from a previous iteration or previous control sample; and (3) estimated system output, $y_{est\_se}$, for a previous iteration or previous control sample. Where the estimated system output, $y_{est\_se}$, is used in the error or cost function, this prediction can come from a prediction portion of the model 4608B. In other words, the estimation law module 4606 adapts the estimated model parameter tensor, Θ, every iteration. Since the frame resynthesizer, or the designer, selects a new time-varying linear system of the nonlinear model for every frame, it can be said that the time-varying linear system, $W_m$, of the model is adapted every frame, and the model is further adapted by changes to the estimated model parameter tensor, Θ, for each iteration or control sample. In other words, adaptation of the model is bifurcated into faster and slower portions—a fast portion based on adaptation of Θ and a slower portion based on adaptation of the time-varying linear system, $W_m$. The illustrated estimation law is based on the input regressor, Ø, and the adaptation gain, Γ, though other estimation laws can be functions of similar or different values (e.g., not including the adaptation gain, Γ, and/or being a function of a filtered version of the input regressor, Ø).

Integrating the illustrated estimation law gives the estimated model parameter tensor, Θ, and once this tensor is estimated, it can be passed to the model 4608, which has two parts: a control portion for determining $u_{se}$ and an estimation portion for determining $y_{est\_se}$, both of which are functions of the estimated model parameter tensor, $\Theta$. Both can also be based on versions of the input regressor or a filtered version thereof, such as, but not limited to, $\omega$ and $\psi$. As shown, the estimation portion of the model 4608B is also a function of the time-varying linear system, $W_m$, of the linearized version of the model, however, an alternative sees the control portion depending on the time-varying linear system, $W_m$. Both portions of the model can be parameterized or parametric. These two portions of the model exhibit duality as they are related through the same model 4608. The control law module is also referred to earlier in this disclosure as a sub-engine, and various sub-engines present differing uses of the model 4608, though ultimately, they all rely on similar inputs to those shown in this illustration, and each sub-engine typically produces a possible control signal, $u_{se}$, and an estimated system output, $y_{est\_se}$.

Both portions or forms of the model 4608A and 4608B "test" the estimated model parameter tensor, $\Theta$, to see how well the estimate performs. This operation in the control law module also produces (1) the possible control signal, $u_{se}$, which is passed to the second form of the model 4608B, and (2) the estimate of the system response/measurement, $y_{est}\_se$, which may $u_{se}$ the time-varying linear system, $W_m$, in some variations, that the frame resynthesizer 4602 or designer has selected for the entire frame.

These two outputs of the model 4608 are passed to the selector module 4610, which selects a best one or a best combination of $u_{se}$ from the various combinations of estimation law modules and control law modules (only one combination is shown) to produce the control, u(t, for the iteration or control sample.

The estimation law module 4606 and control law module loop 4608 in this fashion for a number of iterations or control samples to "adapt" the estimated model parameter tensor, $\Theta$ (or adapt the linearized form of the model) within the current frame. As the adapted model converges on the nonlinear behavior of the system, the estimated model parameter tensor, $\Theta$, will become nearly constant (i.e., see little $\Delta$ as additional iterations occur) as will the time-varying linear system, $W_m$, that depends on the estimated model parameter tensor, $\Theta$. At the end of a frame, the frame resynthesizer (or the designer's lookup table) calculates a new structure of the time-varying linear system, $W_m$, for the linearized form of the nonlinear model, and passes the new structure to the model 4608 to start another series of adaptations of the estimated model parameter, $\Theta$.

Operations of the adaptive engine 4600 can also be bifurcated between a processor and an FPGA. In particular, the processor can compute the structure of the time-varying linear system, $W_m$, once per frame or pre-process various structures for various expected sets of inputs. The FPGA, with its lower latency, can attend to sample-by-sample (real time) calculations of ê, J, $\Theta$, $u_{se}$, and/or $y_{est\_se}$, for each iteration or control sample. In this way, the whole of the adaption engine 4600 can be bifurcated across a processor and an FPGA, or similar components.

Details of Control Law Modules/Sub-Engines

The following sections describe details of various exemplary control law modules or sub-engines, though this list is not limiting. One or more of these sub-engines can be implemented independently from the other sub-engines, and in some embodiments even stand on their own independent from the rest of the adaptive engine. For instance, each sub-engine can be implemented without the herein disclosed estimation law modules or selector module. In other embodiments, less than all of the herein disclosed sub-engines need be implemented. For instance, what will be called a TLMC (or Lyapunov) sub-engine uses the Lyapunov framework which leads to stable outputs in fast dynamic situations and those where large amounts of adaptation are needed. In other words, the TLMC creates a stable control law by ensuring that sensitivity functions do not exhibit abrupt variations and are stable by construction. For these cases, the TLMC sub-engine can be implemented, selected, or given priority in the blending of possible control signals, $u_{se}$. However, this TLMC sub-engine can be slow to converge and is not particularly well-suited for unstable zero dynamics. Accordingly, a second sub-engine or TARC, can be implemented, selected, or given priority in the blending of possible control signals, $u_{se}$, as this sub-engine quickly converges to a target metric and/or optimize an amount of energy used (e.g., a minimum rail voltage to achieve a setpoint). The TARC creates fast and stable control laws by reformulation of the control problem such that some quantities can be pre-computed on a CPU leading to faster and more robust real-time operation. Additionally, the TARC allows a designer to specify the speed and amount of stability desired in addition to characterizing the control actuators that are to do the heavy lifting and the ones that are to do lesser lifting. So, for instance, the selector module may choose between and possibly blend possible control signals, $u_{se}$, from a TLMC and TARC sub-engine. An embodiment using these two sub-engines would provide some coverage for stable and unstable zero-dynamics without any other sub-engines.

However, the TARC sub-engine can become unstable when the adaptive engine is perturbed and/or increases or decreases of the control, $u_{out}$, are too granular to achieve performance that has "converged" and thus the control, $u_{out}$, becomes oscillatory. Examples of perturbations include, but are not limited to, a limiting loop, or a small change in plasma process chemistry). Oscillatory action may happen where the convergence is too large, but the error from a target parameter is too small to merely increase the adaptation gain—the result being an oscillatory control, $u_{out}$. So, the TARC can be implemented, selected or have the most influence on the control, $u_{out}$, for stable and un-stable zero-dynamics, and the TLMC can be implemented, selected or have the most influence on the control, $u_{out}$, when stable adaption is desired (at the sacrifice of convergence speed).

Yet, neither of these sub-engines are well-suited for unstable zero-dynamics, where higher speeds and smaller unknown disturbance rejection is preferred. For these situations, a third sub-engine, the L1 sub-engine, may be implemented, selected or have priority in a blending of possible control signals, $u_{se}$. The L1 sub-engine is configured to provide a fast and robust possible control signal, $u_{se}$, without output chattering by using a sliding mode predictor in conjunction with carrying adaptation based on how different the prediction (not the estimate) is from a smoothed system output measurement, $y_{meas}$.

However, all of the first three sub-engines suffer from slower speeds in situations where expert rules exist (e.g., tricks of the trade picked up through years of trial and error), so a fourth sub-engine, the adaptive proportional-integral-derivative (PID), can be implemented, selected or have the most influence on the control, $u_{out}$, in these situations using known PID rules. The PID sub-engine generalizes and formats the estimation laws so that PID rules can be applied to the outputs of the estimation law modules.

But, where there is not a-priori knowledge about the system dynamics and where large disturbances exist (e.g., an abrupt change in process chemistry or changing chamber pressure, gas flow, or thermal conditions or anything that would cause a large change in plasma impedance), or where the system is oscillatory, a fifth sub-engine, the ATIMC sub-engine can be implemented, selected or have the most influence on the control, $u_{out}$. The ATIMC sub-engine creates a control law in different parts by subtracting specific effects of disturbances, nonlinearities, dither, and noise in a compartmentalized manner rather than lumping these together.

However, there are operating regions where none-of-the-above sub-engines are ideal, or outlier cases where superior empirically derived control rules exist, and for these a sixth sub-engine, or ATFC sub-engine can be implemented, selected or given priority in the possible control signals, $u_{se}$, blending. The ATFC sub-engine uses fuzzy logic design rules that are qualitative rather than quantitative.

One should note that nothing in the literature describes how to carry out any of these sub-engines for MIMO and nonlinear systems or even SISO linear systems in a way that actually fits in real-time (e.g., ≤250 ns) systems with minimal resource consumption.

The TLMC or Lyapunov Sub-Engine

FIG. 10A shows an embodiment of an adaptive engine focusing on details of a Lyapunov control law module or Lyapunov sub-engine (also called a TLMC control law module or sub-engine). The adaptive engine 1000 includes at least one estimation law module 1002, a control law module or sub engine 1005, and a selector module 1008. As with previous adaptive engines discussed herein, the estimation law module 1002 takes an input regressor, Ø, and estimates a model parameter tensor, Θ, for a nonlinear model of the actuators and/or system (e.g., a plasma processing system). The estimated model parameter tensor, Θ, is determined for most estimation laws using at least a portion of the input regressor, Ø, and an estimation error, ê, or cost function, J, either of which can be written in various forms, but typically comprise some combination of two or more of the measured system output, $y_{meas}$, an estimated system output for a given control law module, $y_{est\_se}$, and a reference signal, r. Typically, the measured system output, $y_{meas}$, and the estimated system output, $y_{est\_se}$, are for a previous iteration and thus in some cases can be written as $y_{meas}(k-1)$ and $y_{est\_se}(k-1)$. Said another way, each estimation law module estimates an estimated model parameter tensor, Θ, that minimizes an estimation error, ê, or cost function, J.

The estimated model parameter tensor, Θ, is then used by the nonlinear model in the Lyapunov sub-engine 1005 to generate a possible control signal, $u_{se}$, and to estimate an estimated system output, $y_{est\_se}$, both of which are then used by the selector module 1008 to select a best one or best combination of possible control signals as the control, $u_{out}$. Although only a single estimation law module 1002, and a single corresponding possible control signal, $u_{se}$, and estimated system output, $y_{est\_se}$, are shown, the Lyapunov sub-engine 1005 can take estimated model parameter tensors, Θ, from multiple estimation law modules 1002, and produce multiple pairs of $u_{se}$ and $y_{est\_se}$ (one for each estimation law module 1002).

The estimated model parameter tensor, Θ, is passed to the control law module or sub engine 1005, in this case, the Lyapunov sub-engine 1005, which passes the estimated model parameter tensor, Θ, through a nonlinear model of the system and/or actuators to produce a possible control signal, $u_{se}$, and an estimated system output, $y_{est\_se}$. Specifically, a control portion 1016 of the nonlinear model produces the possible control signal, $u_{se}$, and an estimation portion 1018 of the nonlinear model produces the estimated system output, $y_{est\_se}$.

More particularly, the Lyapunov sub engine 1005 takes the (1) input regressor, Ø, which may include at least the reference signal, r, and the control from the previous iteration, $u_{out}$, and (2) the estimated model parameter tensor, Θ, and performs a tensor multiplication 1012 on these inputs. More specifically, the tensor multiplication 1012 implements a version of the first control law where the input regressor, Ø, is not modified before tensor multiplication 1012:

$$u_{se} = \Theta \cdot \varnothing \quad \text{(Control Law 1A)}$$

However, and as will be discussed in depth later, the Control Law 1A using ω instead of Ø can be used where the sub-engine 1005 of FIG. 10B is implemented and some modification of Ø to get ω occurs. More specifically, in Control Law 1A, ω overlaps with but is not identical to Ø. In particular, ω is a concatenation that can include some form of $u_{out\_k-1}$, $y_{meas}$, and r (i.e., often components of Ø). For instance, one or more of these values can be filtered before being concatenated into ω. For instance, ω may equal $[u_d, y_d, y_{meas}, r]$ where $u_d$ and $y_d$ are filtered or smoothed versions of $u_{out}$ and $y_{meas}$, respectively. See FIG. 10B for a more specific implementation of ω replacing Ø.

The input regressor, Ø, can include inputs that correspond to the output parameters to be controlled (and thus the estimated model parameter tensor Θ). These inputs can include, but are not limited to, the reference signal, r, the measured system output, $y_{meas}$, the control from the previous iteration, $u_{out}$, and in some cases the estimated system output, $y_{est\_se}$, for the Lyapunov sub-engine 1005. For Model 1, the control portion 1016 multiplies the input regressor, Ø, including the control signal from the previous iteration, $u_{out}$, and the estimated model parameter tensor, Θ. For instance, if the input regressor, Ø, includes r and $y_{meas}$, then the estimated model parameter tensor, Θ, will include Θ values for r and $y_{meas}$. More specifically, if Ø=[r, $y_{meas}$, $u_{out}$], then Θ=[$\Theta_r$, $\Theta y_{meas}$, $\Theta_{uout}$]. Accordingly, for this example, the possible control signal would be $u_{se}=\theta\varnothing=$[r, $y_{meas}$, $u_{out}$] [$\Theta_r$, $\Theta y_{meas}$, $\Theta_{uout}$]=$r\Theta_r + y_{meas}\Theta y_{meas} + u_{out}\Theta_{uout}$ and this matrix multiplication takes place in the tensor multiply 1012. The estimation portion 1018 multiplies the time-varying linear system, $W_m$, and the output of the control portion, the possible control signal, $u_{se}$. Where Model 2 is used, the tensor multiplication 1012 sees the control portion 1016 multiply the time-varying linear system, $W_m$, by the total estimated system output, $y_{est\_out}$, or the measured system output, $y_{meas}$. Similarly, the estimation portion 1018 multiplies Θ and Ø.

One might recognize that Control Law 1A is the control portion of Model 1 referred to earlier. An example control law is not presented to correspond to Model 2, but it can be said that the Lyapunov sub-engine 1005 can implement Models 1 or 2 without other modifications, whereas subsequent sub-engines may implement either model, but with modifications to achieve different control goals.

Once the control portion 1016 has calculated $u_{se}$, it can $u_{se}$ the possible control signal, $u_{se}$, to calculate the estimated system output, $y_{est\_se}$ via the estimation portion 1018 of the nonlinear model. In this embodiment, the tensor multiply 1012 can be thought of as implementing the two forms of the model (control and estimation forms) to test the guesses for Θ, which produces $u_{se}$ and $y_{est\_se}$ for this iteration. The resulting $u_{se}$ and $y_{est\_se}$ can be passed to the selector module 1008, that provides a total system control, or control, $u_{out}$, as a best of the possible control signals, $u_{se}$, or a best combination or blending of two or more of the possible control signals, $u_{se}$ (e.g., a weighted average, multiplication, or summation). This calculation can be based on the estimated system outputs, $y_{est\_se}$, from the Lyapunov sub-engine 1005 and all other sub-engines. For instance, a total estimated system output $y_{est\_out}$ can be calculated for various combinations or topologies of $y_{est\_se}$, and the topology leading to a total estimated system output $y_{est\_out}$ that is closest to r or $y_{meas}$ (i.e., a smallest estimated system error, $ê_{out}$, or estimated system cost function, $J_{out}$.) is used to select or combine possible control signals, $u_{se}$.

Thus completes a single iteration of sub-engine 1005 operation. The control, $u_{out}$ can be fed back as part of the next input regressor, Ø, and the time-varying linear system, $W_m$, can be adapted via changing Θ over multiple iterations in this manner until $W_m$ converges on the actual nonlinear system behavior (i.e., the unknown nonlinear portion of $W_m$ is minimized). This can continue until a new frame, at which point a new structure of the time-varying linear system, $W_m$, is provided to the estimation law module 1002 and/or the tensor multiply 1012, and adaptation of Θ within this next frame begins.

Although not explicitly shown, the control signal $u_{out}$ is fed back to the input regressor, Ø, and may be provided to the estimation law module 1002 and/or the sub-engine 1005. The estimated system output, $y_{est\_se}$, can also be passed back to the estimation law module 1002 for $u_{se}$ in determining the next iteration of Θ. One or both of these can be stored in memory along the way, such as a TSP-RAM.

Because a generator or match or any other system to be controlled may include nonlinearities, for instance associated with analog to digital conversion or digital to analog conversion (e.g., quantization effects) and hardware actuator nonlinearities (e.g., slew rate, saturation, windup, deadtime, dead zone, hysteresis, etc.), to name just a few examples, the Lyapunov sub-engine 1005 can optionally include a nonlinear transfer function(s) 1013. When 1013 is implemented, the tensor multiply 1012 can produce what will be called ideal or desired outputs, $u_{desired}$ and $y_{est\_ideal}$, which will then be transformed into $u_{se}$ and $y_{est\_se}$ in the nonlinear transfer function(s) 1013. The hardware nonlinearities can be characterized during the design stage and a parameterized dynamic model of these nonlinearities, and their effects can be hardwired or programmed into the nonlinear transfer function(s) 1013, such that:

$$u_{se} \triangleq (u_{desired} + f(\text{nonlinear}))g(\text{nonlinear}) \quad \text{(Equation 8)}$$

$$y_{est\_se} \triangleq (y_{est\_ideal} + f(\text{nonlinear}))g(\text{nonlinear}) \quad \text{(Equation 9)}$$

While this embodiment implements both the control and estimation portions of the nonlinear model in the tensor multiply 1012, in an alternative embodiment, the estimation portion of the nonlinear model can be implemented in the estimation law module 1002. In this case, $y_{est\_se}$ or $y_{est\_ideal}$ will be calculated in the estimation law module 1002 based on the input regressor, Ø, the estimated system parameter tensor, Θ, and a previous iteration of the possible control signal, $u_{se}$. The estimated system output, $y_{est\_se}$, is then passed to the selector module 1008 as described above, or the $y_{est\_ideal}$ is then passed to the nonlinear transfer function(s) 1013 as shown in FIG. 10A and as described above. For further details of this variation where the estimation portion of the model is used by the estimation law module 1002, refer to FIGS. 5B and 8B.

To further improve accuracy and the speed of convergence, FIG. 10B presents a variation of FIG. 10A where the derivative of the estimated model parameter tensor, Θ, is also used. In particular, the control portion of the nonlinear model, or Control Law 1A, can be written in terms of Θ and its derivative as Control Law 1B as follows:

$$u_{se} = [\theta, \dot{\theta}][\Omega] = \theta\omega + \dot{\theta}\chi \quad \text{(Control Law 1B)}$$

And the estimation law module 1002 can calculate both the estimated model parameter tensor, θ, and its derivative, θ'. These can both be passed to the tensor multiply 1012. However, instead of the input regressor, Ø, being the other input to the tensor multiply 1012, tensor Ω is the second input in the tensor multiply 1012. Said another way, the tensor multiply 1012 performs $u_{se} = [\theta, \theta'] \cdot \Omega$. To get to Control Law 1B, or the control portion of the nonlinear model, the input regressor, Ø, is split up and the system output measurement, $y_{meas}$, and the control signal from a previous iteration, $u_{out}$, are passed through smoothing filters 1020. The smoothed versions of $y_{meas}$ and $u_{out}$ can be referred to as $y_d$ and $u_d$. The smoothing filters 1020 can apply, for instance, a minimum group/phase delay persistent excitation, which can produce noise free signals and/or derivatives of the inputs to the filters 1020. The reference signal, r, and the non-smoothed system output, $y_{meas}$, can then be passed to a tensor concatenation 1022 along with the smoothed values, $y_d$ and $u_d$, to produce a concatenated tensor ω (where ω=[r, $y_{meas}$, $y_d$, $u_d$]). The concatenated tensor w can be passed through another set of smoothing filters 1024 (which can be the same as the smoothing filters 1020 in some embodiments), to obtain χ. The χ tensor can take the filtered value of ω and insert 0's where appropriate. This can be understood as the process having a relative degree when discussing single-in-single-out (SISO) transfer functions. Subsequently, ω and χ can be concatenated in tensor concatenation 1026, and the tensor multiply 1012 performs the Control Law 1B or $u_{se} = \theta\omega + \dot{\theta}\chi$. In other words, regardless of the relative degree of the system, its nonlinearities, and/or its MIMO status, this use of χ allows generic application. Once the $W_m$ structure is selected for a frame, the χ tensor takes on the filtered values from ω and depending on the relative order, fills out some entries with 0's. The remainder of each iteration is carried out as described relative to FIG. 10A.

To enhance the $u_{se}$ of processing resources, the estimation law module 1002 and parts of the sub-engine 1005 can operate in parallel. For instance, determination of the estimated model parameter tensor and its derivative, [θ, $\dot{\theta}$], can be carried out in parallel to determine the ω, χ, and Ω tensors. More specifically, the sub-engine 1005 in a first FPGA cycle can calculate ω, while the estimation law module 1002 begins to determine the estimated model parameter tensor and its derivative, [θ, $\dot{\theta}$]. In a second FPGA cycle, the sub-engine 1005 can determine χ and Ω while the estimation law module 1002 finishes determining the estimated model parameter tensor and its derivative, [θ, $\dot{\theta}$]. In a third FPGA cycle, the tensor multiply 1012 can multiply the estimated model parameter tensor and its derivative, [θ, $\dot{\theta}$], and Ω to produce the $u_{desired}$ and the $y_{est\_ideal}$. In a fourth FPGA cycle, the nonlinear transfer functions 1013 can convert the $u_{desired}$ and the $y_{est\_ideal}$ to the $u_{se}$ and the $y_{est\_se}$, and in a fifth FPGA cycle the selector module 1008 can produce the control signal, $u_{out}$, from the outputs of the multiple sub-engines 1005. This cycle rate can lead to a 6× oversampling/resource sharing/streaming factor and between 5-25 MHz control rate in some embodiments. However, slower control rates, such as lower than 5 MHz can achieve an 8× to 32× oversampling/resource sharing/streaming factor. These lower control rates and higher oversampling factors can lower hardware usage (e.g., as low as 5% FPGA usage).

Figure 47:
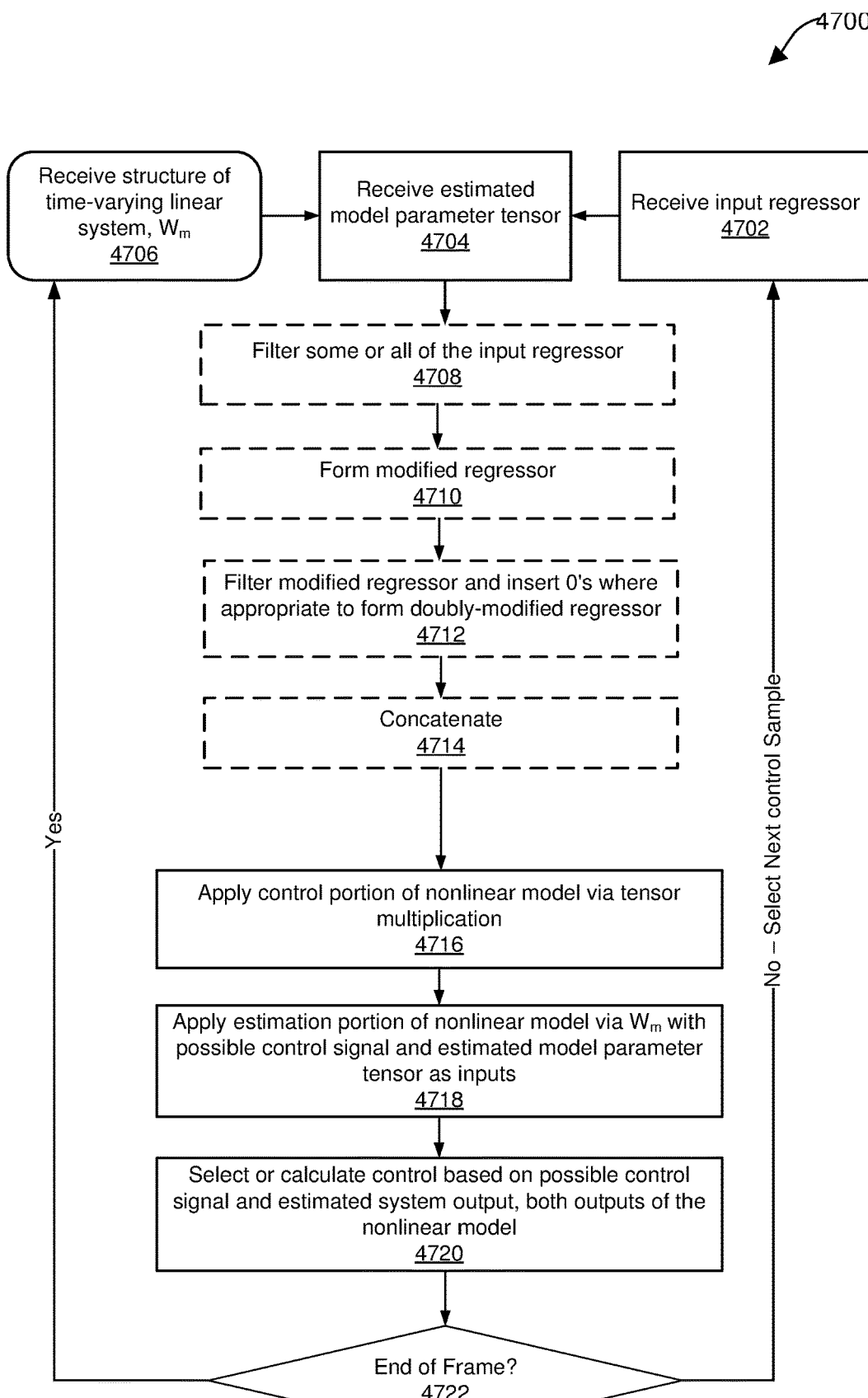
FIG. 47 illustrates a method of operating a sub-engine such as the Lyapunov sub-engine

FIG. 47 illustrates a method of operating a sub-engine such as the Lyapunov sub-engine. The method 4700 comprises receiving an input regressor, Ø (Block 4702), and an estimated model parameter tensor, Θ (Block 4704), for a nonlinear model of the one or more actuators and/or the power system controlled by the one or more actuators. The input regressor, Ø, can include inputs that correspond to the output parameters to be controlled (and thus the estimated model parameter tensor Θ). These inputs can include, but are not limited to, the reference signal, r, the measured system output, $y_{meas}$, the control from the previous iteration, $u_{out}$, and in some cases the estimated system output for the sub-engine, $y_{est\_se}$. The estimated model parameter tensor, Θ, may be estimated, for instance by one of the estimation law modules previously discussed, or may be accessed from an empirically derived lookup table. For instance, if the Lyapunov sub-engine operates independently to control one or more actuators, an estimation law module may not be available, in which case, the estimated model parameter tensors, Θ, can be found via experimentation and stored in a lookup table that the Lyapunov sub-engine can access based on one or more of a reference signal, r, a control, $u_{out}$, from a previous iteration, and measurements of the system output, $y_{meas}$, from a previous iteration. The method 4700 further comprises receiving a structure of a time-varying linear system, $W_m$ (Block 4706) that is part of a nonlinear model. The time-varying linear system, $W_m$, can have a structure that is pre-calculated in a frame resynthesizer and then newly passed to the Lyapunov sub-engine every frame or can be accessed from an empirically derived lookup table at every frame. The time-varying linear system, $W_m$, can depend on the estimated model parameter tensor, Θ, and thus can change or adapt every iteration or control sample. However, it can have a structure that remains the same through a given frame, but changes from frame to frame. Thus, the frame-to-frame changes in structure account for large changes in the nonlinear system behavior, while adjustments to Θ and hence the time-varying linear system, $W_m$, within a frame, account for small nonlinear system behaviors. The method 4700 can optionally perform certain filtering operations on one or more components of the input regressor, Ø (optional Block 4708) and concatenate parts of the input regressor with the new filtered tensors to form a modified regressor, ω (optional Block 4710). These optional steps can be embodied by the components 1020 and 1022, respectively, seen in FIG. 10B. The modified regressor, ω, can optionally be further filtered to form a doubly modified regressor, χ, where 0's can be inserted into χ, where appropriate depending on the relative order of $W_m$ (optional Block 4712). The modified regressor, ω, and the doubly modified regressor, χ, can be concatenated, to form a final tensor, Ω (optional Block 4714). These last two optional blocks can be embodied by the components 1024 and 1026, respectively, see in FIG. 10B. These optional blocks allow the method 4700 to by applied generically to systems regardless of their relative degree, nonlinearities, and/or MIMO status. To either the input regressor, Ø, or the final tensor, Ω, the method 4700 can apply a control portion of the nonlinear model by tensor multiplication of the estimated model parameter tensor, Θ, and the input regressor, Ø (or optionally the final tensor, Ω) (Block 4716). This calculates a possible control signal, $u_{se}$. The method 4700 can also apply an estimation portion of the nonlinear model by using the possible control signal, $u_{se}$, and the estimated model parameter tensor, Θ, as inputs to the time-varying linear system, $W_m$, to estimate an estimated system output, $y_{est\_se}$ (Block 4718). The estimated system output, $y_{est\_se}$, can then be used to determine how the possible control signal, $u_{se}$, influences a control output, $u_{out}$, (Block 4720), which is configured for controlling the one or more actuators and/or the system controlled by the one or more actuators (Block 4722).

Although not illustrated, the Lyapunov sub-engine can operate as a standalone controller. In such an embodiment, the estimation law modules can be replaced by an empirically derived lookup table for the estimated model parameter tensor, Θ. More specifically, a lookup table can be empirically formed as a mapping between (1) $y_{meas}$ and $u_{out}$ from a reference/calibration system and (2) estimated model parameter tensors, Θ. During operation of the Lyapunov sub-engine as a standalone controller, a control, $u_{out}$, can be provided to the one or more actuators, and measurements, $y_{meas}$, can be taken from the one or more actuators and/or system. These can then be used to select an estimated model parameter tensor, Θ, from the lookup table, and then provided to the Lyapunov standalone controller to determine what will be called a control signal, $u_{out}$. This control signal, $u_{out}$, can be provided to the one or more actuators. Alternatively, the Lyapunov standalone controller can produce a string of possible control signals, $u_{se}$, and form a control, $u_{out}$, as a combination of the string. For instance, a weighted average of the possible control signals, $u_{se}$, can be used to calculate the control, $u_{out}$, although other methods of combining the string can also be implemented. In some embodiments, the combination may be based on estimated system outputs, $y_{est\_se}$, for each of the possible control signals, $u_{se}$, similar to the way in which a topology is selected in the selector and combiner mentioned earlier. These estimated system outputs, $y_{est\_se}$, can be found via an estimation portion of the nonlinear model, for instance, using Model 1:

$$y_{est\_se} = W_m\{u_{se}, \Theta\}$$

Where the estimated model parameter tensor, Θ, is found in the lookup table based on the measured system output, $y_{meas}$, and the control, $u_{out}$, both from a previous iteration.

The Tensor Adaptive Tracking and Regulation Control (TARC) Sub-Engine

The Lyapunov sub-engine (i.e., the TLMC sub-engine described above) is designed to operate in a multitude of conditions and with relatively large adaptation gains Γ, $\Gamma_1$, $\Gamma_2$, etc., recalling that Γ is the adaptation gain tensor. In some circumstances, however, the Lyapunov sub-engine may not be the most optimal for adaptive control. For example, the Lyapunov sub-engine may not be the most optimal when the non-linear system being controlled has unstable zero dynamics (e.g., non-minimum phase for a single input single output or SISO linear system). Aspects of the present disclosure are directed to a control law sub-engine (herein referred to as the Tensor Adaptive Tracking and Regulation Control or TARC sub-engine) that is configured to work in conjunction with the Lyapunov control law sub-engine and any of the other control law sub-engines described herein to optimize the control signal(s) provided to the actuator(s) of the non-linear system being controlled. In some embodiments, the TARC sub-engine can also operate independent of any other sub-engines and may therefore be referred to as a TARC controller.

By supporting parallel processing, the TARC control law sub-engine is designed to optimize the use of the Tensor Signal Processing (TSP) hardware resources of the adaptive engine. Additionally, or alternatively, the TARC control law sub-engine also facilitates in the use of internal model control (IMC) principles. Broadly, IMC refers to a control design where the reverted input/output (I/O) model of the process/system being controlled is included within the controller. Said another way, IMC systems are characterized by a control device consisting of the controller and of a simulation of the process being controlled (i.e., the internal model). The internal model computes the difference between the outputs of the process and of the internal model, where the difference represents the effect of disturbances and/or of a mismatch of the internal model. The disclosed TARC control law sub-engine may facilitate in smoother waveforms and/or faster settling times, as compared to the prior art, through the use of an IMC scheme, an adaptive inverse control scheme, or a combination thereof.

In some embodiments, the TARC control sub-engine is configured to manage both desired process performance and efficiency, for instance, when the rail and drive frequency are being controlled simultaneously. In such cases, the TARC control sub-engine is designed to prevent error transmission buildup by incorporating a matrix (or tensor), where the matrix is used to place weights on the control signals whose amplitudes are to be minimized. In some aspects, the TARC control law sub-engine enables the use of weighted control signals in a manner similar to Linear Quadratic Control (LQC) schemes.

In some embodiments, the adaptive engine may be augmented with the TARC and TLMC control law sub-engines, as well as other control law sub-engines described later in the disclosure. In this way, the adaptive engine may select the most optimal control law sub-engine for a particular situation (or the most optimal combination of control law sub-engines). In some examples, the adaptive engine compares the estimated error (or estimation error) associated with the different control law sub-engines to determine which of the control law sub-engines should be used. For instance, the adaptive engine may select the possible control signal produced by one of the plurality of control law sub-engines based on determining that the control law sub-engine is associated with the lowest estimation error (i.e., highest estimation accuracy). Said another way, the adaptive engine (e.g., a selector module) may select a one or combination of possible control signals, $u_{se}$, that lead to a control, $u_{out}$, that causes a measured system output, $y_{meas}$, that is close to the total estimated system output, $y_{est\_out}$, or the reference signal, r. This may involve an error or cost function that compares the measured system output, $y_{meas}$, for a previous iteration, or the reference signal, r, to the total estimated system outputs, $y_{est\_out}$, calculated for various possible topologies. More specifically, the TSD 518 may analyze a cost function, such as Equation 4, to select an optimal possible control signal, $u_{se}$, or combination of possible control signals, $u_{se}$ (in the form of a topology for combining the possible control signals).

In the case of stable zero-dynamics, the TARC control law sub-engine attempts to achieve the desired performance in the shortest time possible and/or with minimal control efforts (e.g., minimal/optimized energy use, minimal/optimal use of controller hardware resources, to name two non-limiting examples). In some cases, for instance, when the TARC control law sub-engine is predicted to cause stability issues, the TLMC control law sub-engine (or any other control law sub-engine) may take over. Once the predictions associated with the TARC control law sub-engine stabilize, the adaptive engine may switch from the TLMC back to using the possible control signal(s) provided by the TARC to control the non-linear system.

As described in further detail below, the TARC control law sub-engine allows for a high level of parallelization by deploying multiple control law modules on parallel paths. The TARC control law sub-engine comprises two or more control law modules (e.g., an adaptive inverse laws or AIL control law module, an eigen control law module, a penalty control law module) that can be implemented in parallel, where the parallel implementation enables one or more of oversampling, resource sharing/streaming, and pipelining. Such a design may serve to optimize hardware resource usage. In some examples, several FPGA clock cycles may be used to collect data which is then passed as a single stream of data, herein referred to as "resource streaming". In some aspects, this serves to reduce the length of the critical path of the system, which may or may not be at the cost of FPGA clock cycles. However, since several FPGA clock cycles can usually be fit within one control clock cycle, such a design has negligible effect on the control output speed.

Figure 11A:
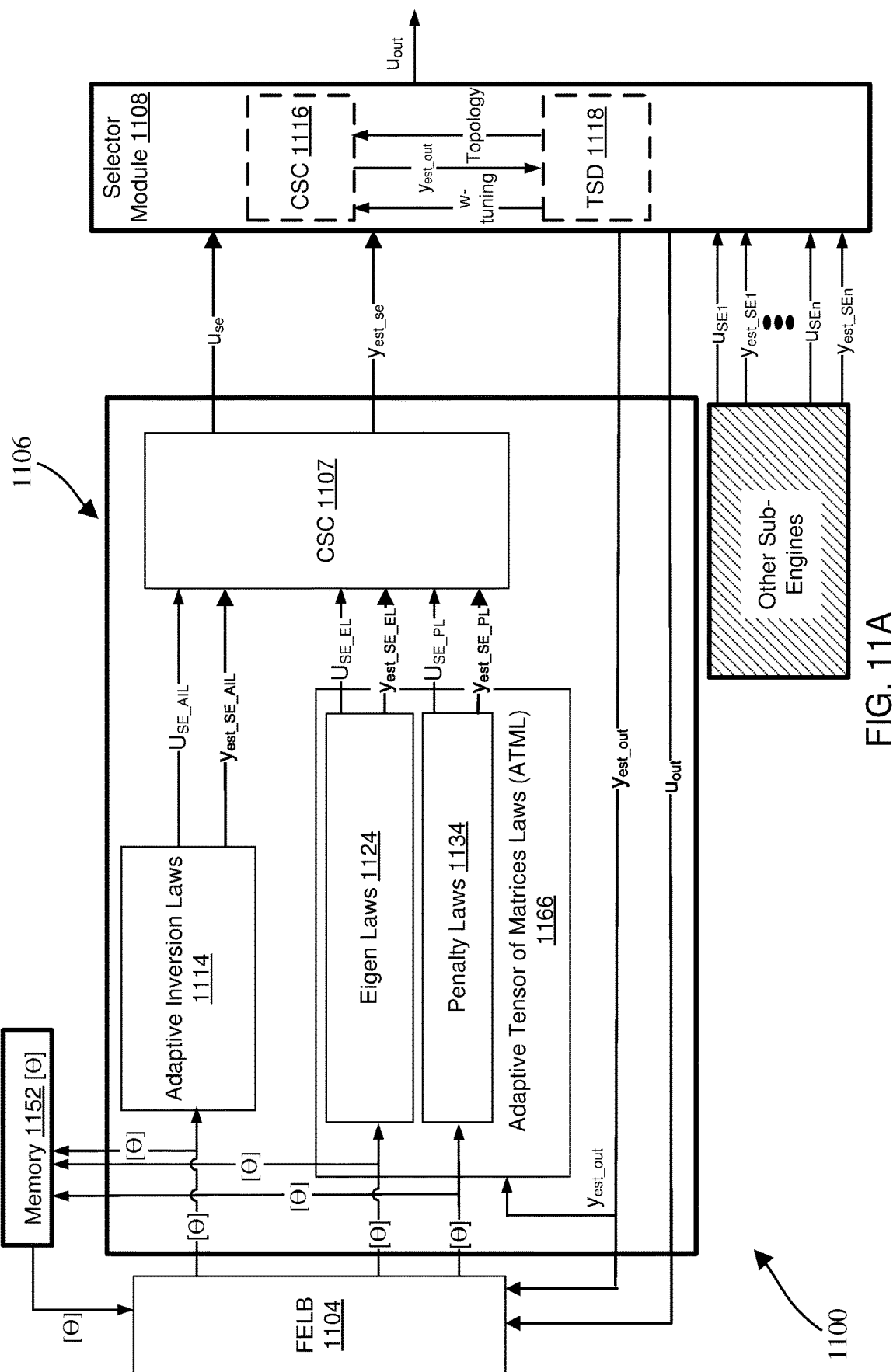
FIG. 11A depicts an example of an adaptive engine implementing a TARC control law sub-engine, according to various aspects of the disclosure.

FIG. 11A depicts an example of an adaptive engine 1100, according to various aspects of the disclosure. As seen, the adaptive engine 1100 comprises an estimation law module 1104 (also referred to as FELB 1104) and a control law sub-engine 1106, where the control law sub-engine 1106 includes a plurality of control law modules. In this example, the control law sub-engine 1106 comprises an Adaptive Inversion Laws (AIL) module 1114 and an Adaptive Tensor of Matrices Laws (ATML) module 1166, where the ATML module 1166 comprises an Eigen Laws (EL) module 1124 and a Penalty Laws (PL) module 1134. It is contemplated that the AIL module 1114, the EL module 1124, and the PL module 1134 may be referred to as the control law modules of the control law sub-engine 1106. The control law sub-engine 1106 further comprises a control selector/combiner (CSC) 1107, where the CSC 1107 is configured to receive a possible control signal from each of the control law modules and output a final possible control signal (e.g., $u_{se}$) for the adaptive engine 1100. The adaptive engine 1100 further includes a selector module 1108, where the selector module 1108 includes another control selector/combiner (CSC) 1116 and an optional topology selector and designer (TSD) 1118. The CSC 1116 and the TSD 1118 may be similar or substantially similar to the CSC 516 and the TSD 518 previously described in relation to FIG. 5.

Figure 11B:
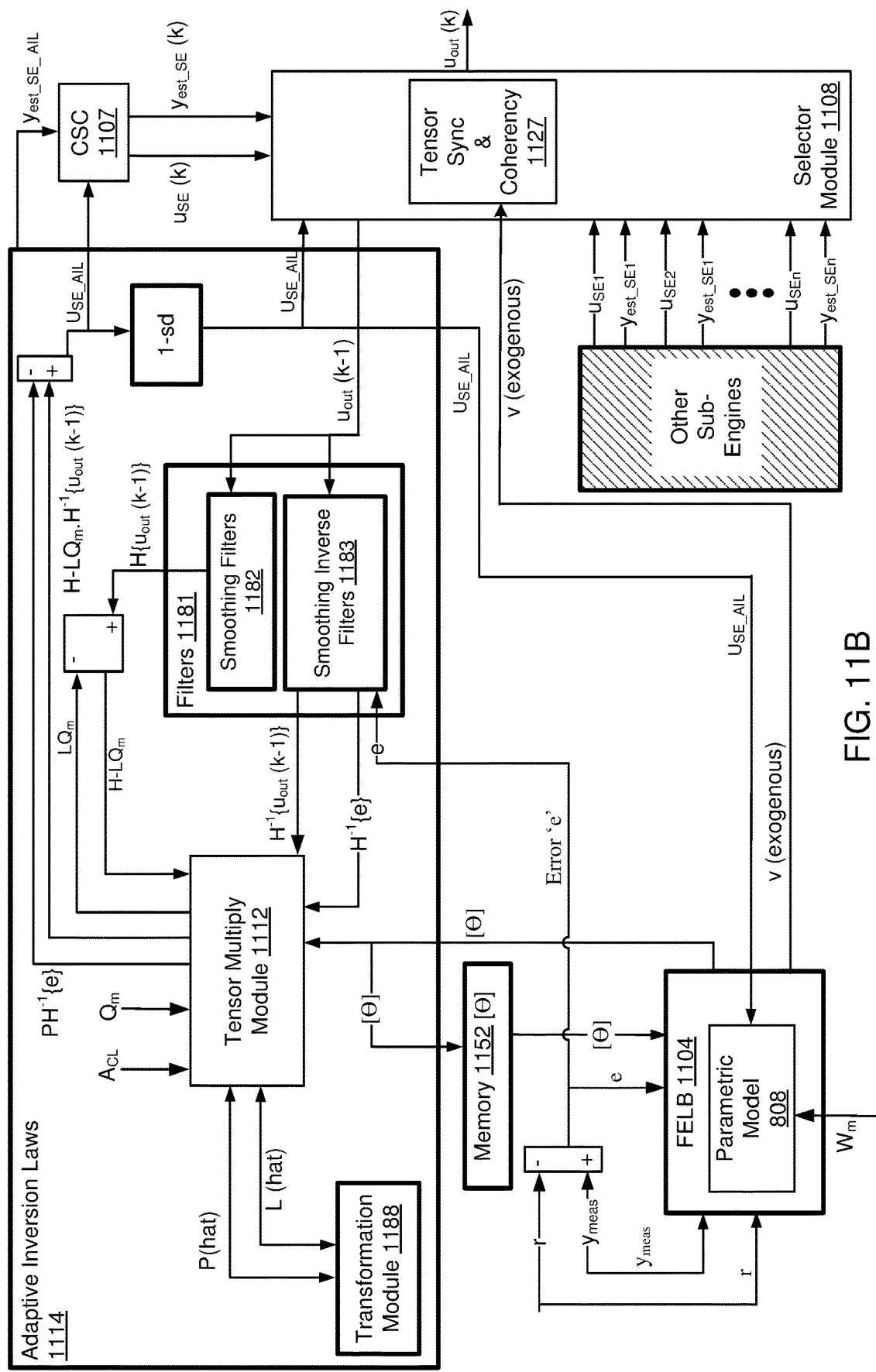
FIG. 11B illustrates a detailed view of an Adaptive Inverse Laws (AIL) control law module of the TARC control law sub-engine in FIG. 11A, according to various aspects of the disclosure.
Figure 11C:
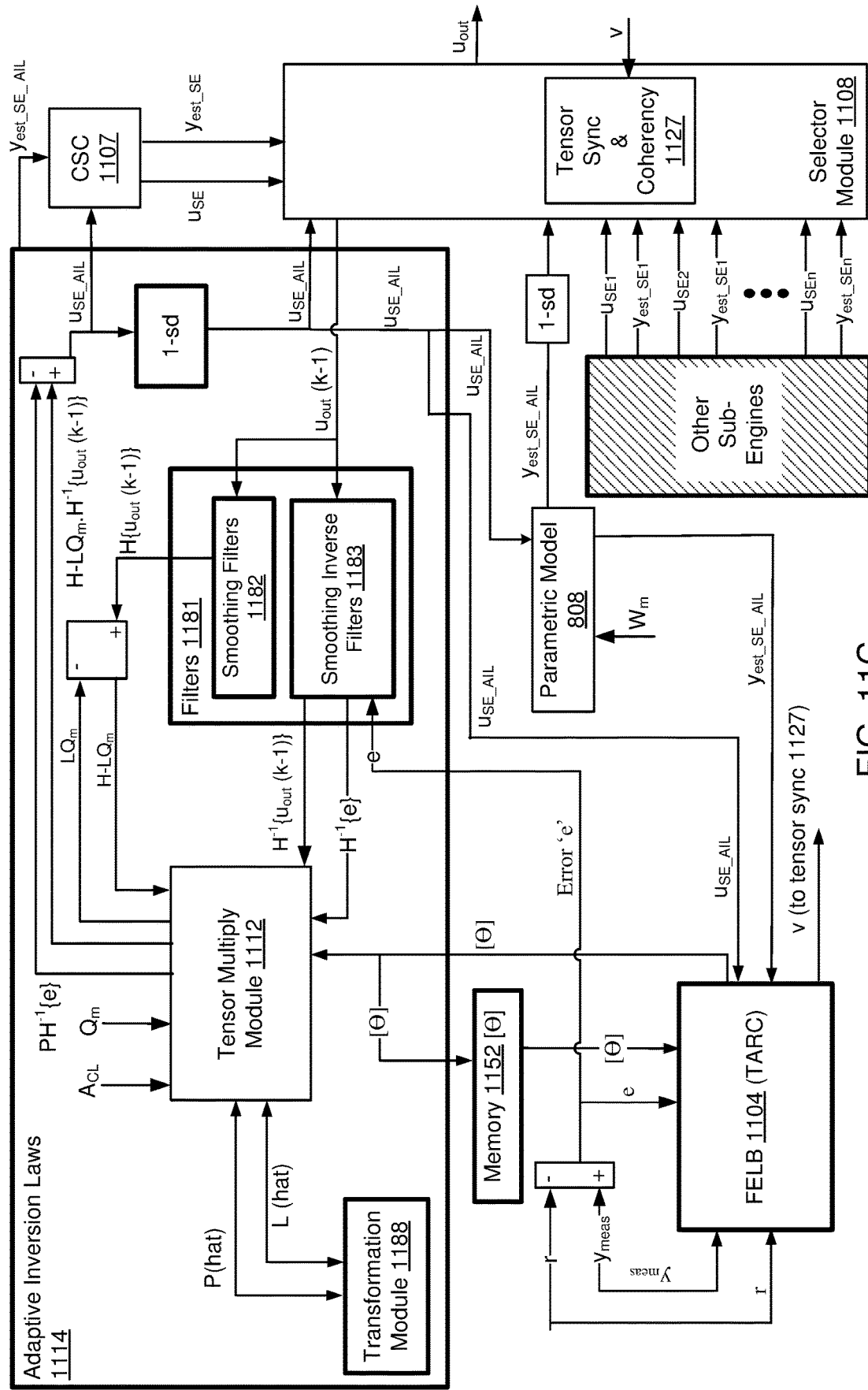
FIG. 11C illustrates an alternate view of an Adaptive Inverse Laws (AIL) control law module of the TARC control law sub-engine in FIG. 11A, according to various aspects of the disclosure.

Similar to some of the other estimation law modules (or FELBs) described herein, the FELB 1104 is configured to receive an input regressor, apply one or more estimation laws to the input regressor, and produce one or more sets of estimated parameter tensors, $\Theta$, for a non-linear (NL) model of the one or more actuators and/or the system controlled by the one or more actuators. In some cases, the input regressor comprises one or more of (1) a setpoint stream (also referred to as a reference signal), r, (2) a system output measurement, $y_{meas}$, and (3) a control output, $u_{out\_k-1}$, from a previous iteration. In some examples, the estimation portion 808 of the nonlinear model (which is a parameterized nonlinear model) is stored and/or executed on the FELB 1104, as depicted in FIG. 11B. In other cases, the estimation portion 808 is stored and/or executed at the control law sub-engine. In either case, the estimation portion 808 is configured to produce a plurality of possible estimated system outputs, $y_{est\_SE}$, based upon a control input. The control input(s) used to produce the possible estimated system output(s) may be based in part on the location of the estimation portion 808. In some instances, the control input fed to the estimation portion 808 includes a previous iteration of the possible control signal, $u_{SE\_k-1}$ (or $u_{se\_k-1}$), for the adaptive engine 1100. In some other cases, the control input fed to the estimation portion 808 includes a current iteration, $u_{SE\_k}$, of the possible control signal. In yet other cases, the control input fed to the estimation portion 808 includes an actual control signal ($u_{out\_k-1}$) for a previous iteration, i.e., the actual/output control signal applied to the one or more actuators and/or the system controlled by the one or more actuators. In some cases, this actual/output control signal is the final control output signal computed by the selector module 1108.

As seen in FIG. 11A, the FELB outputs a plurality of estimated parameter tensors [Θ], one for each of the AIL module 1114, the EL module 1124, and the PL module 1134. In some examples, the FELB 1104 may output a single estimated parameter tensor that is fed to each of the three control law modules. In some instances, the plurality of estimated parameter tensors [Θ] may be stored in tensor memory 1152 of the adaptive engine. The control law modules are configured to output a possible control to the CSC 1107, which then outputs the possible control signal ($u_{SE}$) and the estimated system output ($y_{est\_SE}$) corresponding to the adaptive engine 1100 to the selector module 1108. The selector module 1108 also receives one or more other possible control signals ($u_{SE1}$, $u_{SE2}$, etc.) and estimated system outputs ($y_{est\_SE1}$, $y_{est\_SE2}$, etc.) from one or more other control sub-engines (or control law modules). In some cases, the CSC 1107 outputs one of, or a combination of, the possible control signals received from the control modules of the control law sub-engine 1106. As seen, the CSC 1107 receives a possible control signal (e.g., $u_{SE\_AIL}$, $u_{SE\_EL}$, $u_{SE\_PL}$) and an estimated system output (e.g., $y_{est\_SE\_AIL}$, $y_{est\_SE\_PL}$, $y_{est\_SE\_EL}$) from each of the AIL control law module 1114, the EL control law module 1124, and the PL control law module 1134 and outputs a single $u_{SE}$ and $y_{est\_SE}$ to the selector module 1108. In other words, the $u_{SE}$ and $y_{est\_SE}$ provided to the selector module 1108 may be one of the possible control signals and estimated system outputs, or alternatively, a combination of the possible control signals and estimated system outputs received by the CSC 1107.

In an embodiment, the AIL 1114, the Eigen Laws 1124, and the Penalty Laws 1134, can produce the estimated system output (e.g., $y_{est\_SE\_AIL}$, $y_{est\_SE\_PL}$, $y_{est\_SE\_EL}$) using an estimation portion of the nonlinear model. More specifically, the system model or nonlinear model can be provided with a control portion, for generating possible control signals, $u_{se}$, and an estimation portion for estimating estimated system outputs, $y_{est\_se}$. A time-varying linear system, $W_m$, can make up a foundation of either the estimation portion or the control portion, and can be bifurcated or split into a sum of a linear and a nonlinear portion and the control timeline can be split into frames of differing lengths (or number of control samples or adaptation iterations) with some processing of the nonlinear model occurring on a CPU or other slower resource and real-time aspects of the nonlinear model occurring on an FPGA or other faster resource. A current frame can be supplied with a structure of the time-varying linear system, $W_m$. As noted relative to FIG. 43, the nonlinear portion of the time-varying linear system, $W_m$, is effectively an unknown error and thus not used or considered in the processing (other than in attempt to minimize this error). The structure of the time-varying linear system, $W_m$, can be pre-processed, for instance on a CPU, though it can also be accessed from an empirically-derived lookup table. The structure of the time-varying linear system, $W_m$, remains constant through the current frame. Yet, since the time-varying linear system, $W_m$, is also dependent on the estimated model parameter tensor, Θ, the estimation portion of the nonlinear model adapts within a frame as Θ changes in the FELB 1104 (as the adaptive engine modifies Θ to minimize an error relative to measured system behavior). This can involve calculating an estimation error, ê, or cost function, J, based on two or more of (1) measured system outputs, $y_{meas}$, from a previous iteration, (2) estimated system outputs, $y_{est\_se}$, from a previous iteration, and (3) reference signal, r. Adaption can then involve applying an estimation law to at least the reference signal, r, and the estimation error, ê, or cost function, J, to estimate an estimated model parameter tensor, Θ. The estimated model parameter tensors, Θ, can then be tested in the AIL 1114, Eigen Laws 1124, and the Penalty Laws 1134, and adaptation can continue through the entirety of the frame, and in turn, $W_m$, is adapted throughout the frame (or until convergence is achieved). Once a frame is complete the method selects a next frame and a new structure of the time-varying linear system, $W_m$, is provided into the model and adaptation of the estimated model parameter tensor, Θ, is carried out through this next frame until convergence. As noted earlier, the structure of the time-varying linear system, $W_m$, can include the structure of the A, B, and C matrices that are part of the system of equations making up $W_m$.

Turning now to FIG. 11B, which illustrates a detailed view of the AIL control law module 1114, in accordance with one or more implementations. As seen, the AIL control law module 1114 comprises filters 1181, where the filters 1181 include smoothing filters 1182 and smoothing inverse filters 1183. The AIL control law module 1114 further comprises a transformation module 1188 and a tensor multiply module 1112. In this example, the FELB 1104 comprises the estimation portion 808 (which can implement the time-varying linear system, $W_m$). As seen, the FELB 1104 is configured to receive an input regressor, where the input regressor includes (1) the setpoint stream, r, (2) the system output measurement, $y_{meas}$, (3) an error signal, ê, where the error signal is based on a difference between the setpoint stream and the system output measurement, and/or (4) a possible control signal, $u_{SE\_AIL}$, for the AIL control law module 1114. While not necessary, the possible control signal, $u_{SE\_AIL}$, may correspond to a possible control signal from a current control iteration. The FELB 1104 is configured to calculate a first set of estimated parameter tensors, [Θ], for the nonlinear model based on applying one or more estimation laws to the input regressor. In this example, the FELB 1104 provides the first set of estimated parameter tensors [Θ] to the tensor multiply module 1112.

The tensor multiply module 1112 is electronically, communicatively, and/or logistically coupled to the filters 1181, the memory 1152, the transformation module 1188, and the FELB 1104. Further, the tensor multiply module 1112 is configured to receive a tensor (ACL), where the ACL tensor is the tensor of time-varying linear system representation of the desired arbitrary non-linear waveform desired by the user as the output of the non-linear/chaotic generator/match/chamber plasma system. Additionally, or alternatively, the tensor multiply module 1112 also receives an internal model ($Q_m$), where the internal model, $Q_m$, represents the desired/reference plasma process performance. In some examples, $Q_m$ may be the filtered version of $W_m$. In some cases, the tensor multiply module 1112 receives one or more of the $A_{CL}$ and the $Q_m$ from the FELB 1104 (or another component of the adaptive engine 1100). The smoothing filters 1182 and the smoothing inverse filters 1183 are configured to receive the control output, $u_{out\_k-1}$, from the previous iteration and the error signal, ê, respectively. In some cases, the smoothing inverse filters 1183 may also receive the control output, $u_{out\_k-1}$, from the previous iteration, where the previous iteration's control output is received from the selector module 1108. The smoothing inverse filter 1183 provides an inverse filtered version of the error signal, $H^{-1}\{e\}$, and an inverse filtered version of the previous iteration's control output, $H^{-1}\{u_{out\_k-1}\}$, to the tensor multiply module 1112.

In some examples, the AIL control law module 1114 is configured to form a Matrix Tensor (e.g., a Sylvester matrix tensor) from the first set of estimated model parameter tensors, [Θ], received from the FELB 1104. This Sylvester matrix tensor is then passed through a tensor pseudo-inverse block, which carries the pseudo-inverse operation on every Sylvester matrix in all tensor dimensions. The Sylvester matrices are used to condense the estimated model parameters (Θ's) of the $\hat{A}$, $\hat{B}$ matrices into a 2n×2n matrix for each input and each time sample, leading to a tensor for these matrices. In some other cases, the Sylvester matrices are used to condense the estimated model parameters (Θ's) the estimated coefficients (e.g., $a_{est}$ and $b_{est}$, described later in the disclosure) of the nonlinear model into a 2n×2n matrix for each input and each time sample.

In some cases, the tensor multiply module 1112 applies a tensor multiplication between $A_{CL}$ and the pseudo-inverse of the Sylvester matrices tensor to obtain the tensor of matrices $\hat{P}$ and $\hat{L}$. $\hat{P}$ and $\hat{L}$ may represent a linear algebraic transformation (also known as diffeomorphism) and may be used to compute the adaptive control law. In one non-limiting example, the tensor multiply module 1112 passes the tensor of Sylvester matrices and $A_{CL}$ to the transformation module 1188, which then computes the tensor of matrices, $\hat{P}$ and $\hat{L}$, and passes them back to the tensor multiply module 1112.

$$\{\hat{P},\hat{L}\}=T\{\text{pinv}(S)A_{CL}\} \quad \text{(Equation 10)}$$

In equation (10), 'S' is a tensor of Sylvester matrices and 'T' represents a linear algebraic transformation.

After receiving $\{\hat{P}, \hat{L}\}$ from the transformation module 1188, the tensor multiply module 1112 carries out a tensor (or matrix) multiplication between P and the inverse filtered error signal, $H^{-1}\{e\}$. Further, the tensor $Q_m$, which is the internal model representing the desired/reference plasma process, is tensor multiplied with L. In some cases, the tensor $Q_m$ is the filtered variation of the tensor $W_m$, where $W_m$ is a time-varying linear system used in the nonlinear model, and typically in the estimation portion of the non-linear model. In some cases, a structure of the time-varying linear system, $W_m$, may be pre-calculated in a frame resynthesizer or accessed from an empirically-derived lookup table. Further, the same time-varying linear system, $W_m$, may be used for all iterations of a given frame, and then changed for a next frame. In some examples, the possible control signal, $u_{SE\_AIL}$, produced by the AIL control law module 1114 may be calculated as shown in equation (11) below:

$$u_{SE\_AIL}=[H\{u_{out\_k-1}\}-\hat{L}Q_m]H^{-1}\{u_{out\_k-1}\}-\hat{P}H^{-1}\{e\} \quad \text{(Equation 11)}$$

In some cases, the adaptive engine 1100 also computes one or more of the possible control signals, $u_{SE\_PL}$ and $u_{SE\_EL}$, corresponding to the penalty laws module 1134 and the eigen laws module 1124, respectively. For example, the TARC adaptive engine utilizes the adaptive tensor of matrices laws (ATML) module 1206 to compute an estimated output error, $\hat{e}_{out}$, which is then used to compute the possible control signals for the Eigen and Penalty control laws modules.

Figure 13A:
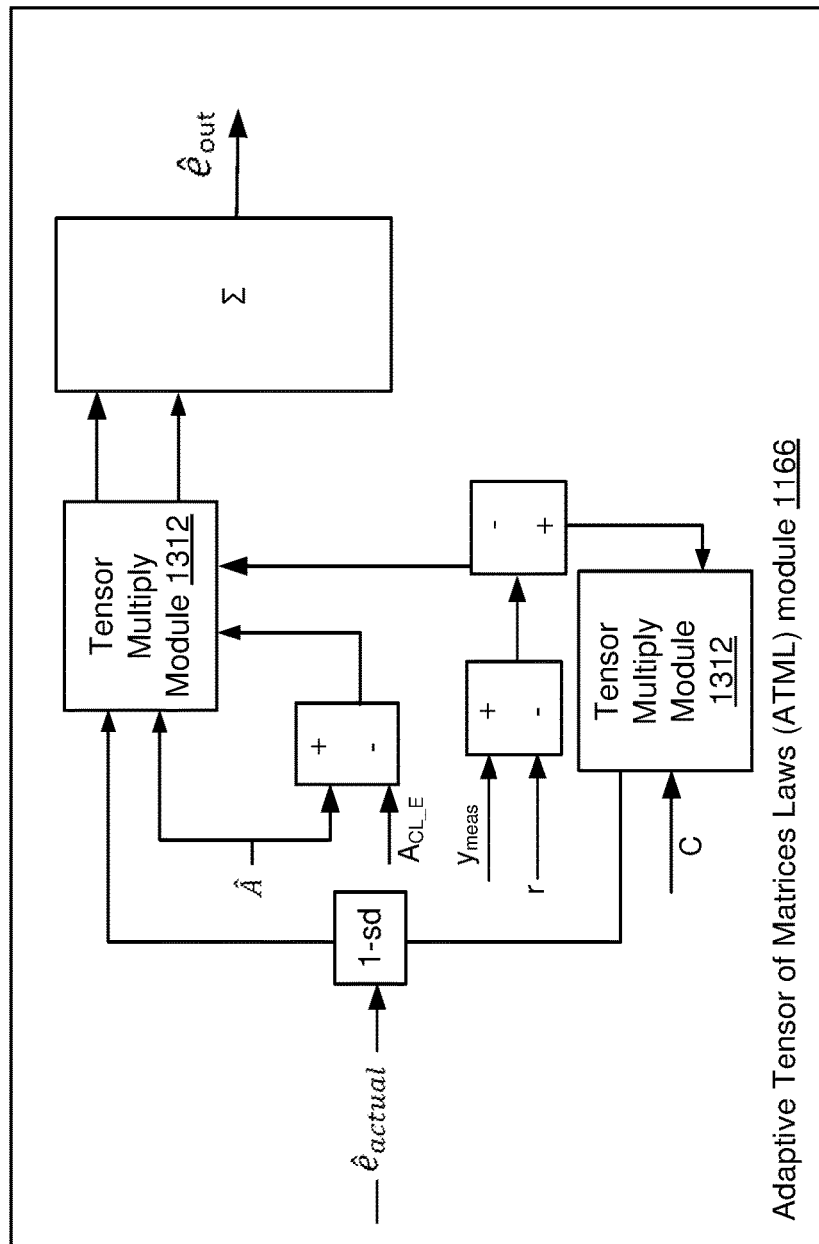
FIG. 13A illustrates a pre-computation block of the ATML module of the TARC control law sub-engine, in accordance with one or more implementations.

FIG. 13A illustrates a pre-computation block 1300-a of the ATML module 1166, in accordance with one or more implementations. In some cases, the ATML module 1166 may be similar or substantially similar to the ATML module 1166 previous described in relation to FIG. 11A. As seen, the pre-computation block 1300-a comprises one or more tensor multiply modules 1312, a sample delay (e.g., 1 sample delay, shown as 1-sd), and one or more summers.

As noted above, the adaptation and estimation laws module (shown as FELB 1104 in FIG. 11A) produces a plurality of sets of estimated parameter tensors, Θ, based on applying the one or more estimation laws to an input regressor, where the input regressor includes one or more of (1) the estimation error, $\hat{e}_{actual}$, (2) the control output from the previous iteration, $u_{out\_k-1}$, (3) $Q_m$, (4) time-varying linear system, $W_m$, (5) reference signal or setpoint stream, r, (6) measured output, $y_{meas}$, and (7) estimated parameter tensors Θ for the previous iteration.

In some cases, the system estimation model may be represented using a linear time varying (LTV) representation (or the time-varying linear system, $W_m$). The LTV representation of the system estimation model may be updated every time sample, which enables modeling the non-linearities, chaotic and dynamic nature, etc., of the non-linear system being controlled to a high degree of precision. In some cases, Equations (12) and (13) represent the LTV representation of the system estimation model:

$$\dot{\hat{x}}=\hat{A}(t)\hat{x}(t)+\hat{B}(t)u_{out}(t), \quad \text{(Equation 12)}$$

$$\hat{y}(t)=C\hat{x}(t), \quad \text{(Equation 13)}$$

The Initial Condition (IC) in equations (12) and (13) is given as $\hat{x}(0)=x_0$.

Further, the matrices $\hat{A}(t)$, $\hat{B}(t)$, and C(t) may be represented (in observer form) as follows:

$$\hat{A}(t) = \begin{bmatrix} \vec{\theta_{a_1}}(t) \\ \vdots \\ \vec{\theta_{a_n}}(t) \end{bmatrix} \begin{bmatrix} 1 & \cdots & 0 \\ \vdots & \ddots & \vdots \\ 0 & \cdots & 1 \\ & 0 & \end{bmatrix} \quad \text{(Equation 14)}$$

$$\hat{B}(t) = [\vec{\theta_{a_n}}(t) \; \vec{\theta_{b_1}}(t) \; \vec{\theta_{b_2}}(t) \; \cdots \; \vec{\theta_{b_{m-1}}}(t) \; \vec{\theta_{b_m}}(t)] \quad \text{(Equation 15)}$$

$$C(t) = I_{n \times n} = \begin{bmatrix} 1 & \cdots & 0 \\ \vdots & \ddots & \vdots \\ 0 & \cdots & 1 \end{bmatrix} \quad \text{(Equation 16)}$$

In Equations 14-16 above, 'n' is the order of the system representation (e.g., $1^{st}$ order, $2^{nd}$ order, $4^{th}$ order, etc.). Further, 'm' is the number of control inputs/actuators in the non-linear system being controlled. Some non-limiting examples of the control inputs/actuators being controlled include drive, rail, frequency, matching network first configuration/position, matching network second configuration/position, etc. In some cases, 'I' is a n×n identity matrix (or alternatively, an identity tensor). Thus, $\hat{A}(t)$ is a matrix or tensor of dimension "n×n", $\hat{B}(t)$ is a matrix or tensor of dimension "n×m", and C(t) is an identity matrix/tensor of dimension "n×n".

The pre-processing block (i.e., pre-computation block 1300-a) of the ATML module 1166 is configured to map the set of estimated parameter tensors, Θ, received from the FELB 1104 for each of the eigen and penalty control laws modules to the matrices $\hat{A}(t)$ and $\hat{B}(t)$ as follows:

$$\theta=[\theta_a,\theta_b]=\theta(t)=[\theta_a(t),\theta_{b_1}(t),\theta_{b_2}(t),\ldots\theta_{b_m}(t)] \quad \text{(Equation 17)}$$

The pre-computation block 1300-a then computes the estimated output error, $\hat{e}_{out}$, for the ATML block as follows:

$$\hat{e}_{out_k}=(\hat{A}(t)\hat{e}_{out_{k-1}})+(\hat{A}-A_{CL_E})[C\hat{e}_{out_{k-1}}-(y_{meas}-r)] \quad \text{(Equation 18)}$$

Specifically, the tensor multiply module 1312 tensor multiplies $\hat{A}(t)$ and C(t) with the actual estimation error for the previous iteration, $\hat{e}_{out_{k-1}}$, to produce (1) $\hat{A}(t)\hat{e}_{out_{k-1}}$, and (2)

$C(t)\hat{e}_{out_{k-1}}$. Further, the measurement error, ê, which corresponds to a difference between the measured output, $y_{meas}$, and the reference signal, r, is calculated. This measurement error, ê, given by $|y_{meas}-r|$ is subtracted from $C(t) \hat{e}_{actual_{k-1}}$ to produce:

$$C(t)\hat{e}_{actual_{k-1}}-(y_{meas}-r) \quad \text{(Equation 19)}$$

Next, the pre-computation block 1300-a computes $\hat{e}_{out}$ (shown in equation 18) based on computing the difference between equations (20) and (21) shown below:

$$\hat{A}(t)\hat{e}_{out_{k-1}} \quad \text{(Equation 20)}$$

$$(\hat{A}-A_{CL_E})[C\hat{e}_{out_{k-1}}-(y_{meas}-r)] \quad \text{(Equation 21)}$$

In the equations 18-21 above, $A_{CL_E}$ represents the observer form tensor of a matrix representation of the Eigenvalues, where the Eigenvalues correspond to the speed of the estimation law module/estimator (i.e., how fast the estimator is designed to be). In some aspects, this design is similar to the filtering time-constants of the smoothing filters H{·}. In some examples, the pre-computation block 1300-a is configured to compute the estimated output error for the tensor of the plurality of estimation law outputs (e.g., if all the estimation laws are being used).

Figure 13B:
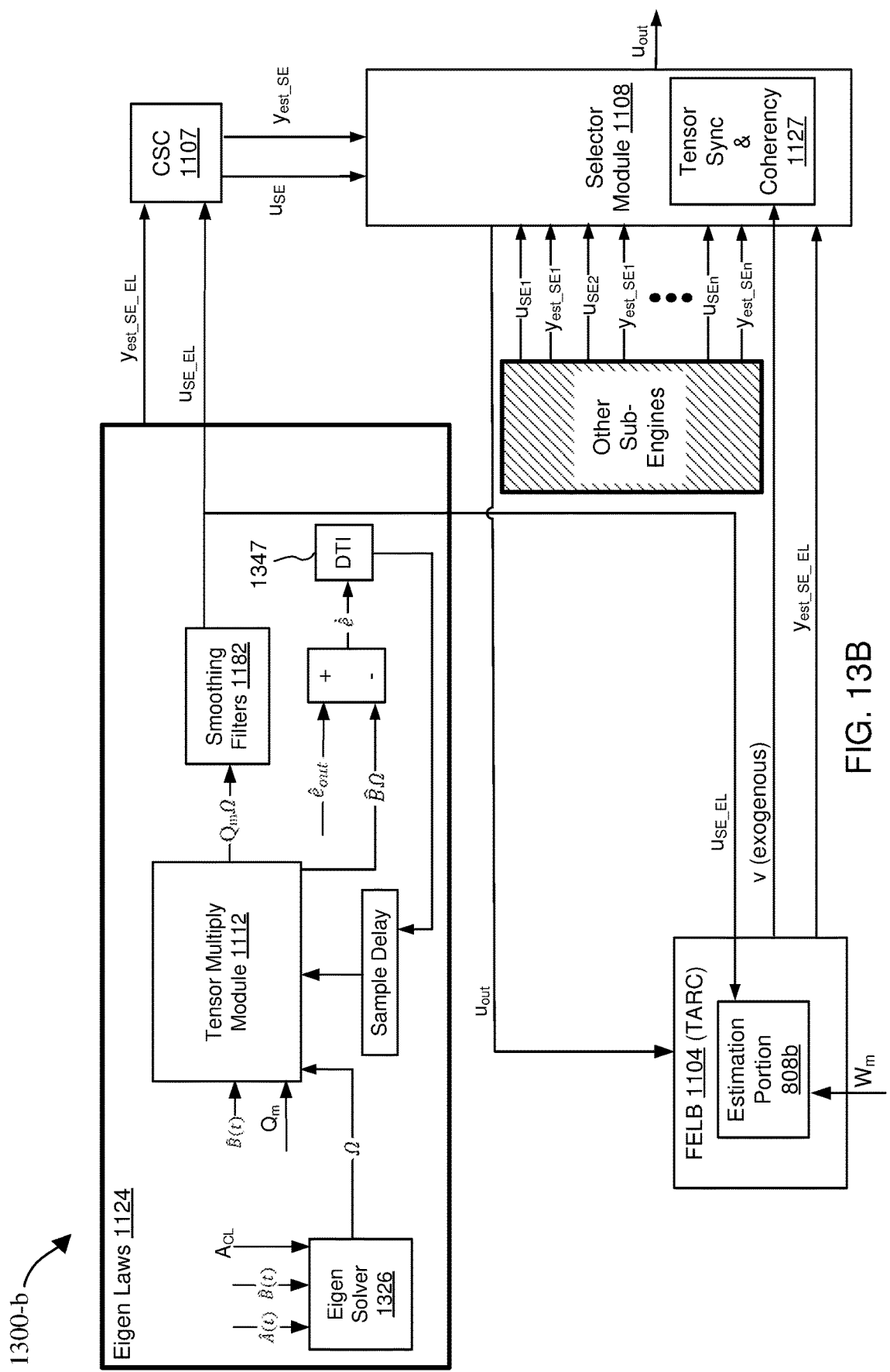
FIG. 13B illustrates a block diagram of the Eigen control laws module of the TARC control law sub-engine, in accordance with one or more implementations.

FIG. 13B illustrates a block diagram 1300-b of the Eigen control laws module 1124, in accordance with one or more implementations. The Eigen control laws module 1124 (also referred to as the EL module 1124) comprises an eigen solver 1326, a tensor multiply module 1112, smoothing filters 1182, a sample delay (e.g., 1-sample delay), one or more summers, and a discrete time integrator 1347 (DTI). As seen, the eigen solver 1326 of the EL module 1124 is configured to receive the $\hat{A}(t)$ and $\hat{B}(t)$ matrices, where the $\hat{A}(t)$ and $\hat{B}(t)$ matrices are computed based on the estimated model parameter tensors, Θ, for a non-linear model of the one or more actuators and/or the power system controlled by the one or more actuators. The eigen solver 1326 may also receive $A_{CL}$, where $A_{CL}$ Corresponds to a matrix (or tensor) of a time-varying linear system (LTV) representation of the non-linear waveform desired by the user as the output of the non-linear system (e.g., a plasma system, a plasma processing chamber, a power system, to name a few non-limiting examples). The eigen solver 1326 solves the following matching problem: Eigenvalues $(\hat{A}-\hat{B}\Omega)$=Eigenvalues $(A_{CL})$. This results in an output tensor, Ω, that is passed to the tensor multiply module 1112. The tensor multiply module 1112 of the EL module 1124 receives the Ω tensor, which is then tensor multiplied with the tensor $Q_m$, where $Q_m$ is the same or substantially the same as the $Q_m$ described in relation to FIG. 11. For example, $Q_m$ may represent an internal model representing the desired/reference plasma process performance. The tensor multiply module 1112 passes $Q_m\Omega$ to the smoothing filters 1182, where it is smoothed/filtered to produce the possible control signal $(u_{SE\_EL})$ for the EL module 1124. In other words, the possible control signal, $u_{SE\_EL}$, may be represented as $H\{Q_m\Omega\}$. This possible control signal, $u_{SE\_EL}$, is passed to the CSC 1107, along with the possible control signals, $u_{SE\_AIL}$ and $u_{SE\_PL}$, for the AIL and penalty control laws modules.

In some embodiments, the Eigen control law module 1124 (or alternatively, the FELB 1104) computes an estimated system output, $y_{est\_SE\_EL}$ (e.g., via an estimation portion of the nonlinear model and in particular via the time-varying linear system, $W_m$), for the Eigen control law module 1124 and passes it to one or more of the CSC 1107 and the selector module 1108. In some examples, the estimated system output, $y_{est\_SE\_EL}(k)$, may be generated by feeding the possible control signal for the current iteration, $u_{SE\_EL}(k)$, into the estimation portion of the nonlinear model, possibly including the time-varying linear system, $W_m$, as described above in relation to FIG. 8B. This estimated system output, $y_{est\_SE\_EL}(k)$, may also be referred to as possible estimated system output, since it is based on a possible control signal produced by a control law module. In other cases, the estimated system output, $y_{est\_SE\_EL}(k-1)$ may be generated by applying the estimation portion to the possible control signal, $u_{SE\_EL}(k-1)$, for the previous iteration, as discussed in relation to FIG. 8A.

As seen, in some cases, the FELB 1104 (or the parametric/non-linear model) may receive the previous iteration's control output, $u_{out\_k-1}$, from the selector module 1108. In such cases, if the non-linear/estimation portion/$W_m$ is in the FELB 1104, a total estimated system output, $y_{est}$ out(k), is computed based on applying the control output, $u_{out\_k-1}$, from the previous iteration to the estimation portion of the model. The topology selector and designer (TSD) of the selector module uses this estimated system output (also referred to as an estimated system output for adaptation) for selecting the different weights applied to the different possible control signals to produce the final/actual control output signal, $u_{out}$, sent from the selector module 1108 to the one or more actuators. In some examples, the adaptive engine 1100 updates the possible estimated system output, $y_{est\_SE}(k-1)$, for the previous iteration when the control output, $u_{out}$, from the previous iteration is different than the possible control signal, $u_{SE}(k-1)$, for the previous iteration. In such cases, the possible estimated system output, $y_{est\_SE}(k-1)$, is updated by applying the estimation portion of the nonlinear model to the actual control output, $u_{out}$, from the previous iteration (k-1). The adaptive engine 1100 may use this updated $y_{est\_SE}(k-1)$ to compute the possible estimated system output, $y_{est\_SE}(k)$, for the current iteration. For example, the adaptive engine 1100 may compute $y_{est\_SE}(k)$ as: $y_{est\_SE}(k)$=updated version of $y_{est\_SE}(k-1)+\dot{y}_{SE_{est}}(k)$, which corresponds to a corrected integration in the discrete time domain.

In some examples, the selector module 1108 passes a total estimated system output, $y_{est\_out}(k)$, to the estimation law module/FELB 1104. When this total estimated system output, $y_{est\_out}(k)$, is received from the selector module 1108, it may be formed as a selection of the best possible estimated system output, $y_{est\_se}$, received from the different estimation-control law module pairs (i.e., FELB-control law sub-engine pairs), or a combination of the different possible estimated system outputs, $y_{est\_se}$, received from the various estimation-control law module pairs. In some embodiments, the selector module 1108 utilizes the same or similar topology and underlying math used to compute the final/actual control output signal, $u_{out}$. Said another way, this estimated system output for adaptation, yes out(k), may be produced (e.g., by the CSC of the selector module) by combining possible estimated system outputs, $y_{est\_se}$, from different estimation-control law module pairs, which may be similar to the way that the total control output, $u_{out}$, is computed from one of (or a combination of) different possible control signals, $u_{se}$. For instance, see Equation 7.

In some embodiments, the eigen control laws module 1124 is also configured to produce the estimation error, ê, and/or a possible control signal, $u_{se\_EL}$, for the next iteration (or time instant). For example, the tensor multiply module 1112 tensor multiplies $\hat{B}$ with the tensor, Ω, to produce $\hat{B}\Omega$, which is then subtracted from the estimated output error $(\hat{e}_{out})$, as follows:

$$\dot{\hat{e}}=\hat{e}_{out}-\hat{B}\Omega \quad \text{(Equation 22)}$$

The estimation error, ê, may be calculated by passing $\dot{\hat{e}}$ through DTI 1347. This estimation error, ê, is passed through a 1-sample delay (shown as 1-sd in FIG. 13A) and fed back to the tensor multiply module 1112.

Figure 13C:
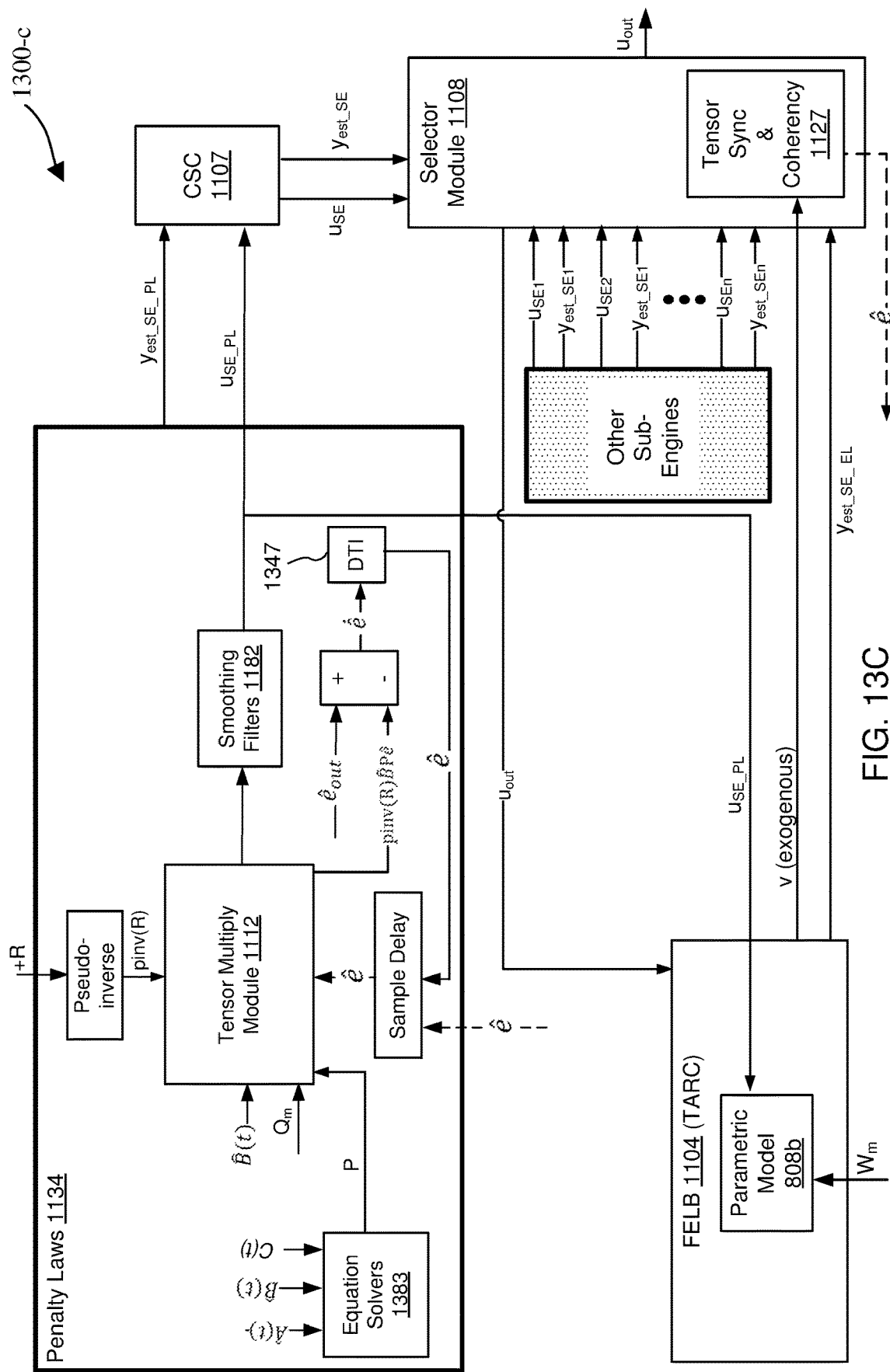
FIG. 13C illustrates a block diagram showing the penalty control laws module of the TARC control law sub-engine, in accordance with one or more implementations.

FIG. 13C illustrates a block diagram 1300-c showing the penalty control laws module 1134, in accordance with one or more implementations. The penalty control laws module 1134 (also referred to as the PL module 1134) comprises a tensor multiply module 1112, smoothing filters 1182, equation solvers 1383, DTI 1347, 1-sample delay, and at least one summer. Similar to the eigen control laws module described in relation to FIG. 13A, the penalty control laws module 1134 uses an equation solver to solve for a tensor, P. Specifically, the equation solver(s) of the PL module 1134 receives a penalty tensor R (or alternatively, a pseudo-inverse (pinv) of the penalty tensor, R), and the $\hat{A}(t)$, $\hat{B}(t)$, and C(t) matrices described above, and determines the tensor, P, where the tensor, P, corresponds to a solution of a continuous time equation. In one non-limiting example, the tensor, P, is a solution of the equation:

$$\hat{A}^T P + P \hat{A} - \text{pinv}(R) P \hat{B} \hat{B}^T P + C C^T = 0 \quad \text{(Equation 23)}$$

In some other cases, the tensor, P, may be determined from the discrete-time counterpart of the above equation. In either case, the tensor multiply module 1112 uses the tensor P, the pseudo-inverse of the penalty tensor, pinv(R), and the estimation error, ê, to determine the input to the smoothing filters 1182. The smoothing filters 1182 are configured to smooth/filter the signal received from the tensor multiply module 1112 and output the possible control signal, $u_{SE\_PL}$, for the PL module 1134 to the CSC 1107. In one non-limiting example, the smoothing filters 1182 receives as input a signal defined by the equation:

$$-Q_m \text{pinv}(R) \hat{B} P \hat{e} \quad \text{(Equation 24)}$$

In this case, the possible control '$u_{SE\_PL}$' output from the PL module 1134 may be represented as follows:

$$u_{SE\_PL} = H\{-Q_m \text{pinv}(R) \hat{B} P \hat{e}\} \quad \text{(Equation 25)}$$

In some examples, the tensor multiply module 1112 also passes a signal (e.g., given by pinv(R)$\hat{B}$P$\hat{e}$) to a summer, where it is subtracted from the estimated output error, $\hat{e}_{out}$, to determine $\dot{\hat{e}}$. In other words, $\dot{\hat{e}}$ may be represented as follows:

$$\dot{\hat{e}} = \hat{e}_{out} - \text{pinv}(R) \hat{B} P \hat{e} \quad \text{(Equation 26)}$$

As shown, the output, $\vec{\dot{e}}$, of the summer is passed through the discrete time integrator (DTI) 1347 to obtain the estimation error, ê. In some embodiments, the estimation error, ê, is fed back to the tensor multiply module 1112 after passing it through the 1-sample delay (shown as sample delay in FIG. 13B).

Figure 12:
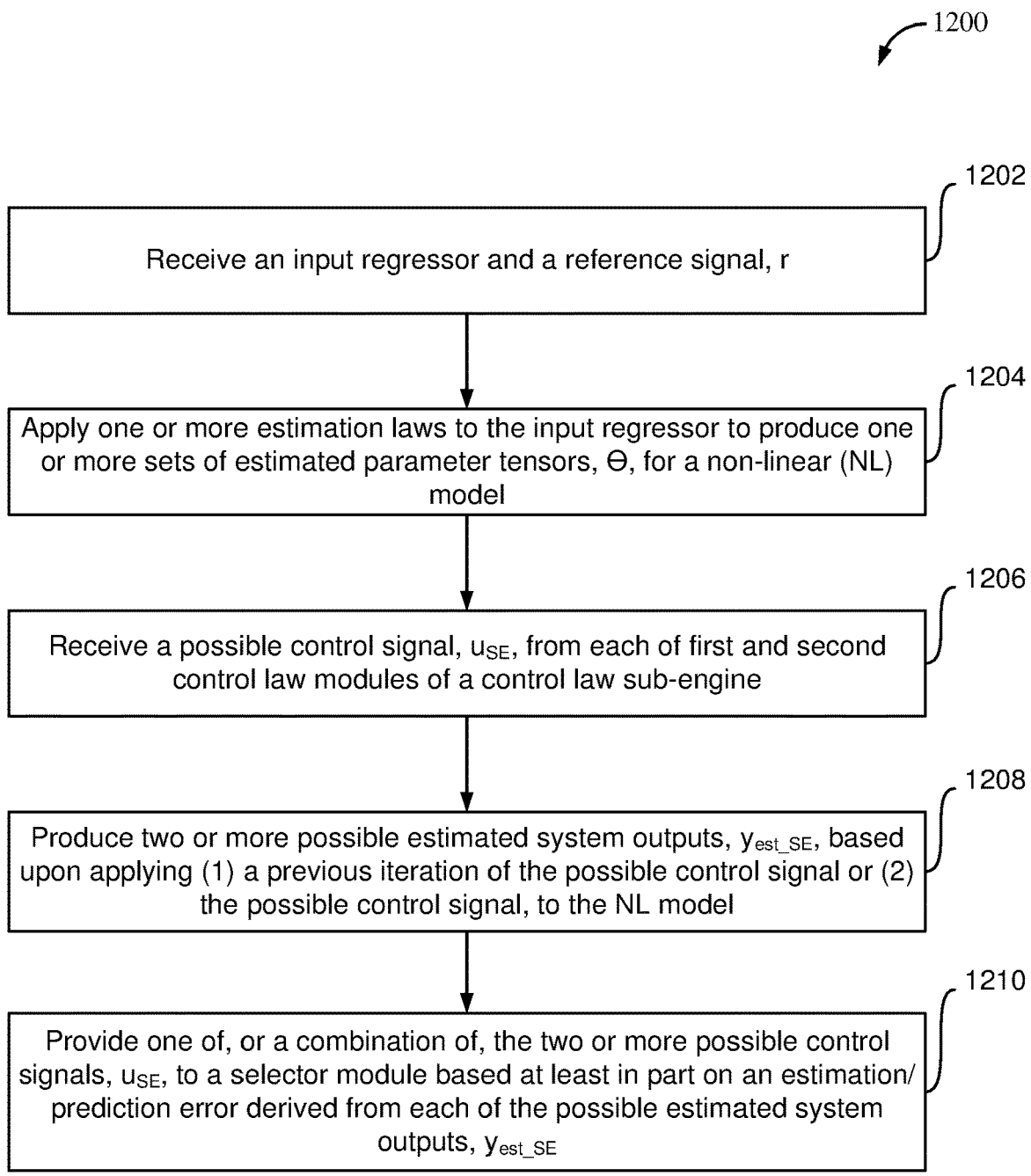
FIG. 12 illustrates an example of a method for controlling a nonlinear system using the TAC control law sub-engine, according to various aspects of the disclosure.

FIG. 12 illustrates an example of a method 1200 for controlling a non-linear system using the TARC sub engine described above in relation to FIGS. 11A-11C and 13A-13C, in accordance with one or more implementations. The operations of method 1200 presented below are intended to be illustrative. In some implementations, method 1200 may be accomplished with one or more additional operations not described, and/or without one or more of the operations discussed. Additionally, the order in which the operations of method 1200 are illustrated in FIG. 12 and described below is not intended to be limiting.

In some implementations, method 1200 may be implemented in one or more processing devices (e.g., a central processing unit or CPU, a digital processor, an analog processor, a digital circuit designed to process information, an analog circuit designed to process information, a state machine, a field programmable gate array or FPGA, and/or other mechanisms for electronically processing information). The one or more processing devices may include one or more devices executing some or all of the operations of method 1200 in response to instructions stored electronically on an electronic storage medium. The one or more processing devices may include one or more devices configured through hardware, firmware, and/or software to be specifically designed for execution of one or more of the operations of method 1200.

A first operation 1202 comprises receiving an input regressor and a reference signal, r. In some examples, the input regressor and the reference signal, r, may be received at the estimation law module (also referred to as the estimation law module or the FELB, in some examples) of the adaptive engine. In one non-limiting example, the input regressor and the reference signal are received at the estimation law module/FELB 1104. The input regressor may comprise a system output measurement, $y_{meas}$, and a control output, $u_{out\_k-1}$, from a previous iteration. The input regressor may include additional components besides the ones listed above and the examples listed herein are not intended to be limiting. In some examples, the first operation 1202 may be performed by one or more hardware processors configured by machine-readable instructions including a module that is the same as or similar to the estimation law module 1104, in accordance with one or more implementations.

A second operation 1204 comprises applying one or more estimation laws to the input regressor to estimate two or more sets of estimated model parameter tensors, Θ, for a nonlinear model. In some examples, the nonlinear model is a function of the two or more sets of estimated model parameter tensors, Θ. Further, each of the two or more sets of estimated model parameter tensors, Θ, comprises estimated parameters of the nonlinear model. In some examples, the second operation 1204 may be performed by one or more hardware processors configured by machine-readable instructions including a module that is the same as or similar to the estimation law module 1104, in accordance with one or more implementations.

A third operation 1206 comprises receiving a possible control signal, $u_{SE}$, from each of first and second control law modules of a control law sub-engine (e.g., TARC control law module/sub-engine 1106). More specifically, third operation 1206 comprises receiving two or more possible control signals, $u_{SE\_k}$, each using a corresponding control portion of the nonlinear model, where each control portion is a function of one of the two or more sets of estimated parameter tensors, Θ, of the nonlinear model. Some non-limiting examples of the control modules (e.g., first, second control law modules) may include the Adaptive Inverse Laws (AIL) control law module, the penalty control law module, and the Eigen control law module. Further, the two or more possible control signals, $u_{SE\_k}$, may be received by one or more of the estimation law module 1104, the control selector and combiner (CSC) 1107, the CSC 1116, and the selector module 1108. A control portion of the nonlinear model may be implemented in the control law sub-engine to take the two or more sets of estimated parameter tensors, Θ, and produce the possible control signals, $u_{SE\_k}$.

A fourth operation 1208 comprises producing (or generating) two or more possible estimated system outputs, $y_{est\_SE}$, based upon applying the nonlinear model to (1) a previous iteration of the possible control signal, $u_{SE\_k-1}$, from one of the two or more control portions, or (2) the possible control signal, $u_{SE\_k}$, from one of the two or more control portions. Additionally, or alternatively, fourth operation 1208 comprises generating two or more estimated system outputs, $y_{est\_SE}$, each using a corresponding estimation portion of the nonlinear model, where each estimation portion is a function of one of the two or more sets of estimated model parameter tensors, $\Theta$. In some examples, each estimation portion is also a function of a structure of the time varying linear system, $W_m$. Further, each of the one or more estimation laws may be a function of an estimation error, ê, or a cost function, J. In some examples, the fourth operation 1208 may be performed by one or more hardware processors configured by machine-readable instructions including a module that is the same as or similar to the estimation law module 1104, or a module that is the same as or similar to the control law module/sub-engine 1106, in accordance with one or more implementations.

A fifth operation 1210 comprises provide one of, or a combination of, the two or more possible control signals, $u_{SE}$, to a selector module (e.g., selector module 1108) based at least in part on an estimation/prediction error derived from each of the possible estimated system outputs, $y_{est\_SE}$. In some examples, fifth operation 1210 comprises selecting (1) a best possible control signal, $u_{SE}$, from a set comprising at least the first possible control signal and the second possible control signal, or (2) a best combination of possible control signals, $u_{SE}$, blended from two or more of the set. For example, the CSC 1107 may select one of, or a combination of the possible control signals, $u_{SE\_k}$, output from each of the Eigen, Penalty, and Adaptive Inverse Law control law modules 1124, 1134, and 1114, respectively, predicted to minimize error. In some examples, the fifth operation 1210 may be performed by one or more hardware processors configured by machine-readable instructions including a module that is the same as or similar to the CSC 1107 (or CSC 1108), in accordance with one or more implementations.

Although not illustrated, the TARC sub-engine can operate as a standalone controller. In such an embodiment, the estimation law modules/FELB can be replaced by an empirically derived lookup table for the estimated model parameter tensors, $\Theta$. More specifically, a lookup table can be empirically formed as a mapping between (1) $y_{meas}$ and $u_{out}$ from a reference/calibration system and (2) estimated model parameter tensors, $\Theta$. During operation of the TARC as a standalone controller, a control, $u_{out}$, can be provided to the one or more actuators, and measurements, $y_{meas}$, can be taken from the one or more actuators and/or system. These can then be used to select estimated model parameter tensors, $\Theta$, from the lookup table, and then provided to the TARC standalone controller to determine what will be called a control signal, $u_{out}$. This control signal, $u_{out}$, can be provided to the one or more actuators. Alternatively, the TARC standalone controller can produce a string of possible control signals, $u_{se}$, and form a control, $u_{out}$, as a combination of the string. For instance, a weighted average of the possible control signals, $u_{se}$, can be used to calculate the control, $u_{out}$, although other methods of combining the string can also be implemented. In some embodiments, the combination may be based on estimated system outputs, $y_{est\_se}$, for each of the possible control signals, $u_{se}$, similar to the way in which a topology is selected in the selector and combiner mentioned earlier. These estimated system outputs, $y_{est\_se}$, can be found via an estimation portion of the nonlinear model, for instance, using Model 1:

$$y_{est\_se} = W_m\{u_{se}, \Theta\}$$

Where the estimated model parameter tensor, $\Theta$, is found in the lookup table based on the measured system output, $y_{meas}$, and the control, $u_{out}$, both from a previous iteration.

The Tensorized Filtered Predictive-Adaptive (TFPA) Sub Engine

As noted above, in some circumstances, the TLMC (Lyapunov) control law module's output (e.g., estimated system output, $y_{est\_SE}$; measured system output, $y_{meas}$) may not converge to a steady-state behavior, for instance, due to having predicted unstable zero dynamics. In such cases, the TLMC control law module's output may comprise disturbances, dither, and/or noise. In some examples, extra filtering may help mitigate the effects of some of these issues. In most cases, this extra filtering is simply a "band-aid solution/fix", meaning it does not address the underlying cause of the predicted unstable zero dynamics. In other cases, however, the system being controlled may go unstable. To alleviate the risk of the entire non-linear system going unstable, aspects of the present disclosure are directed to a control law sub-engine (herein referred to as the TFPA sub-engine) that is specifically designed to handle unstable zero dynamics predictions. In some examples, the TFPA sub-engine is configured to produce a possible control signal, $u_{SE}$, that can be provided as another possible control signal input to the selector module. In other words, the selector module of the adaptive engine is configured to receive the possible control signal, $u_{SE}$, from the TFPA sub-engine, in addition to or in lieu of the possible control signal(s) received from the TLMC sub-engine, the TARC sub-engine, and/or any of the other sub-engines described herein. In some instances, the selector module may utilize the possible control signal provided by the TFPA sub-engine in the case of stable zero dynamics situations, unstable zero dynamics predictions, or a combination thereof. In yet other cases, the TFPA sub-engine can operate as a standalone controller and receive estimated model parameter tensors, $\Theta$, from an empirically derived lookup table.

Turning now to FIG. 14, which depicts a block diagram of an adaptive engine 1400-*a* with details of the control law module (or control law sub-engine) shown. As seen, the adaptive engine 1400-*a* includes at least one estimation law module 1404 (also referred to as FELB 1404), a control law module or sub engine 1405, and a selector module 1488. As with other adaptive engines discussed herein, the FELB 1404 is configured to receive one or more of an input regressor, Ø, a structure of the non-linear model, $W_m$, of the one or more actuators and/or the power system controlled by the one or more actuators, a reference signal, r, a system output measurement, $y_{meas}$, an estimated system output, $y_{est}$, a control output, $u_{out\_k-1}$, from a previous iteration, and a possible control signal, $u_{SE}$, produced by the control law module or sub engine 1405. In some embodiments, the estimation law module or FELB 1404 estimates a model parameter tensor, $\Theta$, for the non-linear model. Further, the control law module/sub-engine 1405 utilizes the estimated model parameter tensor, $\Theta$, received from the FELB 1404 to produce a possible control signal, $u_{SE}$, and optionally, an estimated system output, $y_{est\_SE}$ (e.g., via an estimation portion of the nonlinear model and in particular via a time-varying linear system, $W_m$, whose structure is updated every frame). In other cases, the control law module 1405 provides the possible control signal, $u_{SE}$, to the FELB 1404, where it is utilized to produce the estimated system output.

In the example shown, the control law module 1405 comprises one or more filters 1410, one or more delay filter 1411, a sliding mode predictor 1409 comprising a non-linear (NL) model 1408 of the system and/or actuators, a NL compensation module 1413, and an optional tensor synchronization and coherency module 1427 (also referred to as tensor sync module 1427, for the sake of brevity). In some examples, the control law module 1406 of the control law sub engine 1405 is configured to receive the estimated model parameter tensors, Θ, from the FELB 1404, along with one or more of the control output from the previous iteration, $u_{out\_k-1}$, measured system output, $y_{meas}$, and the filtered measured system output, $y_d$. The control law module 1406 uses the estimated model parameter tensors, Θ, and one or more of the inputs (e.g., $y_d$, $y_{meas}$, $u_{out\_k-1}$) to produce a desired (but unfiltered) possible control signal, which is input to the delay filters 1411. The delay filters 1411 adjust for delays and outputs a desired and filtered possible control signal, $u_{desired}$. The NL compensation module 1413, which may be implemented using one or more NL transfer functions, is configured to compensate for non-linearities (if any) in the control signal, $u_{desired}$, and produce the possible control signal, $u_{SE}$, that is finally sent to the selector module 1488. In some cases, the sliding mode predictor 1409 is configured to produce an estimated system output, $y_{est\_SE}$, where the estimated system output is based at least in part on the possible control signal and the estimated parameter tensors, Θ. For example, the sliding mode predictor 1409 applies the possible control signal to the NL model 1408 of the system, where the NL model 1408 comprises the estimated model parameter tensor, Θ, to produce the estimated system output, $y_{est\_SE}$ (e.g., via an estimation portion of the nonlinear model and in particular via a time-varying linear system, $W_m$, whose structure is updated every frame). In some examples, the sliding mode predictor 1409 also receives the control output, $u_{out}$, from the previous iteration, where the control output is received from one of the selector module 1488 or the tensor sync module 1427. In this example, the selector module 1488 passes the control output, $u_{out}$, to the tensor sync module 1427, where it is processed before forwarding to the NL model 1408. In some cases, processing the control output comprises applying an exogenous signal (e.g., received from the FELB 1404, the selector module 1488, or any other applicable entity) to the control output, which helps smooth transitions between possible control signals (e.g., uSE, $u_{SE1}$, $u_{SE2}$, $u_{SEn}$, etc.) input to the selector module 1488. In this case, however, the exogenous signal is applied to the control output, $u_{out}$, from the previous iteration. In such cases, the tensor sync module 1427 uses the exogenous signal to perform an operation (e.g., adding an offset) to reduce/minimize discontinuities due to a mismatch (if any) between the previously used control law and the current control law. Broadly, the tensor sync module 1427 helps ensure smooth, coherent, and/or synchronized transitions when the adaptive engine is switching between different control law sub-engines (e.g., TARC sub-engine, TLMC sub-engine, and any of the other sub-engines described herein) and/or control law modules within the same sub-engine (e.g., adaptive inverse laws module, penalty laws module, and Eigen laws module of the TARC sub-engine).

In some embodiments, the NL model 1408 is configured to produce a possible estimated system output, $y_{est\_SE}$, for the control law sub engine 1405, based upon applying the possible control signal, $u_{SE}$, to the non-linear model. The NL model 1408 may also produce a total estimated system output, $y_{est\_out}$, based upon applying the iteration of the control output, $u_{out}$, to the non-linear model. In some circumstances, the nonlinear model or NL model 1408 may also pass an estimated system output, $y_{est\_ideal}$, to the NL compensation module 1413 where it is transformed to produce the possible estimated system output, $y_{est\_SE}$. In some cases, $y_{est\_ideal}$, may be produced using the possible control signal, $u_{SE}$. In some embodiments, the total estimated system output, $y_{est\_out}$, is sent to a summer, where it is subtracted from the filtered system output measurement, $y_d$, to determine an estimation error (ê). The estimation error, ê, is passed to the estimation law module/FELB 1404, where it is used (i.e., in addition to the input regressor, Ø) to generate the estimated model parameter tensor, Θ.

In some examples, the control law module 1406 of the control law sub-engine also receives the control output, where the control output is received from one of the tensor sync module 1427 (e.g., after passing it through the 1-sample delay) or the selector module 1488. In some cases, this control output is the control output from the previous iteration (e.g., $u_{out\_k-1}$).

In some examples, the sliding mode predictor 1409 is configured to read (1) an initial linear time varying (LTV) signal (e.g., $W_m$) received from a setpoint streaming module (not shown), where the setpoint streaming module provides the setpoint stream (also referred to as a series of setpoints, or a reference signal, r), and (2) an internally generated LTV signal derived from the desired arbitrary waveform specified by the user. In some embodiments, the initial LTV signal corresponding to the setpoint stream is used as an initial model for adaptation at a start of each frame, each frame comprising a plurality of samples. As described above, $W_m(t)$ at time instant 'k' is a linear model and indirectly specified by the user/designer. The frame synthesizer (not shown) helps approximate the non-linear behavior of $W_m$. In some cases, the structure of $W_m(t)$ is provided once for every frame, but the $W_m(t)$ is updated every iteration or control sample and then used to form the closest linear model of the setpoint stream. In some embodiments, the sliding mode predictor 1409 of the control law sub-engine 1405 is further configured to receive one or more LTV signals adapted from the initial LTV signal, where each of the one or more LTV signals are adapted from the initial LTV signal and correspond to one sample of the plurality of samples of a corresponding frame. In this way, the sliding mode predictor 1409 uses the LTV signal(s) to predict how the system/plant may react in a non-linear fashion. Furthermore, due to its sliding mode nature, the prediction output rapidly and robustly converges, which is especially important while dealing with highly non-linear and chaotic systems. As such, the disclosed TFPA sub-engine optimizes control of non-linear systems, such as those having unstable zero dynamics.

In some cases, the sliding mode predictor 1409 (or the control law module 1406) generates the control law (e.g., similar or substantially similar to Control Law 3 described in the preceding sections) as follows:

$$u_{pred} = \theta_{u_d} u_{out} + \theta_{y_d} y_d + \theta_{y_{pred}} y_{pred} + \theta_r r \quad \text{(Equation 27)}$$

In equation (27), the estimated model parameter tensor, θ, can be written as:

$$\theta = [\theta_{u_d}, \theta_{y_d}, \theta_{y_{meas}}, \theta_r] \quad \text{(Equation 28)}$$

Further, the sliding mode predictor's equations (e.g., in the continuous time domain) may be given as:

$$\dot{x}_{est} = A(t)x_{est} + B(t)u_{pred} - K(y_{est} - y_{meas}) + pinv(L)CFv \quad \text{(Equation 29)}$$

$$\text{where, } v = \begin{cases} \{-\alpha(t, y_{meas}, u_{out})FCpinv\|FC\| & |FC \neq 0 \\ 0 & |\text{else} \end{cases} \quad \text{(Equation 30)}$$

In equations (29) and (30) above, v is an exogenous signal. Additionally, the A(t) and B(t) matrices are generated in the adaptive engine 1400-*a* based on the desired arbitrary waveform (e.g., reference signal, r) specified by the user and received from a setpoint streaming module. In some aspects, the A(t) and B(t) matrices represent the dynamics of $W_m$. Further, K is the gain tensor. In some cases, the gain tensor, K, may be updated whenever the A(t), B(t) and/or C(t) matrices are updated. Further, the output matrix/tensor, C(t), may be used to calculate the estimated system output (e.g., $y_{est\_SE}$, $y_{est\_out}$) as shown in equation (31) below:

$$y_{est}=C(t)x_{est} \quad \text{(Equation 31)}$$

In some cases, the matrix C(t) may be similar or substantially similar to the one described above in relation to the TARC Sub Engine. For instance, C(t) may be an n-by-n identity matrix, in some examples. Furthermore, L in equation (29) may be a tensor of matrices that can be used to solve a Lyapunov equation for every Â(t), C(t), K(t), and an optional strictly positive real (SPR) matrix or tensor, Ω(t). In one non-limiting example, Q(t) may also be an identity matrix (or identity tensor). In other cases, Q(t), which corresponds to a penalty or gain tensor may not be an identity tensor and may be specified by the user/designer. Specifically, the tensor, L, may be used to solve a Lyapunov equation of the form:

$$[A(t)-K(t)C(t)]L+L[A(t)-K(t)C(t)]^T+Q=0 \quad \text{(Equation 32)}$$

Using equation (32), F(t) (in the sliding mode predictor's equations 29 and 30) can be computed as follows:

$$F(t)=C(t)L(t)B(t)\text{pinv}(CC^T) \quad \text{(Equation 33)}$$

As noted above, the exogenous signal, v, can be written using Equation (30). In equation (30), α, is a tuning coefficient and is a function of time, t, the system output measurement, $y_{meas}$, and the control output, $u_{out}$. In some cases, the tuning coefficient, α, follows an optimization law, where the optimization law may be designed offline (e.g., using Pontryagin's minimum principle) or computed online (e.g., when the non-linear system is live/deployed/active). In some other cases, the tuning coefficient, a, is a positive constant.

In some embodiments, one or more of the setpoint streaming module, a precomputing engine (e.g., used to determine the A(t), B(t), C(t), K(t), L(t), F(t) matrices/tensors), and a frame synthesizer may be implemented on a Central Processing Unit (CPU). This allows the CPU, rather than the Field Programmable Gate Array (FPGA), to handle the heavy/intensive computations in an offline (or pseudo-offline) manner. On the other hand, the FPGA is better suited for performing simpler calculations in a very rapid manner (e.g., real-time or substantially real-time). The precomputing engine on the CPU sends the A(t), B(t), C(t), K(t), L(t), and/or F(t) matrices/tensors to the adaptive engine running on the FPGA. In some cases, the CPU also stores these matrices/tensors at a frame processor of the FPGA, for instance, in a TSP RAM of the frame processor. This allows the adaptive engine and/or the control law module/sub-engine to access the precomputed matrices in real time or substantially real time.

In some cases, a setpoint streaming engine/module of the CPU receives the reference signal, r, which may be an arbitrary waveform desired by the user, and creates a plurality of internal values that are based on the reference signal. The precomputing engine receives these internally generated values from the setpoint streaming engine/module and maps them to the matrices/tensors A(t), B(t), C(t), etc.

Thus, some non-limiting examples of the precomputed matrices/tensors (also referred to as frame mapped tensors) include: {A(t), B(t), C(t), K(t), L(t), pinv(L(t)), F(t), pinv(L(t)C(t)), F(t), v}

In an alternate representation (i.e., alternate to equation 28), the estimated model parameter tensor, θ, may be given as follows:

$$\theta=[\theta_{u_{out}},\theta_{y_d},\theta_{y_{est}},\theta_r] \quad \text{(Equation 34)}$$

From equation (34), it can be seen that the estimated model parameter tensor, θ, is a function of the estimation error, ê, since the estimation error, ê, is determined from a difference between the estimated/predicted system output, $y_{est}$, and the measured system output (after filtering), $y_d$. In some embodiments, the estimated parameter tensor, θ, computed by the estimation law module may be based on the derivative of the estimated model parameter tensor, $\dot{\theta}$, as described above and elsewhere in the disclosure.

The control law module/sub-engine 1405 then produces the possible control signal, $u_{SE}$, where $u_{SE}$ is a function of the estimated model parameter tensor θ and the input regressor. Specifically, the possible control signal, $u_{SE}$, is generated by multiplying different sub-components of the estimated model parameter tensor with corresponding sub-components of the input regressor and then combining them (e.g., adding them) to produce the possible control signal, as follows:

$$u_{se}=\theta_{u_{out}}u_{out}+\theta_{y_d}y_d+\theta_{y_{pred}}y_{pred}+\theta_r r \quad \text{(Control Law 3)}$$

In some examples, this control signal, $u_{SE}$, is passed through the delay filters 1411, which help reduce or minimize noise induced during adaptation. In one non-limiting example, the delay filters 1411 comprise minimum lag/delay smoothing filters, but other types of delay filters known in the art are contemplated in different embodiments. In some cases, the smoothing/delay filter 1411 may be Gaussian in nature and implemented as a combination of two bi-quads given by:

$$H(z)=\frac{Y(z)}{X(z)}=\frac{b_0}{[1+a_1z^{-1}+a_2z^{-2}+a_3z^{-3}+a_4z^{-4}]} \quad \text{(Equation 35)}$$

In some examples, equation (35) may be a function of a delay, τ, which may be based on the desired response speed (e.g., rise time, $T_r$) specified by the user. For example, τ may be written in generalized form as shown in equation (36) below:

$$\tau=\frac{\alpha}{\beta+\gamma} \quad \text{(Equation 36)}$$

In equation (36), α and β may be integers or decimal values, and y may be a function of $T_r$, where $T_r$ is the rise time (e.g., on the order of 1 microsecond). In some cases, γ may optionally be a function of the control rate, $T_{control}$. In one non-limiting example, the control rate, $T_{control}$, may be on the order of around 250 ns). While not necessary, in most cases, $T_r > T_{control}$.

The filter then passes the filtered possible control signal, $u_{SE}$, to the NL compensation module 1413, which is implemented by way of one or more NL transfer functions. The NL compensation module 1413 compensates for any non-linearities in the control signal received from the filters 1411 before passing the possible control signal, $u_{SE}$, to the selector module 1488. The selector module 1488 also receives one or more other possible control signals from one or more other control law modules/sub-engines, sifts through their predictions/estimations, and selects the possible control signal (e.g., one of $u_{SE}$, $u_{SE1}$, $u_{SE2}$, $u_{SEn}$) predicted to have the lowest estimation error as the control output, $u_{out}$. This control output, $u_{out}$, is then applied to the one or more actuators and/or the non-linear system controlled by the one or more actuators to effectuate a change in the measured system output so as to reduce the error between the reference signal, r, and the measured system output, $y_{meas}$.

FIG. 15 illustrates an example of a method 1500 for controlling a non-linear system using the TFPA sub engine, previously described in relation to FIG. 14, in accordance with one or more implementations. The operations of method 1500 presented below are intended to be illustrative. In some implementations, method 1500 may be accomplished with one or more additional operations not described, and/or without one or more of the operations discussed. Additionally, the order in which the operations of method 1500 are illustrated in FIG. 15 and described below is not intended to be limiting.

In some implementations, method 1500 may be implemented in one or more processing devices (e.g., a central processing unit or CPU, a digital processor, an analog processor, a digital circuit designed to process information, an analog circuit designed to process information, a state machine, a field programmable gate array or FPGA, and/or other mechanisms for electronically processing information). The one or more processing devices may include one or more devices executing some or all of the operations of method 1500 in response to instructions stored electronically on an electronic storage medium. The one or more processing devices may include one or more devices configured through hardware, firmware, and/or software to be specifically designed for execution of one or more of the operations of method 1500.

A first operation 1502 comprises receive an input regressor and a reference signal, r. In some examples, the input regressor and the reference signal, r, may be received at the estimation law module (also referred to as the estimation law module or the FELB, in some examples) of the adaptive engine. In one non-limiting example, the input regressor and the reference signal are received at the estimation law module/FELB 1404. The input regressor may comprise a system output measurement, $y_{meas}$, and a control output, $u_{out\_k-1}$, from a previous iteration. The input regressor may include additional components besides the ones listed above and the examples listed herein are not intended to be limiting. In some examples, the first operation 1502 may be performed by one or more hardware processors configured by machine-readable instructions including a module that is the same as or similar to the estimation law module 1404, in accordance with one or more implementations.

A second operation 1504 comprises apply one or more estimation laws to the input regressor to produce one or more estimated parameter tensors, $\Theta$, for a nonlinear (NL) model. In some examples, the nonlinear model is a function of the one or more estimated model parameter tensors, $\Theta$. Further, each of the one or more estimated model parameter tensors, $\Theta$, comprises estimated parameters of the nonlinear model. In some examples, the second operation 1504 may be performed by one or more hardware processors configured by machine-readable instructions including a module that is the same as or similar to the estimation law module 1404, in accordance with one or more implementations.

A third operation 1506 comprises receive a system output measurement, $y_{meas}$, a control output from a previous iteration, $u_{out\_k-1}$, and the one or more estimated parameter tensors $\Theta$. In some examples, the third operation 1506 may be performed by one or more hardware processors configured by machine-readable instructions including a module that is the same as or similar to the TFPA control law module/sub-engine 1405, in accordance with one or more implementations.

A fourth operation 1508 comprises receiving (1) an initial LTV signal (e.g., $W_m$) corresponding to the reference signal, r, and (2) a possible control signal, $u_{SE}$, or an internal possible control signal, $u_{SE\_desired}$. In some examples, the fourth operation 1506 may be performed by one or more hardware processors configured by machine-readable instructions including a module that is the same as or similar to the sliding mode predictor 1409, in accordance with one or more implementations. As seen in FIG. 14, in some examples, the sliding mode predictor 1409 comprises the nonlinear model 1408.

In some examples, the possible control signal, $u_{SE}$, or the internal possible control signal, $u_{desired}$, are generating using a control portion of the nonlinear model, where the control portion is a function of the one or more estimated parameter tensors, $\Theta$, of the nonlinear model. In some cases, the control law module 1406 of the TFPA sub engine 1405 generates the possible control signal, $u_{SE}$, and/or the internal possible control signal, $u_{desired}$.

A fifth operation 1510 comprises producing (or generating) an internal possible estimated system output, $y_{est\_ideal}$, and a possible estimated system output, $y_{est\_SE}$. Generating the internal possible estimated system output, $y_{est\_ideal}$, is based upon applying the nonlinear model (e.g., the estimation portion of the nonlinear model) to the control output from the previous iteration, $u_{out\_k-1}$, and the system output measurement, $y_{meas}$. Further, generating the possible estimated system output, $y_{est\_SE}$, is based upon applying the estimation portion of the nonlinear model to (1) the internal possible control signal, $u_{desired}$, (2) the possible control signal for the current iteration, $u_{SE\_k}$, or (3) to the previous iteration of the possible control signal, $u_{SE\_k-1}$. In some examples, each estimation portion is also a function of a structure of the time varying linear system, $W_m$. Further, each of the one or more estimation laws may be a function of an estimation error, ê, or a cost function, J.

In some examples, the fifth operation 1510 may be performed by one or more hardware processors configured by machine-readable instructions including a module that is the same as or similar to the sliding mode predictor 1409, or a module that is the same or similar to the estimation law module 1404 (e.g., if the estimation portion of the nonlinear model is in the estimation law module 1404) in accordance with one or more implementations. As seen in FIG. 14, in some examples, the sliding mode predictor 1409 comprises the nonlinear model 1408.

A sixth operation 1512 comprises receiving the possible control signal, $u_{SE}$, and the possible estimated system output, $y_{est\_SE}$. In some examples, the sixth operation 1512 may be performed by one or more hardware processors configured by machine-readable instructions including a module that is the same as or similar to the selector module 1488, and/or the CSC 516, in accordance with one or more implementations. Optionally, the sixth operation 1512 may also be performed by one or more hardware processors configured by machine-readable instructions including a module that is the same as or similar to the estimation law module 1404.

Although not illustrated, the TFPA sub-engine can operate as a standalone controller. In such an embodiment, the estimation law modules/FELB can be replaced by an empirically derived lookup table for the estimated model parameter tensors, Θ. More specifically, a lookup table can be empirically formed as a mapping between (1) $y_{meas}$ and $u_{out}$ from a reference/calibration system and (2) estimated model parameter tensors, Θ. During operation of the TFPA standalone controller as a standalone controller, a control, $u_{out}$, can be provided to the one or more actuators, and measurements, $y_{meas}$, can be taken from the one or more actuators and/or system. These can then be used to select estimated model parameter tensors, Θ, from the lookup table, and then provided to the TFPA standalone controller to determine what will be called a control signal, $u_{out}$. This control signal, $u_{out}$, can be provided to the one or more actuators. Alternatively, the TFPA standalone controller can produce a string of possible control signals, $u_{se}$, and form a control, $u_{out}$, as a combination of the string. For instance, a weighted average of the possible control signals, $u_{se}$, can be used to calculate the control, $u_{out}$, although other methods of combining the string can also be implemented. In some embodiments, the combination may be based on estimated system outputs, $y_{est\_se}$, for each of the possible control signals, $u_{se}$, similar to the way in which a topology is selected in the selector and combiner mentioned earlier. These estimated system outputs, $y_{est\_se}$, can be found via an estimation portion of the nonlinear model, for instance, using Model 1:

$$y_{est\_se} = W_m\{u_{se}, \Theta\}$$

Where the estimated model parameter tensor, Θ, is found in the lookup table based on the measured system output, $y_{meas}$, and the control, $u_{out}$, both from a previous iteration.

In an embodiment, the slide mode predictor 1409 can produce the estimated system output, $y_{est\_SE}$. More specifically, the system model or nonlinear model can be provided with a control portion, for generating possible control signals, $u_{se}$, and an estimation portion for estimating estimated system outputs, $y_{est\_se}$. A time-varying linear system, $W_m$, can make up a foundation of either the estimation portion or the control portion, and can be bifurcated or split into a sum of a linear and a nonlinear portion and the control timeline can be split into frames of differing lengths (or number of control samples or adaptation iterations) with some processing of the nonlinear model occurring on a CPU or other slower resource and real-time aspects of the nonlinear model occurring on an FPGA or other faster resource. A current frame can be supplied with a structure of the time-varying linear system, $W_m$. As noted relative to FIG. 43, the non-linear portion of the time-varying linear system, $W_m$, is effectively an unknown error and thus not used or considered in the processing (other than in attempt to minimize this error). The structure of the time-varying linear system, $W_m$, can be pre-processed, for instance on a CPU, though it can also be accessed from an empirically-derived lookup table. The structure of the time-varying linear system, $W_m$, remains constant through the current frame. Yet, since the time-varying linear system, $W_m$, is also dependent on the estimated model parameter tensor, Θ, the estimation portion of the nonlinear model adapts within a frame as Θ changes in the FELB 1404 (as the adaptive engine modifies Θ to minimize an error relative to measured system behavior). This can involve calculating an estimation error, ê, or cost function, J, based on two or more of (1) measured system outputs, $y_{meas}$, from a previous iteration, (2) estimated system outputs, $y_{est\_se}$, from a previous iteration, and (3) reference signal, r. Adaption can then involve applying an estimation law to at least the reference signal, r, and the estimation error, ê, or cost function, J, to estimate an estimated model parameter tensor, Θ. The estimated model parameter tensors, Θ, can then be tested in the TFPA sub-engine 1405, and adaptation can continue through the entirety of the frame, and in turn, $W_m$, is adapted throughout the frame (or until convergence is achieved). Once a frame is complete the method selects a next frame and a new structure of the time-varying linear system, $W_m$, is provided into the model and adaptation of the estimated model parameter tensor, Θ, is carried out through this next frame until convergence. As noted earlier, the structure of the time-varying linear system, $W_m$, can include the structure of the A, B, and C matrices that are part of the system of equations making up $W_m$.

The Adaptive Proportional Integral Derivative (PID) Sub Engine

As noted above, in some control law modules (e.g., control law modules 506), more than one control law can be implemented. Some non-limiting examples of which include the TARC control law module/sub-engine and the Adaptive PID control law module. Various aspects of the TARC control law module/sub-engine have been discussed above, including at least in relation to FIGS. 11-13. The following sections discuss the Adaptive PID control law module/sub-engine, its structure and sub-components, algorithm/methods of operation, and control law(s) implemented in the Adaptive PID sub-engine.

PID controllers can be implemented using various different tuning rules (also known as PID tuning rules) and operator tuning methods. These tuning methods and rules are fairly accurate and powerful when the underlying model characterization they are based on is accurate for the duration of operation of a specific PID control law. Typically, PID control laws are characterized for relatively simple linear systems with delays, rather than the highly non-linear/chaotic systems (e.g., plasma processing chambers) generally discussed in this disclosure. Aspects of the disclosure are directed to an Adaptive PID control law module/sub-engine that is designed to consolidate the use of PID control laws in non-linear systems. This approach, described in further detail below, assumes that at any single time instant (i.e., snapshot of time), the non-linear system being controlled can be modeled by a system model (e.g., a estimation portion, a non-linear model) for which PID tuning control laws are available. In some cases, this assumption may be valid for a sufficient duration of time such that the PID tuning control law is applicable for the whole duration (e.g., for the whole frame) of that system model. Additionally, the adaptive PID control law sub-engine and/or the estimation law module associated with the control law sub-engine is configured to incorporate/model the system's non-linearities in the parametric/linear model, $W_m$, of the system. In some examples, the dynamic structure of the parametric/linear model may be fixed for the duration of the PID tuning control law. Further, the system's non-linearities are included in the linear model ($W_m$) through the time varying/changing nature of the plurality of coefficients forming the parametric/linear model. In some embodiments, these time-varying coefficients (e.g., $a_{est}$, $b_{est}$) and/or time-varying parameters (e.g., θ) may be adapted, which serves to adaptively change the control output (e.g., possible control signal) produced by the adaptive PID control law module. Such a design helps ensure that the controller reacts to the non-linearities in accordance with the arbitrary waveform (e.g., reference waveform) specified by the user.

Figure 16:
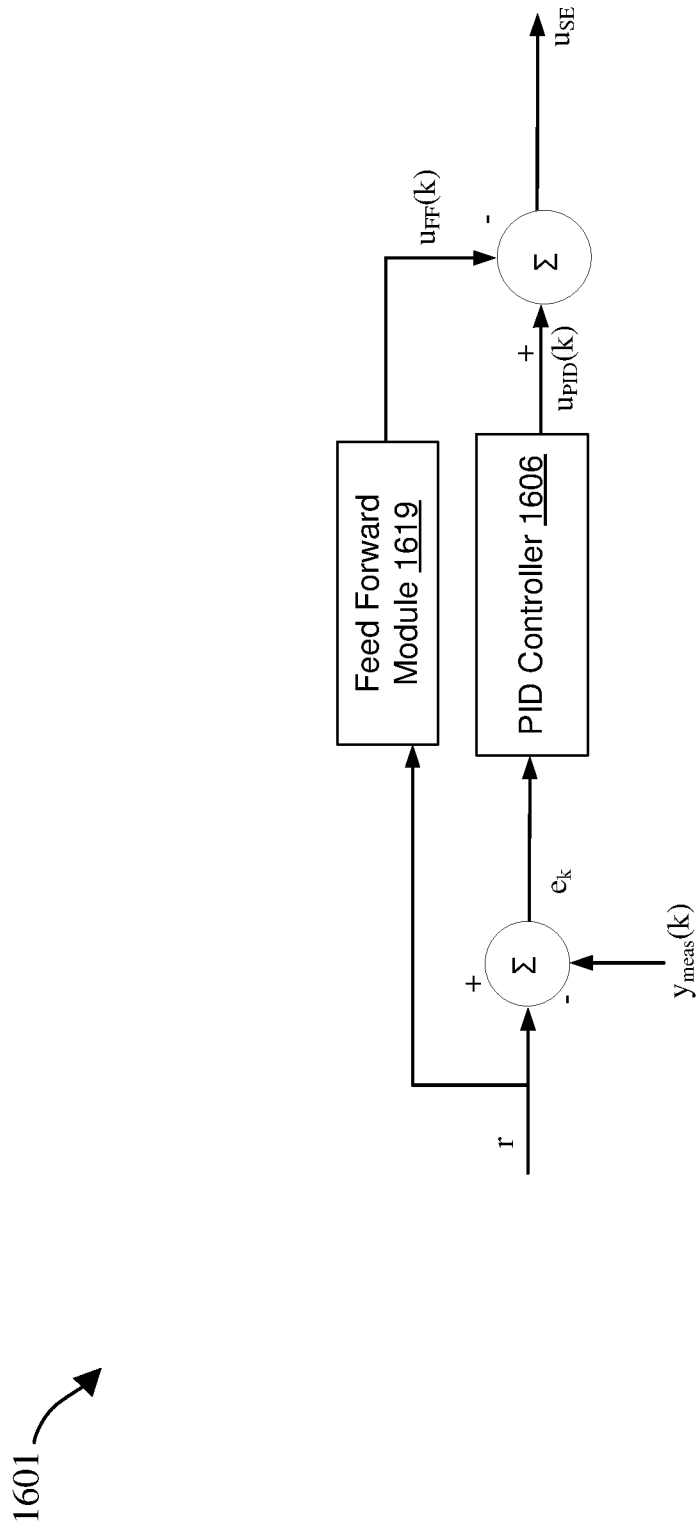
FIG. 16 illustrates a block diagram of an adaptive PID control system, in accordance with one or more implementations.

FIG. 16 illustrates a block diagram 1601 of an adaptive PID control system, in accordance with one or more implementations. As seen, the adaptive PID control system in FIG. 16 comprises an adaptive PID controller 1606, a feed forward module 1619, and a plurality of summers. The adaptive PID control system receives as input the reference waveform (or reference signal), r, and the measured system output, $y_{meas}$. The adaptive PID control system includes a feedback path (i.e., through which the measured system output is received) and a feedforward path, where the feedforward path includes the feed forward module 1619. At the first summer (on the left of the page), a measurement error, ê, is calculated based on a difference between the reference signal, r, and the measured system output, $y_{meas}$. For example, the measurement error (or simply error) is calculated as: $|r-y_{meas}|$. This measurement error, ê, is passed to the PID controller 1606 for further processing. The PID controller 1606 is configured to calculate a first possible control signal (also referred to as a possible PID control signal), $u_{PID}$, which is then passed to the second summer (on the right of the page). In some cases, the reference waveform/signal is also passed to the feed forward module 1619, which processes the reference waveform to produce a second possible control signal (or possible feed forward control signal), $u_{FF}$. This possible feed forward control signal, $u_{FF}$, is also passed to the second summer, which outputs a possible control signal, $u_{SE}$, based on computing a difference between $u_P$ and $u_{FF}$. In other words, the possible control signal, $u_{SE}$, output by the adaptive PID control law module/sub-engine may be represented using Control Law 4 as follows:

$$u_{se} = U_{PID_k} - u_{FF_k} = [\theta, \theta_7][\omega, \omega_7] \quad \text{(Control Law 4)}$$

Figure 17A:
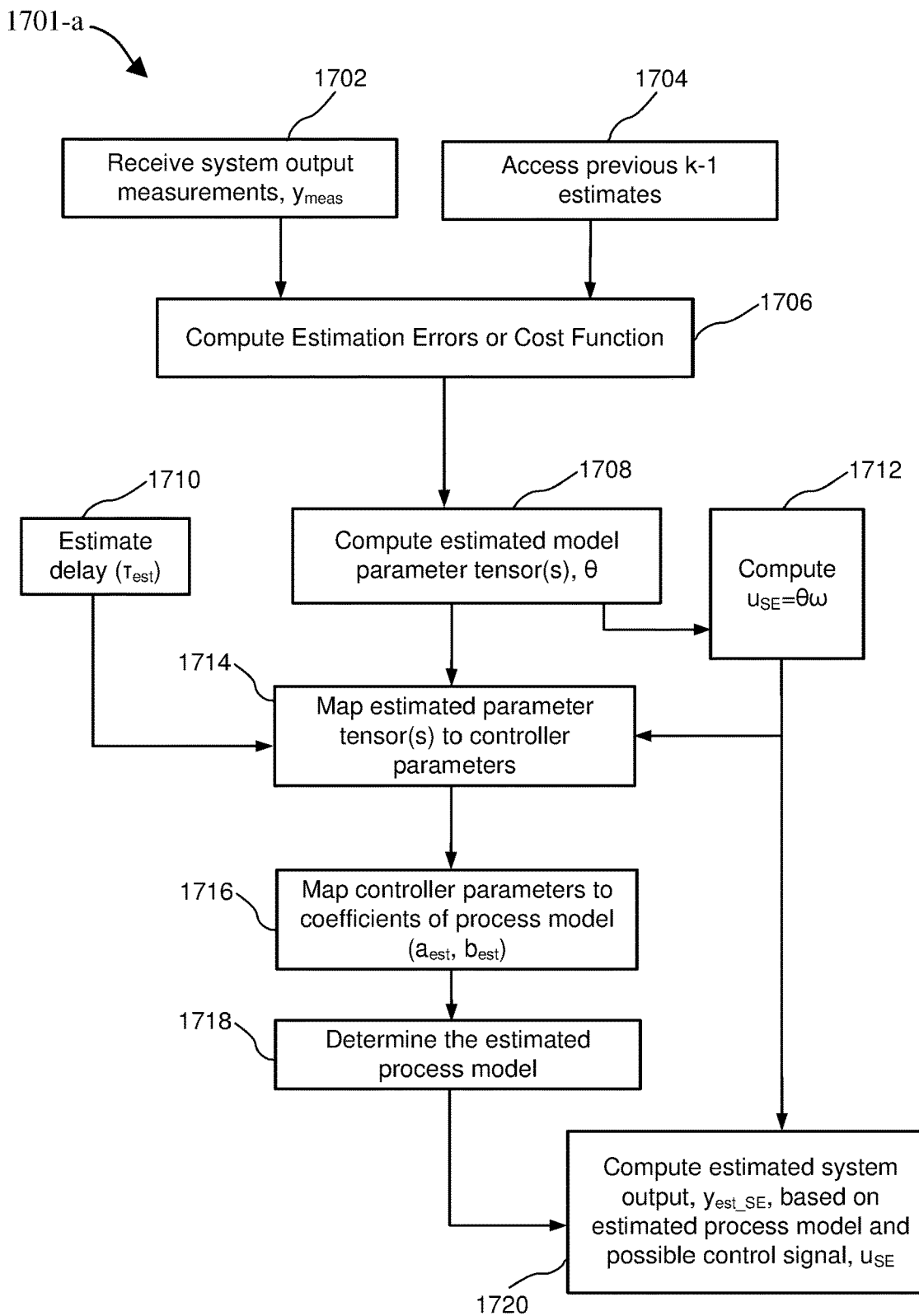
FIG. 17A illustrates an example of a method for controlling a nonlinear system using the adaptive PID control system in FIG. 16, in accordance with one or more implementations.

FIG. 17A illustrates an example of a method 1701-a for controlling a non-linear system using an adaptive PID control module. The operations of method 1701-a presented below are intended to be illustrative. In some implementations, method 1701-a may be accomplished with one or more additional operations not described, and/or without one or more of the operations discussed. Additionally, the order in which the operations of method 1701-a are illustrated in FIG. 17A and described below is not intended to be limiting.

In some implementations, method 1701-a may be implemented in one or more processing devices (e.g., a central processing unit or CPU, a digital processor, an analog processor, a digital circuit designed to process information, an analog circuit designed to process information, a state machine, a field programmable gate array or FPGA, and/or other mechanisms for electronically processing information). The one or more processing devices may include one or more devices executing some or all of the operations of method 1701-a in response to instructions stored electronically on an electronic storage medium. The one or more processing devices may include one or more devices configured through hardware, firmware, and/or software to be specifically designed for execution of one or more of the operations of method 1701-a.

In some embodiments, the PID tuning control law (or simply, PID control law) may be represented as follows:

$$u_k = \theta_1 r_k + \theta_2 \Sigma_{j=1}^k r_j + \theta_3 H\{r_k\} + \theta_4 y_k + \theta_5 \Sigma_{j=1}^k y_j + \theta_6 H\{y_k\} \quad \text{(Equation 37)}$$

In Equation (37), $r_k$ is the reference signal/waveform at time 'k', $y_{meas}$ is the measured system output that is feedback to the input at time 'k', and $u_{SE}$ is the possible control signal for the current iteration. This possible control signal, $u_{SE}$, along with one or more other possible control signals from one or more other control law sub-engines/modules is passed to the selector module, which then selects one of (or a combination of) the possible control signals as the control output for the current iteration 'k'.

In some examples, equation (37) may be represented in estimator form as:

$$u_k = \theta \omega, \text{ where } \omega = [r_k, \Sigma_{j=1}^k r_j, H\{r_k\}, y_k, \Sigma_{j=1}^k y_j, H\{y_k\}]$$

As described above, the tensor ω is also referred to as the input regressor. It should be noted that, the input regressor tensor, ω, discussed in relation to the adaptive PID sub-engine may be similar or substantially similar to the input regressor tensor, φ, discussed in relation to some of the other control law modules/sub-engines.

The adaptive PID controller (e.g., shown as PID controller 1606 in FIG. 16) implements one or more of the process/non-linear/parametric/linear model of the one or more actuators and/or the non-linear system controlled by the one or more actuators. In some examples, the model parameter tensor, θ, estimated by the estimation module (e.g., estimation module or FELB 1804 in FIG. 18) may be mapped to the process model and/or the tuning laws of the adaptive PID controller. One non-limiting example of the PID control system structure includes the two-degrees of freedom filtered derivative PID controller described above in relation to FIG. 15. Other PID control system architectures known or contemplated in the art may be utilized in different embodiments, and the example discussed herein is not intended to be limiting.

In some cases, the possible feed forward control signal, $u_{FF}$, produced by the feed forward module 1519 may be written using equation (38) shown below:

$$u_{FF_k} = \alpha K_C r_k + \left[\alpha K_C \frac{T_d}{N} + \beta K_C T_d\right] H\{r_k\} - \frac{T_d}{N} H\{u_{FF_{k-1}}\} \quad \text{(Equation 38)}$$

Additionally, the possible PID control signal, $u_{PID}$, produced by the PID controller 1506 may be calculated using equation (39):

$$u_{PID_k} = \left[K_C + \frac{K_C}{T_i}\left(\frac{T_d}{N}\right)\right]e_k +$$

$$\frac{K_C}{T_i}\Sigma_{j=1}^k e_j + K_C\left(\frac{T_d}{N}\right)(N+1)H\{e_k\} - \frac{T_d}{N}H\{u_{PID_{k-1}}\} \quad \text{(Equation 39)}$$

In some cases, $e_k$ may be represented as the difference between the reference signal/waveform and the measured system output. That is, $e_k = r_k - y_{meas\_k}$. Further, the controller parameters (e.g., α, $K_c$, $T_d$, N, β, $T_i$, etc.) may be determined based on PID tuning control law(s). In some embodiments, these PID tuning control law(s) may be synthesized from experiments and stored in memory as a look-up table, or another applicable data structure. In some cases, the controller parameters may be defined using Equations 40-45 shown below:

$$\alpha = f_1(a_{est}, b_{est}, \tau_m), \quad \text{(Equation 40)}$$

$$K_c = f_2(a_{est}, b_{est}, \tau_m), \quad \text{(Equation 41)}$$

$$T_d = f_3(a_{est}, b_{est}, \tau_m), \quad \text{(Equation 42)}$$

$$N = f_4(a_{est}, b_{est}, \tau_m), \quad \text{(Equation 43)}$$

$$\beta = f_5(a_{est}, b_{est}, \tau_m), \quad \text{(Equation 44)}$$

$$T_i = f_6(a_{est}, b_{est}, \tau_m) \quad \text{(Equation 45)}$$

$$\text{Further}, [PID+FF]_{6,n} = f(a_{est}, b_{est}, \tau_m) \quad \text{(Equation 46)}$$

In Equations 40-45, $a_{est}$ and $b_{est}$ are the estimated coefficients of the non-linear/parametric/process model and $\tau_m$ is the process delay. In some examples, the process delay, $\tau_m$, may be detected/estimated as described in co-owned U.S. application Ser. No. 17/685,931, the entire contents of which are incorporated herein by reference in their entirety.

In some embodiments, the plurality of sub-components, $\theta_1, \theta_2, \theta_3 \ldots \theta_7$, of the estimated model parameter tensor, [θ], may be written as follows:

$$\theta_1 = \left[K_C + \frac{K_C}{T_i}\frac{T_d}{N}\right] - \alpha K_C \quad \text{(Equation 47)}$$

$$\theta_2 = \left[\frac{K_C}{T_i}\right] \quad \text{(Equation 48)}$$

$$\theta_3 = \left[K_C \frac{T_d}{N}(N+1)\right] - \left[\alpha K_C \frac{T_d}{N} + \beta K_C T_d\right] \quad \text{(Equation 49)}$$

$$\theta_4 = -\left[K_C + \frac{K_C}{T_i}\frac{T_d}{N}\right] = \alpha K_C - \theta_1 \quad \text{(Equation 50)}$$

$$\theta_5 = -\left[\frac{K_C}{T_i}\right] = -\theta_2 \quad \text{(Equation 51)}$$

$$\theta_6 = -\left[K_C \frac{T_d}{N}(N+1)\right] \quad \text{(Equation 52)}$$

$$\theta_7 = -\frac{T_d}{N} \quad \text{(Equation 53)}$$

Further, the estimated model parameter tensor [θ] may be represented by the concatenation of its sub-components. That is, the estimated model parameter tensor [θ] produced by the estimation law module 1804 may be represented as [$\theta_1 \ldots \theta_7$]. In some examples, the possible control signal, $u_{SE}$, produced by the adaptive PID control law module 1805 may be calculated from the possible PID control signal, $u_{PID}$, and the possible feed forward control signal, $u_{FF}$. Similar in line with some of the other sub-engines described herein, the possible control signal, $u_{SE}$, may be a function of the estimated model parameter tensor [θ] and the input regressor, ω. The input regressor, ω, may also comprise a plurality of subcomponents (e.g., 7 subcomponents, $\omega_1 \ldots \omega_7$). Further, each sub-component (e.g., $\theta_1$) of the estimated model parameter tensor may be multiplied by a corresponding sub-component (e.g., oi) of the input regressor to determine a subcomponent of the possible control signal. In other words, the possible control signal, $u_{SE}$, may be calculated as: $u_{SE} = [\theta_1 \ldots \theta_7][\omega_1 \ldots \omega_7]$, where $\omega_7 = H\{u_{out\_k-1}\}$. That is, $\omega_7$ is determined from filtering the control output, $u_{out\_k-1}$, from the previous iteration.

In some examples, the adaptive PID control law module may be implemented using two different mechanisms/schemes. In some examples, the adaptive PID control law module 1805 may comprise a first control law module (e.g., a Control Then Output Estimation or CTOE module) and a second control law module (e.g., an Output Estimation Then Control or OETC module). In some cases, the PID control law module 1805 is made adaptive (e.g., as a result of adapting/changing the estimated model parameter tensor, θ, at each iteration) and integrated into the adaptive engine (e.g., adaptive engine 500 in FIGS. 5A-5C, adaptive engine 800 in FIGS. 8A-B). The possible control signals produced by each of the CTOE and OETC control law modules 1600 and 1700, respectively, may be passed to a control selector and combiner (CSC) 1826 of the sub-engine 1805, which selects one of (or a combination of) the control signals as the possible control signal, $u_{SE}$, for the adaptive PID sub-engine 1805. In some aspects, the CSC 1826 may be similar or substantially similar to the CSC 1107 of the TARC sub-engine, which is configured to select one of (or a combination of) the possible control signals from the adaptive inverse control laws module 1114, the eigen control laws module 1124, and the penalty control laws module 1134.

Said another way, the adaptive engine (e.g., a selector module) may select one or combination of possible control signals, $u_{se}$, that lead to a control, $u_{out}$, that causes a measured system output, $y_{meas}$, that is close to the total estimated system output, $y_{est\_out}$, or the reference signal, r. This may involve an error or cost function that compares the measured system output, $y_{meas}$, for a previous iteration, or the reference signal, r, to the total estimated system outputs, $y_{est\_out}$, calculated for various possible topologies. More specifically, the TSD 1818 may analyze a cost function, such as Equation 4, to select an optimal possible control signal, $u_{se}$, or combination of possible control signals, $u_{se}$ (in the form of a topology for combining the possible control signals)

Returning to FIG. 17A, which depicts an example of a method flow 1701-a implemented by way of a CTOE control law module 1600, in accordance with one or more implementations. In some embodiments, the method flow 1701-a (also referred to as the CTOE method 1701-a) is based at least in part on directly estimating the model parameter tensor, θ. Specifically, the CTOE method depicted in FIG. 17A comprises determining the non-linear/parametric/process model based on PID tuning rules and direct estimation of the subcomponents (e.g., [$\theta_1 \ldots \theta_7$]) of the model parameter tensor, θ.

As seen, a first operation (1702) comprises receiving at least one system output measurement, $y_{meas}$. The system output measurement, $y_{meas}$, may be received at the estimation law module/FELB 1804. A second operation (1704) comprises accessing one or more previously estimated system output, $y_{est\_SE}$. In some cases, the estimation law module or another component of the adaptive engine accesses 'k−1' previous estimates of the system output. A third operation (1706) comprises computing one or more estimation errors or a cost function, where the estimation errors/cost functions are based at least in part on comparing the system output measurement, $y_{meas}$, with one or more previous estimates of the system output. A fourth operation (1708) comprises estimating one or more model parameter tensors, Θ, based at least in part on computing the estimation errors at operation (1706). A fifth operation (1710) comprises estimating a delay, $\tau_{est}$. A sixth operation (1712) comprises computing a possible control signal for the CTOE control law module using the one or more estimated model parameter tensors, Θ, and an input regressor, ω. A seventh operation (1714) comprises mapping the estimated model parameter tensors, θ, to a plurality of controller parameters. The controller parameters may be similar or substantially similar to the ones described in relation to FIGS. 15-21. An eighth operation (1716) comprises mapping the controller parameters to a plurality of coefficients (e.g., $a_{est}, b_{est}$) of the non-linear/parametric/process model. A ninth operation (1718) comprises estimating or adapting the model based at least in part on the mapping 1716. A tenth operation (1720) comprises estimating the system output, $y_{est\_SE}$, for the CTOE control law module 1600 based at least in part on applying the possible control signal, $u_{SE}$, Computed at 1712 to the estimated process model.

Figure 17B:
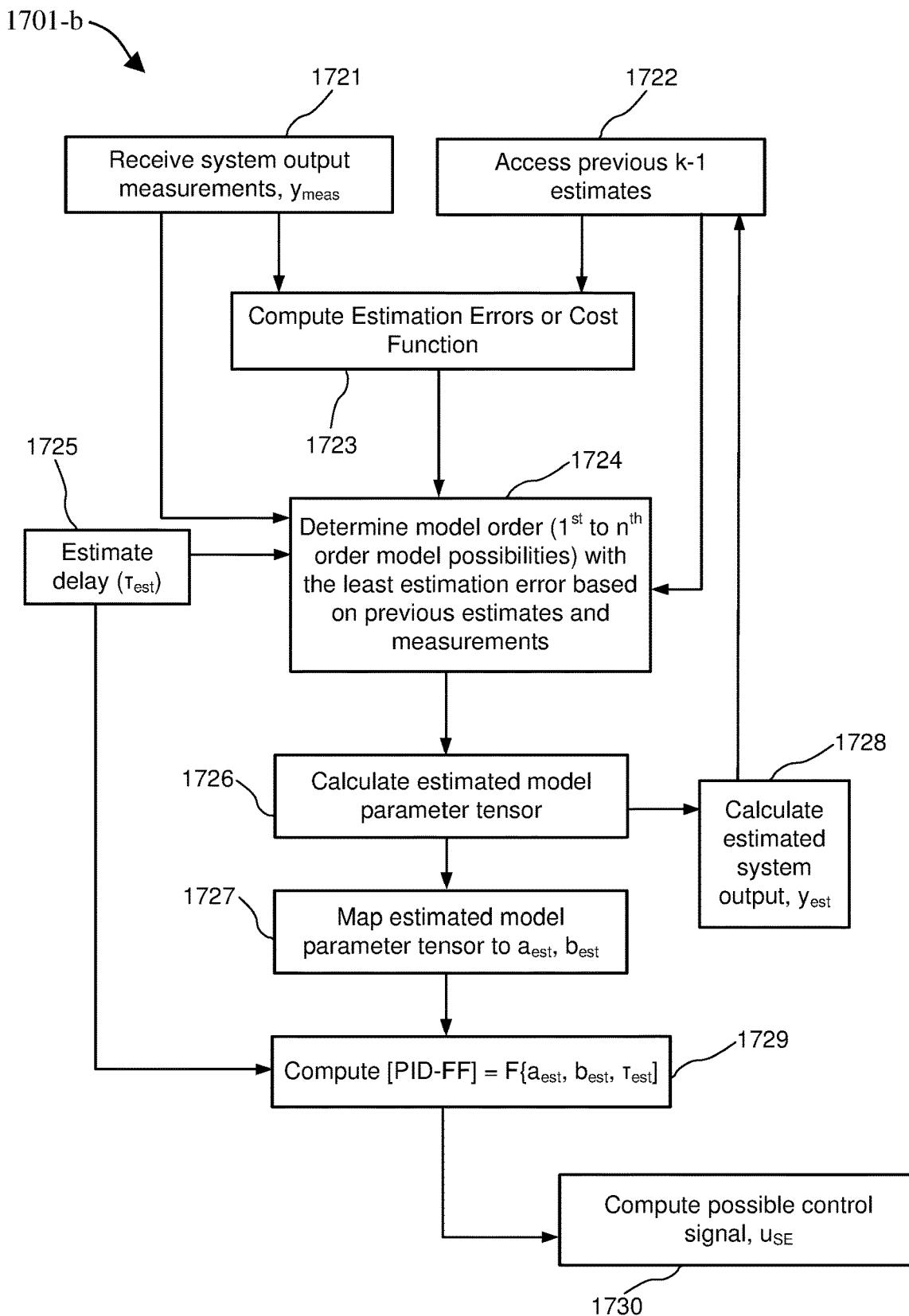
FIG. 17B illustrates another example of a method for controlling a nonlinear system using the adaptive PID control system in FIG. 16, in accordance with one or more implementations.
Figure 18:
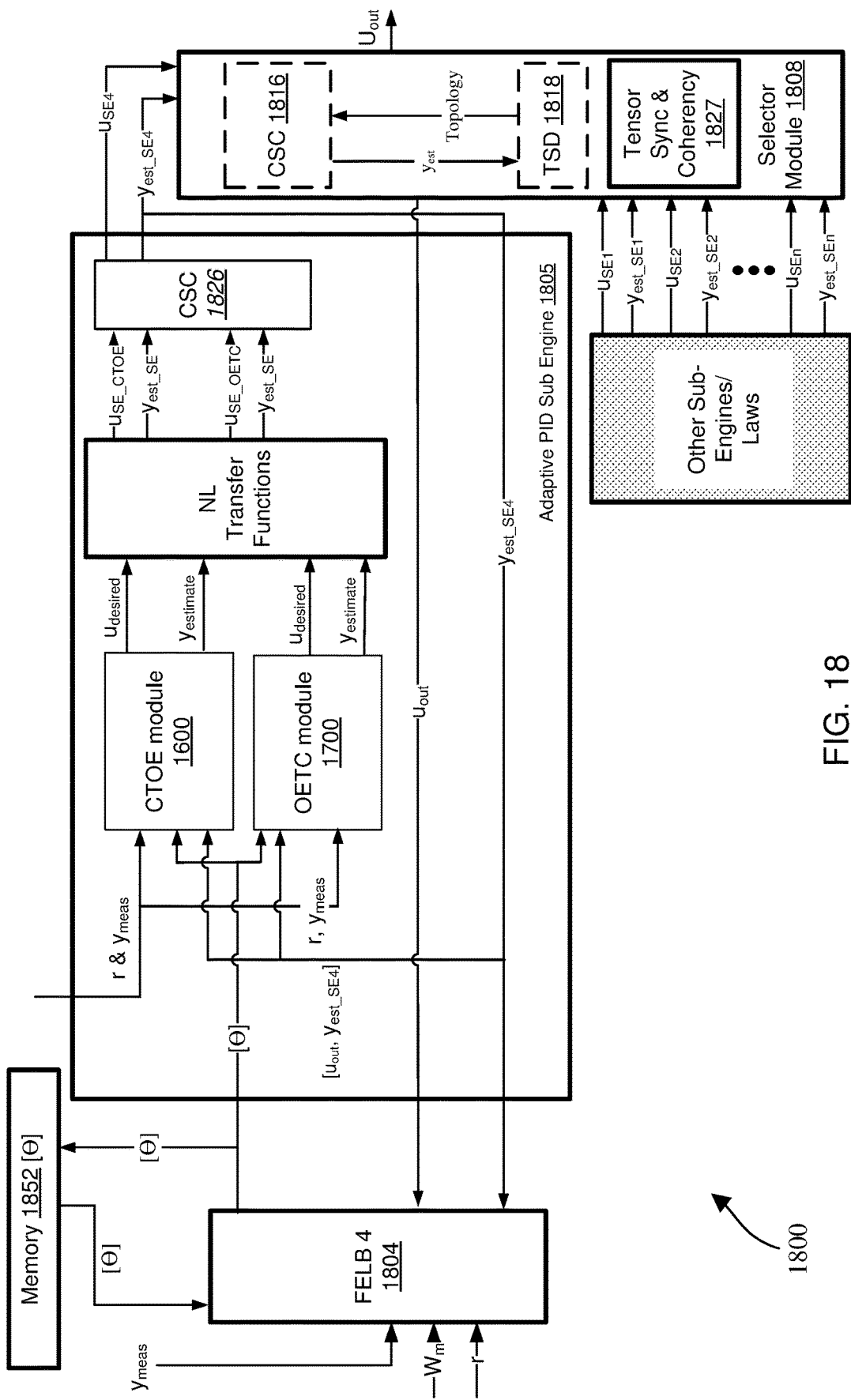
FIG. 18 illustrates a block diagram of an adaptive engine implementing an adaptive PID control law sub-engine, in accordance with one or more implementations.

FIG. 17B illustrates an example of a method 1701-*b* for controlling a non-linear system using an adaptive PID control module. The operations of method 1701-*b* presented below are intended to be illustrative. In some implementations, method 1701-*b* may be accomplished with one or more additional operations not described, and/or without one or more of the operations discussed. Additionally, the order in which the operations of method 1701-*b* are illustrated in FIG. 17B and described below is not intended to be limiting.

In some implementations, method 1701-*b* may be implemented in one or more processing devices (e.g., a central processing unit or CPU, a digital processor, an analog processor, a digital circuit designed to process information, an analog circuit designed to process information, a state machine, a field programmable gate array or FPGA, and/or other mechanisms for electronically processing information). The one or more processing devices may include one or more devices executing some or all of the operations of method 1701-*b* in response to instructions stored electronically on an electronic storage medium. The one or more processing devices may include one or more devices configured through hardware, firmware, and/or software to be specifically designed for execution of one or more of the operations of method 1701-*b*.

Broadly, FIG. 17B depicts an example of a method flow 1701-*b* implemented by way of a OETC control law module (e.g., OETC control law module 1700 in FIGS. 18 and 20), in accordance with one or more implementations. As seen, a first operation (1721) comprises receiving at least one system output measurement, $y_{meas}$. The system output measurement, $y_{meas}$, may be received at the estimation law module/FELB 1804. A second operation (1722) comprises accessing one or more previously estimated system outputs, $y_{est\_SE}$. In some cases, the estimation law module or another component of the adaptive engine accesses 'k-1' previous system output estimates. A third operation (1723) comprises computing one or more estimation errors, where the estimation errors are based at least in part on comparing the system output measurement, $y_{meas}$, with one or more previous estimates of the system output. A fourth operation (1724) comprises determining a model order (e.g., $1^{st}$ order, $2^{nd}$ order, etc.) corresponding to a lowest estimation error, where determining the model order is further based on the previous estimates of the system output and the system output measurement, $y_{meas}$. In some cases, determining the model order is also based on an estimate of the delay, $\tau_{est}$ (fifth operation 1725). A sixth operation 1726 comprises estimating one or more model parameter tensors, $\Theta$. A seventh operation 1728 comprises estimating a system output, $y_{est\_SE}$, based at least in part on the one or more estimated model parameter tensors, $\Theta$. An eighth operation 1727 comprises mapping the one or more estimated model parameter tensors, $\Theta$, to one or more coefficients (e.g., $a_{est}$, $b_{est}$ discussed above) of the non-linear/parametric/process model. Further, a ninth operation 1729 comprises computing the control signals, $u_{PID}$ and $u_{FF}$, based at least in part on the coefficients of the process model, $a_{est}$, $b_{est}$, and the estimated delay, $\tau_{est}$. A tenth operation 1730 comprises computing the possible control signal, $u_{SE}$, from the control signal, $u_{PID}$ and $u_{FF}$. As described above in relation to FIG. 16, the possible control signal, $u_{SE}$, for the adaptive PID sub engine may be calculated from a difference between the control signal ($u_{PID}$) and the feed forward control signal ($u_{FF}$). That is, $u_{SE} = u_{PID} - u_{FF}$. In some other cases, the possible control signal, $u_{SE}$, may be calculated by summing the $u_{PID}$ and $u_{FF}$ control signals. In such cases, $u_{SE} = u_{PID} + u_{FF}$.

Figure 19:
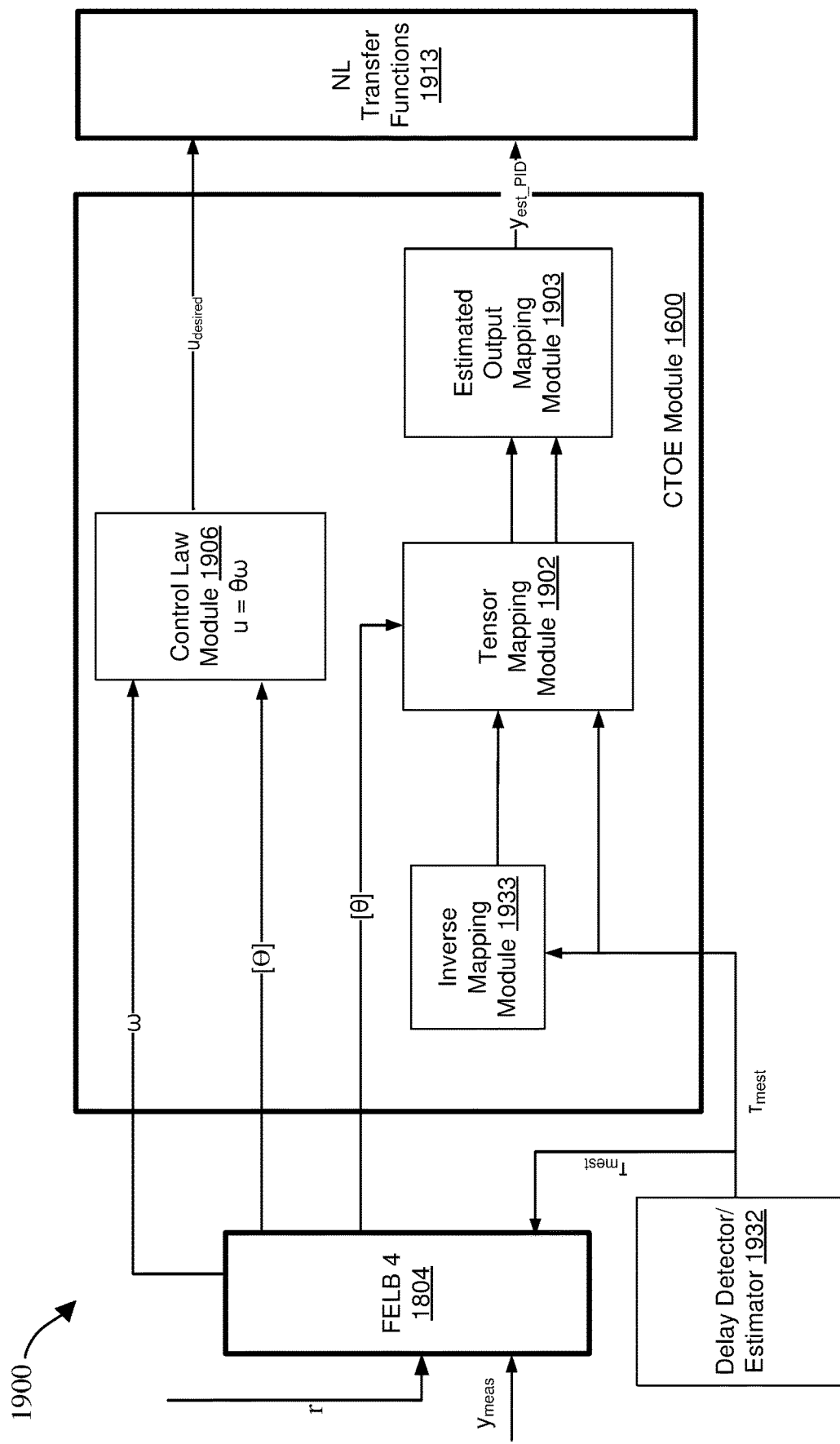
FIG. 19 illustrates a block diagram of an adaptive engine showing the details of the CTOE control law module in FIG. 18, in accordance with one or more implementations.

FIG. 19 depicts an adaptive engine 1900 showing the details of the CTOE control law module 1600 of the adaptive PID sub-engine, according to various aspects of the disclosure. As seen, the adaptive engine 1800 comprises an estimation law module (or FELB) 1804, an adaptive PID sub-engine 1901, and a delay detector/estimator 1932. Further, the adaptive PID sub-engine 1901 comprises a CTOE control law module 1906, a tensor mapping module 1902, an estimated output mapping module 1903, and an inverse mapping module 1933. The inverse mapping module 1933 is configured to calculate $F^{-1}(\theta)$ based on the parametric/process model type and/or order (e.g., $1^{st}$ order, $2^{nd}$ order, N, order). In some cases, the term "parametric/process model type" implies the presence of a delay in the process model. The adaptive engine 1800 further comprises a NL compensation module 1913 configured to compensate for non-linearities in one or more of the control signal (e.g., $u_{desired}$) and the estimated system output (e.g., $y_{est\_PID}$) received from the adaptive PID sub-engine. In one non-limiting example, the NL compensation module 1913 may be implemented using a plurality of NL transfer functions.

Similar to some of the other adaptive engines described herein, the estimation law module/FELB 1804 is configured to receive an input regressor, where the input regressor comprises at least a reference waveform (also referred to as setpoint stream, reference signal, or a series of set points) denoted as 'r', and a system output measurement, $y_{meas}$. In some embodiments, the input regressor may additionally comprise one or more of a total estimated system output for a previous iteration, $y_{est\_out\_k-1}$, an estimated delay, $\tau_{m\_est}$, a control output for a previous iteration, $u_{out\_k-1}$, an estimation error, ê, the non-linear model, $W_m$, and a plurality of coefficients for the non-linear model.

In some examples, the estimation law module 1804 is configured to apply one or more estimation laws to the input regressor, ω, to produce one or more estimated parameter tensors, $\Theta$, for a non-linear model of the one or more actuators and/or the system controlled by the one or more actuators. The estimation law module 1804 passes the one or more estimated parameter tensors, $\Theta$, to the control law module 1906 of the adaptive PID sub-engine. In some examples, the control law module 1906 also receives at least a portion (e.g., one or more subcomponents) of the input regressor. The control law module 1906 computes a control signal given by $u_{desired} = \theta\omega$. This control signal, $u_{desired}$, is passed to the NL compensation module 1913 where it is further processed to compensate for non-linear effects before being passed to the CSC (e.g., shown as CSC 1826 in FIG. 18).

In some examples, the estimation law module 1804 may optionally send the estimated model parameter tensors, $\Theta$, to the tensor mapping module. The tensor mapping module also receives the estimated process delay, $\tau_{m\_est}$, from the delay detector/estimator 1932. In some examples, the inverse mapping module 1933 receives as input the estimated model parameter tensors, $\Theta$, and the estimated process delay, $\tau_{m\_est}$, and outputs a tensor comprising the plurality of controller parameters (e.g., α, $K_c$, $T_d$, N, β, $T_i$, etc.) to the tensor mapping module. Specifically, the inverse mapping module 1933 is used to map the estimated model parameter tensors, $\Theta$, to the plurality of controller parameters, where the mapping from the estimated model parameter tensors to the controller parameters is based on one or more of the estimation error, ê, and the estimated process delay.

As noted above, each of the plurality of controller parameters may be represented as a function of the estimated coefficients (e.g., $a_{est}$, $b_{est}$) of the non-linear/parametric/process model and the estimated process delay. In some cases, the tensor mapping module is configured to map the controller parameters (e.g., received from the inverse mapping module 1933) to the estimated coefficients of the process model. In some aspects, at least a portion of the non-linear/parametric/process model is estimated at the tensor mapping module, based upon mapping the controller parameters to the coefficients of the process model. The tensor mapping module passes information pertaining to the estimation of the process model, the estimated coefficients of the process model, and any other relevant information to the Estimated Output Mapping Module 1903. The Estimated Output Mapping Module 1903 is configured to produce a possible estimated system output, $y_{est\_PID}$, for the CTOE control law module, based upon applying (1) a previous iteration of the possible control signal, $u_{SE\_k-1}$, or (2) the control signal, $u_{desired}$, to the non-linear/process model. This possible estimated system output, $y_{est\_PID}$, corresponding to the CTOE control law module is passed to the NL transfer functions 1913, which compensates for any non-linear effects present in the $y_{est\_PID}$ signal. After compensating for non-linear effects (if any) in the $y_{est\_PID}$ signal, the NL compensation module/transfer functions 1913 passes the possible estimated system output (e.g., $y_{est\_SE\_CTOE}$) corresponding to the CTOE control module 1600 to the control selector/combiner (e.g., CSC 1826).

Figure 20:
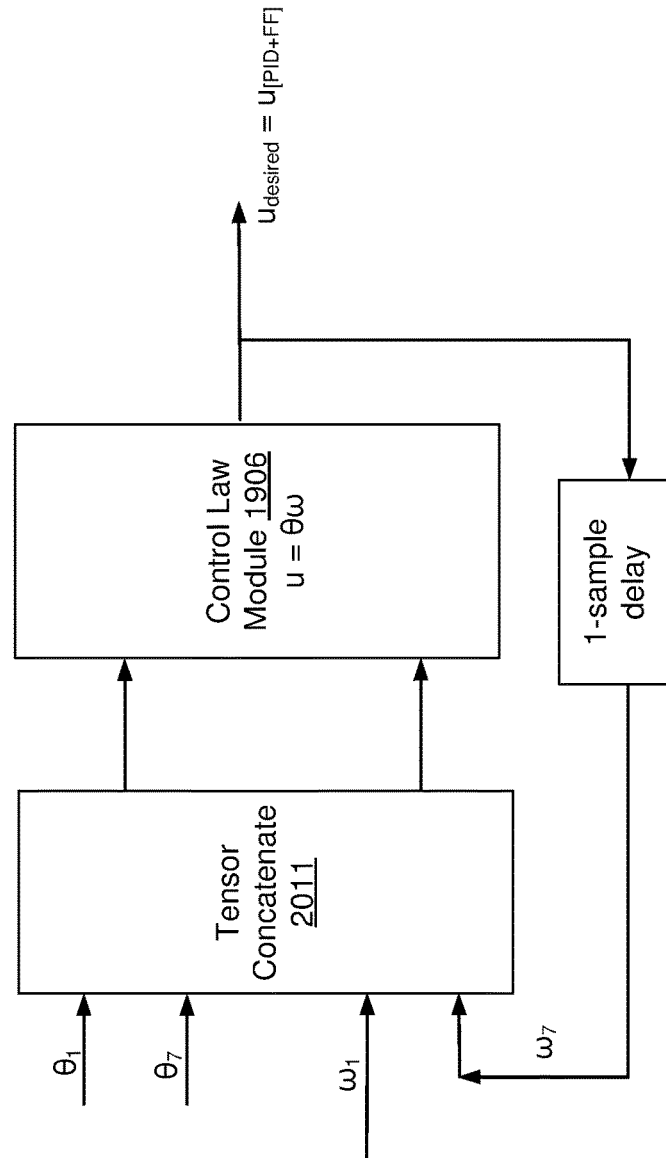
FIG. 20 depicts a block diagram showing an example of how a control law is implemented in the CTOE control law module in FIG. 18, according to various aspects of the disclosure.

FIG. 20 depicts a block diagram 2000 showing how the control law is implemented for the CTOE method, according to various aspects of the disclosure. As seen, FIG. 20 illustrates a tensor concatenate module 2011 and the CTOE control law module 1906 (previously described in relation to FIG. 19). The tensor concatenate module 2011 and the CTOE control law module 1906 may be embodied in hardware, software, or a combination thereof. As seen, the tensor concatenate module 2011 is configured to receive the plurality of subcomponents (e.g., $\theta_1$, $\theta_2$, $\theta_3$ ... $\theta_7$) of the estimated model parameter tensor, $\theta$, from the estimation law module 1804. In some examples, the tensor concatenate module 2011 also receives the plurality of subcomponents (e.g., $\omega_1$, $\omega_2$, $\omega_3$ ... $\omega_7$) of the input regressor, $\omega$. The tensor concatenate module 2011 is configured to concatenate the inputs (e.g., $\theta_1$ ... $\theta_7$; $\omega_1$ ... $\omega_7$) and pass them to the CTOE control law module 1906, which produces the control signal, $u_{desired}$=[$\theta$][$\omega$]. In some examples, the control signal, $u_{desired}$, may also be represented as $u_{PID}$–$u_{FF}$. Alternatively, the control signal, $u_{desired}$, may be calculated as $u_{PID}$+$u_{FF}$.

As seen, in some examples, one of the subcomponents ($\omega_7$) of the input regressor, corresponding to the control output, $u_{out\_k-1}$, from the previous iteration, is in the feedback path, where the feedback path comprises a 1-sample delay. In such cases, the previous iteration's control output, $u_{out\_k-1}$, is delayed by 1-sample before being passed to the tensor concatenate module 2011.

Figure 21:
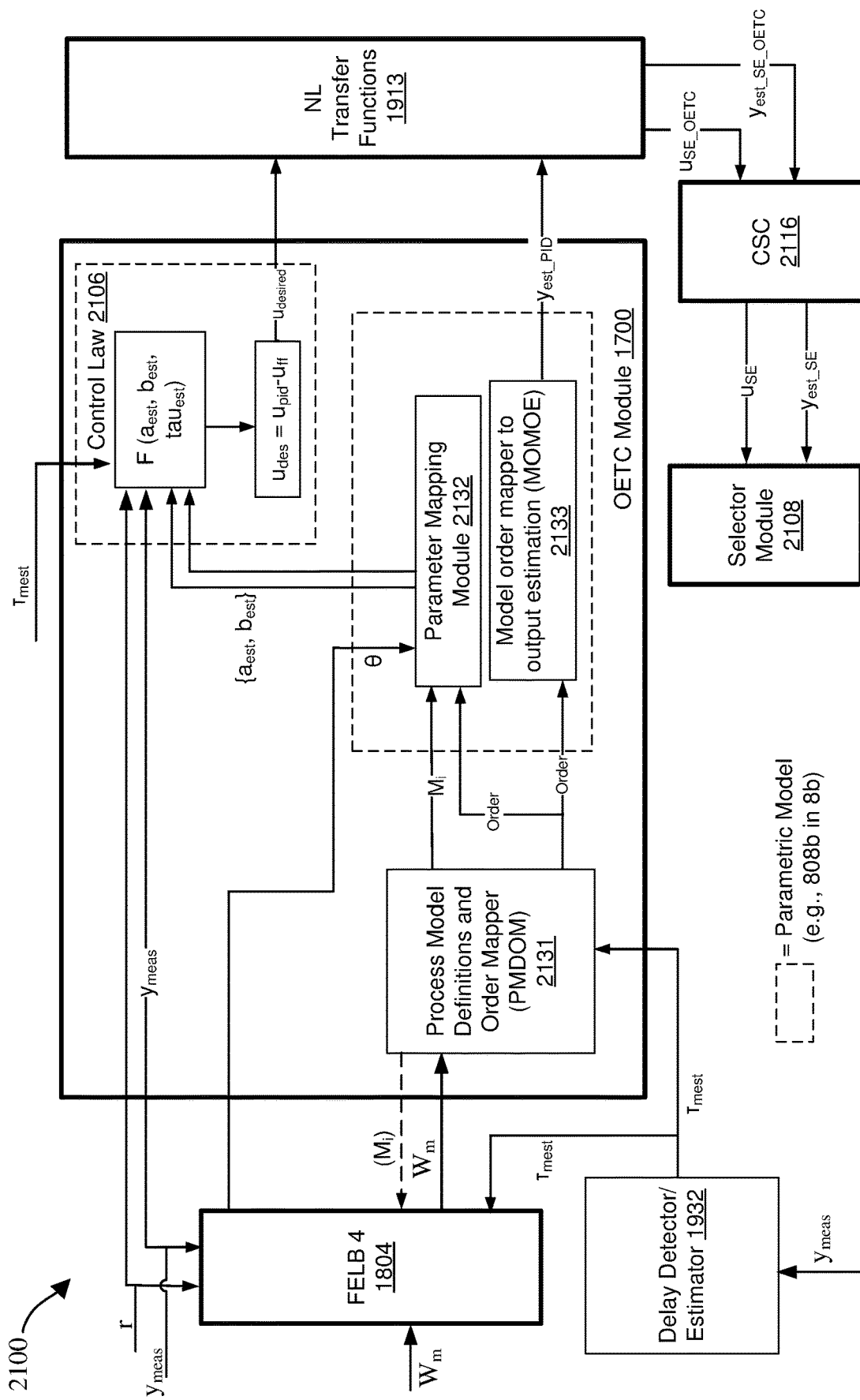
FIG. 21 depicts a block diagram of an adaptive engine showing a detailed view of the OETC control law module in FIG. 18, according to various aspects of the disclosure.

FIG. 21 depicts a block diagram of an adaptive engine 2100, showing a detailed view of the OETC control law module of the adaptive PID sub-engine, according to various aspects of the disclosure. The adaptive engine 2100 in FIG. 21 implements one or more aspects of the adaptive engine 1800 previously described in relation to FIG. 18. The adaptive engine 2100 comprises an estimation law module/FELB 1804, an OETC control law module 2121, a delay detector/estimator 1932, a NL compensation module 1913 (also referred to as NL transfer functions 1913), a control selector/combiner or CSC 2116, and a selector module 2108. The NL transfer functions 1913, the CSC 2116, the delay detector/estimator 1932, and the selector module 2108 may be similar or substantially similar to the ones described above in relation to FIGS. 18-20. While not shown, the selector module 2108 may also comprise a CSC (e.g., shown as CSC 1816 in FIG. 18) and one or more of a TSD (e.g., TSD 1818) and a tensor sync and coherency module (e.g., tensor sync module 1827).

In some embodiments, the OETC control law module comprises a control law 2106 block and a non-linear/estimation portion block (shown by the dashed lines). As seen, the control law 2106 may form a portion of the non-linear/estimation portion, in some examples. The OETC control law module further comprises a process model definitions and order mapper (PMDOM) 2131, a parameter mapping module 2132, a model order mapper to output estimation (MOMOE) 2133.

In the example shown, the estimation law module 1804 receives as input the reference waveform, r, the system output measurement, $y_{meas}$, the estimated delay, $\tau_{m\_est}$, and the non-linear/estimation portion, $W_m$. The estimation law module 1804 may also receive the model order ($M_i$) from the PMDOM 2131. In one non-limiting example, the model order may be equal to or less than 5. It should be noted that, higher model orders (e.g., >5) are contemplated in different embodiments, and the examples listed herein are not intended to be limiting. In some cases, the process model selected may be based on the hardware resources available. For example, a process model having zeros and a delay of less than or equal to order 5 (i.e., a $5^{th}$ order model), may be utilized, based on the hardware resources available.

In some embodiments, the process models used for the OETC method/scheme for which the estimated model parameters can be translated into PID tunable values (i.e., where the PID tunable values are given as a function of the estimated model parameters) may be represented as follows:

$$M_1: y = (K_n z^{-k\tau_m}) u_{out}, \text{ where } k_{\tau m} = \text{ceiling}\left(\frac{\tau_m}{T_s}\right) \quad \text{(Equation 55)}$$

$$M_2: y = (K_n \pm K_n H\{u_{out}\}) z^{-k\tau_m} \quad \text{(Equation 56)}$$

$$M_i: \dot{x}_{est} = \begin{bmatrix} -a_4 & 1 & \cdots & 0 \\ \vdots & & \ddots & \vdots \\ -a_0 & 0 & \cdots & 0 \end{bmatrix} x_{est} + \begin{bmatrix} b_4 \\ \vdots \\ b_0 \end{bmatrix} u_{out} z^{-k\tau_m} \quad \text{(Equation 57)}$$

$$y_{est} = \begin{bmatrix} 1 & \cdots & 0 \\ \vdots & \ddots & \vdots \\ 0 & \cdots & 1 \end{bmatrix} x_{est} \quad \text{(Equation 58)}$$

In accordance with aspects of the disclosure, the OETC control law can be implemented in 4 or less reduced instruction set computer (RISC) clock cycles, in some embodiments. This means that, if the control rate ($T_s$) is ~250 $n_s$ and the real-time processor (e.g., FPGA or ASIC) has a clock rate ($T_{clock}$), where $T_{clock}=T_s/8=31.25$ ns, the controller can be implemented through an oversampling factor of 2, which serves to reduce consumption by a factor of 2, through pipelining, resource sharing and streaming, etc.

In some other cases, if the control rate is set to $T_s=4*T_{clock}=125$ ns, the controller can be twice as fast. In other words, the present disclosure supports the use of a variable control rate (e.g., $T_s=4*T_{clock}$; $T_s=8*T_{clock}$) based on the hardware resources available. In some cases, if the hardware resources are limited, the resource usage can be divided (e.g., by a factor of 2, such that $T_s=8*T_{clock}$), which allows pipelining and sharing of hardware resources.

Although not illustrated, the Adaptive PID sub-engine can operate as a standalone controller. In such an embodiment, the estimation law modules/FELB can be replaced by an empirically derived lookup table for the estimated model parameter tensors, Θ. More specifically, a lookup table can be empirically formed as a mapping between (1) $y_{meas}$ and $u_{out}$ from a reference/calibration system and (2) estimated model parameter tensors, Θ. During operation of the Adaptive PID standalone controller as a standalone controller, a control, $u_{out}$, can be provided to the one or more actuators, and measurements, $y_{meas}$, can be taken from the one or more actuators and/or system. These can then be used to select estimated model parameter tensors, Θ, from the lookup table, and then provided to the Adaptive PID standalone controller to determine what will be called a control signal, $u_{out}$. This control signal, $u_{out}$, can be provided to the one or more actuators. Alternatively, the Adaptive PID standalone controller can produce a string of possible control signals, $u_{se}$, and form a control, $u_{out}$, as a combination of the string. For instance, a weighted average of the possible control signals, $u_{se}$, can be used to calculate the control, $u_{out}$, although other methods of combining the string can also be implemented. In some embodiments, the combination may be based on estimated system outputs, $y_{est\_se}$, for each of the possible control signals, $u_{se}$, similar to the way in which a topology is selected in the selector and combiner mentioned earlier. These estimated system outputs, $y_{est\_se}$, can be found via an estimation portion of the nonlinear model, for instance, using Model 1:

$$y_{est\_se} = W_m\{u_{se}, \Theta\}$$

Where the estimated model parameter tensor, Θ, is found in the lookup table based on the measured system output, $y_{meas}$, and the control, $u_{out}$, both from a previous iteration. The Adaptive Tensor Identity Mapping Sub Engine (ATIMC)

As noted above, when there is not a-priori knowledge about the system dynamics and where large disturbances exist (e.g., an abrupt change in process chemistry or changing chamber pressure, gas flow, or thermal conditions or anything that would cause a large change in plasma impedance), or where the system is oscillatory, a fifth sub-engine, the ATIMC sub-engine can be implemented, selected or have the most influence on the control, $u_{out}$. The ATIMC sub-engine creates a control law in different parts by subtracting specific effects of disturbances, nonlinearities, dither, and noise in a compartmentalized manner rather than lumping these together. In other words, the ATIMC sub engine is configured to separate between disturbance rejection, noise canceling, and the controller itself, while at the same time able to track/follow the reference signal (or setpoint) adaptively and robustly. In some examples, the ATIMC sub engine is designed to support multi-rate signal processing, which allows for faster and more robust adaptation, as compared to the prior art. Additionally, or alternatively, the ATIMC sub engine may also help reduce or minimize control signal noise (e.g., noise associated with the possible control signal, $u_{SE}$, or the output control signal, $u_{out}$). The ATIMC sub engine is configured to produce possible control signals, $u_{SE}$, that can be used for controlling non-linear systems having stable or unstable zero-dynamics. Additionally, the ATIMC sub engine may also be utilized for controlling stable or unstable non-linear systems. In some embodiments, the ATIMC sub engine may be utilized to produce control signals for non-linear multiple input multiple output (MIMO) systems. Additionally, the ATIMC sub engine may be used in conjunction with Artificial Neural Networks (ANN) and/or Fuzzy Logic Mechanisms (FLM), in some embodiments.

The ATIMC sub engine (or ATIMC control law module) is configured to work with one or more of the estimation law modules (or FELBs) described herein. For example, the ATIMC sub engine may be incorporated within an adaptive engine (e.g., adaptive engine 500), where the adaptive engine provides a plurality of combinations of estimation law modules (also referred to as FELBs) and the ATIMC control law module.

Figure 23:
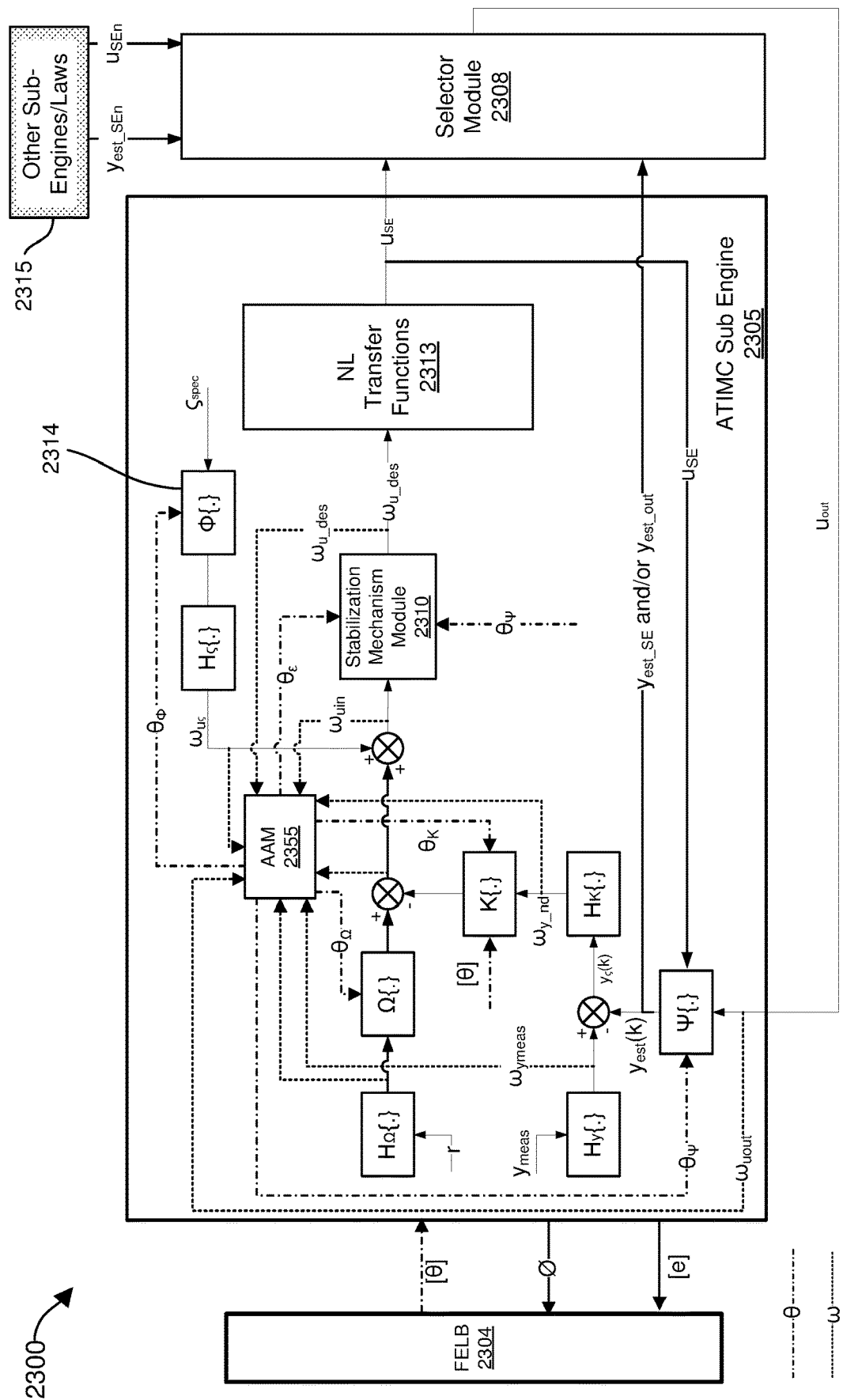
FIG. 23 illustrates an example of an adaptive engine implementing an ATIMC control law sub-engine, in accordance with one or more implementations.

FIG. 23 illustrates an example of an adaptive engine 2300, in accordance with one or more implementations. As seen, the adaptive engine 2300 comprises an estimation law module 2304 (also referred to as FELB 2304), an ATIMC sub engine 2305, and a selector module 2308. The selector module 2308 may be similar or substantially similar to any of the other selector modules described herein, including at least selector module 508. As seen, the selector module 2308 receives one or more possible control signals, $u_{SE}$, from the control law module/sub engine 2305 and the other sub-engines/laws 2315 and selects one or a combination of these possible control signals, $u_{SE}$, for output as the control, $u_{out}$. In the example shown, sub engine 2305 comprises a plurality of internal mechanisms/modules, where each internal mechanism or module is configured to compensate for different physical effects, noise, disturbance, etc. For instance, the sub engine 2305 comprises an Adaptive Adjustment Mechanism (AAM) module 2355 that helps determine at every time instant, k, the coefficients of the estimated model parameter tensor, θ, that are relayed to different mechanisms/modules of the sub engine.

In some examples, a tensor, ω, comprising a plurality of subcomponents (e.g., $\omega_{u\_des}$, $\omega_{uin}$, $\omega_{u\zeta}$, $\omega_{uout}$, etc.) is received by the AAM module 2355. The subcomponents of the ω tensor correspond to different physical quantities, signals, physical effects (e.g., noise and disturbance), etc. Here, the ω tensor is being used as the input regressor tensor, Ø, or a filtered variation thereof (e.g., ψ) described in the preceding sections. As shown, the estimation law module/ FELB 2304 receives the input regressor tensor, Ø, from the sub engine 2305. The FELB 2304 also receives one or more error signals (or a tensor of error tensors, [e]) from the sub engine 2305, generates one or more estimated model parameter tensors, Θ, and passes the model parameter tensors, Θ, to the sub engine. In some examples, the FELB 2304 also passes a derivative of the estimated model parameter tensors, $\dot{\theta}$, to the sub engine. In FIG. 23, the notation [θ] is used to indicate the presence of one or more of θ and its derivative $\dot{\theta}$.

The first letter of the subscript (e.g., 'u', 'y', etc.) of an ω variable/signal in FIGS. 23-30 is used to indicate whether the ω variable/signal corresponds to a control signal, a measurement, etc. In some cases, the AAM module 2355 processes the subcomponents of the ω tensor to generate the one or more error tensors, [e], sent to the estimation module 2304. For instance, as seen in FIG. 23, the AAM module 2355 receives a plurality of subcomponents (e.g., $\omega_{u\_out}$, $w_{y\_meas}$, $\omega_{y\_nd}$, $\omega_{u\_des}$, $\omega_{u\zeta}$) of the ω tensor, where some subcomponents (e.g., $\omega_{u\_out}$, $\omega_{u\_des}$) are associated with control signals, some subcomponents (e.g., $\omega y_{meas}$, $\omega_{y\_nd}$) are associated with system measurements, etc. The sub engine 2305 also includes a plurality of filters, denoted as H{·}, including Hy{·}, $H_K\{\cdot\}$, $H_\zeta\{\cdot\}$, $H_\Omega\{\cdot\}$, etc. Each of these filters receives a signal (e.g., control output, $u_{out}$; system output measurement, $y_{meas}$; reference signal, r; etc.) and outputs a corresponding subcomponent of the ω tensor. For instance, the filter represented by Hy{·} receives as input the system output measurement, $y_{meas}$, and outputs a subcomponent ($\omega_{y\_meas}$) of the ω tensor. Similarly, the filter represented by $H_K\{\cdot\}$ receives as input a signal, $y_\zeta(k)$, which corresponds to a difference between the system output measurement, $y_{meas}$ (or $\omega_{y\_meas}$), and the estimated system output, $y_{est}$, and outputs a subcomponent ($\omega_{y\_nd}$) of the $\omega$ tensor. The estimated model parameter tensor [θ] passed from the FELB 2304 also includes a plurality of subcomponents (e.g., $\theta_\Psi$, $\theta_K$, $\theta_\Omega$, $\theta_\Phi$, $\theta_\varepsilon$) that when combined (e.g., tensor multiplied) with different subcomponents of the $\omega$ tensor allow different portions of the control signal, $u_{SE}$, to be estimated. In other words, each mechanism/module/mapping operator in the sub engine 2305 that receives a subcomponent of the [θ] and [ω] tensors generates a portion of the possible control signal (e.g., using control law 1A, where $u_{SE}=\theta\omega$).

Figure 24:
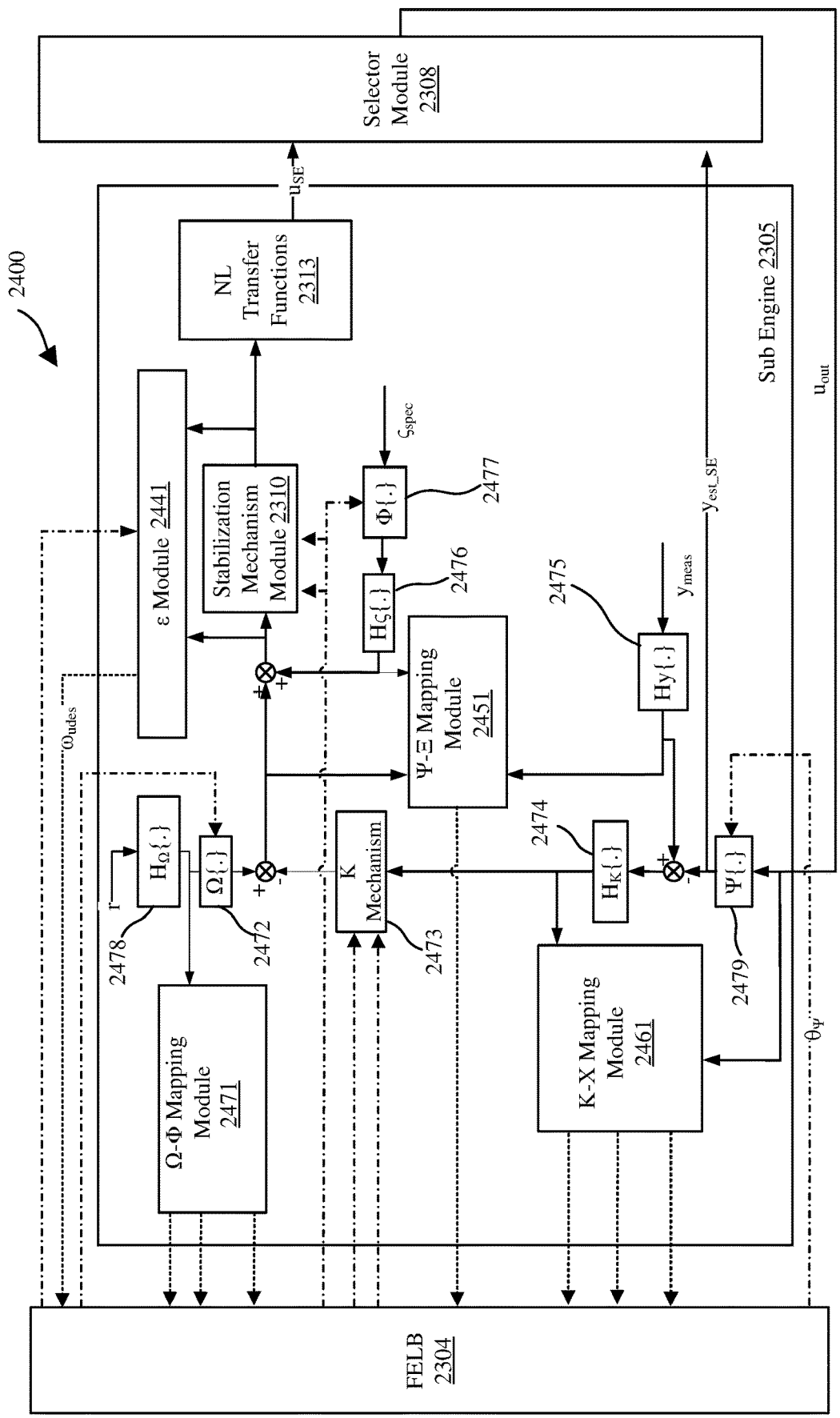
FIG. 24 illustrates another example of an adaptive engine implementing an ATIMC control law sub-engine, in accordance with one or more implementations.

FIG. 24 illustrates an example of an adaptive engine 2400, in accordance with one or more implementations. As seen, the adaptive engine 2400 comprises an estimation law module 2304 (also referred to as FELB 2304), an ATIMC sub engine 2305, and a selector module 2308. The sub engine 2305 in FIG. 24 depicts some examples of the mapping modules, mapping operators, filters, and mechanisms implemented within the ATIMC sub engine, according to various aspects of the disclosure. FIGS. 25-30 discuss these in further detail, but the purpose of the illustration in FIG. 24 is to show them at a higher level. The adaptive engine 2305 comprises a plurality of mapping modules, including an Omega-Phi mapping module 2471, a Kappa-Aleph mapping module 2461, a Psi-Big Theta mapping module 2451, an Epsilon module 2441, a stabilization mechanism module 2310, and a Kappa mechanism 2473. The adaptive engine 2305 further comprises a plurality of mapping operators, including an Omega mapping operator 2472 ($\Omega\{\cdot\}$), a Psi mapping operator 2479 ($\Psi\{\cdot\}$), and a Phi mapping operator 2477 ($\Phi\{\cdot\}$). The adaptive engine 2305 also includes a plurality of filters, including filter 2474 ($H_K\{\cdot\}$), filter 2475 ($Hy\{\cdot\}$), filter 2476 ($H_\zeta\{\cdot\}$), and filter 2478 ($H_\Omega\{\cdot\}$). As seen, the estimation law module/FELB 2304 and the sub engine 2305 are configured to pass a plurality of signals between each other. For the sake of illustration, the dotted arrows represent subcomponents of the $\omega$ tensor that are passed from the different elements of the sub engine to the estimation law module 2304, while the dash-dot arrows represent subcomponents (e.g., coefficients) of the estimated model parameter tensor, [θ], that are produced by the estimation law module 2304 and passed to the different elements of the sub engine 2305. In some cases, an element (e.g., mapping operator) of the sub engine may receive a portion (or subcomponent) of both the $\omega$ tensor and the estimated model parameter tensor, [θ], and produce a portion (or subcomponent) of the possible control signal, $u_{SE}$. The various portions/subcomponents of the possible control signal may be combined to produce the possible control signal, $u_{SE}$, passed to the selector module 2308, in some examples.

Figure 25:
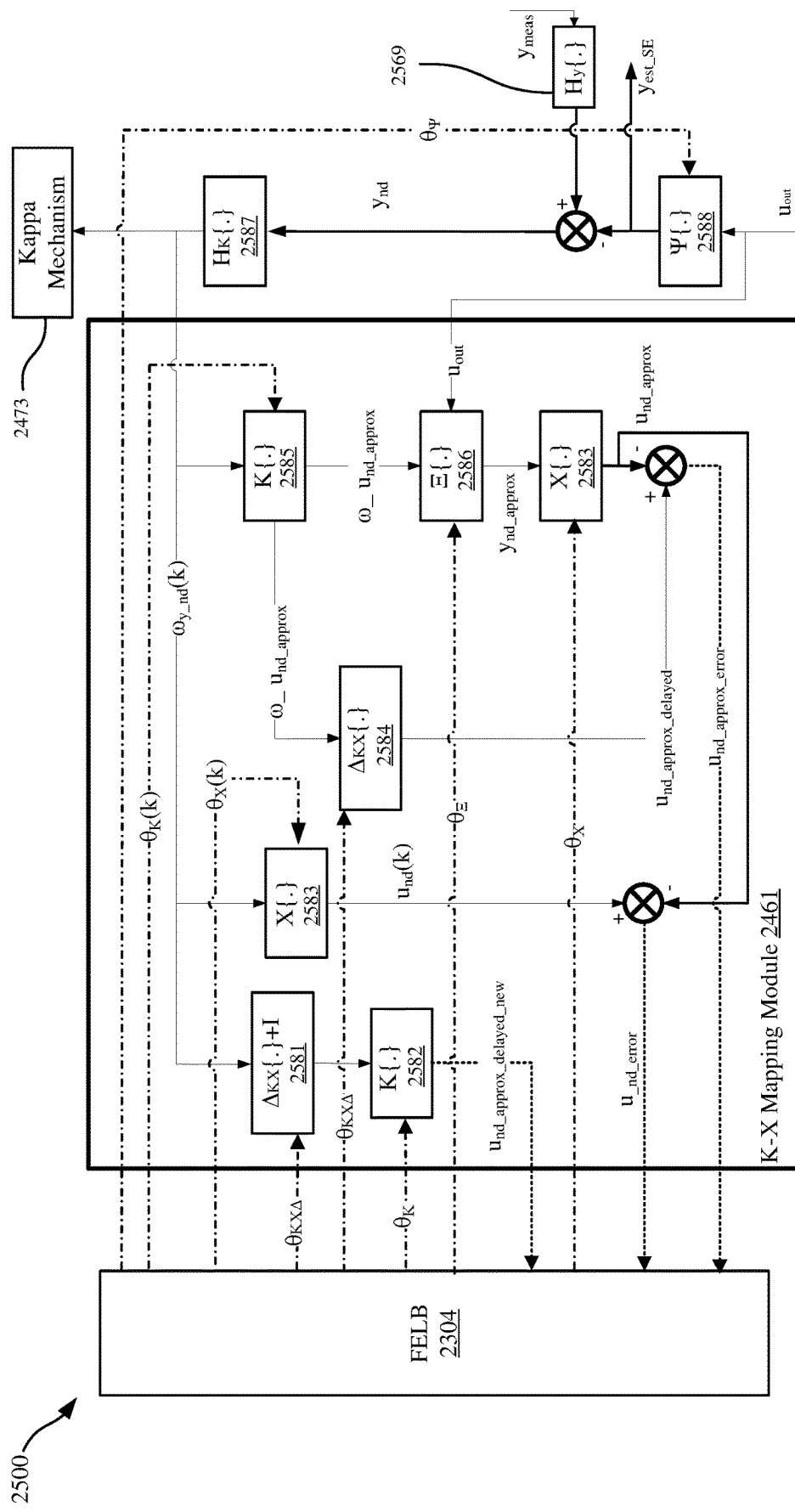
FIG. 25 illustrates a detailed view of a first mapping module of the ATIMC control law sub-engine in FIG. 24, in accordance with one or more implementations.

Turning now to FIG. 25, which illustrates a detailed view of a first mapping module 2461 (i.e., the Kappa-to-Aleph mapping module, or simply K-X mapping module 2461) of an adaptive engine 2500, in accordance with one or more implementations. In some examples, the K-X mapping module 2461 serves as a noise and disturbance mapping module and helps generate one or more learned parameters (e.g., estimated parameters or coefficients of the estimated model parameter tensor, θ) for mapping the measured noise and disturbances (e.g., in the system output measurement, $y_{meas}$) to a control signal component. In other words, the K-X mapping module 2461 helps determine a control signal component of the possible control signal, $u_{SE}$, or the control output signal, $u_{out}$, that may induce/cause the noise and disturbances seen in the measurements. Due to its nature, its contemplated that the K-X mapping module 2461 may also be referred to as a noise-disturbance mapping module 2461.

As seen, the K-X mapping module 2461 comprises one or more Kappa mapping operator 2585 (shown as $K\{\cdot\}$), one or more Aleph mapping operators 2583 (shown as $X\{\cdot\}$), one or more delay blocks 2581, 2584 (shown as $\Delta_{KX}\{\cdot\}+I$, $\Delta_{KX}\{\cdot\}$), and a Big Theta operator 2586 (shown as $\Xi\{\cdot\}$). FIG. 25 also depicts one or more mechanisms/operators/modules external to the K-X mapping module 2461 (but within the sub engine 2305), including a filter 2587 (shown as $H_K\{\cdot\}$), a Psi mapping operator 2588 (shown as $\Psi\{\cdot\}$), a system output measurement filter 2569 (shown as $Hy\{\cdot\}$), and a Kappa mechanism 2473.

The K-X mapping module 2461 (i.e., the noise-disturbance mapping module 2461) is configured to receive a subcomponent, $\omega_{y\_nd}$, of the $\omega$ tensor, where the subcomponent, $\omega_{y\_nd}$, corresponds to the portion of the system output (e.g., measured system output, $y_{meas}$; estimated system output, $y_{est}$) associated with noise and/or disturbance. In some embodiments, this noise and disturbance portion of the system output is isolated from the overall system output (e.g., $y_{meas}$) by subtracting the mapped process output (i.e., generated by passing the control output from the previous iteration, $u_{out}$, through the $\Psi\{\cdot\}$ tensor mapping operator 2588) from the measured output (e.g., $y_{meas}$ or $\omega_{y\_meas}$). In some cases, this noise/disturbance portion, $y_{nd}$, of the system output is passed through the Kappa filter 2587 ($H_K\{\cdot\}$), which serves as the input filter to the Kappa Mechanism 2473 and the K-X mapping module 2461. The filter 2587 outputs the signal, $\omega_{y\_nd}$, and passes it to the mapping module 2461.

In some cases, after the signal comprising the noise/disturbance subcomponent, $\omega_{y\_nd}$, is received at the K-X mapping module 2461, it is passed through each of the delay block 2581, the Aleph mapping operator 2583, and the Kappa mapping operator 2585. The Kappa mapping operator 2585 maps the noise/disturbance component, $\omega_{y\_nd}$, of the measured output to a corresponding noise/disturbance component, $\omega_{u\_nd}$, of the control signal. In other words, $\omega_{u\_nd}$ represents the part of the control signal (e.g., control output signal, $u_{out}$) that corresponds to the additional noise and disturbance seen in the output of the non-linear system being controlled. As seen, the Kappa operator 2585 receives the coefficients ($\theta_K$) of the model parameter tensor and uses them to map the noise/disturbance component, $\omega_{y\_nd}$, of the measured output to an approximation of the noise/disturbance component, $\omega_{u\_nd\_approx}$, of the control signal. This subcomponent ($\omega_{u\_nd\_approx}$) of the $\omega$ tensor corresponding to an approximate of the noise/disturbance inducing portion in the control signal (e.g., $u_{SE}$ or $u_{out}$) is passed to the delay block 2584. The delay block 2584 also receives a delay subcomponent, $\theta_{KX\Delta}$, of the estimated model parameter tensor, θ, where the delay subcomponent, $\theta_{KX\Delta}$, defines the delay increments/decrements to be applied to $\omega_{u\_nd\_approx}$. Applying Control Law 1A, where the control signal is a function of the estimated model parameter tensor, θ, and the input regressor, $\omega$, the output of the delay block 2584 can be calculated to be a control signal, $u_{nd\_approx\_delayed}$, which is a delayed version of the approximated noise/disturbance component, $\omega_{u\_nd\_approx}$, of the control signal.

In some examples, the Big Theta operator 2586 ($\Xi\{\cdot\}$) receives the approximated noise/disturbance component in the control signal, $\omega_{u\_nd\_approx}$, from the Kappa operator 2585, a portion ($\theta_\Xi$) of the estimated model parameter tensor, θ, from the estimation module 2304, and the control output from the previous iteration, $u_{out}$, and produces an approximate of the noise/disturbance component in the measured system output, $y_{nd\_approx}$, and it to the Aleph operator 2583.

The Aleph operator 2583 is used to produce an approximate of the noise/disturbance component, $u_{nd\_approx}$, in the control signal that corresponds to the approximated noise/disturbances, $y_{nd\_approx}$, in the output of the non-linear system. In some examples, the signals $u_{nd\_approx}$ and $u_{nd\_approx\_delayed}$ are passed to a summer, where the summer subtracts $u_{nd\_approx}$ from $u_{nd\_approx\_delayed}$ to produce an error signal ($u_{nd\_approx\_error}$) that is passed as one of the error signals to the estimation law module 2304. The estimation law module 2304 also receives one or more other error signals, including $u_{nd\_error}$, where $u_{nd\_error}$ is calculated from a difference between $u_{nd}(k)$–$u_{nd\_approx}$. The error signal, $u_{nd\_error}$, corresponds to an approximation/estimation error. In some cases, $u_{nd\_k}$ is produced at the output of the Aleph mapping operator 2583 based on mapping the measured noise/disturbance component, $y_{nd}$, to a corresponding control signal component, $u_{nd}$, where the mapping is based on a portion ($\theta_X$) of the estimated model parameter tensor, $\theta$. In some examples, the mapping comprises tensor multiplying the portion, $\theta_X$, of the estimated model parameter tensor, $\theta$, with the portion, $\omega_{y\_n}(k)$, of the $\omega$ tensor.

The delay block 2581 ($\Delta_{KX}\{\cdot\}+I$) also receives the signal, $\omega_{y\_nd\_k}$, and outputs a delayed version of $y_{nd\_k}$. Here, the identity matrix/tensor (i.e., 'I') is used to carry out the preparation of the calculations for the next iteration. In other words, the delay block 2581 is used to compute the value of the new delay increment/decrement (i.e., $\theta_{KX\Delta}$). Further, the output of the delay block 2581, which is $y_{nd\_k}$ (or $\omega_{y\_nd\_k}$) delayed by the new delay increment/decrement, $\theta_{KX\Delta}$, is passed to the Kappa mapping operator 2582. The Kappa mapping operator 2582 also receives a subcomponent ($\theta_K$) of the estimated model parameter tensor, $\theta$, which is used to map the $y_{nd\_k}$ delayed by the new delay (i.e., $y_{nd\_k\_delayed\_new}$) to a corresponding control signal component (approximate), $u_{nd\_approx\_delayed\_new}$. That is, the Kappa mapping operator 2582 (on the left of the page) outputs a delayed version of the approximated noise/disturbance component in the control signal, $u_{nd\_approx}$, where $u_{nd\_approx}$ is also delayed by the new delay increment/decrement, as defined by $\theta_{KX\Delta}$. For example, the Kappa operator 2582 outputs the noise/disturbance portion of the control signal delayed by the new delay as $u_{nd\_approx\_delayed\_new}$ to the estimation law module 2304.

In some embodiments, the estimation law module 2304 thus receives a plurality of error signals (e.g., $u_{nd\_error}$, $u_{nd\_approx}$ error) and an approximated noise/disturbance component, $u_{nd\_approx\_delayed\_new}$, from the K-X mapping module 2461 and outputs at least a portion (e.g., one or more subcomponents) of the estimated model parameter tensor, $\theta$. In this instance, the portions of the estimated model parameter tensor, $\theta$, sent to the K-X mapping module 2461 comprise: one or more delays (e.g., $\theta_{KX\Delta}$) and one or more coefficients (e.g., $\theta_K$, $\theta_X$, $\theta_\Xi$, $\theta_\Psi$) for the various tensorial mapping functions/operators (e.g., K$\{\cdot\}$ 2582, X$\{\cdot\}$ 2583, $\Xi\{\cdot\}$ 2586, $\Psi\{\cdot\}$ 2588).

Figure 26:
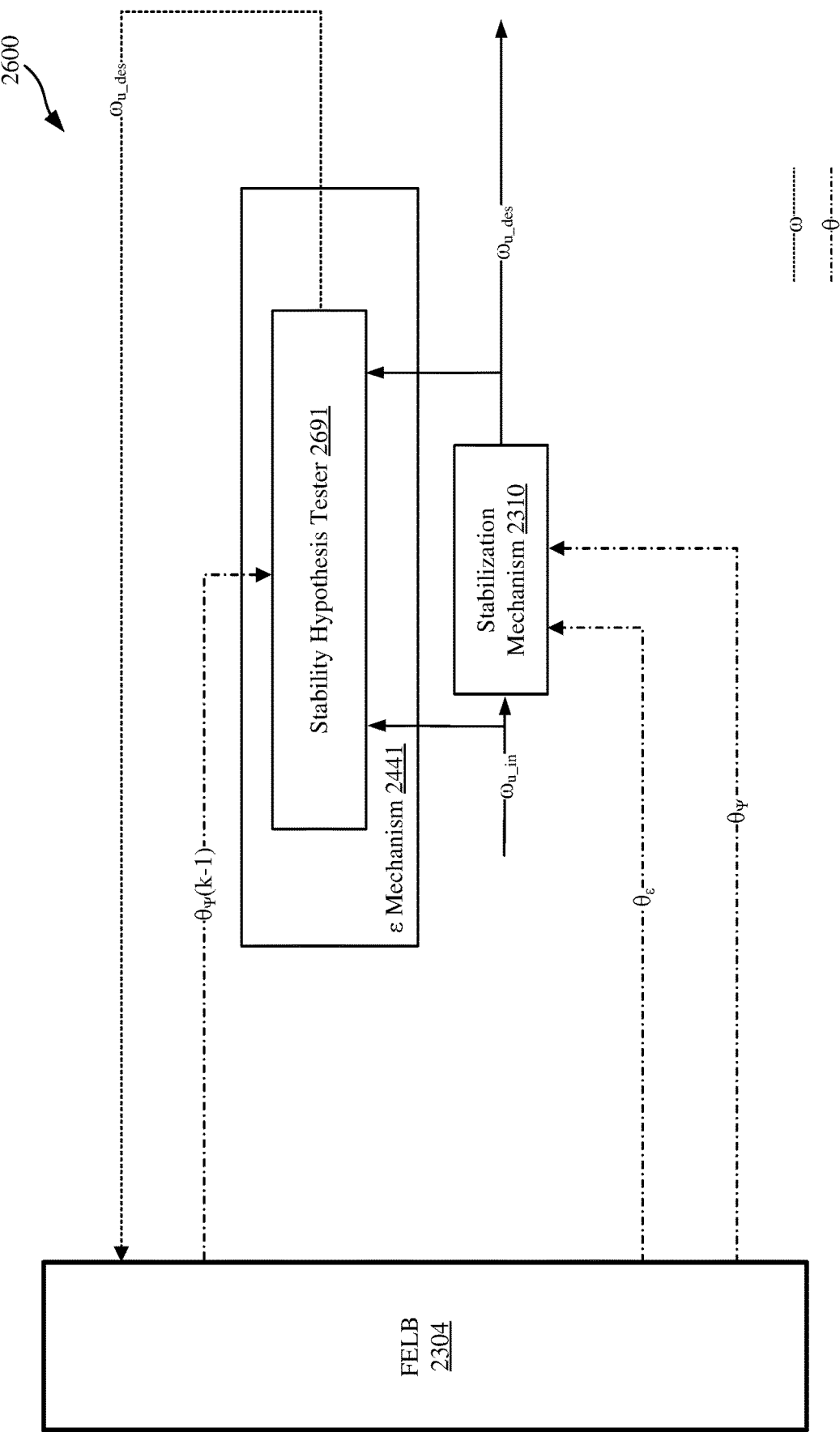
FIG. 26 illustrates a detailed view of a first mechanism implemented in the ATIMC control law sub-engine in FIG. 24, in accordance with one or more implementations.

FIG. 26 illustrates a detailed view of the Epsilon mechanism module 2441 of an adaptive engine 2600, in accordance with one or more implementations. The adaptive engine 2600 may be similar or substantially similar to the adaptive engines 2300-2500 described in relation to FIGS. 23-25. The adaptive engine 2600 comprises an estimation law module/FELB 2304, the Epsilon mechanism module 2441, and the stabilization mechanism module 2310. As seen, the Epsilon mechanism module 2441 comprises a stability hypothesis tester 2691 configured to receive a portion (e.g., one or more subcomponents or coefficients, such as $\theta_\Psi$) of the estimated model parameter tensor, $\theta$, and output a subcomponent (e.g., $\omega_{u\_des}$) of the $\omega$ tensor to the estimation module 2304. The Epsilon mechanism module 2441 (also referred to as an instability prevention module 2441) is configured to "tensorially" generate stabilizing controllers, for instance, in the case that the learned coefficient ($\theta_\Psi$) is unstable, which helps prevent the non-linear system being controlled from going unstable. In other words, the Epsilon mechanism module 2441 helps prevent the learned coefficients, $\theta_{\Psi_k}$, of the estimated model parameter tensor, $\theta$, from going unstable. The module 2441 works in conjunction with the stabilization mechanism module 2310 to test a hypothesis, described in further detail below.

As seen, the stabilization mechanism module 2310 is configured to receive the $\theta_\epsilon$ and $\theta_\Psi$ coefficients of the estimated model parameter tensor, $\theta$, from the estimation module 2304, and produce a desired and possible control signal, $u_{des}$ or $\omega_{u_{des}}$. This desired and possible control signal, $u_{des}$ or $\omega_{u_{des}}$, is passed to the NL transfer functions 2313, which help compensate for a-priori known non-linear effects, and produces a possible control signal, $u_{SE}$. In some examples, the desired and possible control signal, $u_{des}$ or $\omega_{u_{des}}$, is also passed to the stability hypothesis tester 2691 of the Epsilon mechanism module 2441. The stability hypothesis tester 2691 also receives the $\theta_\Psi$ coefficients from the previous iteration (shown as $\theta_{\Psi\_k-1}$) and an input control signal component, $\omega_{u_{in}}$, and determines if a predicted/estimated system output (e.g., $y_{est\_SE}$) is likely to go unstable. That is, the $\theta_\Psi$ coefficients are first used to map the input control signal component, $\omega_{u_{in}}$, to a predicted/estimated system output, following which the stability hypothesis tester 2691 determines if the predicted/estimated system output will be stable or unstable. If the stability hypothesis tester 2791 determines that the predicted system output will be unstable, the estimation law module/FELB 2304 is used to adaptively determine the $\theta_\epsilon$ coefficients such that the predicted/estimated system output will be stable. As shown in FIG. 26, these adapted $\theta_\epsilon$ coefficients/parameters are passed to the stabilization mechanism 2310, where they may be used by a stabilizer (shown as stabilizer 3092 in FIG. 30) to stabilize the input control signal component, $\omega_{u_{in}}$. In some embodiments, the stabilization mechanism 2310 is configured to apply the stabilizer (not shown) if the predicted system output from $\omega_{u_{in}}$ is going to be (or likely to be) unstable. Thus, the possible control signal, $u_{SE}$, produced by applying the NL transfer functions 2313 to the control signal component, $u_{des}$ or $\omega_{u_{des}}$, may be based on one of the original input control signal component, $\omega_{u_{in}}$, or the input control signal component after being passed through a stabilizer, $\omega_{u_{in}\_stabilized}$, further described below in relation to FIG. 30.

Figure 29:
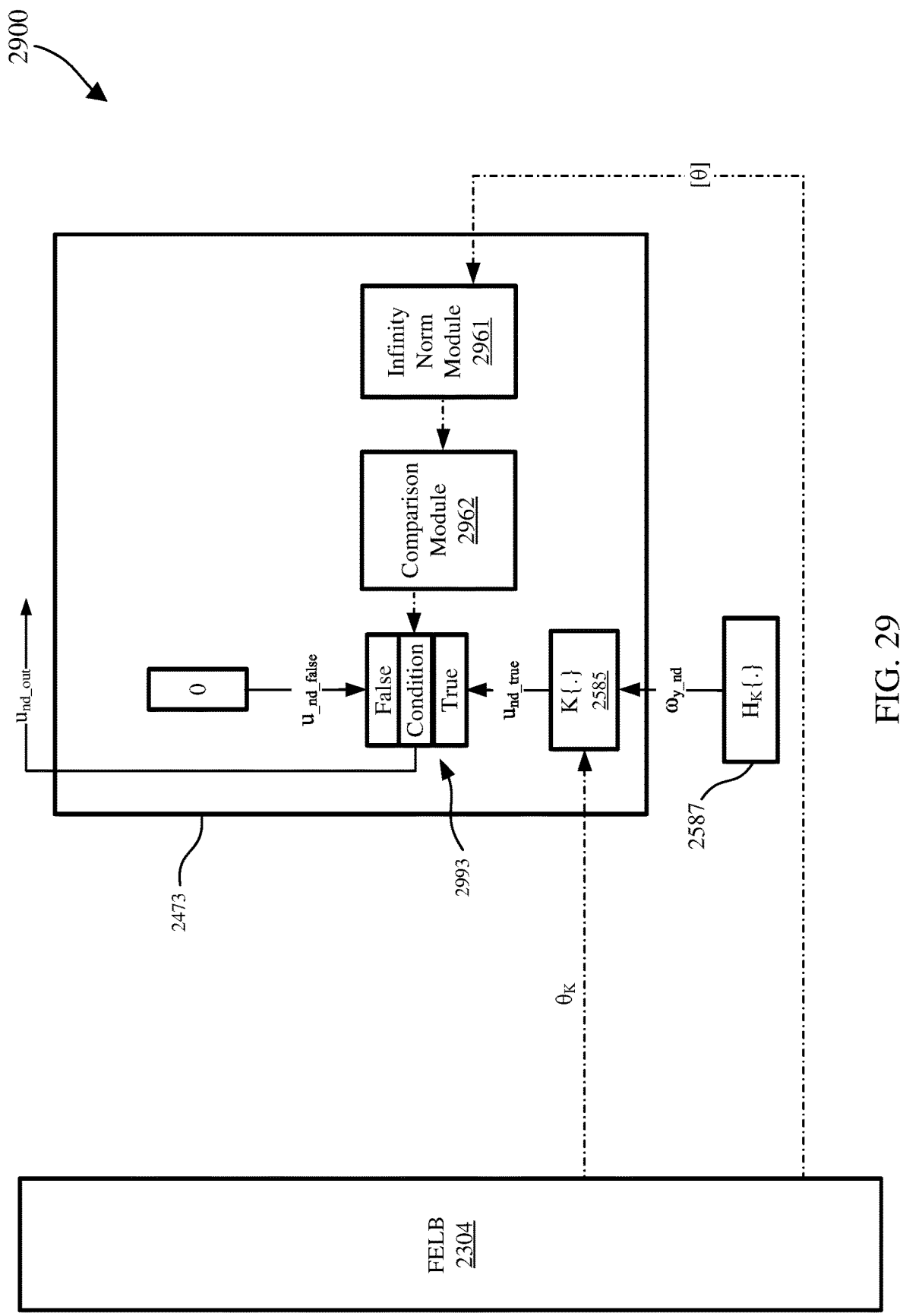
FIG. 29 illustrates a detailed view of a second mechanism implemented in the ATIMC control law sub-engine in FIG. 24, in accordance with one or more implementations.

FIG. 29 illustrates a block diagram showing the details of the Kappa mechanism module 2473 of an adaptive engine 2900, in accordance with one or more implementations. The adaptive engine may be similar or substantially similar to the adaptive engines 2300 and/or 2400 previously described in relation to FIGS. 23 and 24, respectively. The Kappa mechanism module 2473 in the ATIMC sub engine serves as a built-in mechanism to help prevent internal destabilization, for instance, if the adaptation has not converged yet. The H$\{\cdot\}$ filters (e.g., H$_K\{\cdot\}$ 2587) of the ATIMC sub engine helps the adaptation achieve rapid convergence by ensuring that persistent excitation signals have minimal to no impact on the measured system output, $y_{meas}$. In other words, the Kappa mechanism module 2473 may not be employed to reject disturbances until the adaptation has converged, in some examples. In this way, the estimated parameters/coefficients of the estimated model parameter tensor, θ, have minimal to no change. After the adaptation has converged, the Kappa mechanism module 2473 is used to reject noise/disturbances (if any). Such a design facilitates in a stable control output (i.e., a control output that prevents the nonlinear system being controlled from going unstable). In some examples, the convergence rate of the signals (e.g., persistent excitation signals) can be selected by the user/designer and input through a user interface. For example, the ATIMC sub engine allows the user to select the actuation rate and/or sensing rate, and the internal fundamental clock rate of the processor, to name two non-limiting examples. As used herein, the term "actuation rate" refers to the control rate (or the rate at which control signals are being generated). On the other hand, the term "sensing rate" refers to the rate at which the measurements are being taken/collected/obtained. In some cases, the actuation rate and the sensing rate may be the same or different. Additionally, in some circumstances, convergence can be reached within a few control/sensing/measurement samples. In some instances, convergence can be reached in just a single control/measurement sample. Typically, the H{·} filters, such as, but not limited to, the $H_K\{\cdot\}$ filter 2587, do not modify the measured/sensed samples at the time of measurement (e.g., $t_k$, $t_{k+1} \ldots t_{k+N}$). Further, the control sampling rate ($T_s$) may be written as shown below:

$$T_S = t_{k+1} - t_k = \frac{t_{k+N} - t_k}{N} \qquad \text{(Equation 59)}$$

As noted above, the processor (e.g., FPGA processor, CPU processor) on which the adaptation calculations are executed is usually significantly faster than the control rate. In such cases, there may be multiple processor clock samples (e.g., FPGA and/or CPU clock samples) within a single control sample. In one non-limiting example, there may be ten (10) processor clock samples for each control sample. That is, $T_p = T_s/n = T_s/10$, where $T_p$ is the duration of one processor clock sample. In such cases, for each measurement/control sample, there may be nine (9) iterations with a persistent excitation signal and one (1) with the actual control signal. It should be noted that, this iteration factor (e.g., 9:1) may be considered a design variable and can vary depending on the use case. Additionally, or alternatively, the iteration factor may be selected based on determining an optimal iteration factor needed for a quick and/or robust convergence. In some examples, the optimal iteration factor (e.g., 9:1, 12:1, 4:1, etc.) for the number of persistent excitation signals for each control signal may be determined empirically through experiments. In some cases, the persistently exciting signal may be generated by adding noise, where the noise comprises a spectral power covering the full operating range of the signals in question. That is, the additional noise generated is intended to cover the possible scenarios/situations that the nonlinear system is going to operate in, rather than creating a full noise spectrum. Such a design may enhance one or more of accuracy and speed of noise rejection, in some examples. In some cases, the spectral power of the additional noise may be determined based on the reference signal, r. The spectral characteristics of the added noise signals in question may or may not be known a-priori. In some embodiments, an Additive White Gaussian Noise (AWGN) may be utilized if the spectral characteristics of the signals in question are not known a-priori. AWGN refers to a basic noise model used in information theory and is used to mimic the effect of random processes occurring in nature. Other types of noise models known and/or contemplated in the art may be utilized in different embodiments, and the examples listed herein are not intended to be limiting.

As seen in FIG. 29, the Kappa mechanism module 2473 (also referred to as the internal destabilization prevention module 2473) receives an input tensor, [θ], where the input tensor, [θ], comprises at least the derivative of the estimated model parameter tensor, $\dot{\theta}$. In some cases, the input tensor [θ] also includes the estimated model parameter tensor, θ. The Kappa mechanism module 2473 comprises an infinity norm module 2961 configured to compute an infinity norm of the input tensor (e.g., $\dot{\theta}$ tensor). The infinity norm module 2961 passes the infinity norm to a comparison module 2962, which compares the infinity norm to a threshold. In one non-limiting example, the comparison module 2962 determines if the infinity norm is less than or equal to the threshold. In some cases, the threshold may be specified by the user/designer and may be based in part on the precision capabilities (or precision characteristics) of the hardware and/or the sensing equipment, to name two non-limiting examples. In some other cases, the threshold may be based on a minimum Signal-to-Noise (SNR) requirement set by a customer or indicated in a product specification. As such, the threshold may correspond to the lowest value of noise that may be allowable based on the desired SNR. The Kappa mechanism module 2473 also comprises a mapping operator 2585 (also referred to as Kappa mapping operator 2585, or simply K{·} 2585) that is configured to receive the $\theta_K$ coefficients produced by the estimation law module 2304. The mapping operator 2585 also receives a noise/disturbance component of the measured signal, $\omega_{y\_nd}$, which represents the effects of noise and/or disturbance on the system output measurements, $y_{meas}$. The mapping operator 2585 outputs a signal, $u_{nd\_true}$, which represents the extra/added noise and disturbance rejection control component, to the conditional block 2993. The conditional block 2993 also receives another signal, $u_{nd\_false}$, which represents zero (0) noise. The conditional block 2993 takes the output (e.g., Boolean operator, such as True/False) from the comparison module 2962 and outputs a signal, $u_{nd\_out} = u_{nd\_true}$, if the infinity norm is less than or equal to the threshold, and outputs a signal, $u_{nd\_out} = u_{nd\_false}$, if the infinity norm is greater than the threshold. Said another way, the noise and disturbance rejection control component, $u_{nd\_true}$, is added to the possible control signal, $u_{SE}$, or the control output, $u_{out}$, if the adaptation has converged, in which case the "True" condition is satisfied. However, if the adaptation has not yet converged, the "False" condition is satisfied and $u_{nd\_false}$ (e.g., 0, or another value specified by the designer) is utilized, in which case no noise and disturbance rejection may be carried out.

In some cases, the control signal component, und, corresponds to the portion of the control signal (e.g., $u_{SE}$ or $u_{out}$) that induces the noise/disturbance seen in the measured system output.

Figure 27:
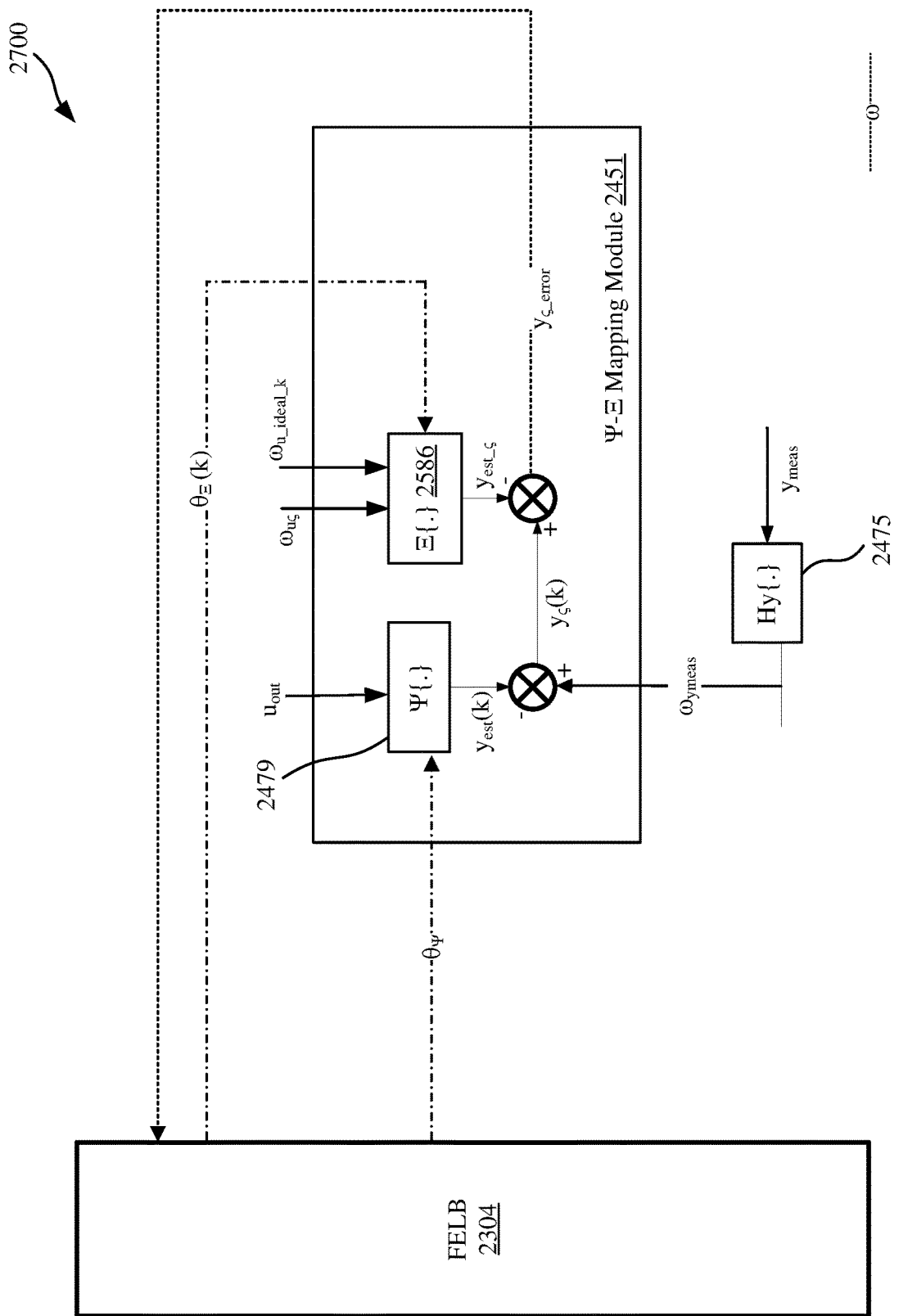
FIG. 27 illustrates a detailed view of a second mapping module of the ATIMC control law sub-engine in FIG. 24, in accordance with one or more implementations.

FIG. 27 illustrates a block diagram representation of the Psi-Big Theta mapping module 2451, in accordance with one or more implementations. In some cases, the Psi-Big Theta mapping module 2451 is also referred to as the control-to-measurement mapping module 2451, since it helps generate the learned coefficients/parameters (e.g., one or more subcomponents of the estimated model parameter tensor, θ) to carry the mapping from the control (e.g., possible control signal, $u_{SE}$, control output, $u_{out}$) to an estimated system output measurement, $y_{est}$.

In some cases, the Big Theta operator 2586 (shown as $\Xi\{\cdot\}$), is also referred to as the sensitivity mapping operator 2586, and is used to map a sensitivity in the Psi operator 2588 ($\Psi\{\cdot\}$) to a change in input, such that:

$$\Xi_k \triangleq \frac{\nabla_T \Psi_k}{\nabla_T u_k},$$

where $\nabla_T$ is a tensorial gradient.

The $\Xi$ operator 2586 is also employed to produce the coefficients, $\theta_\Psi$, that are fed to the Psi operator 2588 ($\Psi\{\cdot\}$). In some aspects, the $\Xi$ operator 2586 is used to determine the non-linear effects (if any) present around the $\Psi$ operator 2588. Said another way, the use of the $\Xi$ operator 2586 is similar to performing small signal analysis (e.g., in real time) and the use of the $\Psi$ operator 2588 is similar to performing large signal analysis. In some examples, the $\Xi$ operator 2586 corresponds to a derivative or sensitivity function of the $\Psi$ operator 2588. In such cases, the $\Xi$ operator 2586 and the $\Psi$ operator 2588 may comprise, or may be associated with, the same coefficients/parameters, but necessarily the same dynamics. In this way, $\Xi$ operator 2586 helps account for small nonlinearities and the $\Psi$ operator 2588 helps account for larger nonlinearities in the process/parametric/nonlinear model behavior. In some embodiments, obtaining the coefficients ($\theta_\Xi$) of the model parameter tensor, $\theta$, may help determine the coefficients ($\theta_\Psi$) of the model parameter tensor, $\theta$. Further, determining the coefficients, $\theta_\Psi$, helps ensure robustness and stability of the non-linear system being controlled, as small changes can often amplify and induce large (undesirable) effects in non-linear systems. As noted above, the coefficients, $\theta_\Psi$, passed to the Psi operator (e.g., Psi operator 2479, 2588) may be used to map a control signal (e.g., $u_{out}$) to an estimated system output (e.g., $y_{est}$). Thus, accurate determination of the coefficients, $\theta_\Psi$, facilitates in reducing or minimizing the estimation error (e.g., error corresponding to a difference between an estimated system output, $y_{est}$, and a measured system output, $y_{meas}$). In some cases, the coefficients $\theta_\Psi$ and $\theta_\Xi$ of the estimated model parameter tensor, $\theta$, sent to the $\Psi$ operator 2588 and the $\Xi$ operator 2586, respectively, may be the same or substantially the same. In other words, $\theta_\Psi=\theta_\Xi$, in some examples. However, it should be noted that $\Psi\{\cdot\}$ may or may not be equal to $\Xi\{\cdot\}$.

In some examples, the Psi mapping function/operator 2479 ($\Psi\{\cdot\}$), which is an example of a tensorial identity mapping operator, is employed to map a control signal (e.g., control output from a previous iteration, $u_{out\_k-1}$; possible control signal, $u_{SE}$) to an estimated system output measurement, $y_{est}$. It should be noted that the estimated system output measurement produced by the $\Psi$ mapping operator 2479 may be based on the control signal that is input to the mapping operator 2479. For example, if the $\Psi$ mapping operator 2479 receives a control output from a previous iteration, $u_{out\_k-1}$, it produces a total estimated system output, $y_{est\_out}$. If the $\Psi$ mapping operator 2479 receives a possible control signal, $u_{SE}$, for the ATIMC sub engine, it outputs a possible estimated system output, $y_{est\_SE}$, corresponding to the ATIMC sub engine. Thus, as seen, the estimated system output measurement produced by the $\Psi$ mapping operator 2479 is based on the control input ($u_{out}$ in this example) and a subcomponent (e.g., $\theta_\Psi$ coefficients) of the estimated model parameter tensor, $\theta$.

As seen in FIG. 27, the total estimated system output, $y_{est\_out}$, produced by the $\Psi$ mapping operator 2479 is passed to a summer, where it is subtracted from the system output measurement, $y_{meas}$, to produce $y_{\zeta(k)}$, where $y_{\zeta(k)}$ represents the effects of $\omega_{u\zeta}$ on the output. In some examples, $\omega_{u\zeta}$ represents a noise signal added to the control to enhance accuracy and/or convergence of the adaptation. In some examples, the added noise signal, $\omega_{u\zeta}$, is within the specification and/or tolerances specified by the end-user or designer. The noise signal, $\omega_{u\zeta}$, may be determined by mapping the specifications and tolerances, $\zeta_{spec}$, specified by the user to a corresponding control tensor component given by $\omega_{u\zeta}$. As shown in FIG. 23, this mapping from the user specified specifications/tolerances, $\zeta_{spec}$, to the noise signal, $\omega_{u\zeta}$, is carried out by the mapping operator 2314 ($\Phi\{\cdot\}$). Thus, the mapping operator 2314 is configured to map a variation or sensitivity in the system measurement outputs, $y_{meas}$, to an additive control component. Generation of this additive noise signal (or tensor control component), $\omega_{u\zeta}$, helps the ATIMC sub engine converge to the process model in real-time (or substantially real-time) as it reduces the time needed for identification of the non-linearities (e.g., small nonlinearities or chaotic behavior). From a practical standpoint, this means that the mapping operator 2314 (D$\{\cdot\}$) helps assess how the user specified tolerance affects the control (e.g., possible control signal, $u_{SE}$, control output, $u_{out}$, or another applicable control signal). It should be noted that, the additive noise signal used to identify the small nonlinearities/chaotic behavior are within the user specified tolerance (i.e., to ensure that the measured system output, $y_{meas}$, matches or substantially matches the one desired by the user). In some aspects, this allows determination of the small nonlinearities (i.e., via the added noise), while at the same time having minimal to no effect on the system output, $y_{meas}$, as seen by the user. In this way, the possible control signal, $u_{SE}$, output by the ATIMC sub engine facilitates responsiveness (e.g., maximize dynamic range in real time) and adaptability of a parallel multi-actuator nonlinear and/or chaotic control system. Moreover, such a design facilitates in improved controls (e.g., to maximize the speed of the response and achieve the shortest response time to reach a desired reference signal value, while also enabling stability and robustness) of a parallel multi-actuator nonlinear and/or chaotic control system. In some cases, the delay estimation and predictive aspects and adaptation aspects of the ATIMC sub engine may also enable all of the above functions and advantages to be achieved even when some of the actuators of the control system are arbitrarily slower than other actuators of the control system.

Returning now to FIG. 27, where the noise signal ($\omega_{u\zeta}$) is added to an "ideal" control signal component, $\omega_{u\_ideal\_k}$. Specifically, the noise signal ($\omega_{u\zeta}$) and the control signal ($\omega_{u\_ideal\_k}$) are input to the mapping operator 2586 which outputs an estimate $y_{est\_\zeta}$, where the estimate, $y_{est\_\zeta}$, represents the effects of the noise signal $\omega_{u\zeta}$ on the possible estimated system output, $y_{est\_SE}$. In some aspects, the estimate, $y_{est\_\zeta}$, is similar to the estimate, $y_{\zeta(k)}$, in that it represents the effects of the noise signal ($\omega_{u\zeta}$) on the system output. The difference being that $y_{est}$Ls represents the effects of the noise signal on the possible estimated system output, $y_{est}$, while $y_{\zeta(k)}$ represents the effect of the noise signal on the measured system output, $y_{meas}$. In some cases, the estimates $y_{est\_\zeta}$ and $y_{\zeta(k)}$ are passed to a summer, which outputs $y_{\zeta\_error}$ based on subtracting $y_{est\_\zeta}$ from $y_{\zeta(k)}$. As described above, the estimation law module/FELB 2304 is configured to receive one or more error tensors and output one or more estimated model parameter tensors, $\Theta$. As seen in FIG. 27, the estimation/approximation error signal, $y_{\zeta\_error}$, is passed to the estimation law module 2304. Further, the estimation law module 2304 processes the approximation/estimation error signal, $y_{\zeta\_error}$, corresponding to the effects of the noise signal and attempts to find the coefficients ($\theta_\Xi$) of the estimated model parameter tensor, $\theta$, that minimize this error. That is, the estimation law module 2304 produces the coefficients, $\theta_\Xi$, with the goal of making the error, $y_{\zeta\_error}$, equal to zero. Once the estimation law module 2304 produces the coefficients, $\theta_\Xi$, it passes them to the ATIMC sub engine 2305 where they are input to the mapping operator 2586. The estimation law module 2304 also produces the coefficients, $\theta_\Psi$, and passes them to the sub engine 2305 where they are input to the mapping operator 2479. In some cases, the coefficients $\theta_\Psi$ passed to the mapping operator 2479 are equal to the coefficients $\theta_\Xi$ passed to the mapping operator 2586.

Figure 28:
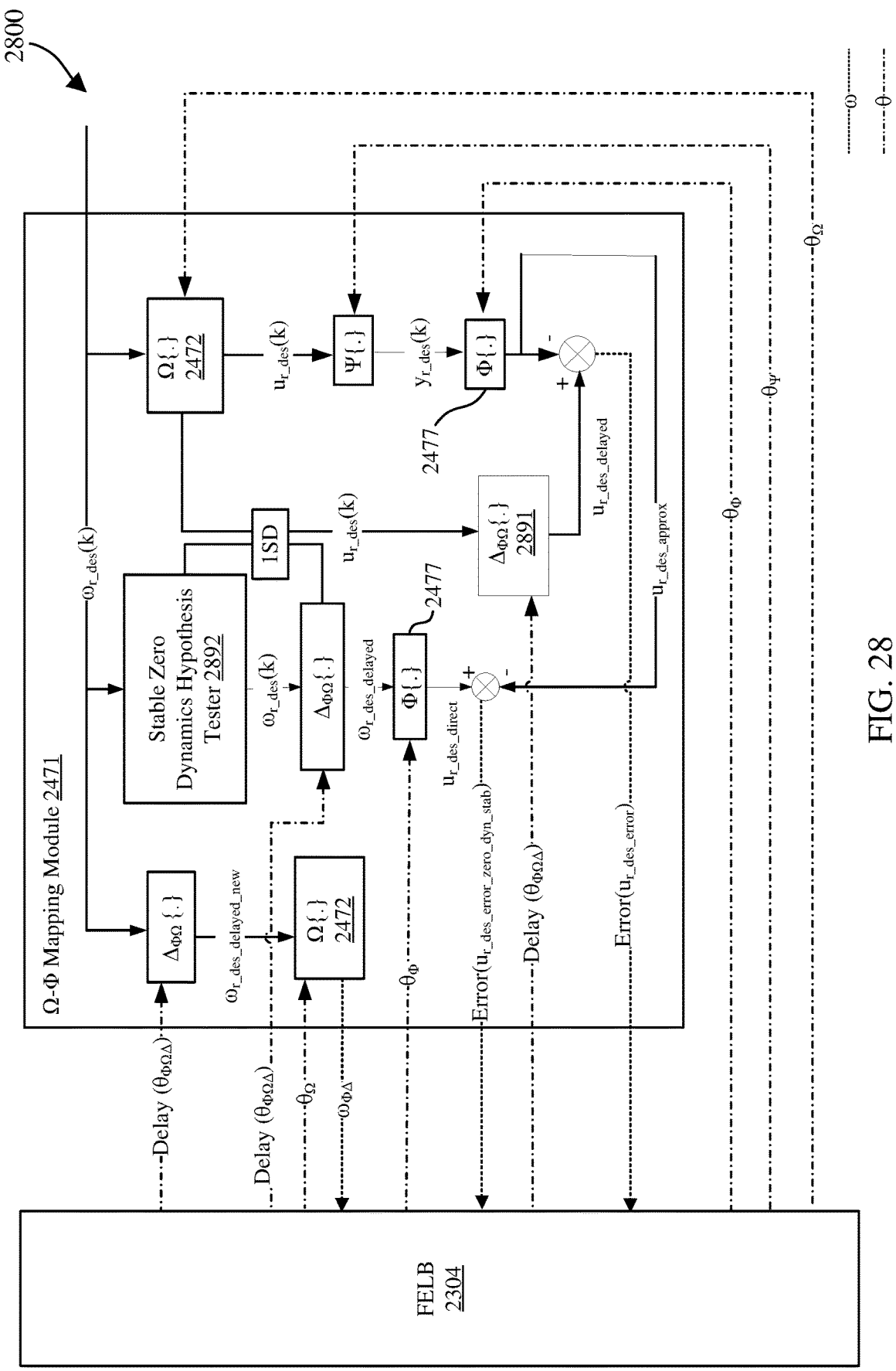
FIG. 28 illustrates a detailed view of a third mapping module of the ATIMC control law sub-engine in FIG. 24, in accordance with one or more implementations.

In some embodiments, the control signal, $\omega_{u\_ideal\_k}$, may be generated from the output of the Omega operator 2472 ($\Omega\{\cdot\}$) shown in FIG. 28. Specifically, $\omega_{u\_nd}$, which is the portion of the control signal that corresponds to the additional noise and disturbances seen at the output of the non-linear system is subtracted from the output, $u_{r\_des}(k)$, of the Omega operator 2472 to produce the control tensor component, $\omega_{u\_ideal\_k}$. The control tensor component, $\omega_{u\_ideal\_k}$, thus corresponds to an "ideal" control signal component (or control tensor) as the noise and/or disturbances in the non-linear system being controlled have been compensated for. In some examples, the control tensor component, $\omega_{u\_ideal\_k}$, is added to the noise signal, $\omega_{u\zeta}$, to produce a control tensor component, $\omega_{u\_in}$, that is input to the stabilization mechanism module 2310 (as shown in FIG. 26). The stabilization mechanism module 2310 uses the input control tensor component, $\omega_{u\_in}$, to produce a control tensor component, $\omega_{u\_des}$, which is passed to the NL transfer functions 2313 (also referred to as NL compensator 2313). The NL transfer functions 2313 produce the possible control signal, $u_{SE}$, from the control tensor component, $\omega_{u\_des}$. As seen in FIG. 23, the NL transfer functions 2313 pass the possible control signal, $u_{SE}$, to the selector module 2308.

As shown in FIG. 27, the noise signal, $\omega_{u\zeta}$, and the control signal, $\omega_{u\_ideal\_k}$, are passed to the tensorial mapping operator 2586 ($\Xi\{\cdot\}$), where the tensorial mapping operator 2586 also receives the $\theta_\Xi$ coefficients of the estimated model parameter tensor, $\theta$, from the estimation law module 2304. The tensorial mapping operator 2586 outputs, $y_{est\_\zeta}$, to a summer, where $y_{est\_\zeta}$ represents the effects of the noise signal $\omega_{u\zeta}$ on the possible estimated system output, $y_{est\_SE}$. In some examples, the adaptation (e.g., adaptively generating the coefficients, $\theta_\Psi$, $\theta_\Xi$ to minimize the error, $y_{\zeta\_error}$) in FIG. 27 works based on the difference between the measurements, $y_{meas}$, and the approximated/estimated system output from the control signal, $\omega_{u\_ideal\_k}$.

Omega-Phi Mapping Module of the ATIMC Sub Engine

The Omega-Phi Mapping Module (e.g., shown in FIG. 28) is configured to "tensorially" generate the learned parameters/coefficients for carrying out the mapping from the desired setpoint ($\omega_{r\_des}$) to a desired control signal ($\omega_{u\_des}$). That is, the Omega-Phi Mapping Module 2471 described in relation to FIG. 28 helps produce the possible control signal, where the possible control signal is based at least in part on adaptively determining the coefficients (On) of the estimated model parameter tensor, $\theta$. In some examples, the Omega-Phi mapping module 2471 is also referred to as the reference-to-possible control mapping module 2471.

In some embodiments, the Omega operator/mechanism/module 2472 (shown as $\Omega\{\cdot\}$) serves as the control law portion of the ATIMC sub engine as it produces the desired control signal, $u_{r\_des}(k)$, where the desired control signal is based at least in part on the desired setpoint (i.e., reference signal, r).

As shown in FIG. 28, the Omega-Phi mapping module 2471 receives a desired setpoint, ($\omega_{r\_des}$), where the desired setpoint is passed to a delay block 2891 ($\Delta_{\Phi\Omega}\{\cdot\}$), a stable zero dynamics hypothesis tester 2892, and a mapping operator 2472 ($\Omega\{\cdot\}$). The delay block 2891 is also configured to receive a delay portion/subcomponent ($\theta_{\phi\Omega\Delta}$) of the estimated model parameter tensor, $\theta$, from the estimation law module 2304. In some examples, the delay subcomponent ($\theta_{\phi\Omega\Delta}$) defines a delay increment/decrement that is applied by the delay block 2891 to the desired setpoint, $\omega_{r\_des}$. The delay block 2891 then outputs a delayed version of the desired setpoint, $\omega_{r\_des\_delayed\_new}$, with the new delay (e.g., defined by the delay subcomponent, $\theta_{\phi\Omega\Delta}$) received from the estimation law module 2304. In some examples, the delayed version of the desired setpoint, $\omega_{r\_des\_delayed\_new}$, is passed to the Omega mapping operator 2472. The omega mapping module 2472 (on the left of the page) also receives the coefficients ($\theta_\Omega$) of the estimated model parameter tensor, $\theta$, and passes a tensor, $\omega_{\phi\Delta}$, to the estimation law module 2304, where the tensor, $\omega_{\phi\Delta}$, corresponds to a delay. Specifically, the estimation law module uses $\omega_{\phi\Delta}$ to generate the delay subcomponent ($\theta_{\phi\Omega\Delta}$) that is passed to the delay block 2891.

Moving on to the stable zero dynamics hypothesis tester 2892 (also referred to as tester 2892), which is also configured to receive the desired setpoint, $\omega_{r\_des}$. The tester 2892 receives the desired setpoint, $\omega_{r\_des}$, processes it, and outputs the desired setpoint, $\omega_{r\_des}$, along with a True/False hypothesis. In some cases, the tester 2892 is configured to test whether the desired setpoint, $\omega_{r\_des}$, has stable or unstable zero dynamics and pass a True/False hypothesis to the delay block 2891 ($\Delta_{\Phi\Omega}\{\cdot\}$). The delay block 2891 applies the delay increment/decrement defined by the delay component, $\theta_{\phi\Omega\Delta}$, to the desired setpoint, $\omega_{r\_des}$, and passes the desired setpoint with the delay, $\omega_{r\_des}$_delayed, to the Phi mapping operator 2477 ($\Phi\{\cdot\}$).

The Phi mapping operator 2477 maps the desired setpoint (with the delay), ($\omega_{r\_des\_delayed}$, to a corresponding control signal value, $u_{r\_des\_direct}$, and passes this control signal value to a summer. In some examples, the summer also receives another control signal value, $u_{r\_des\_approx}$, which is subtracted from the control signal value, $u_{r\_des\_direct}$, to produce an error signal, $u_{r\_des\_error\_zero\_dyn\_stab}$, that is then passed to the estimation law module. This error signal, $u_{r\_des\_error\_zero\_dyn\_stab}$, corresponds to a difference between an approximated control output, $u_{r\_des\_approx}$, and the estimated control output, $u_{r\_des\_direct}$, had the system output measurement, $y_{meas}$, been equal to the desired setpoint, as further described below.

The goal of the Omega-Phi mapping module 2471 is to find the coefficients (On) of the estimated model parameter tensor, $\theta$, that correspond to the minimum error between the approximated control output, $u_{r\_des\_approx}$, and the estimated control output, $u_{r\_des\_direct}$, had the system output measurement, $y_{meas}$, been equal to the desired setpoint ($\omega_{r\_des}$). Thus, by minimizing the difference (or error) given by $u_{r\_des\_direct} - u_{r\_des\_approx}$, the adaptive engine can converge to the coefficients ($\theta_\Omega$) of the estimated model parameter tensor, $\theta$, from which the possible control signal, $u_{SE}$, can be determined. In some examples, the estimated control output, $u_{r\_des\_direct}$, can be obtained by mapping an undisturbed and/or noiseless reference signal (or setpoint) to its corresponding control value. In some cases, this mapping can be achieved through the Phi mapping operator 2477. The estimation law module 2304 is configured to adaptively find and pass the coefficients $\theta_\Xi$ of the estimated model parameter tensor, $\theta$, to the Phi mapping operator 2477, where the coefficients $\theta_\Xi$ are determined in real-time by minimizing the error (e.g., for the current iteration 'k') between $u_{r\_des\_direct}$ and $u_{r\_des\_approx}$. In some examples, the control signal value, $u_{r\_des\_approx}$, is produced by mapping (using the mapping operator 2477), $y_{r\_des}$, to a control signal value. Specifically, the desired setpoint ($\omega_{r\_des}$) is mapped to a desired control signal value ($u_{r\_des}$) using the Omega mapping operator 2472 and the coefficients $\theta_\Omega$. Next, the desired control signal value ($u_{r\_des}$) is mapped to a desired system output ($y_{r\_des}$) using the Psi operator 2479 and the coefficients $\theta_\Psi$, where the Psi operator 2479 is similar or substantially similar to the mapping operator 2479 described in relation to FIG. 27. For example, the mapping operator 2479 is configured to map a control signal value (u) to a system output (y), where the mapping is based at least in part on the coefficients ($\theta_\Psi$) received from the estimation law module 2304. Further, the Phi mapping operator 2477 receives the coefficients ($\theta_\Xi$) from the estimation law module 2304 and maps the undisturbed and noiseless measurement ($y_{r\_des}$) to a corresponding control signal value ($u_{r\_des\_approx}$). In some examples, this approximated control signal value ($u_{r\_des\_approx}$) is passed to a summer, where it is subtracted from the delayed control signal value ($u_{r\_des\_delayed}$) to produce an error signal ($u_{r\_des}$ error), where the error signal ($u_{r\_des}$ error) is passed to the estimation law module 2304 in the error tensor 'e' described above.

In some cases, the estimation law module 2304 receives the one or more error signals (e.g., $u_{r\_des\_error}$, $u_{r\_des\_error\_zero\_dyn\_stab}$, $\omega_{\Phi\Delta}$) from the Omega-Phi mapping module 2471 and uses them to determine the delay increments/decrements (e.g., $\theta_{\Phi\Omega\Delta}$) and/or the coefficients (e.g., $\theta_\Phi$, $\theta_\Omega$, $\theta_\Psi$) of the estimated model parameter tensor, $\theta$.

The estimated model parameter tensor, $\theta$, includes $\theta_\Omega$ coefficients/parameters that are determined through adaptation. Further, the Omega operator 2472 ($\Omega\{\cdot\}$) is a tensorial mapping function/operator that is employed to map a desired reference signal/setpoint (e.g., or des) to a corresponding control signal value, e.g., $u_{r\_des}$. In some examples, the Omega operator 2472 may be configurable by the end-user or designer and may comprise linear and/or non-linear functions/operators. In one non-limiting example, the Omega operator 2472 ($\Omega\{\cdot\}$) may be implemented by way of an Artificial Neural Network (ANN). In some other cases, the Omega operator 2472 may comprise a gain tensor whose weights/parameters are set using the $\theta_\Omega$ coefficients, where the $\theta_\Omega$ coefficients are adapted in real-time (or substantially real time).

In some examples, the adaptive engine comprising the estimation law module 2304 and the ATIMC sub engine 2305 uses adaptation to determine the total estimated delay ($\Delta_{Total}$). After initializing the total estimated delay ($\Delta_{Total}$), the different mapping mechanisms/modules of the ATIMC sub engine 2305 adapt the delay to further enhance the performance of the adaptive engine (e.g., to bypass unstable zero dynamics if they are present in the non-linear system). The use of "delayed" and "undelayed" versions of various signals helps prevent divergence of the control/adaptation against unstable zero dynamics. In some aspects, the extra delay allows the controller to be conscious of the unstable zero dynamics. An example for unstable zero dynamics may be that a system takes time to charge/build up. In such cases, the addition of the delay helps prevent the controller from increasing the value of the control signal, $u_{out}$, applied to an actuator (e.g., if it assumes that the control signal value that it is issuing is not enough). In other words, the addition of the delay helps account for the fact that the non-linear system being controlled may need time (e.g., due to unstable zero dynamics) to respond to such a control output, $u_{out}$. Thus, the delays described herein assist in the control of non-linear systems having unstable zero dynamics. In some cases, the system of the present disclosure is configured to determine a total delay ($\Delta_{Total}$). The ATIMC sub engine comprises a plurality of mechanism mapping modules, each associated with a slightly different delay. In some cases, the different delays (e.g., $\theta_{\Phi\Omega\Delta}$, $\theta_{KX\Delta}$, etc.) passed from the estimation law module 2304 may be added to the total delay ($\Delta_{Total}$) to produce the delay (e.g., $\Delta_{\Phi\Omega}$, $\Delta_{KX}$) for the different mapping modules. The delays passed from the estimation law module/FELB 2304 may comprise positive or negative integer values, and each additional delay increment/decrement may correspond to one control sample. Such a design facilitates in optimizing the time needed to achieve convergence in the case of unstable zero dynamics. Furthermore, when the non-linear system being controlled has no unstable zero dynamics (i.e., has stable zero dynamics), the adaptive engine 2300, 2400 comprising the estimation law module/FELB 2304 and the ATIMC sub engine 2305 may not add any delays, which also optimizes the time needed to achieve convergence.

Figure 30:
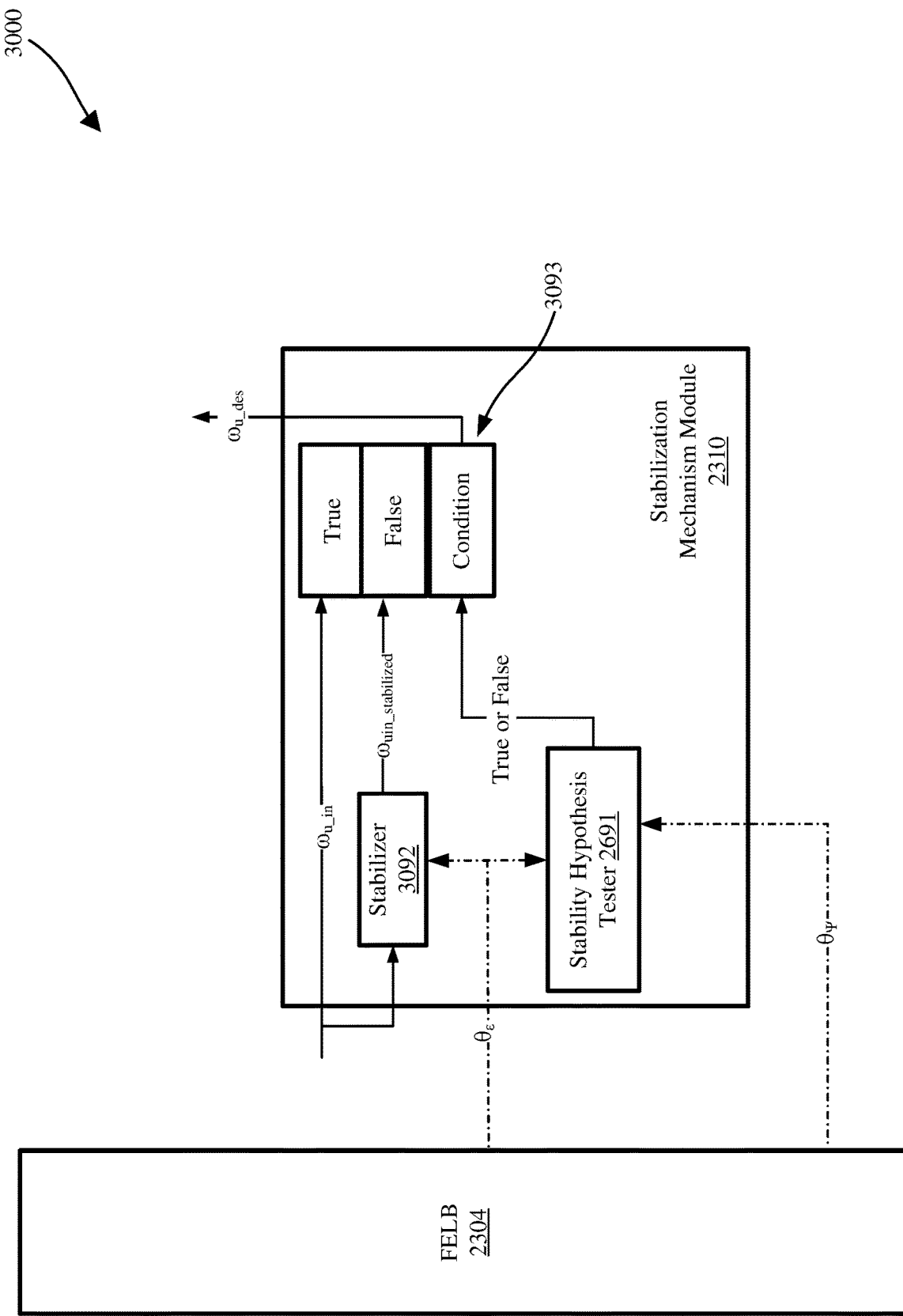
FIG. 30 illustrates a detailed view of a fourth mapping module of the ATIMC control law sub-engine in FIG. 24, in accordance with one or more implementations.

FIG. 30 shows a detailed view of the stabilization mechanism module 2310 of the ATIMC sub engine, in accordance with one or more implementations. The stabilization mechanism module 2310 may be similar or substantially similar to the stabilization mechanism module 2310 previous described in relation to FIG. 26. The stabilization mechanism module 2310 helps ensure (adaptively) that the process/non-linear system being controlled remains stable, regardless of operating conditions. As seen, the stabilization mechanism module 2310 comprises a stability hypothesis tester 3091. The stability hypothesis tester 3091 implements one or more aspects of the stability hypothesis tester 2791 described above in relation to FIG. 26. The stabilization mechanism module 2310 also includes an optional stabilizer 3092. In some embodiments, the stabilizer 3092 is deployed if the predicted system output measurement for a possible control signal (e.g., determined based on applying the possible control signal to one or more of the estimation laws described throughout the disclosure) is going to be unstable.

As seen, the estimation law module/FELB 2304 is configured to produce one or more estimated parameter tensors, $\Theta$, where the one or more estimated parameter tensors comprise one or more subcomponents (also referred to as coefficients), such as, $\theta_\Psi$, $\theta_\varepsilon$, etc. In the example shown, the stability hypothesis tester 3091 is configured to receive the coefficients, $\theta_\Psi$ and $\theta_\varepsilon$, of the estimated model parameter tensor, $\theta$, and output a Boolean response (e.g., True/False) based on predicting if the system output will be unstable. In some cases, the stabilization mechanism module 2310 also receives as input the control tensor component, $\omega_{u\_in}$, where the control tensor component, $\omega_{u\_in}$, is generated by adding $\omega_{u\_ideal\_k}$ to the noise signal, $\omega_{u\xi}$, as described above. Next, the stability hypothesis tester 3091 uses one or more of the control tensor component, $\omega_{u\_in}$, the $\theta_\Psi$, and the $\theta_\varepsilon$ parameters/coefficients to predict the stability of the system output. If the predicted system outputs are stable, the stability hypothesis tester 3091 outputs "True" to the conditional block 3093, in which case the conditional block 3093 passes the control tensor component, $\omega_{u\_in}$, as the desired control output, $\omega_{u\_des}$, to one or more of the Epsilon mechanism module 2441 and the NL transfer function 2313. In some other cases, if the predicted system outputs are unstable, the stability hypothesis tester outputs "False" to the conditional block 3093. In such cases, the optional stabilizer 3092 is used to stabilize the control tensor component, $\omega_{u\_in}$. In some examples, the stabilizer 3092 outputs another control tensor component, $\omega_{u\_in\_stabilized}$, to the conditional block 3093, which then outputs the stabilized control tensor component, $\omega_{u\_in\_stabilized}$, as the desired control output, $\omega_{u\_des}$. In some examples, the desired control output, $\omega_{u\_des}$, is also passed back to the estimation law module/FELB 2304. The estimation law module 2304 adapts the $\theta_\varepsilon$ parameters/coefficients, for instance, if the desired control output, $\omega_{u\_des}$, is different from the control tensor component, $\omega_{u\_in}$, if the stabilizer 3092 was deployed, or a combination thereof. In other words, the $\theta_\varepsilon$ parameters/coefficients may be adapted (i.e., adaptively determined) such that the predicted system output measurement(s) are stable.

Figure 22:
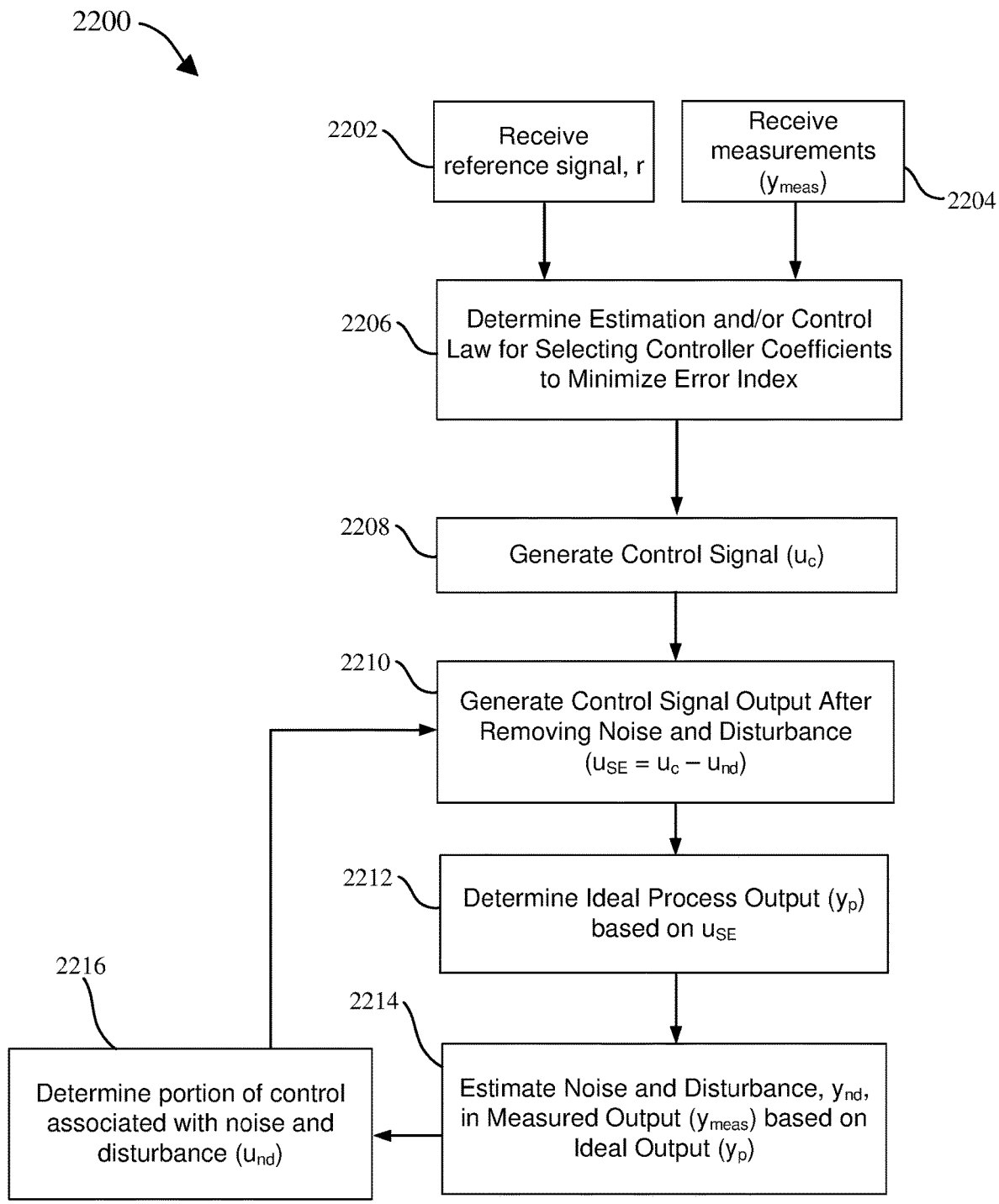
FIG. 22 illustrates an example of a method 2200 for controlling a nonlinear system using an ATIMC control law sub-engine, in accordance with one or more implementations.

FIG. 22 illustrates an example of a method 2200 for controlling a non-linear system using an ATIMC control law module/sub-engine, in accordance with one or more implementations. The operations of method 2200 presented below are intended to be illustrative. In some implementations, method 2200 may be accomplished with one or more additional operations not described, and/or without one or more of the operations discussed. Additionally, the order in which the operations of method 2200 are illustrated in FIG. 22 and described below is not intended to be limiting.

In some implementations, method 2200 may be implemented in one or more processing devices (e.g., a central processing unit or CPU, a digital processor, an analog processor, a digital circuit designed to process information, an analog circuit designed to process information, a state machine, a field programmable gate array or FPGA, and/or other mechanisms for electronically processing information). The one or more processing devices may include one or more devices executing some or all of the operations of method 2200 in response to instructions stored electronically on an electronic storage medium. The one or more processing devices may include one or more devices configured through hardware, firmware, and/or software to be specifically designed for execution of one or more of the operations of method 2200.

As seen, a first operation (2202) comprises receiving a reference signal, r, where the reference signal, r, may be received at the estimation law module/FELB 2304. A second operation 2204 comprises receiving at least one system output measurement, $y_{meas}$. In some embodiments, the system output measurement, $y_{meas}$, is received at the estimation law module/FELB 2304. A third operation (2206) comprises determining one or more of an estimation law and/or control law for selecting controller coefficients (also referred to as estimated parameter tensor coefficients or estimated model parameter tensor coefficients, such as the coefficients, $\theta_\Omega$), where the controller coefficients are predicted to minimize or reduce at least one error index (e.g., corresponding to the various errors passed from the control law module/sub-engine 2305 to the estimation law module 2304). A fourth operation (2208) comprising generating a control signal, $u_c$ (e.g., $\omega_{u\_ideal\_k}$ in FIG. 27) based at least in part on determining the control law portion for selecting the controller coefficients. A fifth operation (2210) comprises generating a possible control signal, $u_{SE}$, for the current iteration after removing the effects of noise and/or disturbance (e.g., $u_{nd}$, or $u_{nd\_approx}$) from the control signal, $u_c$. Specifically, the possible control signal, $u_{SE}$, may be generated as: $U_{SE} = u_c - u_{nd}$.

In some cases, sixth operation (2212) comprises determining an ideal process output, $y_p$. More specifically, the adaptive engine (e.g., adaptive engine 2300) determines an ideal process output, $y_p$, by applying the possible control signal, $u_{SE}$, to the non-linear model (e.g., the estimation portion of the non-linear model).

As described above in relation to FIG. 25, the control output, $u_{out}$, may be passed through the mapping operator 2588 to produce the total estimated system output, $y_{est\_SE}$ or $y_{est\_out}$. Additionally, the noise/disturbance component (e.g., $\omega_{y\_nd}(k)$ or $y_{nd}$) in the measured system output, $y_{meas}$, may be calculated from a difference between the ideal system/process output (e.g., $y_{est\_SE}$ or $y_{est\_out}$) and the measurement, $y_{meas}$. Similarly, at operation (2214), the method 2200 comprises estimating (or determining) the effects of noise and disturbance, $y_{nd}$, in the measured system output, $y_{meas}$. In some examples, the estimation of the noise/disturbance effects, $y_{nd}$, comprises evaluating a difference between the measured system output, $y_{meas}$, and the ideal system/process output, $y_p$. In some cases, the ideal system/process output, $y_p$, discussed in relation to FIG. 22 may be similar or substantially similar to the total estimated system output (e.g., $y_{est\_SE}$ or $y_{est\_out}$) described in other portions of this disclosure.

An eighth operation (2216) comprises determining, $u_{nd}$, where $u_{nd}$ corresponds to the portion of the control signal (e.g., possible control signal, $u_{SE}$; control output from the previous iteration, $u_{out\_k-1}$) associated with the noise and/or disturbance effects. In some cases, determining the noise/disturbance inducing portion of the control signal, $u_{nd}$, comprises mapping the measured noise and disturbance component, $y_{nd}$, to a corresponding control signal value, as described above in relation to FIG. 25. In some cases, the estimated/approximated $u_{nd}$ (i.e., determined at operation 2216) is used to generate the control signal output for the next iteration. Furthermore, the adaptive engine is configured to update/adapt the estimated parameter.

Figure 31:
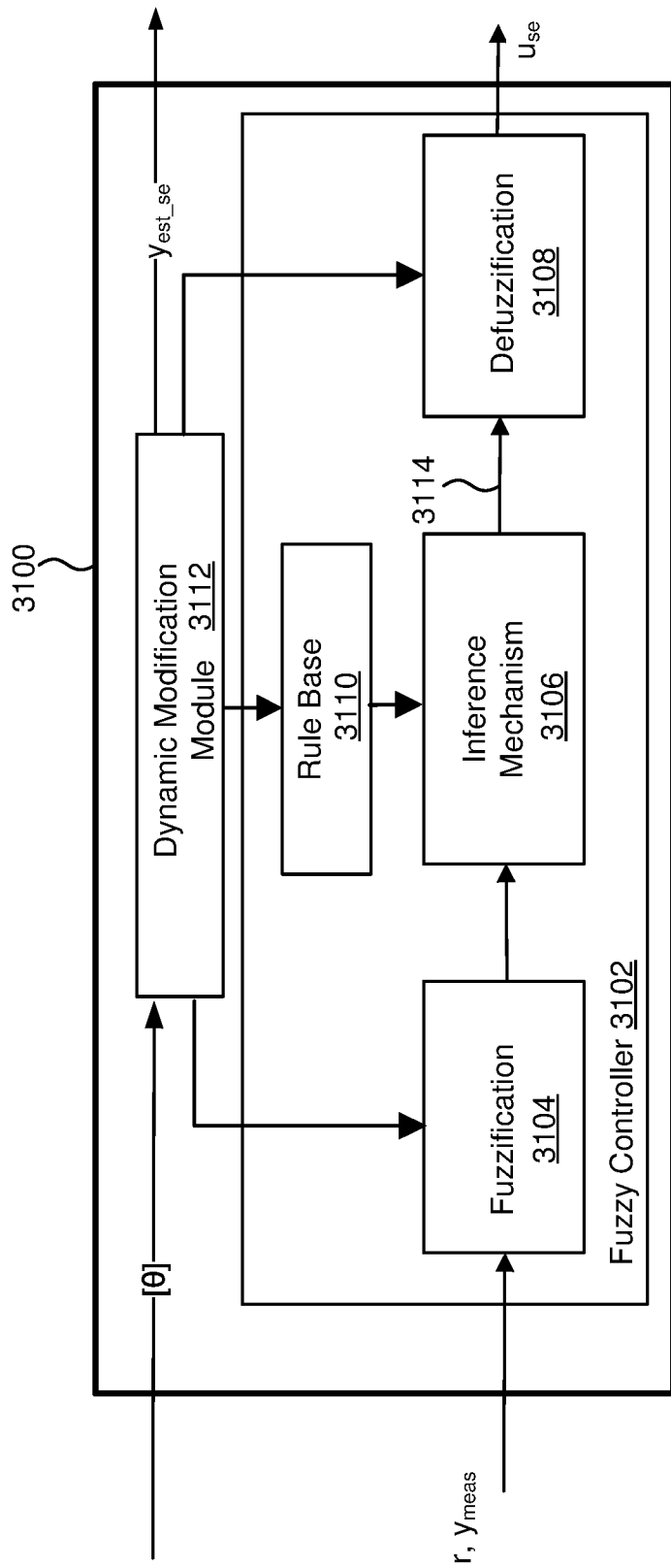
FIG. 31 is a block diagram depicting an adaptive fuzzy controller.
Figure 39:
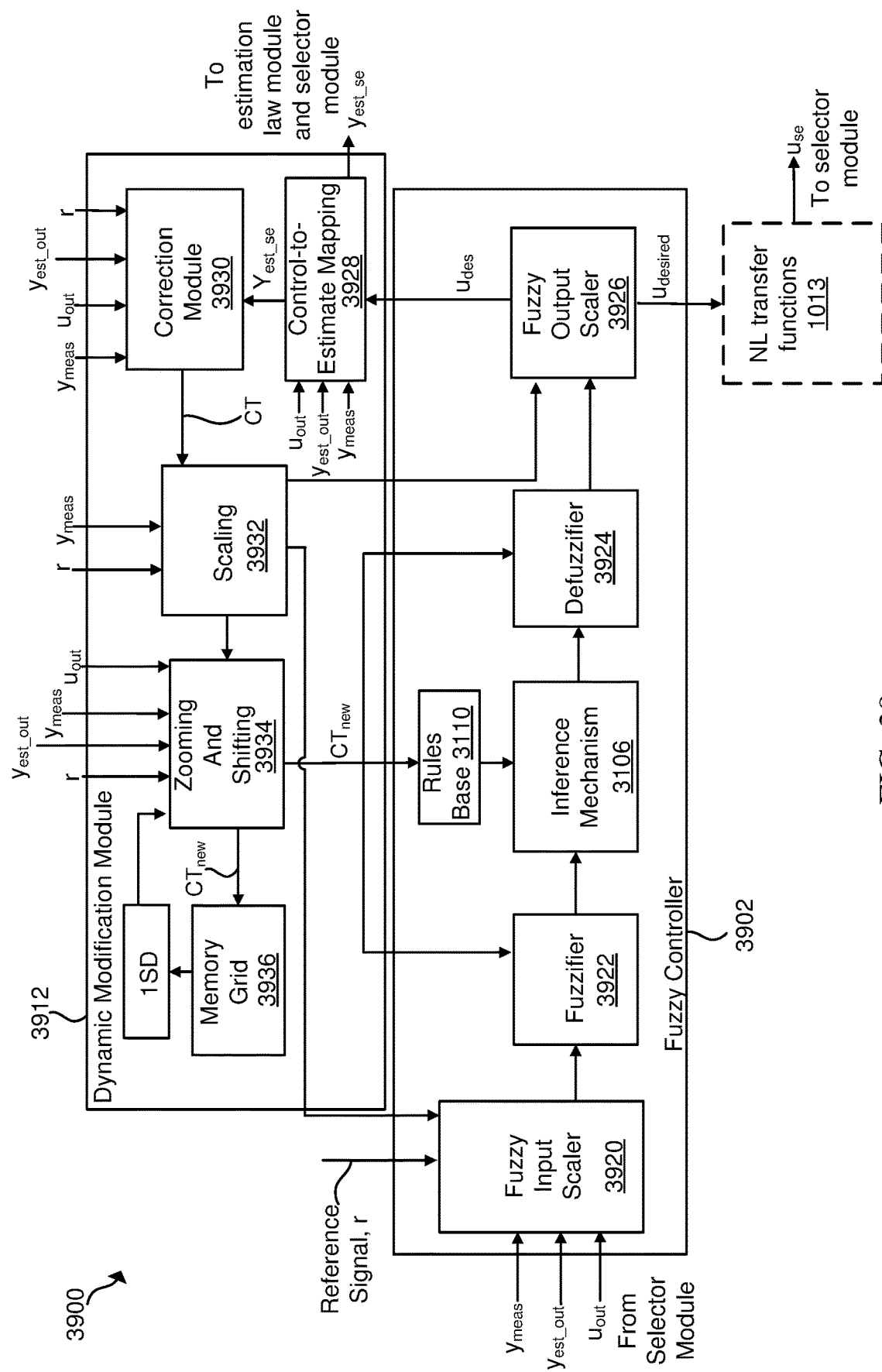
FIG. 39 is a block diagram depicting an example adaptive fuzzy controller that may be used to realize the adaptive fuzzy controller shown in FIG. 31.

Although not illustrated, the ATIMC sub-engine can operate as a standalone controller. In such an embodiment, the estimation law modules/FELB can be replaced by an empirically derived lookup table for the estimated model parameter tensors, $\Theta$. More specifically, a lookup table can be empirically formed as a mapping between (1) $y_{meas}$ and $u_{out}$ from a reference/calibration system and (2) estimated model parameter tensors, $\Theta$. During operation of the ATIMC standalone controller as a standalone controller, a control, $u_{out}$, can be provided to the one or more actuators, and measurements, $y_{meas}$, can be taken from the one or more actuators and/or system. These can then be used to select estimated model parameter tensors, $\Theta$, from the lookup table, and then provided to the ATIMC standalone controller to determine what will be called a control signal, $u_{out}$. This control signal, $u_{out}$, can be provided to the one or more actuators. Alternatively, the ATIMC standalone controller can produce a string of possible control signals, $u_{se}$, and form a control, $u_{out}$, as a combination of the string. For instance, a weighted average of the possible control signals, $u_{se}$, can be used to calculate the control, $u_{out}$, although other methods of combining the string can also be implemented. In some embodiments, the combination may be based on estimated system outputs, $y_{est\_se}$, for each of the possible control signals, $u_{se}$, similar to the way in which a topology is selected in the selector and combiner mentioned earlier. These estimated system outputs, $y_{est\_se}$, can be found via an estimation portion of the nonlinear model, for instance, using Model 1:

$$y_{est\_se} = W_m\{u_{se}, \Theta\}$$

Where the estimated model parameter tensor, Θ, is found in the lookup table based on the measured system output, $y_{meas}$, and the control, $u_{out}$, both from a previous iteration. The ATFC Controller and Control Law Module or Sub-Engine Referring next to FIG. 31, shown is a block diagram of an adaptive tensorial fuzzy controller (ATFC) 3100 that may be implemented as a stand-alone control law module 506 or it may be implemented among other control law modules 506 in the adaptive engine 500 described with reference to FIGS. 5A, 5B, and 5C. As shown, the ATFC 3100 comprises a fuzzy controller 3102 that includes a fuzzification module 3104, that is coupled to an inference mechanism 3106, and the inference mechanism 3106 is coupled to a defuzzification module 3108 and a rule base 3110. Also shown is a dynamic modification module 3112 that is coupled to the fuzzification module 3104, the rule base 3110, and the defuzzification module 3108. It should be recognized that the depiction of the components that make up the ATFC 3100 is a logical depiction of functional blocks, and each functional block may be combined with other functions or further separated in an actual implementation. For example, the fuzzification module 3104 may be separated into a fuzzy input scaler module and a fuzzifier module and the defuzzification module may be separated into a defuzzifier module and a fuzzy output scaler module as shown in FIG. 39. As discussed further herein, the depicted functional blocks may be realized by memory, processor executable instructions stored in memory, and a field programmable gate array programmed with instructions stored in memory.

In operation, the fuzzification module 3104 generally operates to transform input variables into fuzzy values that are in a form that the inference mechanism 3106 can handle utilizing input membership functions (MFin). The inference mechanism 3106 then generates a fuzzy output 3114 according the rule base 3110, and the defuzzification module 3108 transforms, utilizing output membership functions (MFout), the fuzzy output 3114 into a possible control signal, use, that is either used for controlling one or more actuators 408 of the plasma processing system (if the ATFC 3100 is utilized as a stand-alone control law module 506) or the possible control signal, $u_{se}$, is provided to the selector module (if the ATFC 3100 is utilized in connection with other control law modules 506) as described with reference to FIGS. 5A, 5B, and 5C.

In general, the dynamic modification module 3112 is configured to adapt input membership functions, MFin, of the fuzzification module 3104, output membership functions, MFout, of the defuzzification module 3108, and the rule base 3110 while controlling an output (e.g., the load output 430) of a plasma processing system (e.g., plasma processing system 400). Aspects and variations of the dynamic modification module 3112 are discussed further herein.

Figure 32:
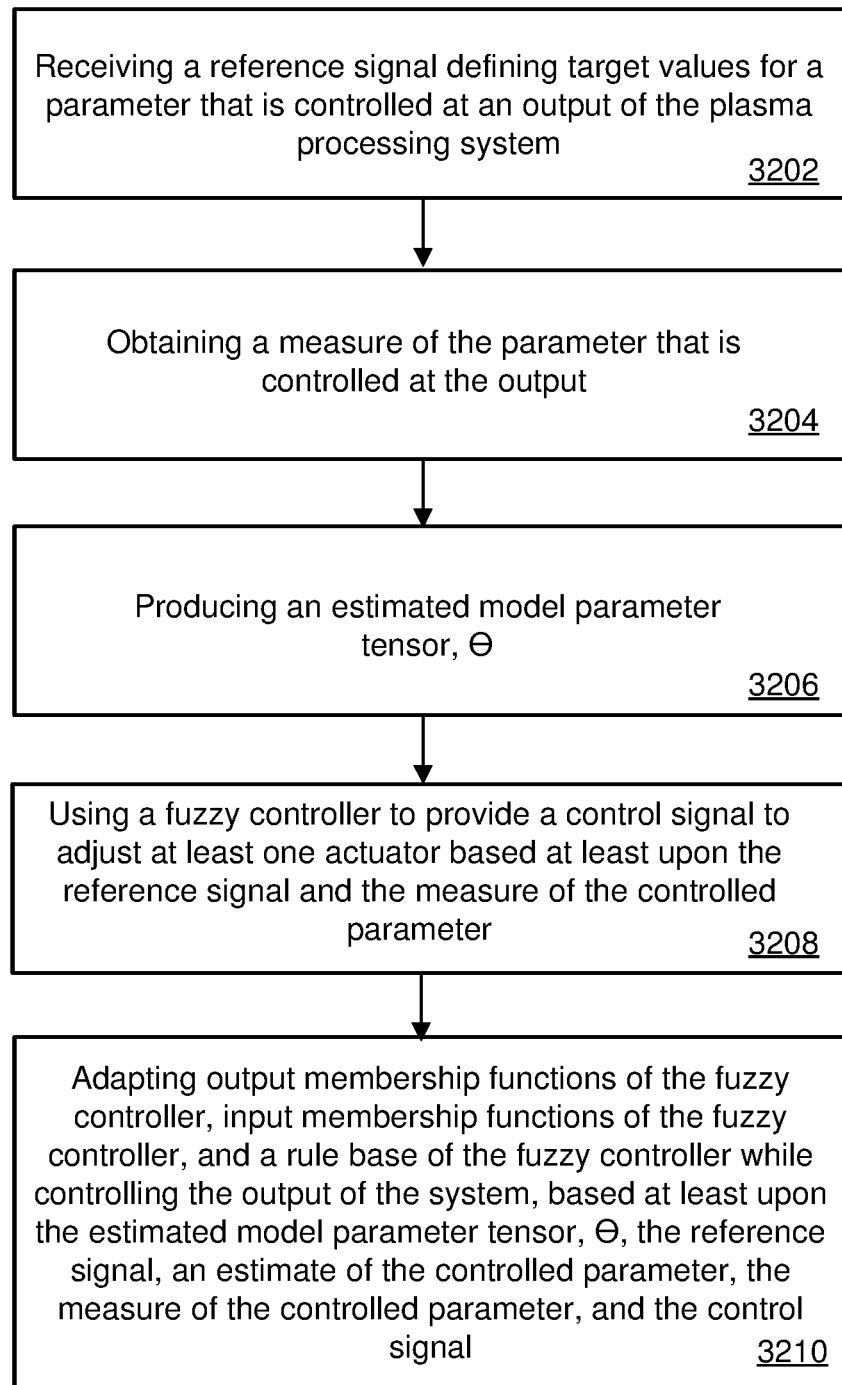
FIG. 32 is a flowchart depicting a method for controlling a plasma processing system with the adaptive fuzzy controller depicted in FIG. 31.

While referring to FIG. 31, simultaneous reference is made to FIG. 32, which is a flowchart depicting a method for controlling a plasma processing system such as the plasma processing systems 100, 400 described with reference to FIGS. 1 and 4. At the outset, it is important to note that the method depicted in FIG. 32 is applicable in the context of tensorial control where there are potentially multiple outputs, multiple controller parameters, and multiple actuators that are utilized to achieve desired parameter values, but FIG. 32 is simplified for purposes of clarity.

Figure 2:
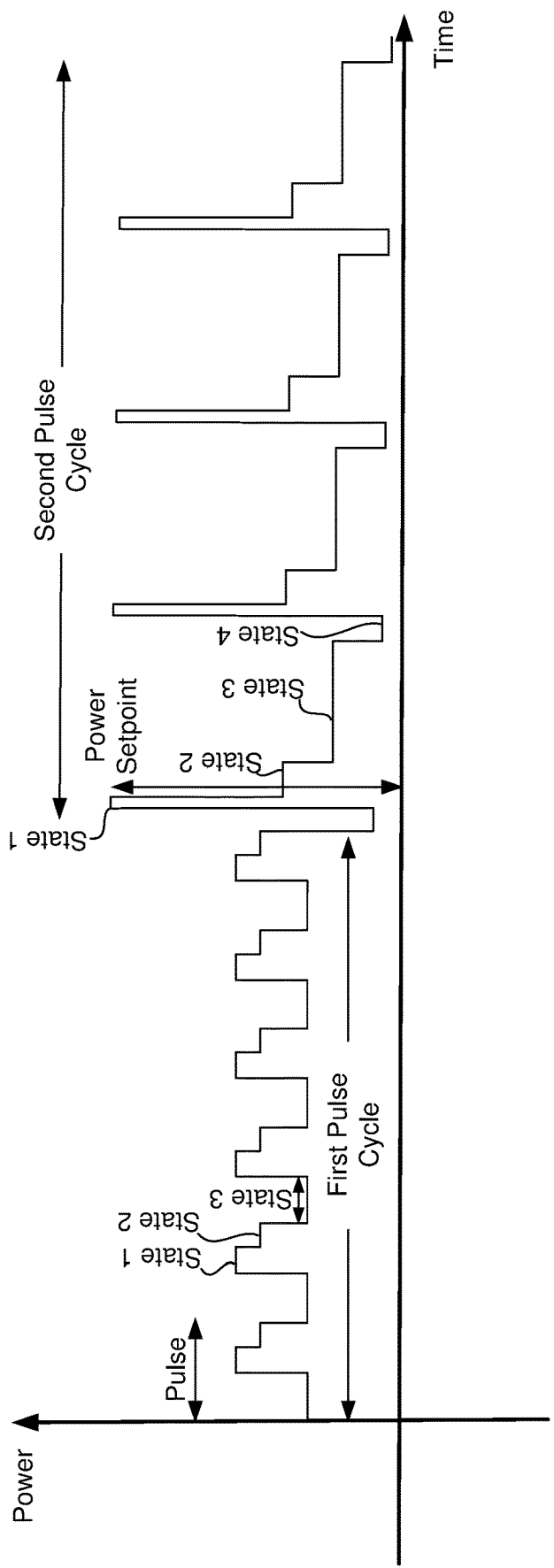
FIG. 2 illustrates a pulse waveform for the system of FIG. 1.

As shown, the method includes receiving a reference signal, r, (e.g., reference signal 405) defining target values for a parameter that is controlled at an output (e.g., at the load output 430) of the plasma processing system (Block 3202). The controlled parameter may be, for example, forward power and the target values may, for example, define states of a multilevel power setpoint (e.g., as shown in FIG. 2). The method also comprises obtaining a measure, $y_{meas}$, of the parameter that is controlled at the output (Block 3204). At least one sensor (e.g., sensor(s) 410) including, for example and without limitation, directional couplers, VI sensors, current transducers, and simple voltage sensors may be used to obtain the measure, $y_{meas}$, of the parameter that is controlled at the output. Again, it should be noted that there may be multiple controlled parameters (such as forward power, voltage, current, substrate bias voltage, ion energy, frequency, impedance, etc,) and there may be multiple outputs (e.g., one or more of the load output 430 and/or the actuator outputs 432). Those of ordinary skill in the art will appreciate that the signals from the at least one sensor may be sampled and converted into digital format for use by the adaptive engine 420.

As shown, the method also includes producing an estimated model parameter tensor, Θ (Block 3206). As previously discussed with reference to FIGS. 5A, 5B, and 5C an estimation law module 504 may take as input regressor, Ø, or a subset thereof, including values such as the reference signal, r, and the measured system output, $y_{meas}$, and an estimated error, ê, and the estimation law module 504 may process these inputs through an estimation law to produce the estimated model parameter tensor, Θ.

As shown, the fuzzy controller 3102 provides a control signal to adjust at least one actuator based at least upon the reference signal and the measure of the controlled parameter (Block 3208). As discussed above, in the context of an adaptive engine 500 that includes multiple control law modules 506, the control signal may be a possible control signal, $u_{se}$. Or the ATFC A00 may operate as a standalone control law module to provide control, $u_{out}$, as a signal that is used to control an actuator 408.

In addition, the dynamic modification module 3112 adapts the output membership functions (MFout) of the fuzzy controller 3102, input membership functions (MFin) of the fuzzy controller 3102, and a rule base 3110 of the fuzzy controller 3102 while controlling the output of the system, based at least upon the estimated model parameter tensor, Θ, the reference signal, r, the estimate of the controlled parameter, $y_{est\_se}$, the measure of the controlled parameter, $y_{meas}$, and the control signal ($u_{se}$ or $u_{out}$)(Block 3210).

Beneficially, the ATFC 3100 is able to extend the regions of operation of the plasma processing system 100, 400 that is driving a nonlinear and/or chaotic load 104 where (in some embodiments) aspects of the system 100, 400 can still be controlled at a nanosecond scale at a user's specific specifications.

More specifically, aspects of the ATFC 3100 enable the addition of heuristic, rule-based, case-by-case knowledge to the control mechanism that other control methodologies cannot achieve. In addition, the adaptive aspects of this mechanism enable updating and changing these rules and/or the addition of rules that cover more regions while the system is running so performance and stability are maintained, and if a new process (e.g., for processing a work piece) is added, the rules may be extended to that process.

Standard fuzzy technology suffers from not being able to be implemented to its full extent into real time devices that deal with highly uncertain and nonlinear/chaotic systems. In contrast, embodiments of the ATFC 3100 overcome memory limitations by using tensor signal processing and storage. In addition, by using rule estimation (executed, e.g., by an estimation law module 504), the rule base 3110 of the fuzzy controller 3102 may be dynamically adjusted at every control sample, Ts, to deal with systems and/or operating conditions that a designer did not consider during the design stage. This dynamic adjustment provides a tremendous advantage over linear adaptation and/or robust control methodologies that need knowledge of the dynamics of the process and quantization of uncertainties which cannot be known a-priori in highly nonlinear/uncertain systems to perform well.

Other "non-fuzzy" control systems (e.g., robust learning control systems) may be superior when the system is operating within predefined, a-priori contemplated, regions because accurate a-priori knowledge is very useful but operating in accurately known a-priori-defined regions is more of an exception rather than the general case. As a consequence, using both robust learning control and adaptive tensorial fuzzy control extends performance, reliability, stability and the operating regions in a complimentary non overlapping way; thus, producing a superior product (e.g., processed workpiece) with very little added costs.

Portions of the ATFC 3100 mechanism may be implemented in real time hardware as discussed further below (e.g., by using TSP RAM, registers, and general tensor signal processing). It should be noted that although some of the terminology used to characterize the ATFC 3100 is similar to terminology used in connection with other machine learning approaches, the machine learning approaches are not the same as the ATFC 3100 mechanisms. For example, machine learning engines may use clustering/batch processing and frames, or pseudo real time and offline processing to carry out its learning with, for example, unscented Kalman filters to develop new rules and adapt in real time as opposed to the approach used in the ATFC 3100. But it should be recognized that the ATFC 3100 may be used in parallel with machine learning engines.

In addition, the ATFC 3100 is particularly applicable to multiple input multiple output (MIMO) nonlinear, chaotic, and uncertain plasma loads, that can be unstable as well as have unstable zero dynamics. As described further herein, in addition to adaptation of the input and output membership functions (of the fuzzification module 3104 and defuzzification module 3108, respectively) and adaptation of the rule base 3110, the dynamic modification module 3112 may also store updates to the rule base 3110 and expand the rule base 3110 through tensorial correction values, zooming and sliding tensorial memory grids, and delay/filtering/averaging operators. Moreover, the dynamic modification module 3112 may also genericize the rule base 3110, the input and output membership functions, input and output gain, scaling, and tuning.

Before detailing functional aspects of the dynamic modification module 3112, it is helpful to understand the operation of the fuzzy controller 3102 by way of an example, without loss of generality. In the plasma processing systems 100, 400, there may be many inputs and outputs (e.g., rail voltage, drive voltage, generator frequency, match settings, etc.) but taking a MIMO subset as an example, such as rail voltage and drive voltage, provides ease of comprehension. For example, the rule base may include the following rules:

R1: IF (Drive is Reference) AND (Error is positive) THEN (Rail is Up);

R2: IF (Drive is Reference) AND (Error is zero) THEN (Rail is zero);

. . .

Rn: IF (Ini is Conditioni) AND (Ink is Conditionm) THEN (Outputp is Conditionp).

Again, the ATFC 3100 is a MIMO system capable of effectuating rules that will not only generate a rail voltage, but may also, for example, establish drive frequency, substrate-bias voltage, and match positions for all amplifiers and match networks. As a consequence, the rule base 3110 is composed of all the "Rn" rules for all the i inputs, all the conditions, and all the outputs.

Figure 33:
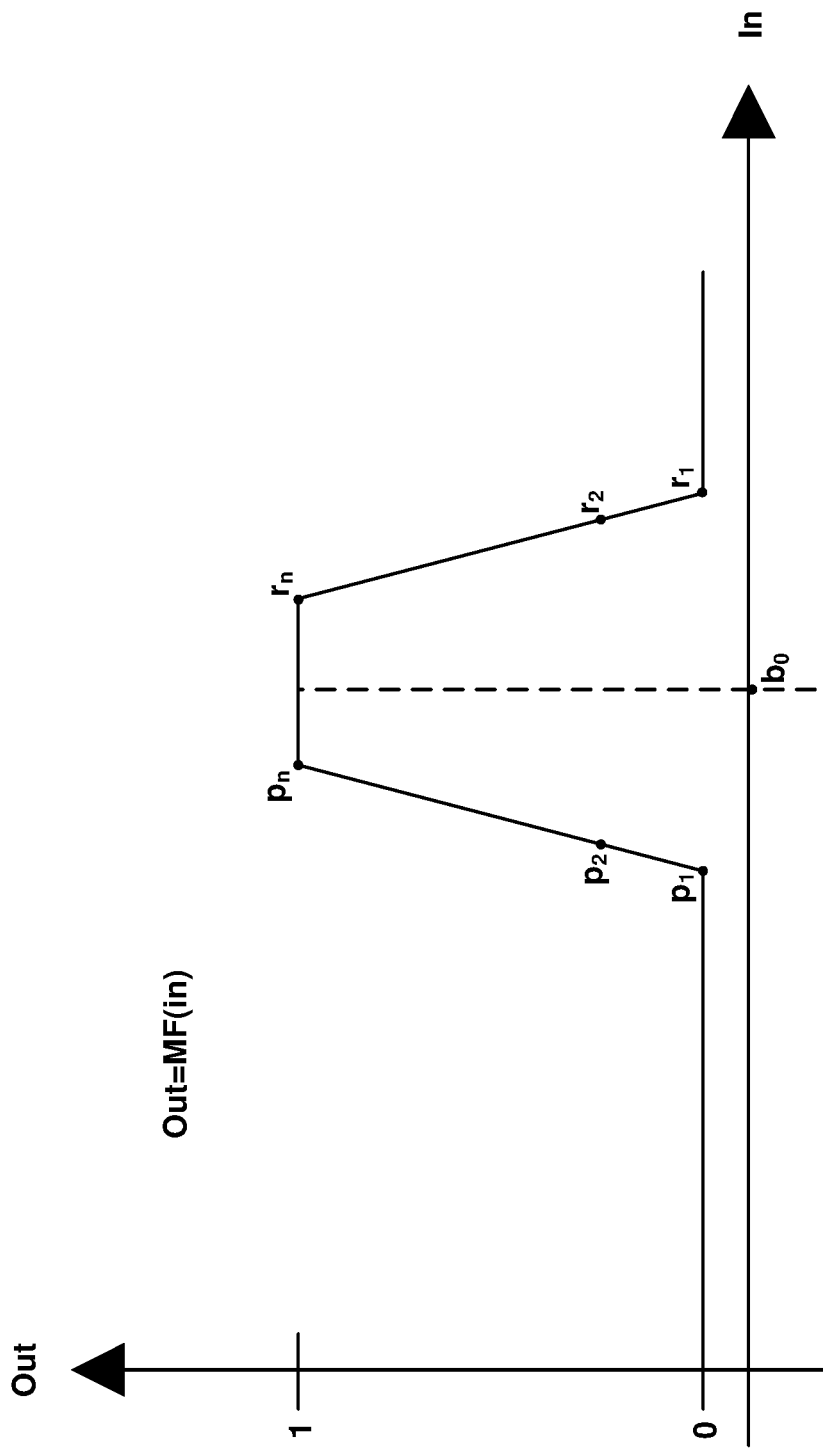
FIG. 33 is a graphical representation of generic membership functions that may be used in the adaptive fuzzy controller depicted in FIG. 31.

The fuzzification module 3104 functions to create a "degree of truth" to each statement by mapping how much "Drive is Reference" and how much "Error is Positive" and how much "Error is Zero," which is achieved through the membership functions, MFin, as is known in the art. Due to available processing devices (e.g., CPUs and FPGAs) and to make storage computations easy, the shape of the membership functions (in a generic, normalized form) may be as shown in FIG. 33. As shown in FIG. 33, the membership functions may be composed of 2n points with points "pi" and "ri" spaced from a center "bo" in a symmetric manner about bo.

In the ATFC 3100, adaptation is carried out on {bo, pi, . . . pn, ri, . . . , rn} for all MFin functions. Pn and rn may overlap; thus, making the membership function triangular about bo. It should be noted that the distance between bo and pi and bo and ri does not need to be smaller than "bo and pi−1" and "bo and ri." Only the symmetry of "pi" and "ri" with respect to "bo" is desired, and pi should lie to the left of bo and ri, should lie to the right of bo and pi.

Figure 34:
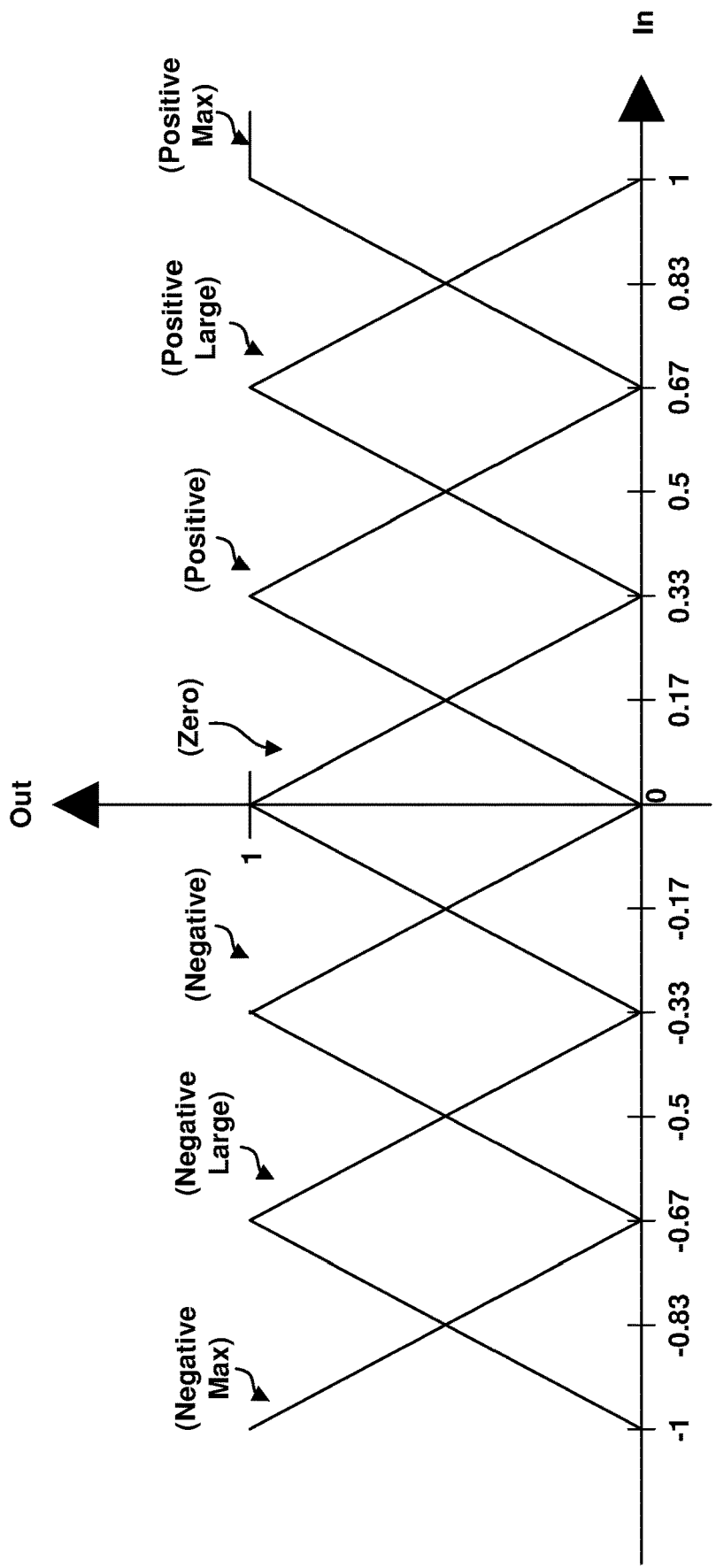
FIG. 34 is a graphical representation of a specific example of membership functions that may be used in the adaptive fuzzy controller depicted in FIG. 31.

The number of points "n" may be selected based on the hardware. Applying the above definitions to this example and without loss of generality, everything may be normalized between [−1, 1], or alternatively, between [0, 1]. Assuming (as an example only) Reference equals 0.85, Drive=0.85, and Error is 0.1, then the membership functions are depicted in FIG. 34.

Figure 35:
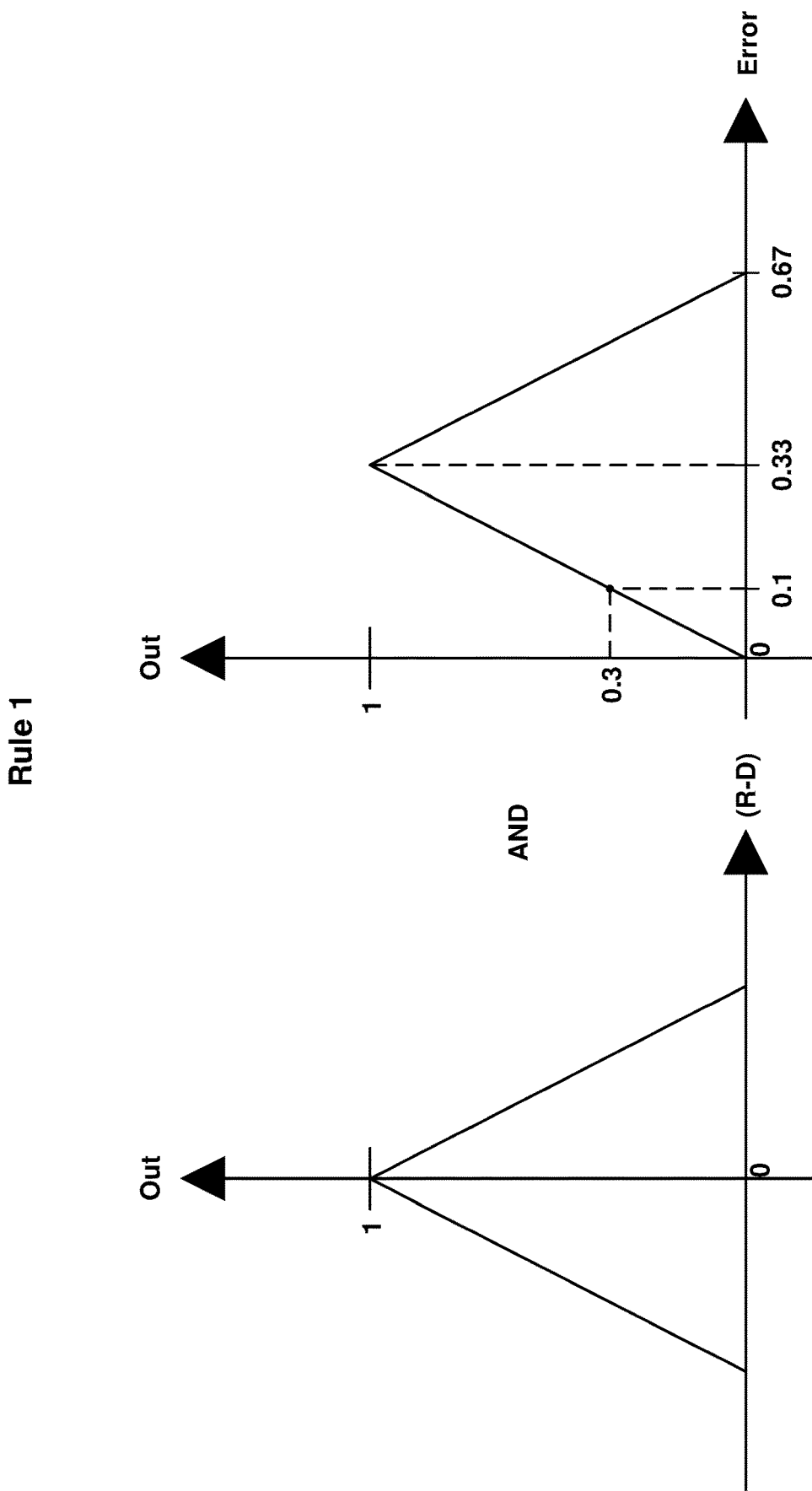
FIG. 35 is a graphical representation of an example of fuzzification of a rule.
Figure 36:
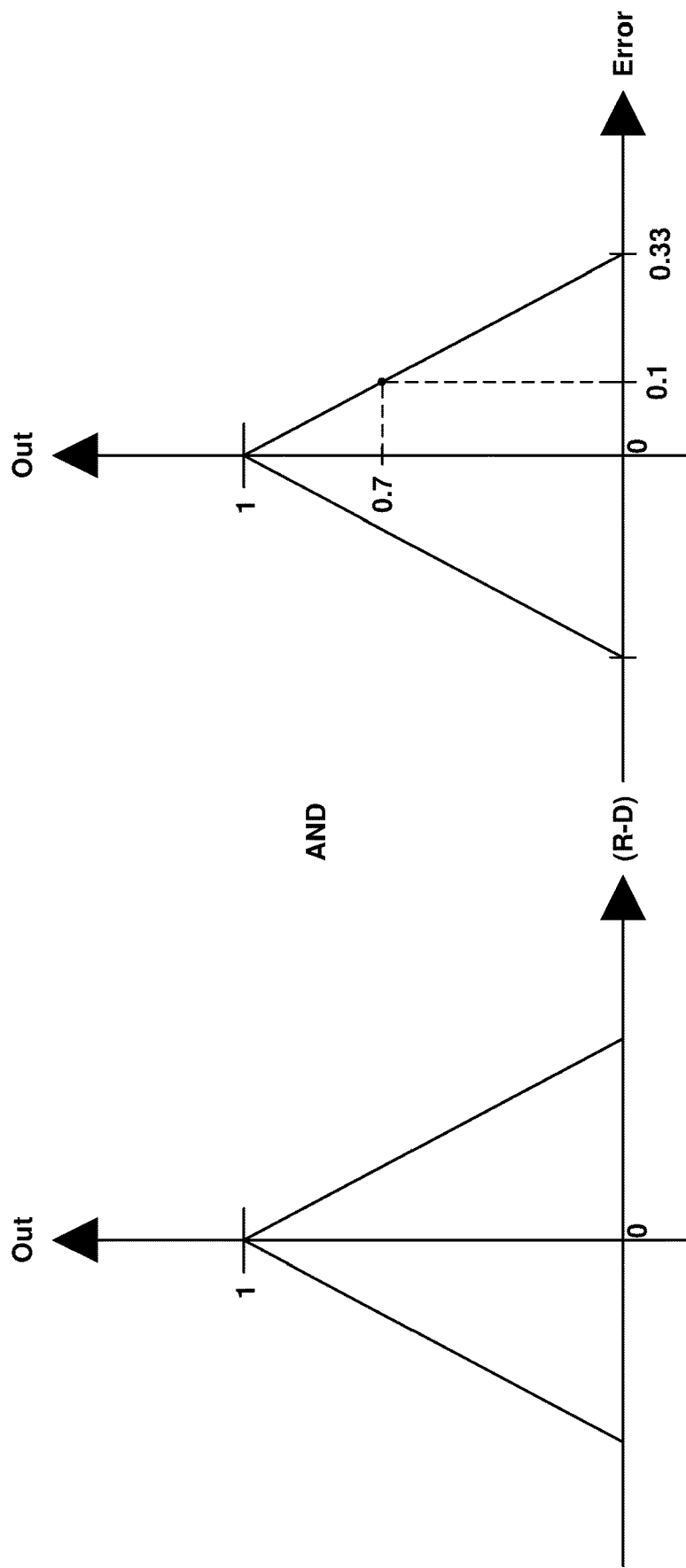
FIG. 36 is a graphical representation of an example of fuzzification of another rule.
Figure 38:
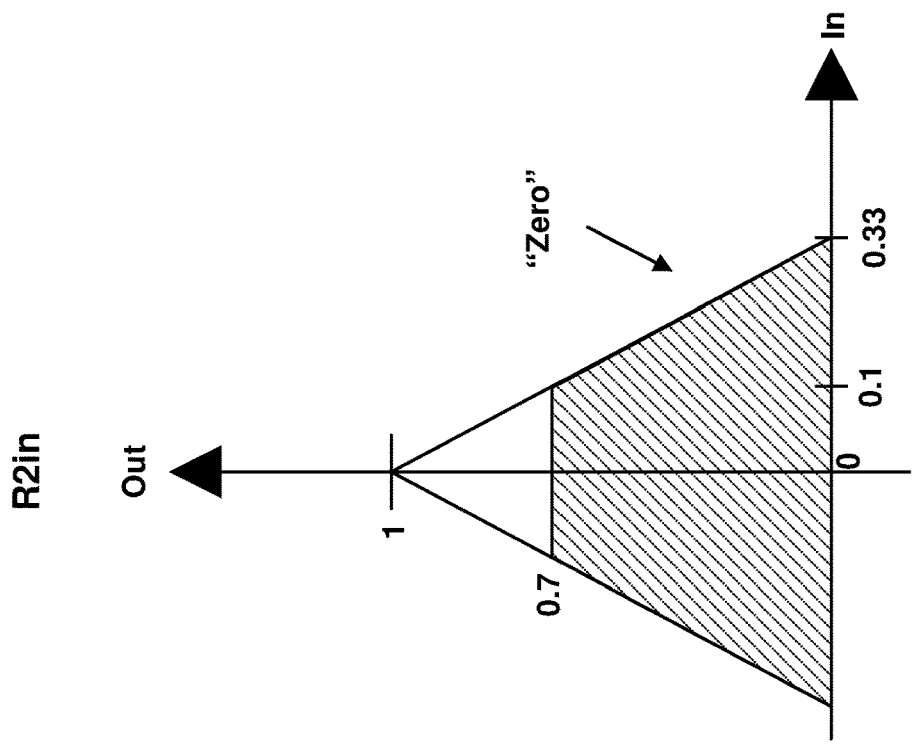
FIG. 38 is a graphical representation of an output membership function that results from the fuzzy rule depicted in FIG. 36.
Figure 37:
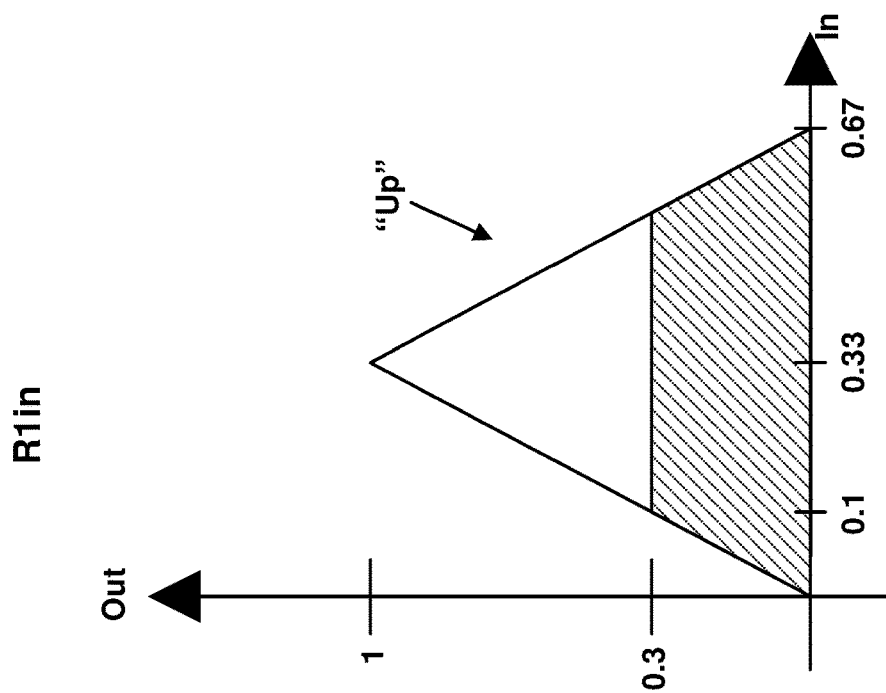
FIG. 37 is a graphical representation of an output membership function that results from the fuzzy rule depicted in FIG. 35.

Using "Up" as "Positive" for the rail, "Down" as "Negative," and "Drive" as "Reference" correlated to "(Reference-Drive)==0" it can be seen that there are two laws activated per rule. FIG. 35 depicts Rule 1 (R1) and FIG. 36 depicts Rule 2 (R2).

As a consequence, the fuzzyification mechanism will output:

Rin=1 AND 0.3

R2in=1 AND 0.7.

Depending upon how the "AND" operator is defined, R1in and R2in will take on the corresponding values. For the present example, since the minimum operator is faster and less resource intensive, especially for tensors, as compared to other operations such as multiplication, the fuzzification module A04 will send to the inference mechanism A06 the following:

$R1in = \min(1, 0.3) = 0.3$ $R2inin = \min(1, 0.7) = 0.7$ $R3in = 0$

...

$Rnin = 0.$

In turn, the inference mechanism 3106 simply reads these rule values and computes the output membership function resulting from them. As a consequence, we have the membership function depicted in FIG. 37 for R1in and the membership function depicted in FIG. 38 for R2in. Depending on the way the inference mechanism A06 is implemented, the rule base 3110 can have its fuzzy output inferred differently depending on the membership functions used. The defuzzification module A08 then converts the inferred decisions into actions. There exist several methods for defuzzification such as center of gravity, center average, scaling, etc.

By way of example only, the center average may be calculated as:

$$v_{rail} = \frac{R_{1out} \times R_{1in} + R_{2out} \times R_{2in}}{R_{1in} + R_{2in}}$$
$$= \frac{0.3 \times 1 + 0.7 \times 0}{0.3 + 0.7}$$

$$\boxed{v_{rail} = 0.3}$$

As another example, scaling is calculated as:

$$v_{rail} = \frac{1 \times \left(\frac{0.\overline{6} \times 0.3}{2}\right) + 0 \times \left(\frac{0.\overline{6} \times 0.7}{2}\right)}{\left(\frac{0.\overline{6} \times 0.3}{2}\right) + \left(\frac{0.\overline{6} \times 0.7}{2}\right)}$$
$$= \frac{0.1 + 0}{(3/30) + (7/30)}$$

$$\boxed{v_{rail} = 0.3}$$

And the center of gravity defuzzification approach may be calculated as:

$$v_{rail} = \frac{0.\overline{3} \times \left[0.\overline{6} \times \left(0.3 - \frac{0.3^2}{2}\right)\right] + 0 \times \left[0.\overline{6} \times \left(0.7 - \frac{0.7^2}{2}\right)\right]}{0.\overline{6} \times \left[\left(0.3 - \frac{0.3^2}{2}\right) + \left(0.7 - \frac{0.7^2}{2}\right)\right]}$$
$$= \frac{0.\overline{3} \times (17/100) + 0 \times (91/100)}{(17/100) + (91/100)}$$

$$\boxed{v_{rail} = 0.1197}$$

Having gone over the concepts, definitions and a practical example, an example ATFC 3900, which may be used to realize the ATFC 3100 is described with reference to FIG. 39. As shown, the ATFC 3900 comprises a fuzzy controller 3902 and a dynamic modification module 3912. As shown, in implementations where the ATFC 3900 is realized as a control law module 506 among other control law modules 506 (such as is shown in FIGS. 5A, 5B, and 5C), the fuzzy controller 3902 receives the control, $u_{out}$, from the selector module 508; the measured system output, $y_{meas}$; the total estimated system output, $y_{est\_out}$, and the reference signal, r, while the dynamic modification module 3912 receives the measured system output, $y_{meas}$, and the reference signal, r.

The fuzzy controller 3902 operates in the same way as the fuzzy controller 3102 described with reference to FIG. 31 except that the functions of the fuzzification module 3104 are separated into a fuzzy input scaler module 3920 and a fuzzifier 3922, and functions of the defuzzification module 3108 are separated into a defuzzifier 3924 and a fuzzy output scaler module 3926. As shown, the fuzzy input scaler module 3920 receives the measured system output, $y_{meas}$, the total estimated system output, $y_{est\_out}$, the control, $u_{out}$, and the reference signal, r, and the fuzzy output scaler module 3926 outputs $u_{desired}$, which may be processed by the NL transfer functions 1013 to produce the possible control signal, $u_{se}$. The fuzzy input scaler module 3920 may normalize the inputs it receives to values between [−1,1] (or alternatively, between [0,1]), and the fuzzy output scaler may provide signal values that are useful for a particular actuator. In some implementations, the fuzzifier 3922, inference mechanism 3106, and the defuzzifier 3924 are realized by an FPGA that is programmed using instructions in hardware description language and the other components depicted in FIG. 39 are realized by processor executable instructions in connection with a processor (e.g., CPU) that processes the instructions.

The dynamic modification module 3912 in this embodiment comprises a control-to-estimate mapping module 3928, a correction module 3930, a scaling module 3932, a zooming and shifting module 3934, and a memory grid 3936, that is coupled to the zooming and shifting module 3934 via a one-sample delay, 1SD. In some implementations, these functional components of the dynamic modification module are realized by software executed by a processor (e.g., a CPU).

The control-to-estimate mapping module 3928 generally functions to provide a fuzzy tensorial mapping from the control, $u_{out}$, to the estimated system output, $y_{est\_se}$. The estimate may be updated at every control sample and is adapted to match the measurements, $y_{meas}$. The estimated system output, $y_{est\_se}$ may be provided to the selector module 508 and the estimation law module 504 as shown in FIGS. 5A and 5B.

Figure 40:
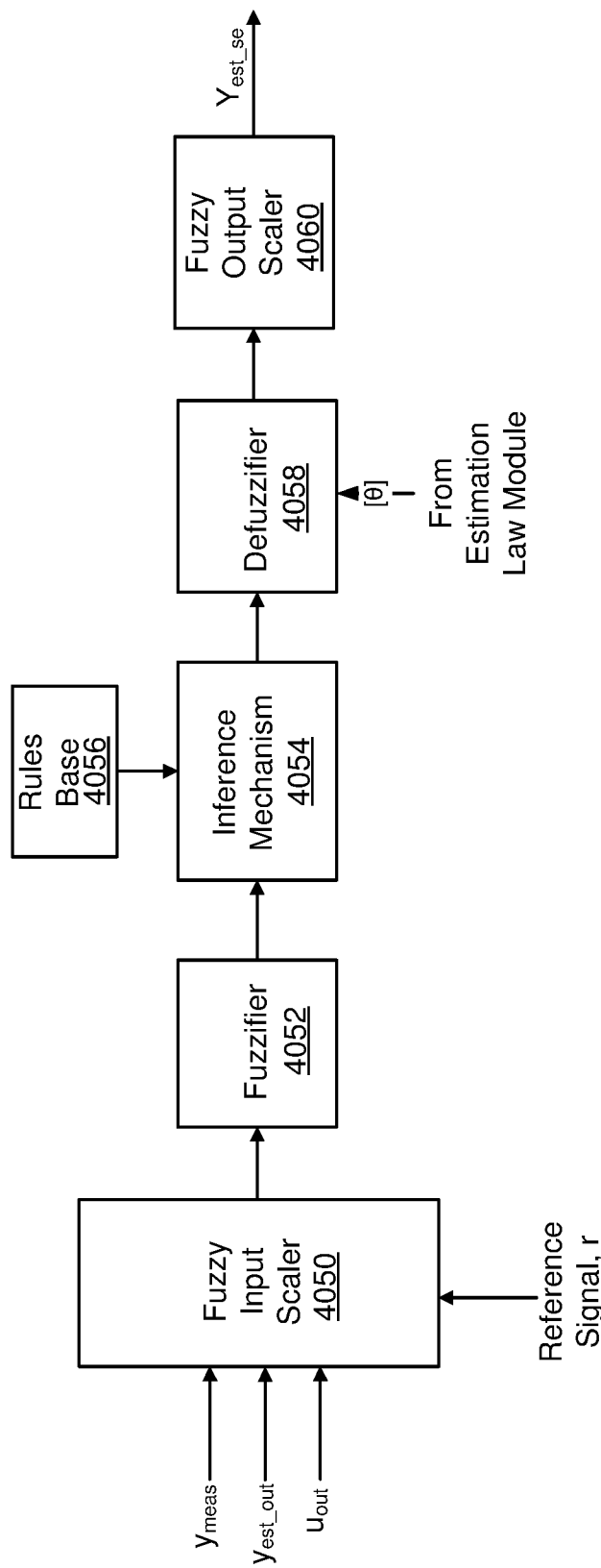
FIG. 40 is a block diagram depicting an example of a control-to-estimate mapping module that may be used to realize the control-to-estimate mapping module depicted in FIG. 39.

Referring briefly to FIG. 40, shown is an embodiment of the control-to-estimate mapping module 3928. As shown, the control-to-estimate mapping module 3928 includes a fuzzy input scaler module 4050, a fuzzifier 4052, an inference mechanism 4054 that is coupled to a rule base 4056, a defuzzifier 4058, and a fuzzy output scaler module 4060. As shown, the fuzzy input scaler module 4050 receives the total estimated system output, $y_{est\_out}$, the control, $u_{out}$, and the measurements, $y_{meas}$. In operation, the control-to-estimate mapping module 3928 provides a fuzzy estimate, $y_{est\_se}$, of the controlled output of the system (obtained through defuzzification) and the calculation for $y_{est\_se}$ is adapted in real time by having its defuzzification coefficients adapted in real time by the estimated model parameter tensor, Θ, to minimize the error between $y_{estk-1}$ which are given by $Θ_k$ every iteration.

The correction module 3930 functions to provide a tensorial mapping from the measurements, $y_{meas}$, relative to the reference signal, r, (e.g., streaming setpoints) into a correction tensor, CT, added to the input/output membership function centers and points. As such, the correction module 3930 enables an adaptation at each and every control sample to minimize an error between the measurement and the reference signal.

Figure 41:
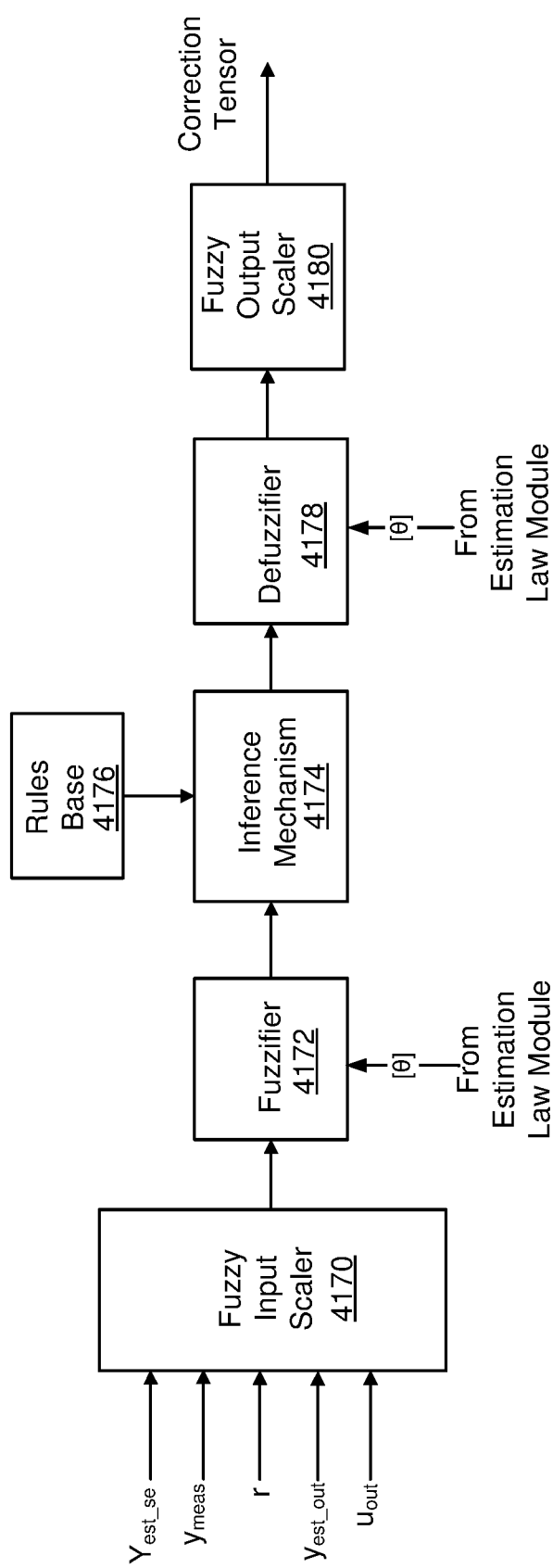
FIG. 41 is a block diagram depicting an example correction module that may be used to realize the correction module depicted in FIG. 39.

Referring briefly to FIG. 41, shown is an embodiment of the correction module 3930. As shown, the correction module 3930 includes a fuzzy input scaler module 4170, a fuzzifier 4172, an inference mechanism 4174 that is coupled to a rule base 4176, a defuzzifier 4178, and a fuzzy output scaler module 4180. As shown, the fuzzy input scaler module 4170 receives the control, $u_{out}$, the total estimated system output, $y_{est\_out}$, the reference signal, r, the measurements, $y_{meas}$, and estimated system output, $y_{est\_se}$. As depicted, the estimated model parameter tensor, Θ, is utilized by each of the fuzzifier 4172 and the defuzzifier 4178 to different effect. Specifically, Θ is utilized to affect the coefficients of the input membership functions (MFin) of the fuzzifier 4172 so as to affect the fuzzy values output by the fuzzifier 4172. And the estimated model parameter tensor, Θ is also utilized to affect the coefficients of the defuzzifier 4178 to, e.g., enable modification of the weights used with the center of gravity method.

As shown, the correction module 3930 produces a correction tensor, CT. In general, the correction tensor, CT, is indicative of an error, and it is generally desirable to minimize the correction, so as a consequence, parameters are adjusted so the CT tends to move to zero.

In addition to this correction tensor, CT, the meaning of the rules may be adjusted by scaling them with the scaling module 3932. As such, the scalars may autotune themselves so they narrow or extend the inputs so that the normalized range covers these inputs and not a larger in region. The inputs and scaling are considered over timeframes and calculated based upon the reference signal, r, which may be organized into synthesized frames.

The zooming and shifting module 3934 functions to shift the rule set with respect to a fixed grid such that updates are made only inside the active rules and membership functions. So, in other words, the entire rule base is zoomed in to cover only the active rules and shifted outside the original definitions whenever the rules that are active (e.g., corresponding to different operating conditions) are beyond the initial definitions. The power of this zooming-shifting method is twofold: first, because the scaling module 3932 changes the whole rule base meaning, this zooming-shifting method only zooms into the active rules; thus, only affecting the current active rules. Second, this method allows extending the rule base to a different set of conditions (inputs/outputs). So, using the estimated model parameter tensor, Θ, the zooming and shifting module 3934 optimizes itself and selects the shifting method to cover solely the current active laws.

Figure 42:
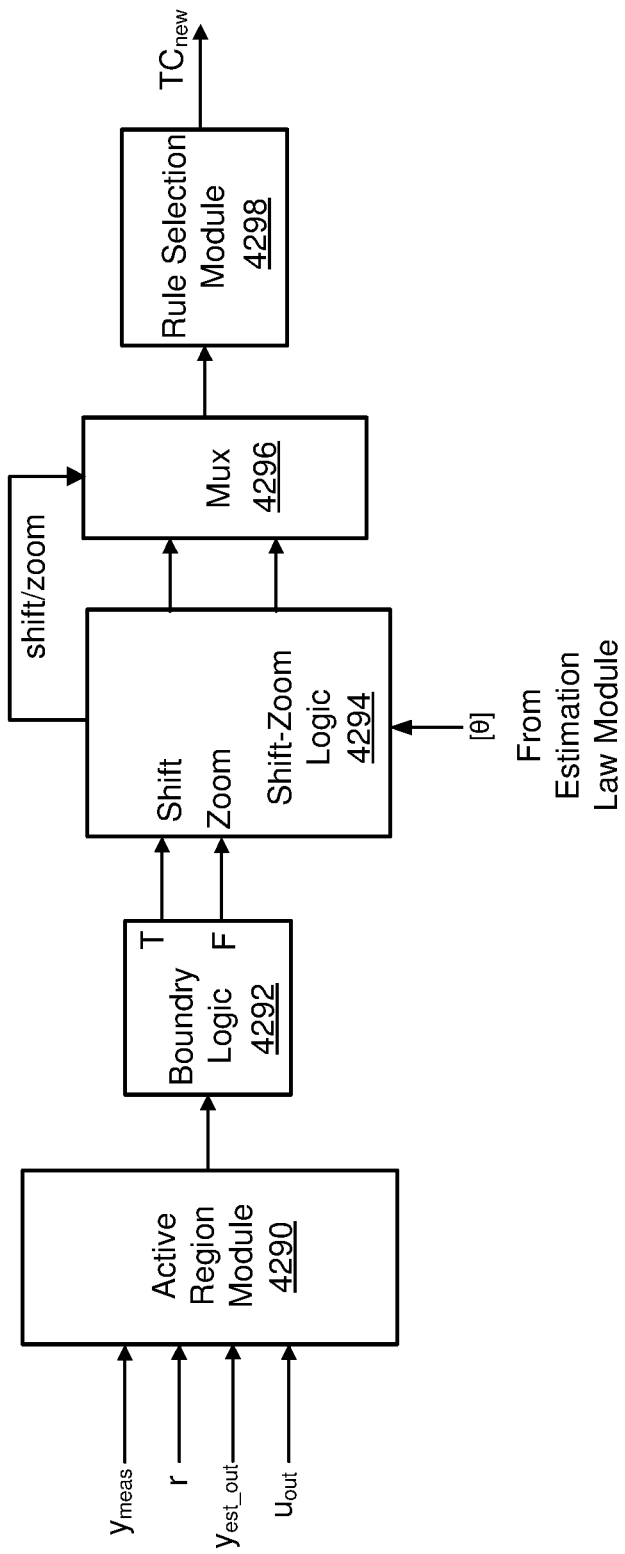
FIG. 42 is a block diagram depicting an example zooming and shifting module that may be used to realize the zooming and shifting module depicted in FIG. 39.

Referring to FIG. 42, shown is an embodiment of the zooming and shifting module 3934, which includes an active region module 4290, boundary logic 4292, shift-zoom logic 4294, a multiplexor 4296, and a rules selection module 4298. The active region module 4290 is configured to divide operational aspects of the system into regions utilizing the measured system output, $y_{meas}$, the reference, r, the total estimated system output, $y_{est\_out}$ and the control, $u_{out}$, to determine which region is currently active.

In turn, the boundary logic 4292 provides a TRUE signal if the active region is outside of the current active rule set and a FALSE signal if the active region is not outside of the active rule set boundaries. In response to the TRUE signal (indicating the active region is outside of the current active rule set), the shift-zoom logic 4294 will shift the center of the rules. The active region is a region of the rule base around the rules that are currently non-zero. The center of the region is where the measurements lead to a highest rule membership value (e.g., the rule the measurements/inputs fit into by the greatest amount).

In response to a FALSE signal, the shift-zoom logic 4294 will zoom in so as to cover the rules that are available so far. As shown, the shift-zoom logic 4294 receives the estimated model parameter tensor, Θ, and based upon Θ establishes the amount by which the rule base should be shifted or zoomed into so as to only require one active rule boundary set (e.g., for a single frame period).

The multiplexor 4296 then passes along either the shifted or the zoomed-in value based upon a shift/zoom signal. The rule selection module 4298 then determines a new tensor correction, TCnew, that enables a shift in the rules (relative to TC), so that instead of applying TC to all the rules in the system, TCnew is applied to a subset of rules from the rule base. In this way, only a subset of the rules (e.g., the rules where the system has been the last few samples) are moved.

As shown, CTnew is fed to the fuzzifier 3922, the rule base 3110, and the defuzzifier 3924. CTnew enables the zooming and shifting (performed by the zooming and shifting module 3934) to be applied to the fuzzifier 3922, defuzzifier 3924, and the rule base 3110 to enable the membership rules (of the fuzzifier 3922 and defuzzifier 3924) and rule base 3110 to be changed. For example, a center of the membership rules (e.g., bo depicted in FIG. 33) may be changed. Without the application of the zooming and shifting, the entire rule base 3110 would be changed. But if operation is within a linear system, it is desirable to shift the rule base 3110 around the current region where the system is operating, so the zooming and shifting allows a change to the correction factor, TC, based on the measurements that have been obtained in the region the system has been currently operating. In the context of the rule base 3110, application of the new tensor correction, TCnew results in adjustment of the rules where they are needed (e.g., based on the measurements). Instead of having a coarse mesh, it is desirable to have the rule base 3110 be very fine within the region of operation.

The memory grid 3936 creates a memory tensor composed of a grid that stores the new correction tensor, CTnew, for all the active laws during a period of time (e.g., during a frame). As such, a next time the same conditions are experienced, the new correction tensor, CTnew, is available and performance (e.g., robustness and reliability) will neither degrade nor change and adaptation need not be restarted.

If the memory grid 3936 requires more resources than are available, instead of using and storing the entire new correction tensor, an adaptation procedure may be used to determine an equivalent correction tensor that (given the amount of memory locations determined from hardware limitations or designed specs) is used for all the rules in a set of coarse memory locations such that it minimizes output error. In this way, an equivalent correction tensor may be adapted based upon the new correction tensor that is used during a frames' length for the most time (e.g., weights of the average may be selected such that r minus $y_{est\_out}$ tends as close as possible to zero where the $$\text{equivalent current tensor} = \left[ = \sum_{i=1}^{n} \frac{\theta_i CT_{new_i}}{1} \right].$$

Where n is the size of memory cell in terms of the actual rule set (number of fine cells in a coarse cell) and Θ is the estimated model parameter tensor.

When the ATFC is implemented as a standalone controller, the estimation law modules/FELB can be replaced by an empirically derived lookup table for the estimated model parameter tensors, Θ. More specifically, a lookup table can be empirically formed as a mapping between (1) $y_{meas}$ and $u_{out}$ from a reference/calibration system and (2) estimated model parameter tensors, Θ. During operation of the ATFC standalone controller, the control, $u_{out}$, can be provided to the controlling the one or more actuators 408, and measurements, $y_{meas}$, can be taken from the one or more actuators and/or system. These can then be used to select estimated model parameter tensors, Θ, from the lookup table, and then provided to the ATFC standalone controller to determine the control signal, $u_{out}$. This control signal, $u_{out}$, can be provided to the one or more actuators. Alternatively, the ATFC stand-alone controller can produce a string of possible control signals, $u_{se}$, and form the control, $u_{out}$, as a combination of the string. For instance, a weighted average of the possible control signals, $u_{se}$, can be used to calculate the control, $u_{out}$, although other methods of combining the string can also be implemented. In some embodiments, the combination may be based on estimated system outputs, $y_{est\_se}$, for each of the possible control signals, $u_{se}$, similar to the way in which a topology is selected in the selector and combiner mentioned earlier. These estimated system outputs, $y_{est\_se}$, can be found via an estimation portion of the nonlinear model, for instance, using Model 1:

$$y_{est\_se} = W_m\{u_{se}, \Theta\}$$

Where the estimated model parameter tensor, $\Theta$, is found in the lookup table based on the measured system output, $y_{meas}$, and the control, $u_{out}$, both from a previous iteration.

Adaptive Engine with Pre-Processed Control Laws

As previously noted, the control law modules or sub-engines can be processed on an FPGA or similar high-speed resource. However, for legacy systems that do not have such a resource, legacy processing may have difficulty implementing the heretofore mentioned control laws. One possible solution considered was application of gain scheduling-linearizing the system offline and then finding a controller capable of controlling the linearized system for various controls. However, any small parameters changes lead to a failure of this control approach. Another considered solution was to implement a robust controller, but this still led to poor performance, a small region of useful operation, and a lack of repeatability. Yet another proposal looked at interpolating between different controllers tailored to different operating regimes and challenges, yet while this was found to be effective for linear systems, it was found to be ineffective for nonlinear systems such as plasmas.

Eventually, the inventor conceived of developing a series of mappings between empirical data and controls that could be used as a replacement for the control law functionality. Certainly some convergence speed and latency are sacrificed over the adaptive engine as previously discussed, but this solution does prove effective given hardware limitations seen in many legacy power systems.

Figure 49:
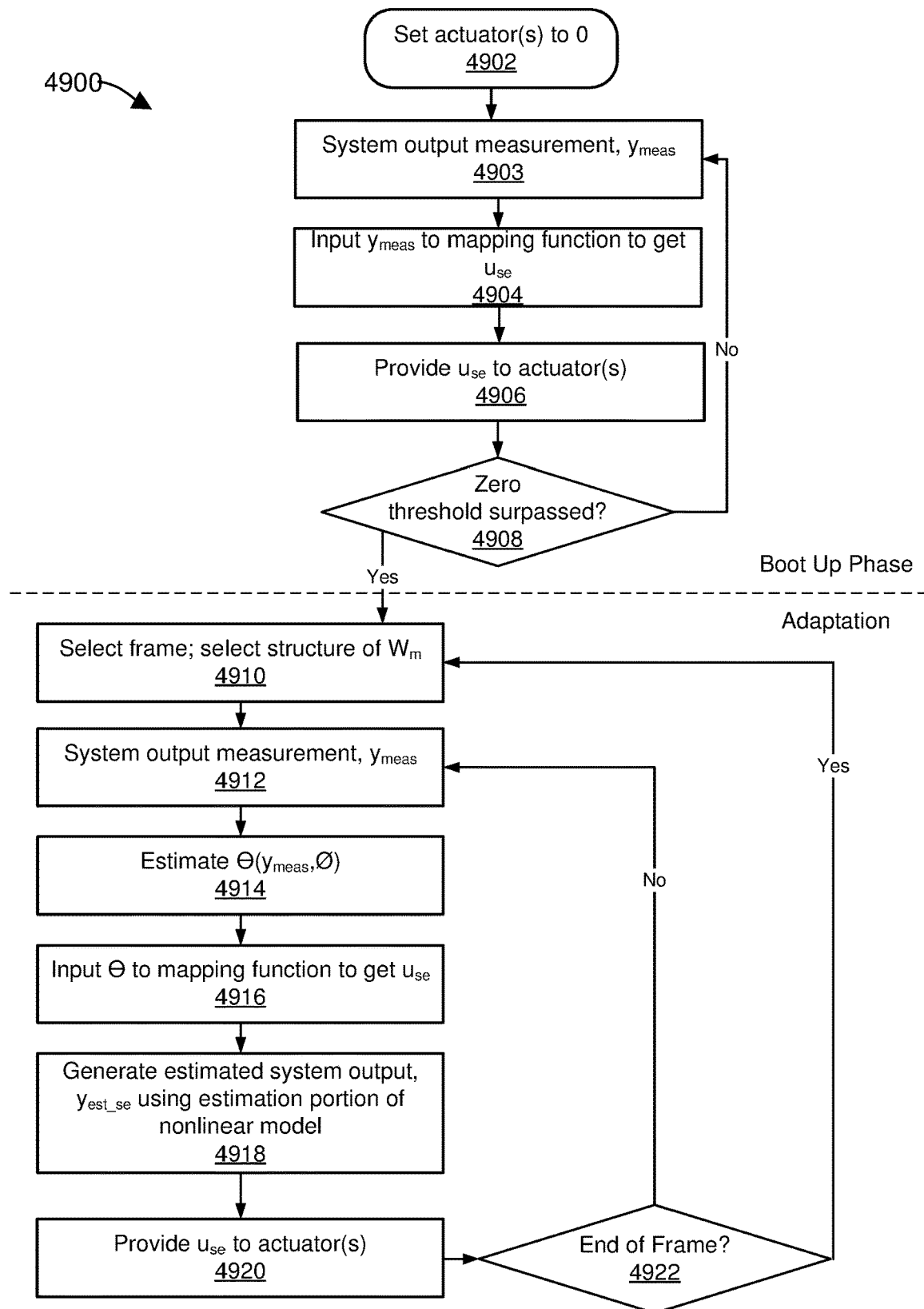
FIG. 49 illustrates a method of adaptive control where mappings of the control laws are empirically derived.

FIG. 49 illustrates a method of adaptive control where mappings of the control laws are empirically derived. The method 4900 starts by setting one or more actuators controlling a power system to 0 (Block 4902) in what will be called a boot up phase of the adaptive controller. A system output measurement, $y_{meas}$, is taken for the system controlled by the one or more actuators (Block 4903), and this measurement is input to a mapping function (Block 4904) to get a possible control, $u_{se}$, that corresponds to the measurement, $y_{meas}$. The mapping function can be related to and approximate the effects of a nonlinear model through empirical study of the power system. This possible control signal, $u_{se}$, is provided to the one or more actuators (Block 4906), and is likely zero or below a zero threshold at least for a first few iterations of the boot up phase (Decision 4908=No). If this version of the adaptive engine includes a single possible control signal, $u_{se}$, then $u_{se}=u_{out}$, or where multiple possible control signals, $u_{se}$, are provided from separate mapping functions, then the best $u_{se}$ or a combines $u_{se}$ can be the $u_{out}$. Another system output measurement, $y_{meas}$, is taken (Block 4903), and again inputted to the mapping function (Block 4904), which provides another possible control, $u_{se}$, that corresponds to the second measurement, $y_{meas}$, and that is provided to the one or more actuators (Block 4906). This portion of the boot up phase (Block 4903-4908) loops until a possible control, $u_{se}$, greater than the zero threshold occurs (Decision 4908=Yes), at which point the adaptive engine has reached an end of the boot up phase.

Adaptation can now begin following similar steps to those seen in earlier descriptions (e.g., see similarities between Adaptation phase and FIG. 7). Control samples can be grouped into frames and a best linear approximation of the system behavior over the new frame can be selected (Block 4910)—in other words, a structure of a time-varying linear system, $W_m$, can be selected for the first frame (Block 4910). This structure can be calculated in a frame resynthesizer or accessed from an empirically-derived lookup table. Another system output measurement, $y_{meas}$, can be taken (Block 4912), but this time the measurement can be used in an estimation law module as previously discussed (Block 4914). In particular the estimation law module can estimate an estimated model parameter tensor, $\Theta$, for every control sample of a nonlinear model, where this estimation is at least a function of the system output measurement, $y_{meas}$, and an input regressor, $\emptyset$. The input regressor, $\emptyset$, for this first iteration of the Adaptation phase may include a reference signal, r, and the last control from the boot up phase, $u_{out}$. In subsequent iterations, $\emptyset$, may include additional components such as $y_{est\_se}$. The estimating can be based on an estimation law that is a function of an estimated error, ê, or cost function, J. The estimated model parameter tensor, $\Theta$, comprises estimated parameters of the nonlinear model such as, but not limited to, r, $y_{meas}$, $y_{est\_se}$, and $u_{out}$. These $\Theta$ values can be elements within the A, B, and C matrices of a system of equations underlying the time-varying linear system, $W_m$, which is used in the nonlinear model, and in particular, in an estimation portion of the nonlinear model. The estimated model parameter tensor, $\Theta$, can be input to the mapping function used in the boot up phase, and via a different mapping in the mapping function, a possible control signal, $u_{se}$ can be extracted from the mapping function based on the $\Theta$ input (Block 4916). In other words, the mapping function can have two operations or two sets of mappings: (1) a first that gives $u_{se}$ in terms of $y_{meas}$, and (2) a second that gives $u_{se}$ in terms of $\Theta$. The adaptive engine can then provide the possible control signal, $u_{se}$, to an estimation portion of the nonlinear model to generate an estimated system output, $y_{est\_se}$ (Block 4918) estimated to result if the possible control signal, $u_{se}$, is provided to the one or more actuators. The estimation portion of the nonlinear model uses the structure for the time-varying linear system, $W_m$, selected for the current frame with $u_{se}$ and $\Theta$ as inputs. Alternatively, an additional realm of the mapping function can give the estimated system output, $y_{est\_se}$, based on an input of the possible control signal, $u_{se}$ (Block 5018 in FIG. 50). If used, the estimation portion of the nonlinear model is also a function of the estimated model parameter tensor, $\Theta$. In some embodiments, the estimation portion of the nonlinear model can be implemented in the estimation law module, though this processing location is not limiting.

The mapping function can also provide the possible control signal, $u_{se}$, to the one or more actuators (Block 4920) as the control, $u_{out}$, assuming no other possible control signals, $u_{se}$, for this control sample or iteration, are provided by the mapping function or another mapping function. If another possible control signal, $u_{se}$, is provided (this variation is not shown, but will be familiar from previous discussions of the adaptive engine), the method 4900 can select (1) a best possible control signal, $u_{se}$, from a set including the possible control signal, $u_{se}$, from the first mapping function, and additional possible control signals, $u_{se}$, or (2) a best combination of possible control signals, $u_{se}$, blended from two or more of the set. The blending can be based on a topology that can include averaging, multiplication, summations, differences, divisions, integrals, derivatives, exponentials, complex functions, logarithms, series, statistical distributions, matrices, tensors, neural networks, nonlinear functions, graphs, maps, transformations, trees, to name a few non-limiting examples, or combinations thereof. The topology can be selected based on a total estimated system output, $y_{est\_out}$, for each of multiple possible topologies, and then based on comparing this total estimated system output, $y_{est\_out}$, to the reference signal, r, the measured system output, $y_{meas}$, or a combination of these (referred to as estimated system error, $e_{out}$). For instance, a specific example using all three of these values is shown in Equation 4, where a cost function, $J_{out}$ of two errors is used. This selection and/or blending can be performed by a selector module, such as the selector modules 508.

If the current frame has not ended (Decision 4922=No), then the adaptation of the estimated model parameter tensor, Θ, (Blocks 4912-4922) repeat for all iterations or control samples in the frame (until Decision 4922=Yes). This adaptation leaves the linear approximation (or structure of the time-varying linear system, $W_m$) constant through the frame, but adapts the estimated model parameter tensor, Θ, at each control sample or iteration in the frame until the bifurcated nonlinear model converges on the system's nonlinear behavior.

At the end of each frame (Decision 4922=Yes), a new linear approximation (structure of the time-varying linear system, $W_m$) is calculated or accessed (Block 4910), and adaptation of the estimated model parameter tensor, Θ, again restarts from the baseline of the linear approximation until convergence on the nonlinear system behavior is achieved. The final estimated model parameter tensor, Θ, in each frame can be stored along with a mapping to the frame and the structure of the time-varying linear system, $W_m$, such that these values can be recalled should the reference signal, r, underlying the frame be seen again.

Figure 50:
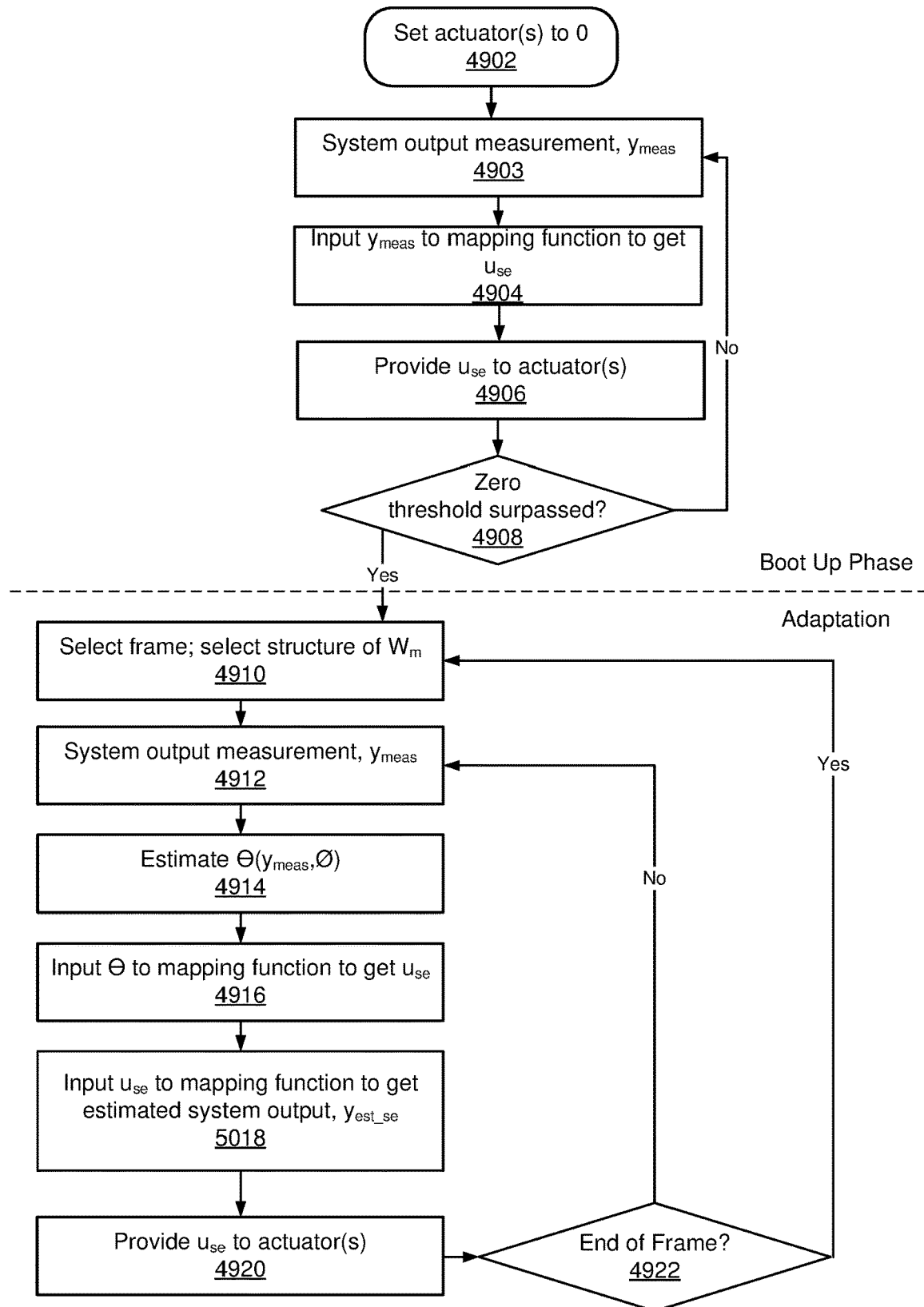
FIG. 50 shows another alternative where the mapping function also determines the estimated system output, $y_{est\_se}$.

As seen, this alternative adaptive engine operates similarly to those shown in previous aspects of this disclosure, but with a unique boot up phase and unique use of a mapping function rather than the control law module to determine the possible control signal, $u_{se}$, from the estimated model parameter tensor, Θ. Further, FIG. 50 shows another alternative where the mapping function also determines the estimated system output, $y_{est\_se}$ based at least on the possible control signal, $u_{se}$, also found from the mapping function.

In the above description the possible control signal, $u_{se}$, is effectively the control, $u_{out}$, previously discussed, since it is provided directly to the actuators. However, in other embodiments, the adaptive engine can include multiple estimation law modules each producing their own estimated model parameter tensors, Θ, that can all be fed into the mapping function to produce different possible control signals, $u_{se}$, and then a selector module can select a best of these possible control signals, $u_{se}$, or a best combination or blending of two or more of these possible control signals, $u_{se}$, as the control, $u_{out}$. In another alternative, multiple estimation law modules can feed multiple mapping functions, each mapping function approximating different ones of the control laws discussed previously, and again, a selector module can select a one or combination of possible control signals, $u_{se}$, as the control, $u_{out}$. Where multiple possible control signals, $u_{se}$, come into play, the estimated system outputs, $y_{est\_se}$, corresponding to each of these, can be used in the selector module to select the one or a combination of the possible control signals, $u_{se}$, as the control, $u_{out}$.

The estimation law module can $u_{se}$ any number of estimation laws, such as, but not limited to, Estimation Laws 1-7 previously discussed, though they typically are a function of the estimation error, ê, which can be based on a difference between two or more of r, $y_{meas}$, and $y_{est\_se}$. The estimation laws are also typically a function of the input regressor, Ø. Some estimation laws may include an adaptation gain, that controls an influence that adaptation has on the control, $u_{out}$.

Where a single estimation law module and a single mapping function are used, and rather than apply $u_{se}$ as the $u_{out}$, a string of multiple $u_{se}$ can be combined, for instance in an average, to produce a control $u_{out}$ at each control sample or iteration.

Figure 51:
FIG. 51 shows a mapping function as used during a boot up phase of an alternative adaptive engine.
Figure 52:
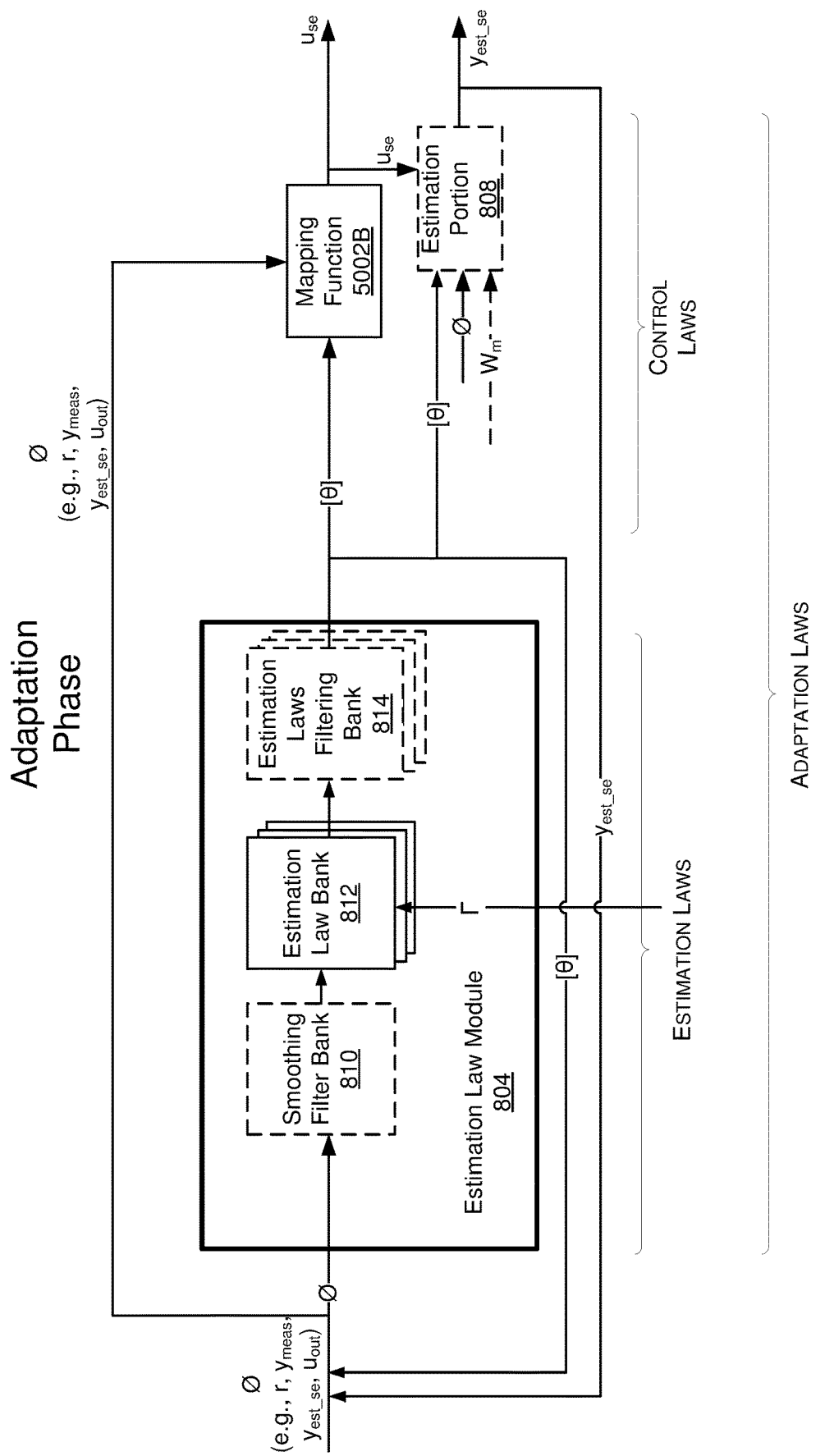
FIG. 52 shows a mapping function as used during an adaptation phase of an alternative adaptive engine.
Figure 53:
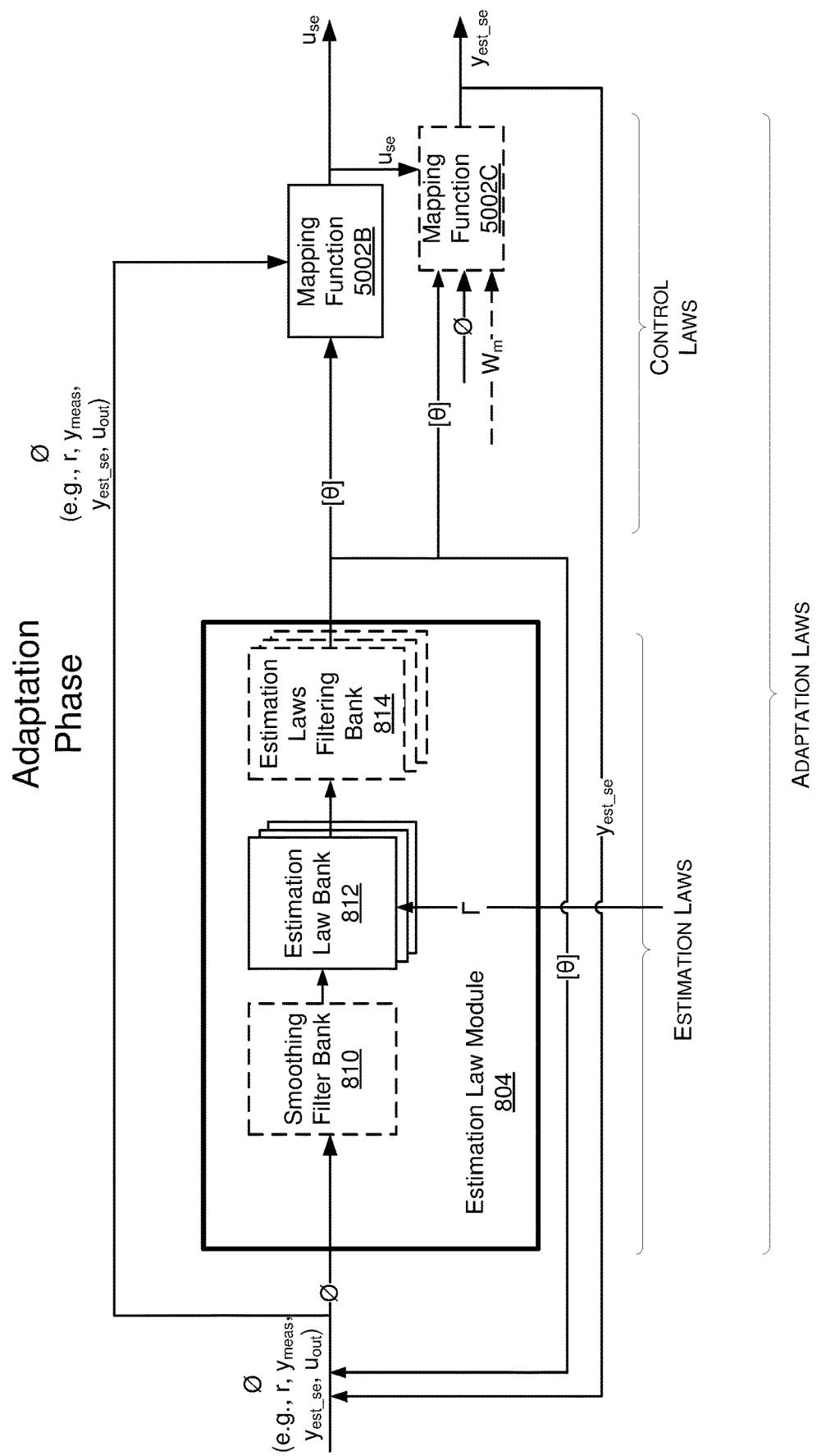
FIG. 53 shows a mapping function as used during an adaptation phase of an alternative adaptive engine.

FIGS. 51-53 illustrate components of an adaptive engine implementing a mapping function to enable the adaptive engine to operate on legacy hardware that may have limited processing resources. For instance, where the FPGA previously discussed as processing the control laws (or control portion of the nonlinear model) is not available or has insufficient processing power to perform these functions, FIGS. 51-53 may provide a strong alternative. For instance, FIG. 50 illustrates the mapping function 5002A as used during the boot up phase discussed relative to FIGS. 49 and 50. In particular, the mapping function 5002A can provide a possible control signal, $u_{se}$, based on a system output measurement of the one or more actuators or a power system controlled by the one or more actuators. This means of generating the possible control signal, $u_{se}$, which may be provided to the one or more actuators as the control, $u_{out}$, can be repeated until the possible control signal, $u_{se}$, exceeds a zero threshold. The mapping function 5002A can be related to a nonlinear model via an empirical study of the power system. A separate region of the mapping function 5002B can then operate as part of a larger adaptive engine as shown in FIG. 52 or 53. Alternatively, the mapping function 5002B shown in FIGS. 52 and 53 can be a distinct mapping function from the one shown in FIG. 51. The mapping functions 5002B and 5002C can also be related to the nonlinear model via an empirical study of the power system. As seen, these two regions of the mapping function or distinct mapping functions have distinct operation: the first provides $u_{se}$ in terms of $y_{meas}$ and the second provides $u_{se}$ in terms of Θ. Where the possible control signal, $u_{se}$, is provided directly to the one or more actuators, or combined in a string of possible control signals, $u_{se}$, from the mapping function 5002B, the estimation portion 808 may not be needed. The estimation portion 808 produces the estimated system output, $y_{est\_se}$, corresponding to each possible control signal, $u_{se}$, and this output has two functions: (1) to help a selector module in selecting a best or a best combination of possible control signals, $u_{se}$, as the control, $u_{out}$; and (2) to aid in calculating an estimation error, e. However, where a selector module is not needed because the possible control signal, $u_{se}$, is provided directly to the one or more actuators, and where the estimation error, ê, is found using a form that does not use $y_{est\_se}$ (e.g., instead using $|y_{meas}-r|$), then the estimation portion 808 may be superfluous and can be excluded. Similarly, the mapping function 5002C in FIG. 53 can also be optional for these same reasons.

Aside from the mapping function 5002B, FIG. 52 operates as described in FIG. 8A, and thus reference can be made to that figure and the corresponding description for an appreciation of the remainder of FIG. 52. The alternative shown in FIG. 53 is also very similar to FIG. 8A, but here replaces the estimation portion 808 of the nonlinear model with an additional region of the mapping function 5002C (or a distinct mapping function). This mapping function 5002C provides an estimated system output, $y_{est\_se}$, corresponding to a possible control signal, $u_{se}$, based on inputs that include the estimated model parameter tensor, $\Theta$, the structure of the time-varying linear system, $W_m$, and optionally the input regressor, $\emptyset$. The specific inputs used depend on the form of the nonlinear model being used.

Although FIGS. 51-53 do not use a control law module, the mapping function 5002A, 5002B, and optionally 5002C can still be developed to implement a control law. In fact, the mapping functions 5002A, 5002B, and optionally 5002C can produce virtually the same possible control signals, $u_{se}$, as the control law modules or sub-engines described earlier in this disclosure, including the TLMC, TARC, L1, Adaptive PID, ATIMC, and ATFC. Admittedly, speed and other parameters will be sacrificed by implementing the control laws in the mapping functions as compared to the control law modules previously described. However, where hardware is limiting, the solutions provided in FIGS. 49-53 still provide a worthy improvement over existing adaptive controllers.

Figure 48:
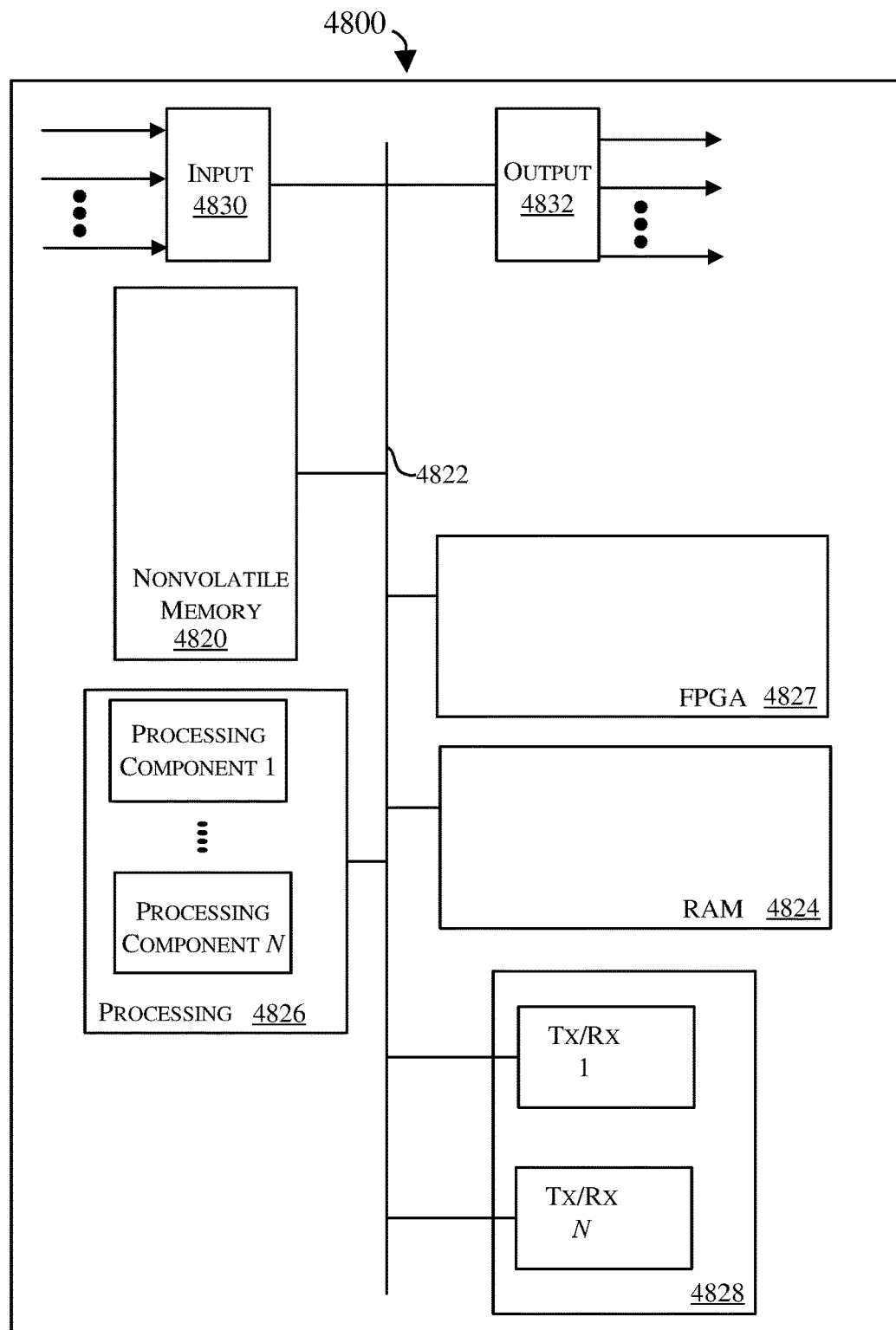
FIG. 48 shows a block diagram depicting physical components that may be utilized to realize the adaptive engine according to an exemplary embodiment.

The methods described in connection with the embodiments disclosed herein may be embodied directly in hardware, in processor-executable code encoded in a non-transitory tangible processor readable storage medium, or in a combination of the two. Referring to FIG. 48 for example, shown is a block diagram depicting physical components that may be utilized to realize the adaptive engine according to an exemplary embodiment. As shown, in this embodiment a display portion 4812 and nonvolatile memory 4820 are coupled to a bus 4822 that is also coupled to random access memory ("RAM") 4824, a processing portion (which includes N processing components) 4826, an optional field programmable gate array (FPGA) 4827, and a transceiver component 4828 that includes N transceivers. Although the components depicted in FIG. 48 represent physical components, FIG. 48 is not intended to be a detailed hardware diagram; thus many of the components depicted in FIG. 48 may be realized by common constructs or distributed among additional physical components. Moreover, it is contemplated that other existing and yet-to-be developed physical components and architectures may be utilized to implement the functional components described with reference to FIG. 48. For instance, while the RAM 4824 may take the form of a TSP-RAM in some instances, other forms of RAM can also be implemented. Further, while the frame resynthesizer may be implemented in the processing portion 4826 (e.g., a CPU) due to hardware limitations in today's FPGAs, future FPGAs or similar-type resources may be able to perform both the functions of the frame resynthesizer, estimation law modules, control law modules, selector module, and the control and estimation portions of the nonlinear model. For instance, future neural networks or quantum computing may enable a neural-network enabled processor or quantum computer to perform all processes of the adaptive engine without splitting functionality between different processing resources. With existing hardware, the processing portion 4826 is likely to process frames and the structure of the time-varying linear system, $W_m$, and possibly the estimated model parameter tensor, $\Theta$, while the FPGA 4827 is like to process the control law modules, the control and estimation portions of the nonlinear model, and the selector module (and in some cases may take on estimation of the estimated model parameter tensor, $\Theta$, too).

This display portion 4812 generally operates to provide a user interface for a user, and in several implementations, the display is realized by a touchscreen display. In general, the nonvolatile memory 4820 is non-transitory memory that functions to store (e.g., persistently store) data and processor-executable code (including executable code that is associated with effectuating the methods described herein). In some embodiments for example, the nonvolatile memory 4820 includes bootloader code, operating system code, file system code, and non-transitory processor-executable code to facilitate the execution of methods described with reference to FIGS. 7, 9, 32, 47, and 49 described further herein. For instance, the non-transitory processor-executable code could facilitate execution of steps used to carry out adaptation of the nonlinear model including steps for identifying frames, selecting a structure of $W_m$ at each frame, and adapting $\Theta$ at each control sample to produce a control $u_{out}$ that is tailored to specific operating regimes and instability challenges.

In many implementations, the nonvolatile memory 4820 is realized by flash memory (e.g., NAND or ONENAND memory), but it is contemplated that other memory types may be utilized as well. Although it may be possible to execute the code from the nonvolatile memory 4820, the executable code in the nonvolatile memory is typically loaded into RAM 4824 and executed by one or more of the N processing components in the processing portion 4826.

The N processing components in connection with RAM 4824 generally operate to execute the instructions stored in nonvolatile memory 4820 to enable adaptation. For example, non-transitory, processor-executable code to effectuate the methods described with reference to FIGS. 7, 9, 32, 47, and 49 may be persistently stored in nonvolatile memory 4820 and executed by the N processing components in connection with RAM 4824. As one of ordinarily skill in the art will appreciate, the processing portion 4826 may include a video processor, digital signal processor (DSP), microcontroller, graphics processing unit (GPU), or other hardware processing components or combinations of hardware and software processing components (e.g., an FPGA or an FPGA including digital logic processing portions).

In addition, or in the alternative, the processing portion 4826 may be configured to effectuate one or more aspects of the methodologies described herein (e.g., the methods described with reference to FIGS. 7, 9, 32, 47, and 49). For example, non-transitory processor-readable instructions may be stored in the nonvolatile memory 4820 or in RAM 4824 and when executed on the processing portion 4826, cause the processing portion 4826 to perform adaptation using a bifurcated nonlinear model. Alternatively, non-transitory FPGA-configuration-instructions may be persistently stored in nonvolatile memory 4820 and accessed by the processing portion 4826 (e.g., during boot up) to configure the hardware-configurable portions of the processing portion 4826 to effectuate the functions of the adaptive engine.

The input component 4830 operates to receive signals (e.g., the reference signal, r) that are indicative of one or more aspects of a desired waveform or desired performance of the power system. The signals received at the input component may include, for example, setpoints or power delivery parameters or a plasma processing recipe. The output component generally operates to provide one or more analog or digital signals to effectuate an operational aspect of the adaptive engine. For example, the output portion 4832 may provide the control, $u_{out}$, to the one or more actuators.

The depicted transceiver component 4828 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The terms and expressions employed herein are used as terms and expressions of description and not of limitation, and there is no intention, in the use of such terms and expressions, of excluding any equivalents of the features shown and described or portions thereof. Each of the various elements disclosed herein may be achieved in a variety of manners. This disclosure should be understood to encompass each such variation, be it a variation of an embodiment of any apparatus embodiment, a method or process embodiment, or even merely a variation of any element of these. Particularly, it should be understood that the words for each element may be expressed by equivalent apparatus terms or method terms-even if only the function or result is the same. Such equivalent, broader, or even more generic terms should be considered to be encompassed in the description of each element or action. Such terms can be substituted where desired to make explicit the implicitly broad coverage to which this invention is entitled.

As but one example, it should be understood that all action may be expressed as a means for taking that action or as an element which causes that action. Similarly, each physical element disclosed should be understood to encompass a disclosure of the action which that physical element facilitates. Regarding this last aspect, by way of example only, the disclosure of a "protrusion" should be understood to encompass disclosure of the act of "protruding"—whether explicitly discussed or not—and, conversely, were there only disclosure of the act of "protruding", such a disclosure should be understood to encompass disclosure of a "protrusion". Such changes and alternative terms are to be understood to be explicitly included in the description.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An adaptive engine configured to receive a reference waveform and apply a control output, $u_{out\_k}$, to one or more actuators, the adaptive engine comprising: a processor; a memory storing instructions that, when executed by the processor, cause the adaptive engine to implement:
   an estimation law module configured to receive an input regressor, the input regressor comprising:
     a reference signal, r,
     a system output measurement, $y_{meas}$, and
     a control output, $u_{out\_k-1}$, from a previous iteration, and applied to the one or more actuators;
   the estimation law module configured to apply one or more estimation laws to the input regressor to produce two or more estimated model parameter tensors, $\Theta$, for a nonlinear model of the one or more actuators or a power system controlled by the one or more actuators;
   a control law sub-engine comprising a first control law module and a second control law module;
   a control law selector and combiner (CSC) coupled to outputs of the first and second control law modules and configured to receive a possible control signal, $u_{SE\_k}$, for a current iteration from each of the first and second control law modules;
   wherein the nonlinear model is configured to produce two or more estimated system outputs, $y_{est\_SE}$ based upon applying from each of the first and second control law modules: (1) a previous iteration of a possible control signal, $U_{SE\_k-1}$, or (2) the possible control signal $u_{SE\_k}$, to the nonlinear model; and
   wherein the CSC is configured to provide one of, or a combination of, (1) the possible control signal, $U_{SE\_k}$, for the current iteration from the first control law module and (2) the possible control signal, $U_{SE\_k}$, for the current iteration from the second control law module, to a selector module based at least in part on an estimation or prediction error derived from each of the estimated system outputs, $y_{est\_SE}$, and wherein the selector module computes the control output, $u_{out\_k}$, applied to the one or more actuators.

2. The adaptive engine of claim 1, wherein the control law sub-engine further comprises a third control law module.

3. The adaptive engine of claim 2, wherein:
the first control law module comprises an adaptive inverse control law module (AIL control law module) configured to receive a first estimated model parameter tensor from the estimation law module,
the second control law module comprises an eigen control law module (EL control law module) configured to receive a second estimated model parameter tensor from the estimation law module, and
the third control law module comprises a penalty control law module (PL control law module) configured to receive a third estimated model parameter tensor from the estimation law module.

4. The adaptive engine of claim 3, wherein the AIL law module is the first control module, and wherein applying the AIL control law module comprises:
computing one or more of a measurement error, e, and a cost function, J, wherein the measurement error, e, is $|y_{meas}-r|$, and wherein the cost function, J, is $|y_{est}-r|$;
computing the first estimated model parameter tensor, $\Theta$, based upon one or more of:
the system output measurement, $y_{meas}$,
the previous iteration of the possible control signal, $U_{SE\_k-1}$, for the AIL control law module,
the control output from the previous iteration, $U_{out\_k-1}$, and
one or more of the measurement error, e, and the cost function, J;
passing, through a smoothing inverse filter, one or more of:
the measurement error, e,
the cost function, J,
the previous iteration of the possible control signal, $u_{SE\_k-1}$, for the AIL control law module, and
the control output from the previous iteration, $u_{out\_k-1}$; and
passing, through a smoothing filter, one or more of:
the previous iteration of the possible control signal, $U_{SE\_k-1}$, for the AIL control law module, and
the control output from the previous iteration, $u_{out\_k-1}$.

5. The adaptive engine of claim 4, wherein applying the AIL control law module further comprises:
producing the possible control signal, $U_{SE\_k}$, corresponding to the AIL control law module based at least in part on:
a linear system representation of the reference signal, r,
an internal model representing a desired or reference plasma process performance, $Q_m$,
the control output from the previous iteration, $U_{out\_k-1}$, and
one or more of the measurement error, e, and the cost function, J.

6. The adaptive engine of claim 5, wherein the possible control signal, $U_{SE\_k}$, corresponding to the AIL control law module is applied to the nonlinear model to calculate the estimated system output, $y_{est\_SE}$, corresponding to the AIL control law module.

7. The adaptive engine of claim 3, wherein the EL control law module is the second control law module, and wherein applying the EL control law module comprises:
computing an estimated output error; and
computing the possible control signal, $U_{SE\_k}$, corresponding to the EL module based at least in part on;
an internal model representing a desired or reference plasma process performance, $Q_m$,
a linear time varying (LTV) signal corresponding to the reference signal, r,
the estimated output error, and
the second estimated model parameter tensor, $\Theta$.

8. The adaptive engine of claim 3, wherein the PL control law module is the third control law module, and wherein applying the PL control law module comprises:
computing an estimated output error; and
computing the possible control signal, $U_{SE\_k}$, based at least in part on:
a penalty tensor, R,
the estimated output error,
the third estimated model parameter tensor, $\Theta$, and
an internal model representing a desired or reference plasma process performance, $Q_m$.

9. The adaptive engine of claim 8, wherein the possible control signal, $U_{SE\_k}$, corresponding to the PL control law module is applied to the nonlinear model to calculate a estimated system output, $y_{est\_SE}$, corresponding to the PL control law module.

10. The adaptive engine of claim 3, wherein the penalty and eigen control law modules are used in parallel.

11. The adaptive engine of claim 10, wherein the CSC selects one of, or a combination of the possible control signals, $U_{SE\_k}$, output from each of the EL, PL, and AIL control law modules predicted to minimize error.

12. The adaptive engine of claim 1, wherein,
the selector module is configured to receive one or more other possible control signals from one or more other control law sub-engines,
the selector module further comprises a tensor synchronization and coherency module configured to receive an exogenous signal, and
the exogenous signal is applied to the possible control signals, $U_{SE\_k}$, and the one or more other possible control signals to smooth transitions between possible control signals input to the selector module.

13. The adaptive engine of claim 12, wherein the tensor synchronization and coherency module computes an estimated output error based at least in part on the exogenous signal.

14. The adaptive engine of claim 1, wherein the estimation law module is optimized for unstable zero dynamic situations seen in nonlinear systems.

15. The adaptive engine of claim 1, wherein the estimation law module is configured to achieve convergence during stable and unstable zero-dynamics.

16. A method of adaptive control for applying a control output, $u_{out\_k}$, to one or more actuators, the method comprising:
receiving an input regressor, the input regressor comprising:
a reference signal, r,
a system output measurement, $y_{meas}$, and
a control output, $u_{out\_k-1}$, from a previous iteration, and applied to the one or more actuators;
applying one or more estimation laws to the input regressor to estimate two or more estimated model parameter tensors, $\Theta$, for a nonlinear model of the one or more actuators or a power system controlled by the one or more actuators, wherein the nonlinear model is a function of the two or more estimated model parameter tensors, $\Theta$, and wherein each of the two or more estimated model parameter tensors, $\Theta$, comprises estimated parameters of the nonlinear model;
receiving, for a current iteration, two or more possible control signals, $U_{SE\_k}$, each of the two or more possible control signals, $U_{SE\_k}$, received using a corresponding control portion of the nonlinear model, and wherein each control portion is a function of one of the two or more estimated model parameter tensors, $\Theta$, of the nonlinear model;

generating two or more estimated system outputs, Y est_SE, each of the two or more estimated system outputs, $y_{est\_SE}$, generated using a corresponding estimation portion of the nonlinear model, and wherein each estimation portion of the nonlinear model is a function of one of the two or more estimated model parameter tensors, $\Theta$; and computing the control output, $u_{out\_k}$, applied to the one or more actuators, wherein computing the control output, $u_{out\_k}$, comprises:

selecting one of, or a combination of, the two or more possible control signals, $U_{SE\_k}$, as the control output, $u_{out\_k}$, wherein the selecting is based at least in part on an estimation or prediction error derived from each of the two or more estimated system outputs, $y_{est\_SE}$.

17. The method of claim 16, wherein each estimation portion is also a function of a structure of a time varying linear system, $W_m$, and wherein each of the one or more estimation laws is a function of an estimation error, $\hat{e}$, or a cost function, J.

18. The method of claim 16, wherein generating each of the two or more possible estimated system outputs, $y_{est\_SE}$, is further based upon applying the nonlinear model to (1) a previous iteration of the respective possible control signal, $u_{SE\_k-1}$, from one of the two or more control portions, or (2) the respective possible control signal, $U_{SE\_k}$, from one of the two or more control portions.

19. A non-transient computer-readable storage medium having instructions embodied thereon, the instructions being executable by one or more processors to perform a method for adaptive control for applying a control output, $u_{out\_k}$, to one or more actuators, the method comprising:

receiving an input regressor, the input regressor comprising:

a reference signal, r, a system output measurement, $y_{meas}$, and a control output, $u_{out\_k-1}$, from a previous iteration, and applied to the one or more actuators;

applying one or more estimation laws to the input regressor to estimate two or more estimated model parameter tensors, $\Theta$, for a nonlinear model of the one or more actuators or a power system controlled by the one or more actuators, wherein the nonlinear model is a function of the two or more estimated model parameter tensors, $\Theta$, and wherein each of the two or more estimated model parameter tensors, $\Theta$, comprises estimated parameters of the nonlinear model;

receiving, for a current iteration, two or more possible control signals, $U_{SE\_k}$, each of the two or more possible control signals, $U_{SE\_k}$, received using a corresponding control portion of the nonlinear model, and wherein each control portion is a function of one of the two or more estimated parameter tensors, $\Theta$, of the nonlinear model;

generating two or more estimated system outputs, $y_{est\_SE}$, each of the two or more estimated system outputs, $y_{est\_SE}$, generated using a corresponding estimation portion of the nonlinear model, and wherein each estimation portion of the nonlinear model is a function of one of the two or more estimated model parameter tensors, $\Theta$; and computing the control output, $u_{out\_k}$, applied to the one or more actuators, wherein computing the control output, $u_{out\_k}$, comprises:

selecting one of, or a combination of, the two or more possible control signals, $U_{SE\_k}$, as the control output, $u_{out\_k}$, wherein the selecting is based at least in part on an estimation or prediction error derived from each of the two or more estimated system outputs, $y_{est\_SE}$.

20. The non-transient computer-readable storage medium of claim 19, wherein each estimation portion is also a function of a structure of the time varying linear system, $W_m$, and wherein each of the one or more estimation laws is a function of an estimation error, $\hat{e}$, or a cost function, J.

* * * * *